(12) United States Patent
Cheng et al.

(10) Patent No.: US 11,630,212 B2
(45) Date of Patent: Apr. 18, 2023

(54) LIGHT-SENSING APPARATUS AND LIGHT-SENSING METHOD THEREOF

(71) Applicant: Artilux, Inc., Menlo Park, CA (US)

(72) Inventors: Szu-Lin Cheng, Hsinchu (TW); Chien-Yu Chen, Zhubei (TW); Shu-Lu Chen, Zhubei (TW); Yun-Chung Na, Zhubei (TW); Ming-Jay Yang, Zhubei (TW); Han-Din Liu, Sunnyvale, CA (US); Che-Fu Liang, Zhubei (TW); Jung-Chin Chiang, Zhubei (TW); Yen-Cheng Lu, Zhubei (TW); Yen-Ju Lin, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 66 days.

(21) Appl. No.: 17/404,812

(22) Filed: Aug. 17, 2021

(65) Prior Publication Data
US 2021/0373168 A1 Dec. 2, 2021

Related U.S. Application Data

(63) Continuation of application No. 16/904,583, filed on Jun. 18, 2020, now Pat. No. 11,105,928, which is a
(Continued)

(51) Int. Cl.
*G01S 17/894* (2020.01)
*G01S 17/26* (2020.01)
(Continued)

(52) U.S. Cl.
CPC .......... *G01S 17/894* (2020.01); *G01S 7/4814* (2013.01); *G01S 7/4816* (2013.01); *G01S 17/26* (2020.01);
(Continued)

(58) Field of Classification Search
CPC .... G01S 17/894; G01S 7/4814; G01S 7/4816; G01S 17/26; G01S 7/4863;
(Continued)

(56) References Cited

U.S. PATENT DOCUMENTS 3,621,466 A 11/1971 Toshio
4,341,918 A 7/1982 Evans, Jr. et al.
(Continued)

FOREIGN PATENT DOCUMENTS

CN 1853276 10/2006
CN 101310387 11/2008
(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.
(Continued)

*Primary Examiner* — Karen Kusumakar
*Assistant Examiner* — Adam S Bowen
(74) *Attorney, Agent, or Firm* — Fish & Richardson P.C.

(57) ABSTRACT

A photo-detecting apparatus is provided. The photo-detecting apparatus includes: a substrate made by a first material or a first material-composite; an absorption layer made by a second material or a second material-composite, the absorption layer being supported by the substrate and the absorption layer including: a first surface; a second surface arranged between the first surface and the substrate; and a channel region having a dopant profile with a peak dopant concentration equal to or more than $1\times10^{15}$ cm$^{-3}$, wherein a distance between the first surface and a location of the channel region having the peak dopant concentration is less than a distance between the second surface and the location
(Continued)

of the channel region having the peak dopant concentration, and wherein the distance between the first surface and the location of the channel region having the peak dopant concentration is not less than 30 nm.

20 Claims, 79 Drawing Sheets

Related U.S. Application Data continuation-in-part of application No. 16/282,881, filed on Feb. 22, 2019, now Pat. No. 10,777,692.

(60) Provisional application No. 63/012,930, filed on Apr. 21, 2020, provisional application No. 63/012,249, filed on Apr. 19, 2020, provisional application No. 63/008,834, filed on Apr. 13, 2020, provisional application No. 63/006,696, filed on Apr. 7, 2020, provisional application No. 62/865,305, filed on Jun. 24, 2019, provisional application No. 62/862,687, filed on Jun. 18, 2019, provisional application No. 62/776,995, filed on Dec. 7, 2018, provisional application No. 62/770,196, filed on Nov. 21, 2018, provisional application No. 62/755,581, filed on Nov. 5, 2018, provisional application No. 62/752,285, filed on Oct. 29, 2018, provisional application No. 62/717,908, filed on Aug. 13, 2018, provisional application No. 62/698,263, filed on Jul. 15, 2018, provisional application No. 62/695,060, filed on Jul. 8, 2018, provisional application No. 62/695,058, filed on Jul. 8, 2018, provisional application No. 62/686,697, filed on Jun. 19, 2018, provisional application No. 62/682,254, filed on Jun. 8, 2018, provisional application No. 62/660,252, filed on Apr. 20, 2018, provisional application No. 62/654,454, filed on Apr. 8, 2018, provisional application No. 62/634,741, filed on Feb. 23, 2018.

(51) Int. Cl.
*H01L 27/148* (2006.01)
*G01S 7/481* (2006.01)

(52) U.S. Cl.
CPC .. *H01L 27/14812* (2013.01); *H01L 27/14856* (2013.01)

(58) Field of Classification Search
CPC ......... H01L 27/14812; H01L 27/14856; H01L 27/14616; H01L 27/1464
See application file for complete search history.

(56) References Cited

U.S. PATENT DOCUMENTS

| | | | |
|---|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,509,203 B2 | 1/2003 | Spartiotis et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,495,202 B2 | 2/2009 | Schrey et al. |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,888,763 B2 | 2/2011 | Qian et al. |
| 7,961,301 B2 | 6/2011 | Earhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,405,823 B2 | 3/2013 | Pfaff |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 10,254,389 B2 | 4/2019 | Na et al. |
| 10,256,264 B2 | 4/2019 | Na et al. |
| 10,269,855 B2 | 4/2019 | Sallin et al. |
| 10,269,862 B2 | 4/2019 | Na et al. |
| 10,310,060 B2 | 6/2019 | Na et al. |
| 10,353,056 B2 | 7/2019 | Na et al. |
| 10,418,407 B2 | 9/2019 | Na et al. |
| 10,564,718 B2 | 2/2020 | Na et al. |
| 10,613,202 B2 | 4/2020 | Roy et al. |
| 10,690,495 B2 | 6/2020 | Takagi et al. |
| 10,739,443 B2 | 8/2020 | Na et al. |
| 10,741,598 B2 | 8/2020 | Na et al. |
| 10,777,692 B2 | 9/2020 | Cheng et al. |
| 10,795,003 B2 | 10/2020 | Na et al. |
| 10,886,309 B2 | 1/2021 | Na et al. |
| 10,886,311 B2 | 1/2021 | Na et al. |
| 10,886,312 B2 | 1/2021 | Na et al. |
| 11,105,928 B2 | 8/2021 | Cheng et al. |
| 11,131,757 B2 | 9/2021 | Na et al. |
| 11,329,081 B2 | 5/2022 | Chen et al. |
| 2003/0042500 A1 | 3/2003 | Rhodes et al. |
| 2003/0127672 A1 | 7/2003 | Rahn et al. |
| 2003/0189159 A1 | 10/2003 | Lnoue |
| 2004/0121507 A1 | 6/2004 | Bude et al. |
| 2005/0051730 A1 | 3/2005 | Kuijk et al. |
| 2005/0077588 A1 | 4/2005 | Kasuga |
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0114626 A1 | 5/2007 | Kang et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0242935 A1 | 1/2009 | Fitzgerald |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1 | 9/2009 | Kim et al. |
| 2010/0078680 A1 | 4/2010 | Cheng et al. |
| 2010/0102409 A1 | 4/2010 | Hansson |
| 2010/0184246 A1 | 7/2010 | Sakai |
| 2010/0291730 A1 | 11/2010 | Uya et al. |
| 2011/0018625 A1 | 1/2011 | Hodel et al. |
| 2011/0031578 A1 | 2/2011 | Miura et al. |
| 2011/0102553 A1 | 5/2011 | Corcoran et al. |
| 2011/0109880 A1 | 5/2011 | Nummela |
| 2011/0128430 A1 | 6/2011 | Fossum |
| 2011/0155893 A1 | 6/2011 | Endo et al. |

(56) References Cited

U.S. PATENT DOCUMENTS

| | | |
|---|---|---|
| 2011/0181591 A1 | 7/2011 | Benitez |
| 2011/0188780 A1 | 8/2011 | Wang et al. |
| 2011/0255071 A1 | 10/2011 | Van Der Tempel et al. |
| 2011/0304696 A1 | 12/2011 | Centen et al. |
| 2012/0001234 A1 | 1/2012 | Lim et al. |
| 2012/0080726 A1 | 4/2012 | Sakano |
| 2012/0133922 A1 | 5/2012 | Pfaff |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught et al. |
| 2013/0214161 A1 | 8/2013 | Cazaux et al. |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman et al. |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0225173 A1 | 8/2014 | Kim et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0291793 A1 | 10/2014 | Tanaka |
| 2014/0312206 A1 | 10/2014 | Okhonin et al. |
| 2014/0367740 A1 | 12/2014 | Morse |
| 2014/0368613 A1 | 12/2014 | Krupka |
| 2015/0001664 A1 | 1/2015 | Van Der Tempel et al. |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitus |
| 2015/0092983 A1 | 4/2015 | Nguyen et al. |
| 2015/0171146 A1 | 6/2015 | Ooki et al. |
| 2015/0187923 A1 | 7/2015 | Kawahito |
| 2015/0193938 A1 | 7/2015 | Freedman et al. |
| 2015/0331508 A1 | 9/2015 | Nho et al. |
| 2015/0281618 A1 | 10/2015 | Saito |
| 2015/0286340 A1 | 10/2015 | Send et al. |
| 2016/0014352 A1 | 1/2016 | Moriyama et al. |
| 2016/0027837 A1 | 1/2016 | Webster et al. |
| 2016/0049476 A1 | 2/2016 | Rachmady et al. |
| 2016/0056315 A1 | 2/2016 | Shibata et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko |
| 2016/0172393 A1 | 6/2016 | Kim et al. |
| 2016/0187976 A1 | 6/2016 | Levesque et al. |
| 2016/0190304 A1 | 6/2016 | Morin et al. |
| 2016/0225922 A1 | 8/2016 | Akkaya et al. |
| 2016/0239974 A1 | 8/2016 | Wang |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0040361 A1 | 2/2017 | Ikeda et al. |
| 2017/0040362 A1* | 2/2017 | Na .................. H01L 27/14605 |
| 2017/0041589 A1 | 2/2017 | Patil et al. |
| 2017/0062508 A1 | 3/2017 | Na et al. |
| 2017/0068319 A1 | 3/2017 | Viswanathan |
| 2017/0074643 A1 | 3/2017 | Chang et al. |
| 2017/0075421 A1 | 3/2017 | Na et al. |
| 2017/0084648 A1 | 3/2017 | Liu et al. |
| 2017/0123233 A1 | 5/2017 | Sabovic |
| 2017/0131389 A1 | 5/2017 | Na et al. |
| 2017/0141153 A1 | 5/2017 | Lee et al. |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2017/0317116 A1 | 11/2017 | Celo et al. |
| 2017/0332024 A1 | 11/2017 | Feick |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru et al. |
| 2018/0175084 A1 | 6/2018 | Na et al. |
| 2018/0175095 A1 | 6/2018 | Sallin et al. |
| 2018/0180546 A1 | 6/2018 | Rothberg et al. |
| 2018/0188356 A1 | 7/2018 | Na et al. |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0247968 A1 | 8/2018 | Na et al. |
| 2018/0261645 A1 | 9/2018 | Na et al. |
| 2018/0269239 A1 | 9/2018 | Na et al. |
| 2019/0011984 A1 | 1/2019 | Na et al. |
| 2019/0033432 A1 | 1/2019 | Na et al. |
| 2019/0049564 A1 | 2/2019 | Na et al. |
| 2019/0103435 A1 | 4/2019 | Na et al. |
| 2019/0081095 A1 | 5/2019 | Hanzawa et al. |
| 2019/0267498 A1 | 8/2019 | Cheng et al. |
| 2019/0302243 A1 | 10/2019 | Na et al. |
| 2019/0312158 A1 | 10/2019 | Na et al. |
| 2019/0319139 A1 | 10/2019 | Cho et al. |
| 2019/0348463 A1 | 11/2019 | Na et al. |
| 2019/0378872 A1 | 12/2019 | Chen |
| 2020/0052016 A1 | 2/2020 | Na et al. |
| 2020/0249327 A1 | 8/2020 | Na et al. |
| 2020/0319345 A1 | 10/2020 | Cheng et al. |
| 2020/0382736 A1 | 12/2020 | Na et al. |
| 2020/0395393 A1 | 12/2020 | Na et al. |
| 2020/0400797 A1 | 12/2020 | Liang |
| 2021/0020672 A1 | 1/2021 | Chen et al. |
| 2021/0126027 A1 | 4/2021 | Na et al. |
| 2021/0302549 A1 | 9/2021 | Na et al. |
| 2022/0262835 A1 | 8/2022 | Chen et al. |
| 2022/0262974 A1 | 8/2022 | Lu et al. |

FOREIGN PATENT DOCUMENTS

| | | |
|---|---|---|
| CN | 104617119 | 5/2015 |
| CN | 105322001 | 2/2016 |
| CN | 105762220 | 7/2016 |
| CN | 104535179 | 9/2016 |
| CN | 106449684 | 2/2017 |
| CN | 107403814 | 11/2017 |
| CN | 109270547 | 1/2019 |
| EP | 0278408 | 8/1988 |
| EP | 2081004 | 7/2009 |
| EP | 2224319 | 9/2010 |
| EP | 2330637 | 6/2011 |
| JP | H0548139 | 2/1993 |
| JP | H05211321 | 8/1993 |
| JP | H06334168 | 12/1994 |
| JP | 2000-133791 | 5/2000 |
| JP | 2003-225207 | 8/2003 |

(56) References Cited

FOREIGN PATENT DOCUMENTS

| | | |
|---|---|---|
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2014-107562 | 6/2014 |
| JP | 2015-194838 | 11/2015 |
| JP | 2016-533648 | 10/2016 |
| WO | WO 2005/036647 | 4/2005 |
| WO | WO 2013/104718 | 7/2013 |
| WO | WO 2014/085789 | 6/2014 |
| WO | WO 2014/192989 | 12/2014 |
| WO | WO 2014/197226 | 12/2014 |
| WO | WO 2015/104307 | 7/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |
| WO | WO 2019/165220 | 8/2019 |
| WO | WO 2019/165229 | 8/2019 |
| WO | WO 2019/199691 | 10/2019 |

OTHER PUBLICATIONS

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6): 1702-1709.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ~1.55 μm," Optics Express, Aug. 2, 2010, 18(16):16474-16479.

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12): 1578-1586.

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron. Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon. Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Place et al., "Rad tolerant CMOS image sensor based on hole collection 4T pixel pinned photodiode." IEEE Transactions on Nuclear Science. Dec. 6, 2012, 59(6):2888-93.

Rafferty et a., "Monolithic germanium SWIR imaging array," 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Sep. 21, 2015, 23(19):24433-9.

Tseng et al., "A self-assembled microbonded germanium/silicon heterojunction photodiode for 25 Gb/s high-speed optical interconnects," Sci. Rep. Nov. 15, 2013, 3:3225, 6 pages.

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J. Mar. 2007, 7(3):317-318.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express Oct. 17, 2007, 15(21):13965-13971.

Yokogawa et al., "IR sensitivity enhancement of CMOS Image Sensor with diffractive light trapping pixels," Sci. Rep. Jun. 19, 2017, 7(1):3832, 9 pages.

Alsam et al: "What the Eye Did Not See—A Fusion Approach to Image Coding", Advances in Visual Computing, dated Jan. 1, 2012, pp. 199-208 (with abstract & partial English translation).

Bandara el al., "Fabrication and characterization of low temperature (<450° C.) grown p-Ge/n-Si photodetectors for silicon based photonics," Materials Scoence and Engineering B, 2004, 113:79-84.

Kang et al., "Monolithic Ge/Si Avalanche Photodiodes," IEEE Xplore, 2009, 3 pages.

Ramirez et al, "Recent progress on the quantum-dot avalanche photodiode," 22nd Annual Meeting of the IEEE Lasers and Electro-optics Society, Oct. 4, 2009, 2 pages.

Zanuttigh et al.: "ToF Depth Camera Components", Time-of-Flight and Structured Light Depth Cameras: Technology and Applications, dated May 24, 2016, pp. 31-33.

* cited by examiner

LIGHT-SENSING APPARATUS AND LIGHT-SENSING METHOD THEREOF

CROSS REFERENCE TO RELATED APPLICATIONS

This patent application is a continuation and claims the priority to U.S. patent application Ser. No. 16/904,583, filed Jun. 18, 2020, which is a continuation-in-part of and claims the priority to U.S. patent application Ser. No. 16/282,881, filed Feb. 22, 2019, which claims the benefit of U.S. Provisional Patent Application No. 62/634,741, filed Feb. 23, 2018, U.S. Provisional Patent Application No. 62/654,454, filed Apr. 8, 2018, U.S. Provisional Patent Application No. 62/660,252, filed Apr. 20, 2018, U.S. Provisional Patent Application No. 62/698,263, filed Jul. 15, 2018, U.S. Provisional Patent Application No. 62/682,254, filed Jun. 8, 2018, U.S. Provisional Patent Application No. 62/686,697, filed Jun. 19, 2018, U.S. Provisional Patent Application No. 62/695,060, filed Jul. 8, 2018, U.S. Provisional Patent Application No. 62/695,058, filed Jul. 8, 2018, U.S. Provisional Patent Application No. 62/752,285, filed Oct. 29, 2018, U.S. Provisional Patent Application No. 62/717,908, filed Aug. 13, 2018, U.S. Provisional Patent Application No. 62/755,581, filed Nov. 5, 2018, U.S. Provisional Patent Application No. 62/770,196, filed Nov. 21, 2018, and U.S. Provisional Patent Application No. 62/776,995, filed Dec. 7, 2018, which are each incorporated by reference herein in its entirety.

U.S. patent application Ser. No. 16/904,583 also claims the benefit of U.S. Provisional Patent Application No. 62/862,687, filed Jun. 18, 2019, U.S. Provisional Patent Application No. 62/865,305, filed Jun. 24, 2019, U.S. Provisional Patent Application No. 63/006,696, filed Apr. 7, 2020, U.S. Provisional Patent Application No. 63/008,834, filed Apr. 13, 2020, U.S. Provisional Patent Application No. 63/012,249, filed Apr. 19, 2020, U.S. Provisional Patent Application No. 63/012,930, Apr. 21, 2020, which are each incorporated by reference herein in its entirety.

BACKGROUND OF THE INVENTION

1. Field of the Invention

The present invention relates generally to a photo-detecting apparatus and a photo-detecting method.

2. Description of the Prior Art

Photodetectors may be used to detect optical signals and convert the optical signals to electrical signals that may be further processed by another circuitry. Photodetectors may be used in consumer electronics products, image sensors, data communications, time-of-flight (TOF) ranging or imaging sensors, medical devices, and many other suitable applications. However, when photodetectors are applied to these applications in a single or array configuration, the leakage current, dark current, electrical/optical cross-talk, and power consumption can degrade performance.

SUMMARY OF THE INVENTION

According to an embodiment of the present disclosure, a photo-detecting apparatus is provided. The photo-detecting apparatus includes a semiconductor substrate. A first germanium-based light absorption material is supported by the semiconductor substrate and configured to absorb a first optical signal having a first wavelength greater than 800 nm. A first metal line is electrically coupled to a first region of the first germanium-based light absorption material. A second metal line is electrically coupled to a second region of the first germanium-based light absorption material. The first region is un-doped or doped with a first type of dopants. The second region is doped with a second type of dopants. The first metal line is configured to control an amount of a first type of photo-generated carriers generated inside the first germanium-based light absorption material to be collected by the second region.

According to an embodiment of the present disclosure, a photo-detecting method is provided. The photo-detecting method includes transmitting an optical signal modulated by a first modulation signal, wherein the optical signal is modulated by the first modulation signal with one or multiple predetermined phase(s) for multiple time frames. The reflected optical signal is received by a photodetector. The reflected optical signal is demodulated by one or multiple demodulation signal(s), wherein the one or multiple demodulation signal(s) is/are the signal(s) with one or multiple predetermined phase(s) for multiple time frames. At least one voltage signal is output on a capacitor.

Among other advantages and benefits of the embodiments disclosed herein, the embodiments provide a photo-detecting apparatus capable of absorbing a least but not limited to a near-infrared (NIR) light or a short-wave infrared (SWIR) light efficiently. In some embodiments, a photo-detecting apparatus provides a high demodulation contrast, low leakage current, low dark current, low power consumption, low electrical/optical cross-talk and/or architecture for chip size miniaturization. In some embodiments, a photo-detecting apparatus is capable of processing the incident optical signal with multiple wavelengths, including different modulation schemes and/or time-division functions. Moreover, the photo-detecting apparatus can be used in time-of-flight (ToF) applications, which may operate at longer wavelengths compared to visible wavelengths (e.g., NIR and SWIR ranges) compared to visible wavelengths. A device/material implementer can design/fabricate a 100% germanium or an alloy (e.g., GeSi) with a predetermined percentage (e.g., more than 80% Ge) of germanium, either intrinsic or extrinsic, as a light absorption material to absorb the light at the aforementioned wavelengths.

According to an embodiment of the present disclosure, a photo-detecting apparatus is provided. The photo-detecting apparatus includes an absorption layer including a first surface; a passivation layer over the first surface of the absorption layer, wherein the passivation layer includes two first regions and a second region separating the two first regions, wherein each of the first regions includes a property, and the second region includes a property different from the property of each of the first regions.

In some embodiments, the property includes material or resistance.

According to an embodiment of the present disclosure, a photo-detecting apparatus is provided. The photo-detecting apparatus includes an absorption layer including a first surface; two second doped regions in the absorption layer; a passivation layer over the first surface of the absorption layer, wherein the passivation layer includes two intermediate regions each over respective second doped region, wherein each of the intermediate regions includes a peak dopant concentration lower than a peak dopant concentration of each of the two second doped regions.

According to an embodiment of the present disclosure, a photo-detecting apparatus is provided. The photo-detecting apparatus includes an absorption layer; two switches each including a control contact layer over the absorption layer; two buried counter-doped regions in the absorption layer and each at least partially under the respective switch.

According to an embodiment of the present disclosure, a photo-detecting apparatus is provided. The photo-detecting apparatus includes an absorption layer; two switches each including a control contact layer and a readout contact layers both above the absorption layer, wherein a distance between the two control contact layers is less than a width of the absorption layer, and a distance between the two readout contact layers is greater than the width of the absorption layer.

According to an embodiment of the present disclosure, a photo-detecting apparatus is provided. The photo-detecting apparatus includes a substrate and an absorption layer supported by the substrate; two switches electrically coupled to the absorption layer, and each switch including a first doped region and a second doped region, wherein the first doped regions are in the substrate, each of the second doped regions covers a part of an interface between the substrate and the absorption layer.

According to an embodiment of the present disclosure, a photo-detecting apparatus is provided. The photo-detecting apparatus includes: an absorption layer; an absorbed region in the absorption layer; two switches each disposed at the same side of the absorbed region and electrically coupled to the absorption layer; a guiding region between two switches.

In some embodiments, each of the switches includes a control contact layer disposed at the same side of the absorbed region. The guiding region is between the portions of the absorption layer right under the two control contact layers.

According to an embodiment of the present disclosure, a photo-detecting apparatus is provided. The photo-detecting apparatus includes: a substrate made by a first material or a first material-composite; an absorption layer made by a second material or a second material-composite, the absorption layer being supported by the substrate and the absorption layer including: a first surface; a second surface arranged between the first surface and the substrate; and a channel region having a dopant profile with a peak dopant concentration equal to or more than $1\times10^{15}$ cm$^{-3}$, wherein a distance between the first surface and a location of the channel region having the peak dopant concentration is less than a distance between the second surface and the location of the channel region having the peak dopant concentration, and wherein the distance between the first surface and the location of the channel region having the peak dopant concentration is not less than 30 nm.

According to an embodiment of the present disclosure, a photo-detecting apparatus is provided. The photo-detecting apparatus includes: a substrate made by a first material or a first material-composite; an absorption layer made by a second material or a second material-composite, the absorption layer being supported by the substrate and the absorption layer including: a first surface; a second surface arranged between the first surface and the substrate; and a channel region having a dopant profile with a peak dopant concentration equal to or more than $1\times10^{15}$ cm$^{-3}$, wherein a distance between the first surface and the location of the channel region having the peak dopant concentration is not less than 30 nm, and a distance between the second surface and the location of the channel region having the peak dopant concentration is not less than 30 nm.

In some embodiments, the absorption layer further includes a hinder region that is arranged between the channel region and the first surface.

According to an embodiment of the present disclosure, a photo-detecting apparatus is provided. The photo-detecting apparatus includes: an absorption layer including a material having a first band gap; a carrier control layer on the absorption layer, wherein the carrier control layer includes a material having a second band gap greater than the first band gap and includes a thickness not less than 100 nm; and a readout contact layer on a first surface of the carrier control layer.

According to an embodiment of the present disclosure, a photo-detecting apparatus is provided. The photo-detecting apparatus includes: an absorption layer including a material having a first band gap, wherein the absorption layer is capable of absorbing photons and generating photogenerated carriers; a carrier control layer on the absorption layer, wherein the carrier control layer includes a material having a second band gap greater than the first band gap, and the carrier control layer is capable of at least collecting the photogenerated carriers; and a readout contact layer on a first surface of the carrier control layer.

In some embodiments, the photo-detecting apparatus further includes a barrier region covering a part of the interface between the absorption layer and the carrier control layer.

In some embodiments, a dopant concentration of the barrier region at the interface between the absorption layer and the carrier control layer is not less than $1\times10^{15}$ cm$^{-3}$.

According to an embodiment of the present disclosure, a photo-detecting apparatus is provided. The photo-detecting apparatus includes: an absorption layer; a first switch electrically coupled to the absorption layer; a second switch electrically coupled to the absorption layer; and a first modification contact layer configured to shape an electric field near the first switch; and a second modification contact layer configured to shape an electric field near the second switch.

According to an embodiment of the present disclosure, a photo-detecting apparatus is provided. The photo-detecting apparatus includes: an absorption layer including a material having a first band gap; a carrier collection layer on the absorption layer, wherein the carrier control layer includes a material having a second band gap greater than the first band gap; two second doped regions in the carrier control layer, wherein each of the second doped regions has a depth, and the depth of each of the second doped regions is greater than a thickness of the carrier collection layer.

According to an embodiment of the present disclosure, a photo-detecting apparatus is provided. The photo-detecting apparatus includes: an absorption layer; a preliminary collector in the absorption layer; and two switches electrically coupled to the absorption layer and disposed at two opposite sides of the preliminary collector.

In some embodiments, each of the switches includes a first doped region of a first conductivity type, wherein the preliminary collector is of a conductivity type same as a first conductivity type of the first doped region.

In some embodiments, each of the switches further includes a second doped region. The preliminary collector overlaps with at least a portion of each of the second doped regions.

In some embodiments, the absorption layer further includes a hinder region connected to the preliminary collector.

In some embodiment, the hinder region is of a conductivity type different from the conductivity type of the preliminary collector.

In some embodiments, the photo-detecting apparatus further includes two counter-doped regions overlapping with at least a portion of the respective first doped region.

According to an embodiment of the present disclosure, a photo-detecting apparatus is provided. The photo-detecting apparatus includes: an absorption layer; and two switches electrically coupled to the absorption layer, wherein each of the two switches includes a first doped region; and a first buffer region and a second buffer region between the two first doped regions.

According to an embodiment of the present disclosure, an imaging system is provided. The imaging system includes one or more cameras; and a photo-detecting apparatus. In some embodiments, The photo-detecting apparatus includes a pixel-array for time-of-flight information, each pixel of the pixel-array includes a substrate made by a first material or a first material-composite; an absorption layer made by a second material or a second material-composite, the absorption layer being supported by the substrate and the absorption layer including: a first surface; a second surface arranged between the first surface and the substrate; and a channel region having a dopant profile with a peak dopant concentration equal to or more than $1 \times 10^{15}$ cm$^{-3}$, wherein a distance between the first surface and a location of the channel region having the peak dopant concentration is less than a distance between the second surface and the location of the channel region having the peak dopant concentration, and wherein the distance between the first surface and the location of the channel region having the peak dopant concentration is not less than 30 nm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
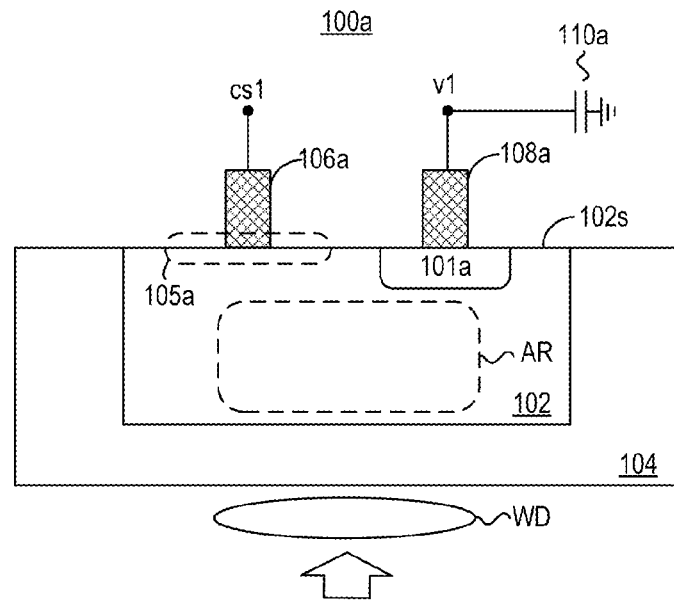
FIGS. 1A-1J illustrate cross-sectional views of a photo-detecting apparatus, according to some embodiments.

FIG. 1A illustrates a cross-sectional view of a photo-detecting apparatus, according to some embodiments. The photo-detecting apparatus 100a includes a germanium-based light absorption material 102 supported by the semiconductor substrate 104. In one implementation, the semiconductor substrate 104 is made by silicon or silicon-germanium or germanium or III-V compounds. The germanium-based light absorption material 102 herein refers to intrinsic germanium (100% germanium) or an alloy of elements including germanium, e.g., silicon-germanium alloy, ranging from 1% to 99% Ge concentration. In some implementations, the germanium-based light absorption material 102 may be grown using a blanket epitaxy, a selective epitaxy, or other applicable techniques. The germanium-based light absorption material 102 is embedded in the semiconductor substrate 104 in FIG. 1A, and in alternative embodiments the germanium-based light absorption material 102 may be partially embedded in or may be standing on the semiconductor substrate 104.

The photo-detecting apparatus 100a includes a control metal line 106a and a readout metal line 108a. The control metal line 106a and the readout metal line 108a are both electrically coupled to the surface 102s of the germanium-based light absorption material 102. In this embodiment, the control metal line 106a is electrically coupled to an un-doped region 105a on the surface 102s, where the un-doped region 105a has no dopants. The readout metal line 108a is electrically coupled to a doped region 101a on the surface 102s, where the doped region 101a has dopants.

It is noted that the germanium-based light absorption material 102 can be formed as intrinsic or extrinsic (e.g., lightly P-type or lightly N-type). Due to the defect characteristics of the germanium material, even if there is no additional doping process introduced, the germanium-based light absorption material 102 may still be lightly P-type. Thus, the un-doped region 105a may also be lightly P-type. The doped region 101a may be doped with P-type dopants or N-type dopants, depending on the type of photo-carries (i.e. holes or electrons) to be collected. In some implementations, the doped region 101a could be doped by thermal-diffusion, ion-implantation, or any other doping process.

The control metal line 106a is controlled by a control signal cs1 for controlling the moving direction of the electrons or holes generated by the absorbed photons. Assume that the doped region 101a is N-type and the control signal cs1 is at logic 1. An electric field is generated from the control metal line 106a to the germanium-based light absorption material 102. The electrons will move toward the control metal line 106a and be collected by the doped region 101a. On the contrary, if the doped region 101a is P-type, the holes will be collected instead. Alternatively, assume that the doped region 101a is N-type when the control signal cs1 is at logic 0, a different electric field is generated from the control metal line 106a to the germanium-based light absorption material 102. The electrons will not move toward the control metal line 106a and so cannot be collected by the doped region 101a. On the contrary, if the doped region 101a is P-type, the holes will not be collected instead.

Using the structure illustrated in FIG. 1A, the optical signal IL reflected by a target object (not shown in FIG. 1A) and incoming through the optical window WD can be absorbed by the germanium-based light absorption material 102, and generate electron-hole pairs such that the electrons or the holes (depending on whether the doped region 101a is N-type and P-type) are moving toward and being stored in the capacitor 110a according to the assertion of control signal cs1. The absorbed region AR is a virtual area receiving the optical signal IL incoming through the optical window WD. Due to a distance existing between the photo-detecting apparatus 100a and the target object (not shown in FIG. 1A), the optical signal IL has a phase delay with respect to the transmitted light transmitted by a transmitter (not shown in FIG. 1A). When the transmitted light is modulated by a modulation signal and the electron-hole pairs are demodulated through the control metal line 106a by a demodulation signal, the electrons or the holes stored in the capacitor 110a will be varied according to the distance. Therefore, the photo-detecting apparatus 100a can obtain the distance information based on the voltage v1 on the capacitor 110a.

The embodiments of FIG. 1A are a one-tap structure because they only use one control metal line 106a and one readout metal line 108a to obtain the distance information. The disclosed embodiments may also use two or more control lines or readout lines, and varieties of implantations to obtain the distance information, which will be described in detail hereinafter.

Figure 1B:
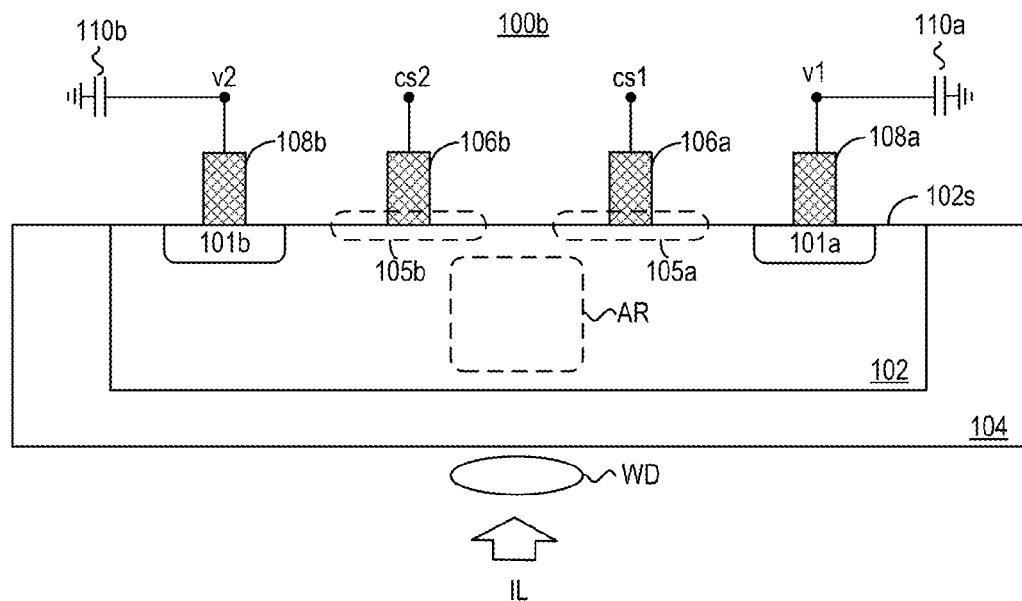

FIG. 1B illustrates a cross-sectional view of a photo-detecting apparatus, according to some embodiments. Compared to the embodiment of FIG. 1A, the photo-detecting apparatus 100b in FIG. 1B uses two control metal lines 106a, 106b to control the movement of the electrons or holes generated by the absorbed photons in the germanium-based light absorption material 102. Such a structure is referred as a two-tap structure. The photo-detecting apparatus 100b includes control metal lines 106a, 106b and readout metal lines 108a, 108b. The control metal lines 106a, 106b and the readout metal lines 108a, 108b are electrically coupled to the surface 102s of the germanium-based light absorption material 102. In this embodiment, the control metal lines 106a, 106b are respectively electrically coupled to the un-doped regions 105a, 105b on the surface 102s, where the un-doped regions 105a, 105c are the areas without dopants; and the readout metal line 108a, 108b are respectively electrically coupled to doped regions 101a, 101b on the surface 102s, where the doped regions 101a, 101b are the areas with dopant. The doped regions 101a, 101b may be doped with P-type dopants or N-type dopants.

The control metal lines 106a, 106b are respectively controlled by the control signals cs1, cs2 for controlling the moving direction of the electrons or holes generated by the absorbed photons. In some implementations, the control signals cs1 and cs2 are differential voltage signals. In some implementations, one of the control signals cs1 and cs2 is a constant voltage signal (e.g., 0.5 v) and the other control signal is a time-varying voltage signal (e.g., sinusoid signal, clock signal or pulse signal operated between 0V and 1V).

Assume that the doped regions 101a, 101b are N-type and the control signals cs1, cs2 are clock signals with 180-degree phase different to each other. When the control signal cs1 is at logic 1 and the control signal cs2 is at logic 0, the photo-detecting apparatus 100b generates an electric field from the control metal line 106a to the germanium-based light absorption material 102, and the electrons will move toward the control metal line 106a and then be collected by the doped regions 101a. Similarly, when the control signal cs1 is at logic 0 and the control signal cs2 is at logic 1, the photo-detecting apparatus 100b generates an electric field from the control metal line 106b to the germanium-based light absorption material 102, and the electrons will move toward the control metal line 106b and then be collected by the doped region 101b. On the contrary, if the doped regions 101a and 101b are P-type, the holes will be collected instead.

In accordance with this two-tap structure, the optical signal IL reflected from a target object (not shown in FIG. 1B) can be absorbed by the germanium-based light absorption material 102 and generates electron-hole pairs such that the electrons or the holes (depending on the doped region 101a is N-type and P-type) move towards and are stored in the capacitor 110a or capacitor 110b, according to the assertions of control signal cs1 and control signal cs2. Due to a distance existing between the photo-detecting apparatus 100b and the target object (not shown in FIG. 1B), the optical signal IL has a phase delay with respect to the transmitted light transmitted by a transmitter (not shown in FIG. 1B). When the transmitted light is modulated by a modulation signal and the electron-hole pairs are demodulated through the control metal lines 106a and 106b by the demodulation signals, the electrons or the holes stored in the capacitor 110a and capacitor 110b will be varied according to the distance. Therefore, the photo-detecting apparatus 100b can obtain the distance information based on the voltage v1 on the capacitor 110a and the voltage v2 on the capacitor 110b. According to one embodiment, the distance information can be derived based on calculations with voltage v1 and voltage v2 as input variables. For one example, in a pulse time-of-flight configuration, voltage ratios related to voltage v1 and voltage v2 are used as input variables. In another example, in a continues-wave time-of-flight configuration, in-phase and quadrature voltages related voltage v1 and voltage v2 are used as input variables.

The control metal line 106a in FIG. 1A and control metal lines 106a, 106b in FIG. 1B are electrically coupled to the un-doped regions of the germanium-based light absorption material 102. In other embodiments, as described below, certain structures and the control metal lines 106a, 106b are electrically coupled to doped regions.

Figure 1C:
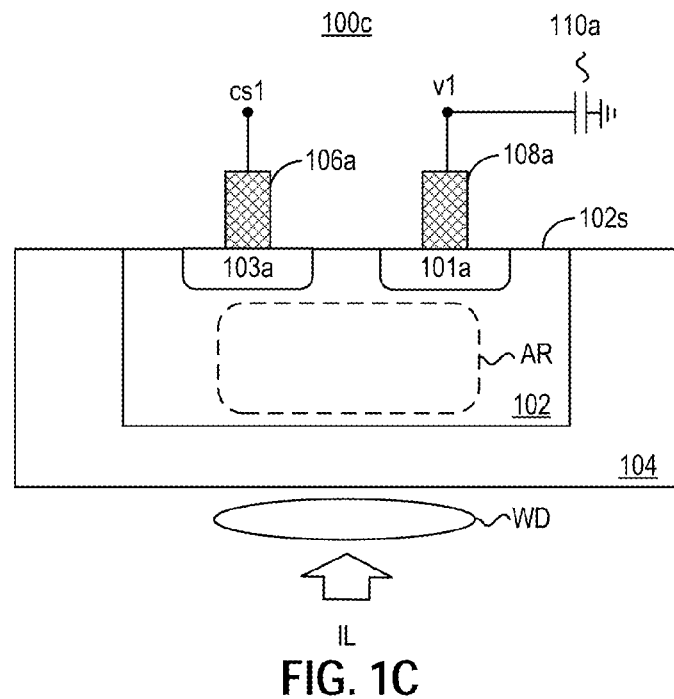

FIG. 1C illustrates a cross-sectional view of a photo-detecting apparatus, according to some embodiments. Similar to FIG. 1A, the photo-detecting apparatus 100c includes a control metal line 106a and a readout metal line 108a. The control metal line 106a and the readout metal line 108a are both electrically coupled to the surface 102s of the germanium-based light absorption material 102. In this embodiment, the control metal line 106a is electrically coupled to a doped region 103a on the surface 102s, where the doped region 103a is an area with dopants; and the readout metal line 108 is electrically coupled to a doped region 101a on the surface 102s, where the doped region 101a is also an area with dopants. In this embodiment, the region 101a and region 103a are doped with dopants of different types. For example, if the doped region 101a is doped with N-type dopants, the region 103a will be doped with P-type dopants, and vice versa.

The operation of photo-detecting apparatus 100c is similar to the embodiment of FIG. 1A. The control metal line 106a is used to control the moving direction of the electrons or holes generated by the absorbed photons according to the control signal cs1 to make the electrons or holes being collected by doped region 110a. By controlling the control signal cs1 and reading the voltage v1 on the capacitor 110a, the photo-detecting apparatus 100c can obtain a distance information between the photo-detecting apparatus 100c and the target object (not shown in FIG. 1C).

Figure 1D:
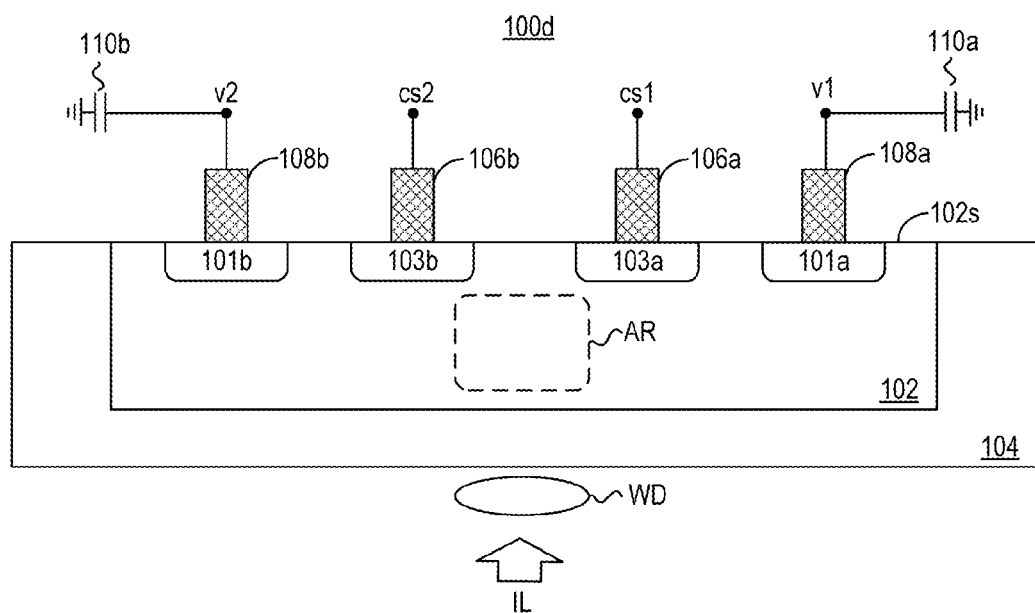

FIG. 1D illustrates a cross-sectional view of a photo-detecting apparatus, according to some embodiments. The photo-detecting apparatus 100b includes control metal lines 106a, 106b and readout metal lines 108a, 108b. The control metal lines 106a, 106b and the readout metal lines 108a, 108b are electrically coupled to the surface 102s of the germanium-based light absorption material 102. In this embodiment, the control metal lines 106a, 106b are respectively electrically coupled to the doped regions 103a, 103b on the surface 102s, where the doped regions 103a, 103b are areas with dopants. The readout metal line 108a, 108b are respectively electrically coupled to the doped regions 101a, 101b on the surface 102s, where the doped regions 101a, 101b are also areas with dopants. The regions 101a, 101b, 103a, 103b may be doped with P-type dopants or N-type dopants. In this embodiment, the doped regions 101a, 101b are doped with a dopant of the same type; and the doped regions 103a, 103b are doped with a dopant of the same type. However, the type of doped regions 101a, 101b is different from the type of the doped regions 103a, 103b. For example, if the doped regions 101a, 101b are doped as N-type, the doped regions 103a, 103b will be doped as P-type, and vice versa.

The operation of photo-detecting apparatus 100d is similar to the embodiment of FIG. 1B. The control metal lines 106a, 106b are used to control the moving direction of the electrons or holes generated by the absorbed photons according to the control signals cs1, cs2 to make the electrons or holes being stored in capacitor 110a or capacitor 110b. By controlling the control signals cs1, cs2 and reading the voltages v1, v2 on the capacitor 110a, 110b, the photo-detecting apparatus 100d can obtain a distance information between the photo-detecting apparatus 100d and the target object (not shown in FIG. 1D).

Figure 1E:
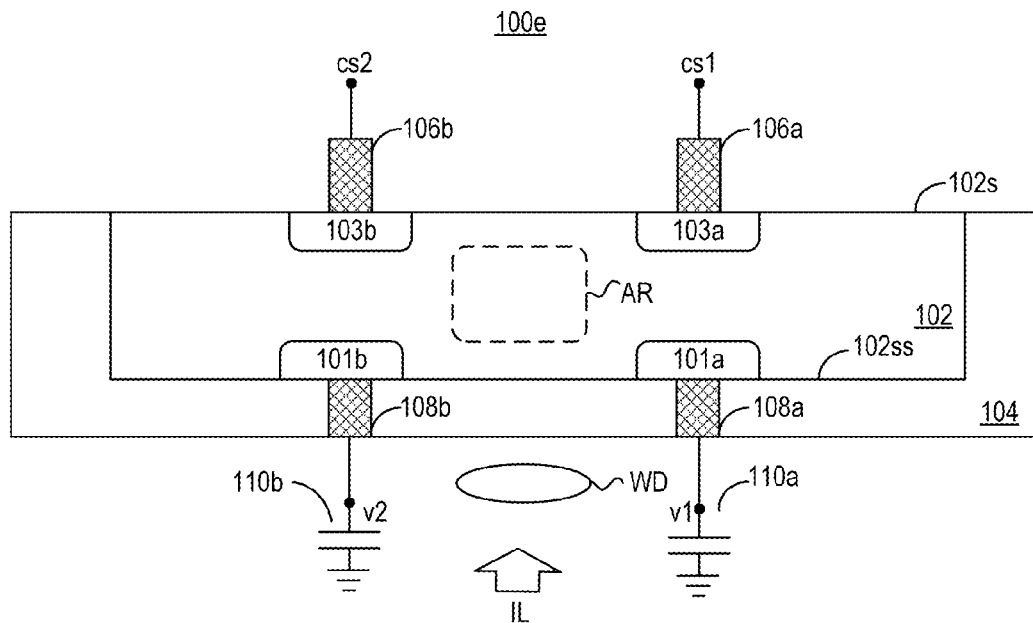

FIG. 1E illustrates a cross-sectional view of a photo-detecting apparatus, according to some embodiments. The operation of the apparatus is similar to FIG. 1D, in which the apparatus is able to obtain to the distance information between the photo-detecting apparatus 100d and the target object (not shown in FIG. 1E) by the way of generating the control signals cs1, cs2 and reading the voltages v1, v2 on the capacitor 110a, 110b. The difference from FIG. 1D is that the readout metal lines 108a, 108b and doped regions 101a, 101b are arranged at the surface 102ss opposite to the surface 102s. Because the control metal lines 106a, 106b and readout metal lines 108a, 108b are arranged in a vertical direction, the horizontal area of the photo-detecting apparatus 100e can be reduced accordingly.

Figure 1F:
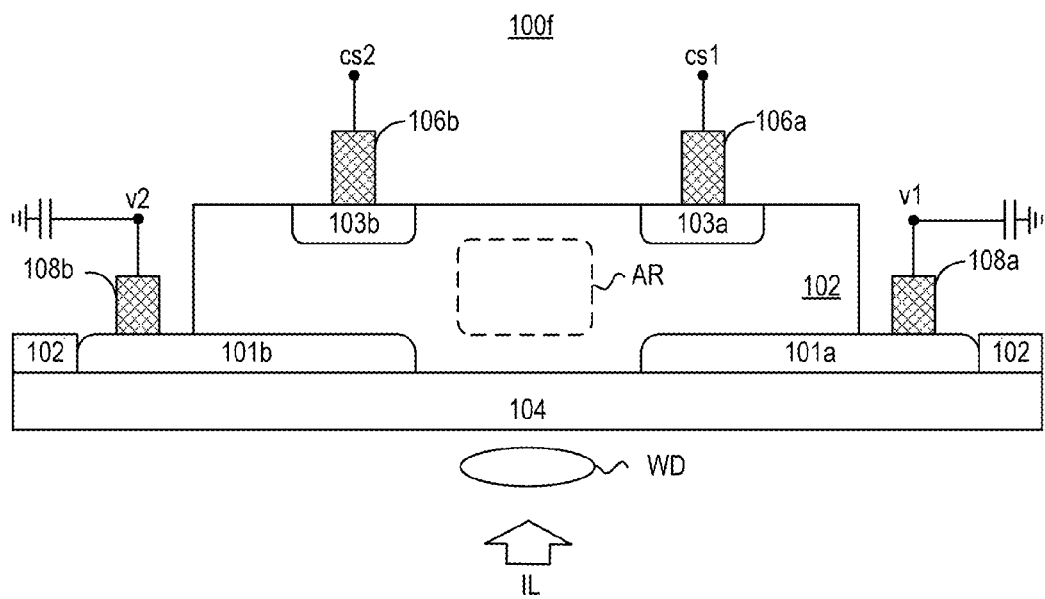

FIG. 1F illustrates a cross-sectional view of a photo-detecting apparatus, according to some embodiments. Compared to FIG. 1E, the embodiment in FIG. 1F also arranges the doped regions 101a, 101b at the surface 102ss opposite to the surface 102s, but the readout metal lines 108a, 108b are extending toward the surface 102s, rather than the semiconductor substrate 104. Such arrangements may simplify the fabrication process.

In some implementations, as the embodiments illustrated in FIG. 1A to FIG. 1F and the embodiments hereinafter, the control metal lines 106a, 106b and the surface 102s can be made as a metal-semiconductor junction (MS junction) with Schottky barrier, or a metal-insulator-semiconductor capacitor (MIS capacitor) by introducing oxide or high-K dielectric materials as the insulator in-between the metal and the semiconductor.

As the embodiments illustrated in FIG. 1A to FIG. 1F and the embodiments hereinafter, the germanium-based light absorption material 102 is made as rectangular from its cross-sectional view, however, in some implementations, the germanium-based light absorption material 102 can be made as inverted trapezoid or other patterns from its cross-sectional view.

The photo-detecting apparatuses illustrated in the present disclosure can be used in time-of-flight (ToF) applications, which may operate at longer wavelengths (e.g., NIR or SWIR range) compared to visible wavelengths. The wavelength could be more than 800 nm, such as 850 nm, 940 nm, 1050 nm, 1064 nm, 1310 nm, 1350 nm, or 1550 nm. On the other hand, the device/material implementer can design/fabricate a 100% germanium or an alloy (e.g., GeSi) with a predetermined percentage (e.g., more than 80% Ge) of germanium, either intrinsic or extrinsic, as a light absorption material to absorb the light at the aforementioned wavelengths.

Although the embodiments herein illustrate that the photo-detecting apparatus absorbs the optical signal IL from a back side, however, in some implementations, the photo-detecting apparatus can be designed to absorb the optical signal IL from a front side, e.g., by creating an optical window WD between the two control metal lines 106a, 106b.

The embodiments illustrated in FIG. 1A to FIG. 1F include a single photodetector, which can serve as a unit and be applied to each pixel of a pixel array. The following descriptions are alternative embodiments based on either one-tap or two-tap structures disclosed in FIG. 1A to FIG. 1F. In the following descriptions, one or two embodiments from FIG. 1A to FIG. 1F may be selected as a representative embodiment. The person skilled in the art can change, modify or combine the structures disclosed herein, such as replace two-tap structure with one-tap structure.

Figure 1G:
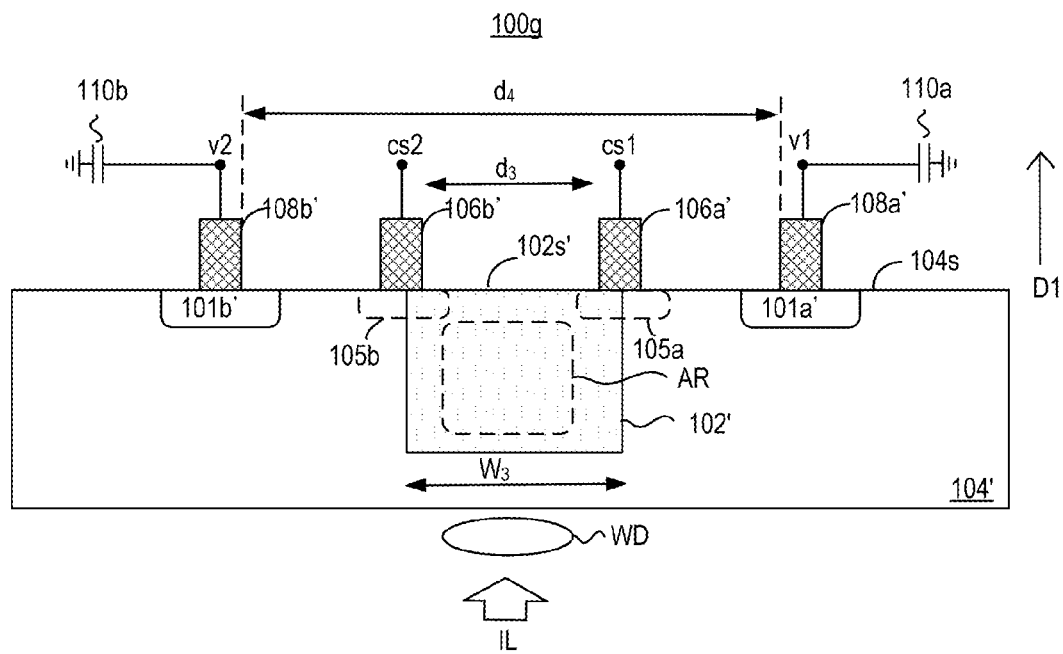

FIG. 1G illustrates a cross-sectional view of a photo-detecting apparatus, according to some embodiments. The photo-detecting apparatus 100g includes a substrate 104'. The photo-detecting apparatus further includes a pixel (not labeled) including an absorption layer 102' supported by the substrate 104'. The pixel includes an absorbed region AR in the absorption layer 102' and defined by an optical window WD. The absorbed region AR is a virtual area receiving the optical signal IL incoming through the optical window WD. The pixel includes a first switch (not labeled) and a second switch (not labeled) electrically coupled to the absorption layer 102'. The first switch includes a control contact layer 106a' and a readout contact layer 108a'. The second switch includes a control contact layer 106b' and a readout contact layer 108b'. In some embodiments, the readout contact layers 108a', 108b' are formed over a first surface 104s of the substrate 104'. In some embodiments, a width w3 of the absorbed region AR is less than a distance $d_4$ between the readout contact layers 108a', 108b'. In some embodiments, the readout contact layers 108a', 108b' are disposed at two opposite sides of the absorbed region AR. In some embodiments, a distance $d_3$ between the control contact layers 106a', 106b' is less than a width $w_3$ of the absorption layer 102'. In some embodiments, the first surface 102s' of the absorption layer 102' is substantially flush with the first surface 104s of the substrate 104'.

The photo-detecting apparatus 100g includes a pixel-array including multiple repeating pixels. In some embodiments, the pixel-array may be a one-dimensional or a two-dimensional array of pixels.

In some embodiments, the control contact layers 106a', 106b' are formed over both of the first surface 104s of the substrate 104' and the first surface 102s' of the absorption layer 102'. In other words, a part of the control contact layers 106a', 106b' is formed over the first surface 104s of the substrate 104' and the other part of the control contact layers 106a', 106b' is formed over the first surface 102s' of the absorption layer 102'. In some embodiments, the control contact layers 106a', 106b' cover a part of the interface between the substrate 104' and the absorption layer 102' along a vertical direction D1. The vertical direction D1 is substantially perpendicular to the first surface 102s' of the absorption layer 102'.

In some embodiments, un-doped regions 105a, 105b are right under the control contact layers 106a', 106b'. That is, the portions of the absorption layer 102' and the substrate 104' right under the control contact layers 106a', 106b' may be intrinsic or include a dopant, each of the portions has a dopant profile with a peak dopant concentration below approximately $1 \times 10^{15}$ cm$^{-3}$. The term "intrinsic" means that the portions of the absorption layer 102' and the substrate 104' right under the control contact layers 106a', 106b' are without intentionally adding dopants. In some embodiments, the control contact layers 106a', 106b' on the absorption layer 102' and the substrate 104' may lead to formation of a Schottky contact, an Ohmic contact, or a combination thereof having an intermediate characteristic between the two, depending on various factors including the material of the absorption layer 102', the material of the control contact layers 106a', 106b', the material of the substrate 104', and the impurity or defect level of the absorption layer 102' as well as the substrate 104'.

The pixel further includes two control signals cs1, cs2 controlling the control contact layers 106a', 106b' for controlling the moving direction of the electrons or holes generated by the absorbed photons in the absorption layer 102'. For example, when voltages are used, if the control signal cs1 is biased against the control signal cs2, an electric field is created between the two portions right under the control contact layers 106a', 106b', and free charges drift towards one of the two portions right under the readout contact layers 108b' 108a' depending on the direction of the electric field.

In some embodiments, the pixel includes two capacitors 110a, 110b. The readout contact layers 108a' is electrically coupled to the capacitor 110a, and the readout contact layers 108b' is electrically coupled to the capacitor 110b. The capacitors 110a, 110b are for storing the carriers generated in the absorption layer 102' based on the control of the two control signals cs1, cs2. For example, due to a distance existing between the photo-detecting apparatus 100g and a target object (not shown), the optical signal IL has a phase delay with respect to a transmitted light transmitted by a transmitter (not shown). When the transmitted light is modulated by a modulation signal and the electron-hole pairs are demodulated through the control contact layers 106a' and 106b' by a demodulation signal, the electrons or the holes stored in the capacitor 110a, 110b will be varied according to the distance. Therefore, the photo-detecting apparatus 100g can obtain the distance information based on the voltage v1 on the capacitor 110a and the voltage v2 on the capacitor 110b.

In some embodiments, the pixel further includes a first readout circuit (not shown) and a second readout circuit (not shown) electrically coupled to the first switch and the second switch respectively for processing the collected charges. The first readout circuit may include the capacitor 110a. The second readout circuit may include the capacitor 110b. The first readout circuit is electrically coupled to the readout contact layer 108a'. The second readout circuit is electrically coupled to the readout contact layer 108b'.

In some embodiments, the first switch includes a first doped region 101a' under the readout contact layers 108a'. The second switch includes a first doped region 101b' under the readout contact layers 108b'.

In some embodiments, the first doped regions 101a', 101b' are of a first conductivity type. In some embodiments, the first doped regions 101a', 101b' include a first dopant and a dopant profile. The peak dopant concentrations of the first doped regions 101a', 101b' depend on the material of the readout contact layers 108a', 108b' and the material of the substrate 104', for example, between $5 \times 10^{18}$ cm$^{-3}$ to $5 \times 10^{20}$ cm$^{-3}$. The first doped regions 101a', 101b' are for collecting the carriers generated from the absorption layer 102', which are further processed by the first readout circuit (not shown) and the second readout circuit (not shown) respectively based on the control of the two control signals cs1, cs2.

Figure 1H:
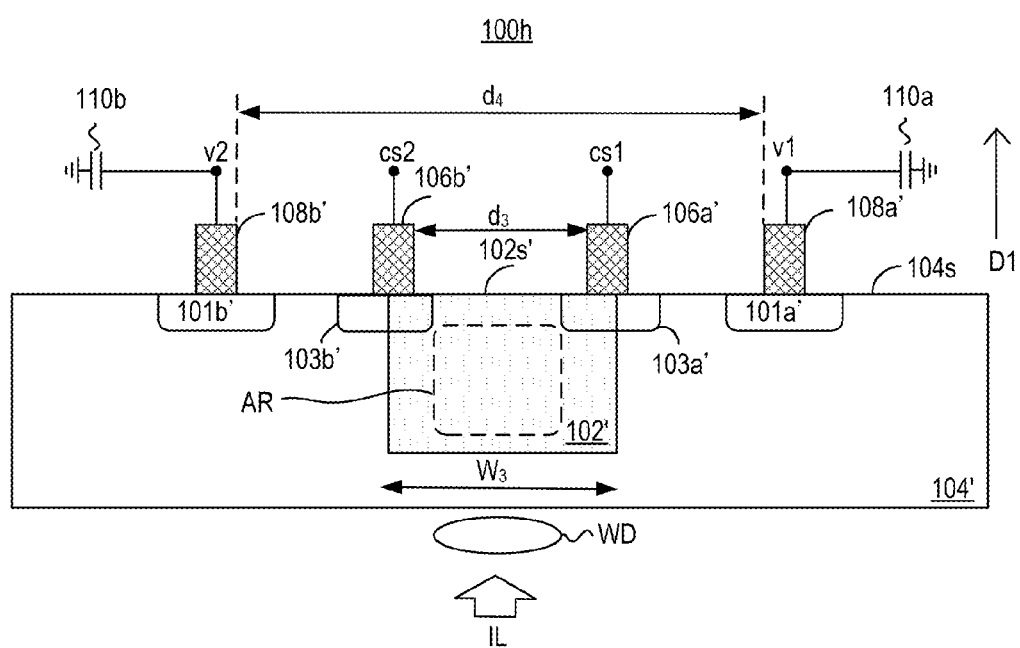

FIG. 1H illustrates a cross-sectional view of a photo-detecting apparatus, according to some embodiments. The photo-detecting apparatus 100h in FIG. 1H is similar to the photo-detecting apparatus 100g in FIG. 1G, where the difference is described below. In some embodiments, the first switch further includes a second doped region 103a' under the control contact layers 106a'. The second switch further includes a second doped region 103b' under the control contact layers 106b'. The second doped regions 103a', 103b' are formed in both the absorption layer 102' and the substrate 104'. In some embodiments, each of the second doped regions 103a', 103b' covers a part of the interface between the substrate 104' and the absorption layer 102'. The interface is substantially perpendicular to the first surface 102s'. In some embodiments, the second doped regions 103a', 103b' are of a second conductivity type different from the first conductivity type of the first doped regions 101a', 101b'. In some embodiments, the second doped regions 103a', 103b' include a second dopant and a dopant profile. The peak dopant concentrations of the second doped regions 103a', 103b' depend on the material of the control contact layers 106b', 106a' and the material of the absorption layer 102' and the material of the substrate 104', for example, between $1 \times 10^{17}$ cm$^{-3}$ to $5 \times 100$ cm$^{-3}$. In some embodiments, a concentration at the interface between the substrate 104' and the absorption layer 102' and covered by the second doped regions 103a', 103b' is between $1 \times 10^{17}$ cm$^{-3}$ to $5 \times 10^{20}$ cm$^{-3}$. The second doped regions 103a', 103b' forms a Schottky or an Ohmic contact or a combination thereof with the control contact layers 106b', 106a'. The second doped regions 103a', 103b' are for demodulating the carriers generated from the absorption layer 102' based on the control of the control signals cs1, cs2. By forming the second doped regions 103a', 103b' covering the interface between the substrate 104' and the absorption layer 102', the photo-detecting apparatus 100h can with a satisfied dark current and demodulation contrast at the same time. In some embodiments, the control contact layers 106b', 106a' can be entirely formed over the absorption layer 102' or be entirely formed over the substrate 104'.

Figure 1I:
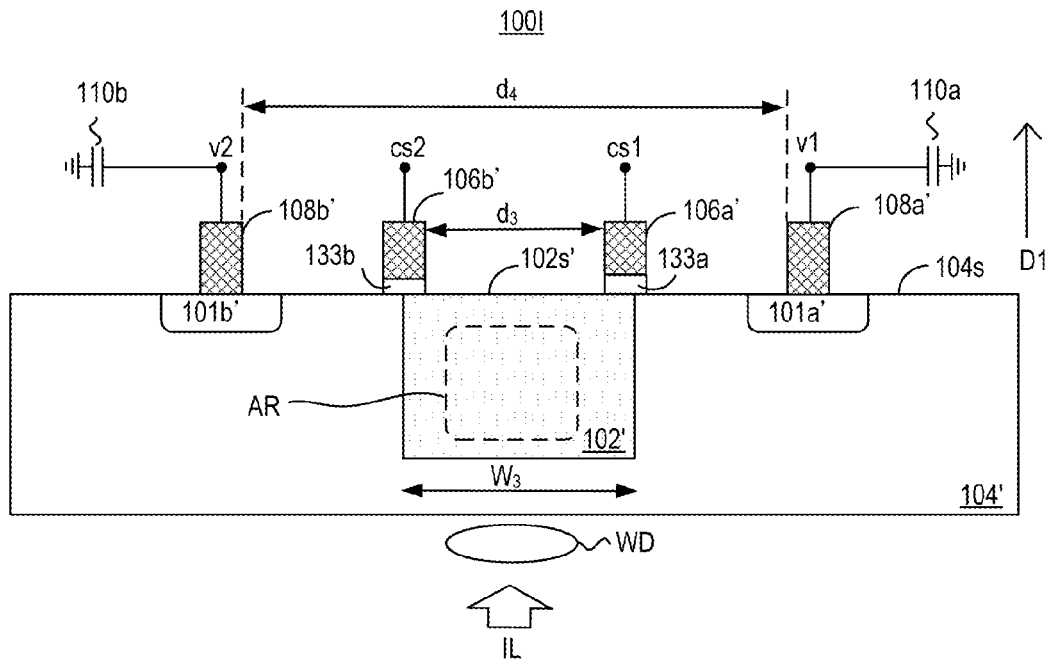

FIG. 1I illustrates a cross-sectional view of a photo-detecting apparatus, according to some embodiments. The photo-detecting apparatus 100i in FIG. 1I is similar to the photo-detecting apparatus 100g in FIG. 1G, where the difference is described below. In some embodiments, the first switch further includes a first dielectric layer 133a between the absorption layer 102' and the control contact layer 106a'. The second switch may further include a second dielectric layer 133b between the absorption layer 102' and the control contact layer 106b'. The first dielectric layer 133a prevents direct current conduction from the control contact layer 106a' to the absorption layer 102' and to the substrate 104', but allows an electric field to be established within the absorption layer 102' in response to an application of a voltage to the control contact layer 106a'. The second dielectric layer 133b prevents direct current conduction from the control contact layer 106b' to the absorption layer 102' and to the substrate 104' but allows an electric field to be established within the absorption layer 102' in response to an application of a voltage to the control contact layer 106b'. The established electric field may attract or repel charge carriers within the absorption layer 102'.

Figure 1J:
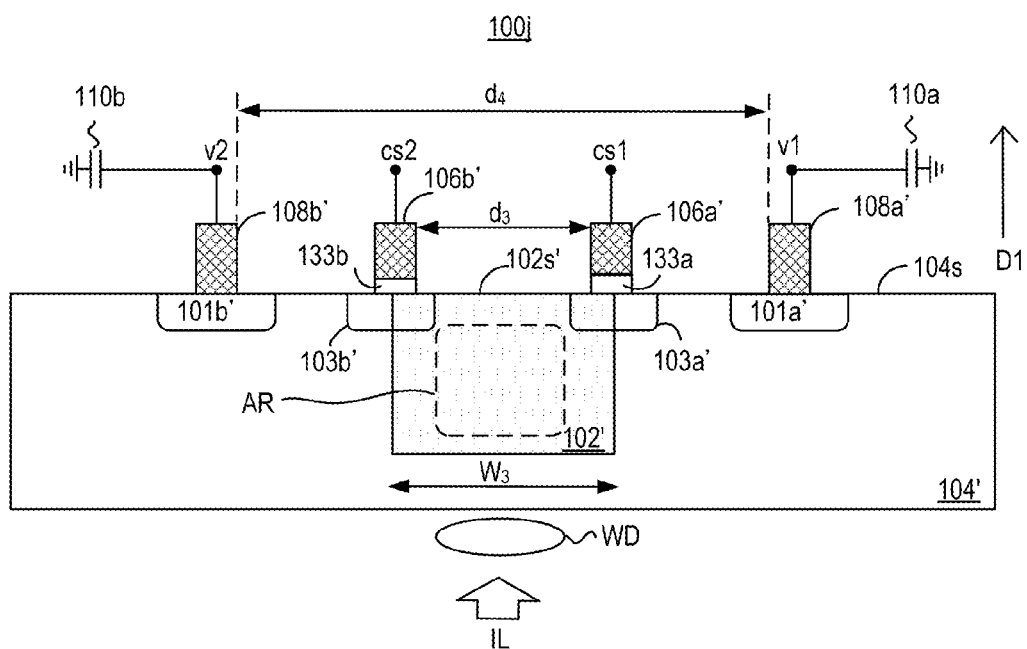

FIG. 1J illustrates a cross-sectional view of a photo-detecting apparatus, according to some embodiments. The photo-detecting apparatus 100j in FIG. 1J is similar to the photo-detecting apparatus 100i in FIG. 1I, where the difference is described below. In some embodiments, the first switch further includes a second doped region 103a' under the first dielectric layer 133a. The second switch further includes a second doped region 103b' under the second dielectric layer 133b. The second doped regions 103a', 103b' are similar to the second doped regions 103a', 103b' described in FIG. 1H. In some embodiments, the control contact layers 106b', 106a', the first dielectric layer 133a and the second dielectric layer 133b can be entirely formed over the absorption layer 102' or be entirely formed over the substrate 104'.

Figure 2A:
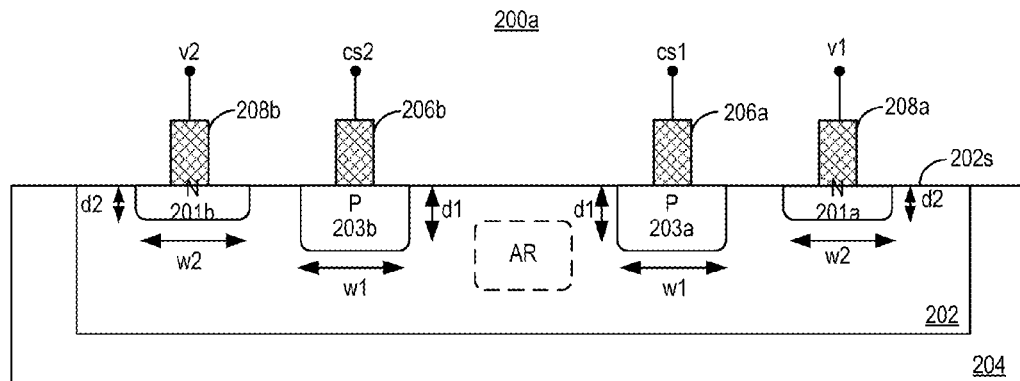
FIGS. 2A-2H illustrate cross-sectional views of a photo-detecting apparatus with body depletion mode, according to some embodiments.

FIG. 2A illustrates a cross-sectional view of a photo-detecting apparatus with body depletion mode, according to some embodiments. The photo-detecting apparatus 200a includes control metal lines 206a, 206b and readout metal lines 208a, 208b. The control metal lines 206a, 206b and the readout metal lines 208a, 208b are electrically coupled to the surface 202s of the germanium-based light absorption material 202. The control metal lines 206a, 206b are respectively electrically coupled to the P-type regions 203a, 203b on the surface 202s, and the readout metal line 208a, 208b are respectively electrically coupled to the N-type regions 201a, 201b on the surface 202s. In some embodiments, the depth d1 of the P-type regions 203a, 203b extending from the surface 202s is deeper than the depth d2 of the N-type regions 201a, 201b, and the germanium-based light absorption material 202 is lightly N-type. With deeper P-type regions 203a, 203b, larger depletion regions are created between the deeper P-type regions 203a, 203b and the N-type germanium-based light absorption material 202, which may allow electrons moving toward the N-type regions 201a, 201b when two different voltages are applied to the control metal lines 206a, 206b and therefore increases the quantum efficiency and the demodulation contrast. In other aspects, the width w1 of P-type regions 203a, 203b, the width w2 of N-type regions 201a, 201b, the doping concentration of P-type regions 203a, 203b, and/or the doping concentration of N-type regions 201a, 201b are also the parameters to adjust the area of the depletion regions.

In some embodiments, to fully deplete the body of the N-type germanium-based light absorption material 202, one can design through the N-type regions 201a, 201b and/or P-type regions 203a, 203b, either through its depths, widths or doping concentrations. Also, the thickness of the germanium-based light absorption material 202 should be designed accordingly.

Figure 2B:
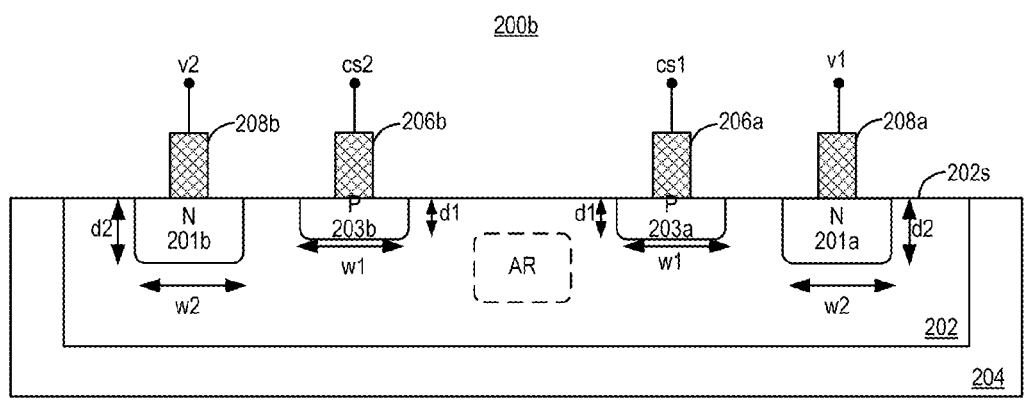

FIG. 2B illustrates a cross-sectional view of a photo-detecting apparatus with body depletion mode, according to some embodiments. The photo-detecting apparatus 200b can be designed with shallower P-type regions 203a, 203b. In other words, the depth d1 of the P-type regions 203a, 203b extending from the surface 202s is shallower than the depth d2 of the N-type regions 201a, 201b. Applying shallower P-type regions 203a, 203b may reduce the leakage between the P-type region 203a and P-type region 203b.

Figure 2C:
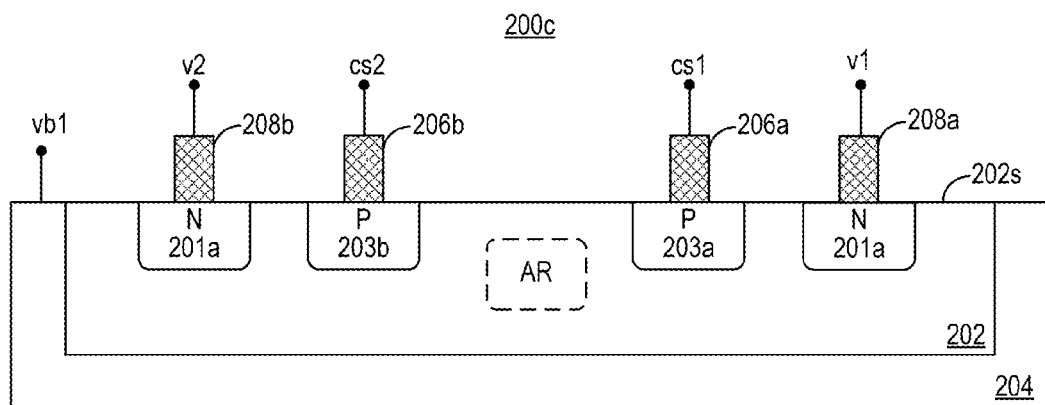

FIG. 2C illustrates a cross-sectional view of a photo-detecting apparatus with body depletion mode, according to some embodiments. The structure of photo-detecting apparatus 200c is similar to the photo-detecting apparatus 200a, 200b. The photo-detecting apparatus 200c applies a bias voltage vb1 on the semiconductor substrate 204. This bias voltage vb1 is applied for creating a reverse bias across the junctions between the N-type germanium-based light absorption material 202 and the P-type regions 203a, 203b. As a result, the depletion region underneath the P-type regions 203a, 203b can be enlarged or even fully depleted. Due to the larger depletion regions generated underneath the P-type regions 203a, 203b, it may make allow electrons moving toward the N-type regions 201a, 201b when two different voltages are applied to the control metal lines 206a, 206b and thus increases the quantum efficiency and the demodulation contrast.

Figure 2D:
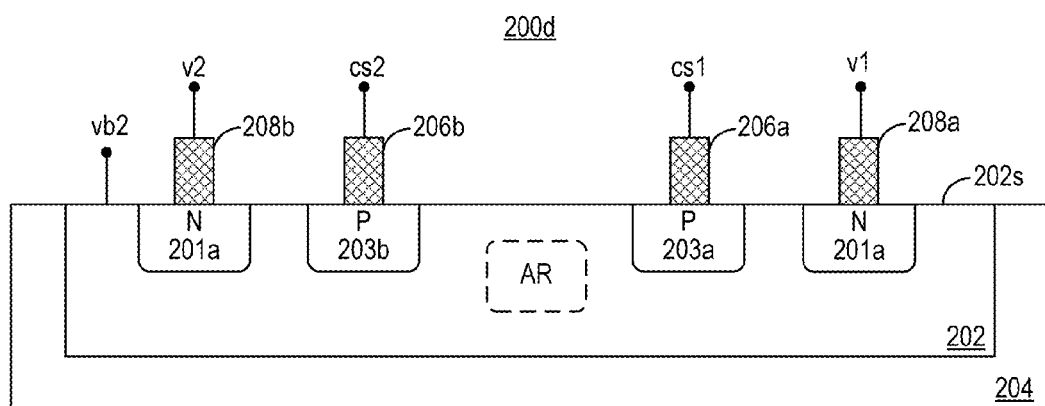

FIG. 2D illustrates a cross-sectional view of a photo-detecting apparatus with body depletion mode, according to some embodiments. Similar to the structure of photo-detecting apparatuses 200a, 200b, this embodiment applies a bias voltage vb2 on the germanium-based light absorption material 202 to control the depletion regions inside the germanium-based light absorption material 202. Specifically, the bias voltage vb2 is a reverse bias to the P-type regions 203a, 203b and the N-type germanium-based light absorption material 202, and so be able to enlarge the depletion regions surrounding the P-type regions 203a, 203b or even being fully depleted.

Figure 2E:
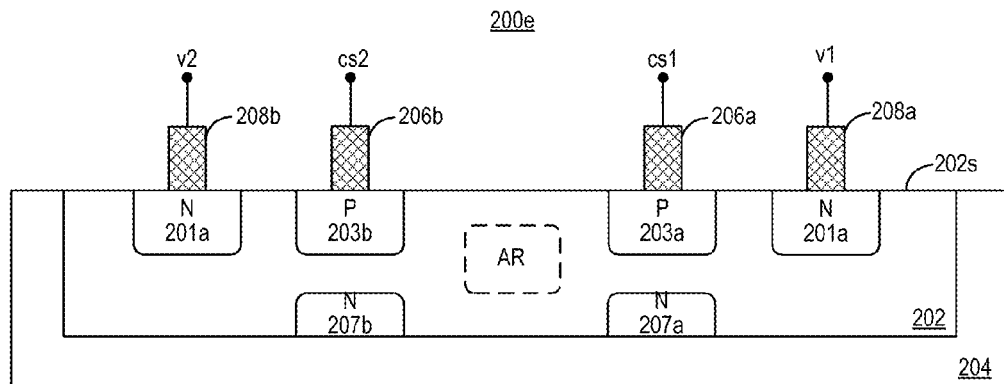

In order to create even larger depletion regions inside the germanium-based light absorption material 202, the embodiment shown in FIG. 2E is disclosed. The photo-detecting apparatus 200e includes N-type regions 207a, 207b on the surface 202ss. The surface 202ss is opposite to the surface 202s. With the N-type regions 207a, 207b, PN junctions are formed in which a depletion region between P-type region 203a and N-type region 207a, and a depletion region between P-type region 203b and N-type region 207b, are generated. Consequently, electric fields are created in the absorption region when two different voltages are applied to the control metal lines 206a, 206b. Therefore, the said depletion regions/electrical fields can be controlled by control signals cs1, cs2 to control the electron moving direction, either toward N-type region 201a or N-type region 201b.

Figure 2F:
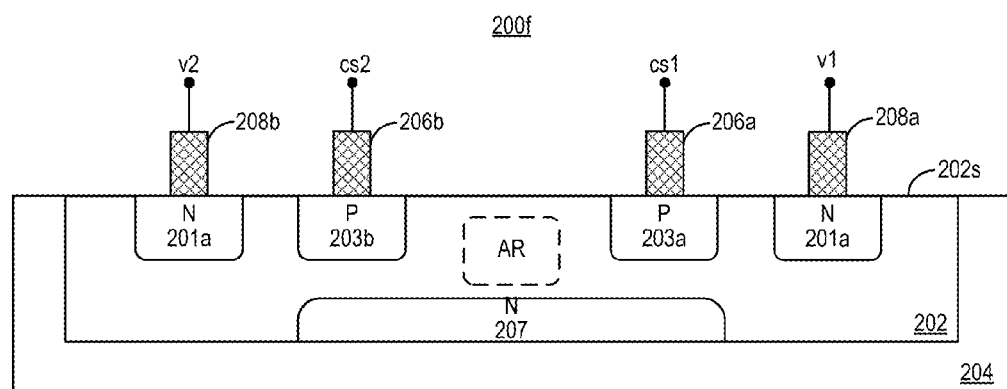

FIG. 2F illustrates a cross-sectional view of a photo-detecting apparatus with body depletion mode, according to some embodiments. The photo-detecting apparatus 200f includes a wider N-type region 207, which is located underneath the P-type regions 203a, 203b. Similarly, the N-type region 207 may enhance the generation of the depletion regions surrounding the P-type regions 203a, 203b and therefore increase the quantum efficiency and the demodulation contrast. It is noted that the width of the N-type region 207 is designable, and the width of the N-type region 207 in FIG. 2F is depicted for a reference.

Figure 2G:
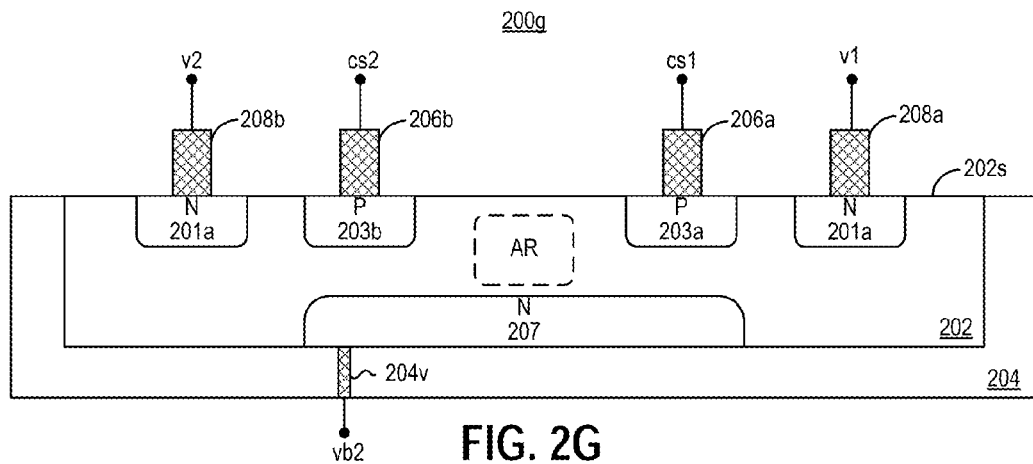
Figure 2H:
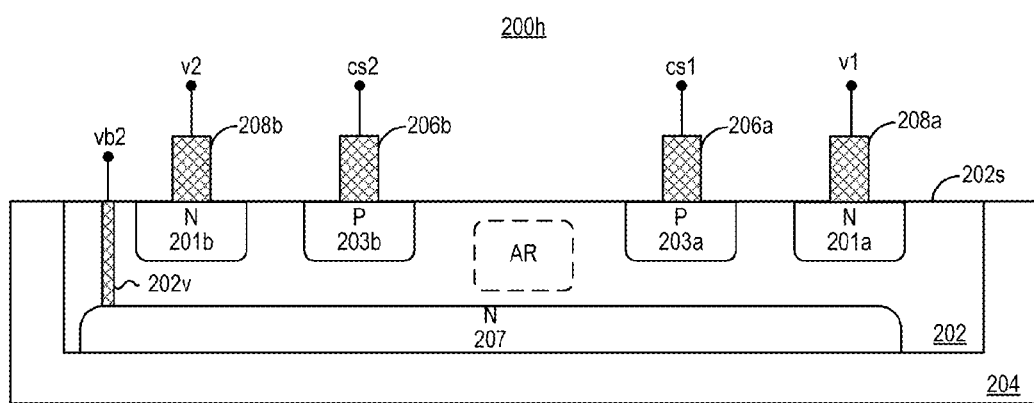

FIG. 2G and FIG. 2H illustrate alternative embodiments showing an approach to bias the N-type region 207. FIG. 2G applies a through-silicon-via (TSV) 204v to bias the N-type region 207, and FIG. 2G applies a through-germanium-via 202v extending from surface 202s to bias N-type region 207.

FIG. 2A to FIG. 2H illustrate a variety of embodiments using body depletion modes, including designing the depth of P-type regions 203a, 203b, applying bias voltages vb1, vb2 on either on semiconductor substrate 204 or germanium-based light absorption material 202, adding N-type regions 207, 207a, 207b inside the germanium-based light absorption material 202, etc. These approaches create the depletion regions underneath or surrounding the P-type regions 203a, 203b to control the moving of the electrons generated from the absorbed photons, either toward N-type region 201a or N-type region 201b.

Figure 3A:
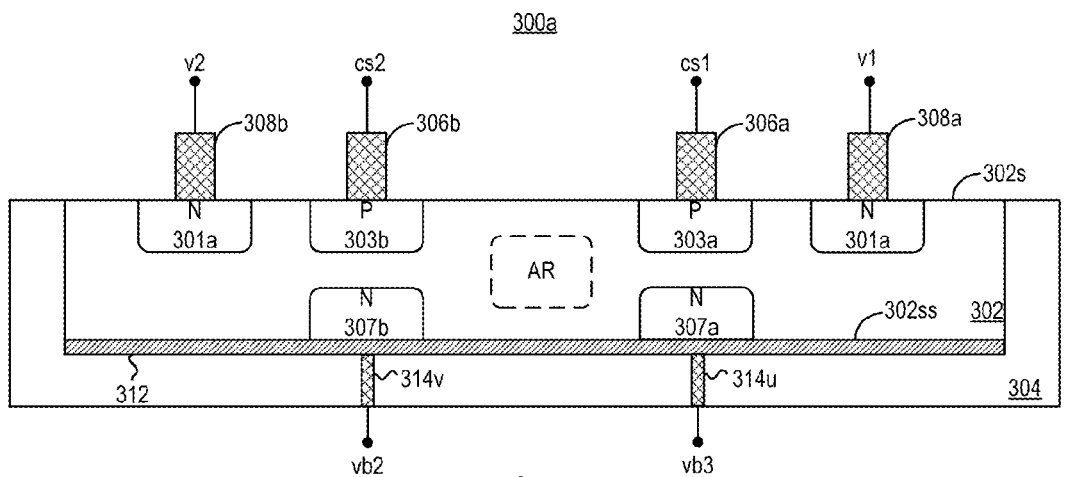
FIGS. 3A-3B illustrate cross-sectional views of a photo-detecting apparatus with gated body depletion mode, according to some embodiments.
Figure 3B:
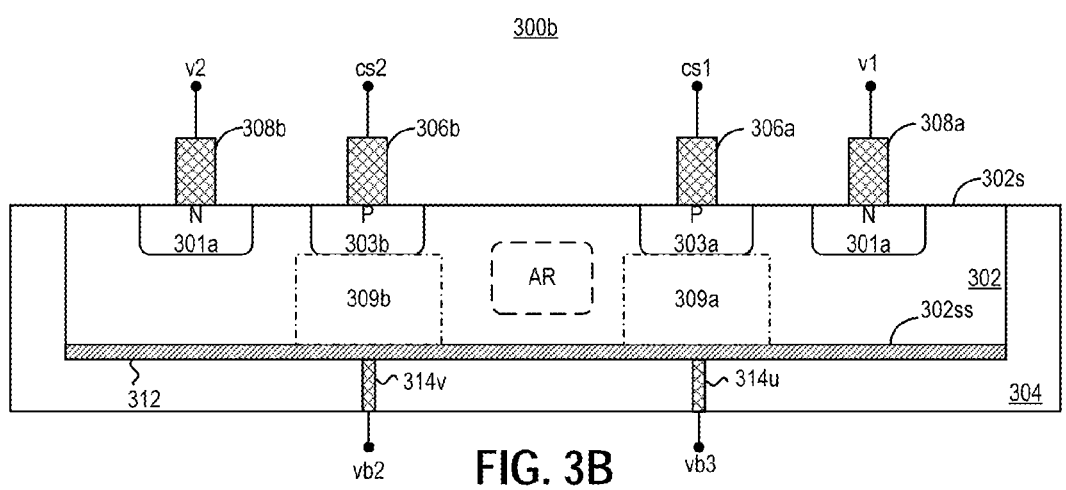

FIGS. 3A-3B illustrate cross-sectional views of a photo-detecting apparatus with gated body depletion mode, according to some embodiments Further to the embodiments illustrated in FIGS. 2A-2H, dielectric-gated body depletion modes are disclosed in FIGS. 3A-3B. The photo-detecting apparatus 300a includes control metal lines 306a, 306b and readout metal lines 308a, 308b. The control metal lines 306a, 306b and the readout metal lines 308a, 308b are electrically coupled to the surface 302s of the germanium-based light absorption material 302. The control metal lines 306a, 306b are respectively electrically coupled to the P-type regions 303a, 303b on the surface 302s, and the readout metal line 308a, 308b are respectively electrically coupled to the N-type regions 301a, 301b on the surface 202s. The germanium-based light absorption material 302 is lightly N-type. Furthermore, the photo-detecting apparatus 300a includes a N-type region 307 on the surface 302ss, and a dielectric layer 312 formed between the germanium-based light absorption material 302 and the semiconductor substrate 304, and a through silicon via (TSV) 314. In some embodiments, a dielectric layer 312 is arranged between a metal (via 314) and semiconductor (germanium-based light absorption material 302), which forms a MOS-like structure. With the dielectric layer 312 formed between the N-type region 307 and via 314, it may reduce or prevent the electrons from flowing into N-type region 307 to leak through via 314.

In some alternative embodiments, the dielectric layer 312 may not necessarily be continuous layer across the whole semiconductor substrate 304 but can be patterned into different regions located underneath N-type region 307. The dielectric layer 312 may be thin or with some predetermined thickness, including multiple kinds or layers of materials or alloy or compounds, for example, $SiO_2$, $SiN_x$, high-K dielectric material or a combination of thereof.

FIG. 3B illustrates a cross-sectional view of a photo-detecting apparatus with gated body depletion mode, according to some embodiments. This embodiment has no N-type region 307 on the surface 302ss, but generates the depletion regions 309a, 309b through the body bias vb2 and vb3. The body bias vb2 and body bias vb3 may be jointly applied or individually applied to control the size of the depletion regions 309a, 309b. The individually applied voltage of the body bias vb2 and the individually applied voltage of body bias vb3 may be the same or different.

Either in FIG. 3A or FIG. 3B, these embodiments insert a dielectric layer 312 between the germanium-based light absorption material 302 and semiconductor substrate 304, and generate the depletion regions (e.g., 309a, 309b in FIG. 3B) underneath the P-type regions 303a, 303b according to the control signals cs1, cs2 and body bias vb2, vb3 so as to control the electron moving direction inside the germanium-based light absorption material 302. Due to the insertion of the dielectric layer 312, it may reduce or prevent the electrons from flowing into the N-type region 307 (FIG. 3A) and the depletion regions 309a, 309b (FIG. 3B) to leak through via 314 (both FIGS. 3A and 3B).

Figure 4A:
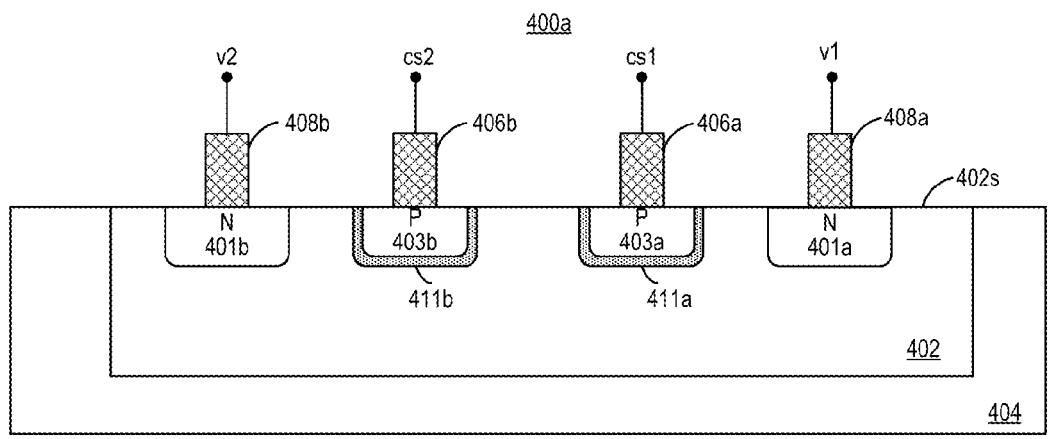
FIGS. 4A-4H illustrate cross-sectional views of a photo-detecting apparatus with a lower leakage current and a lower dark current, according to some embodiments.
Figure 4B:
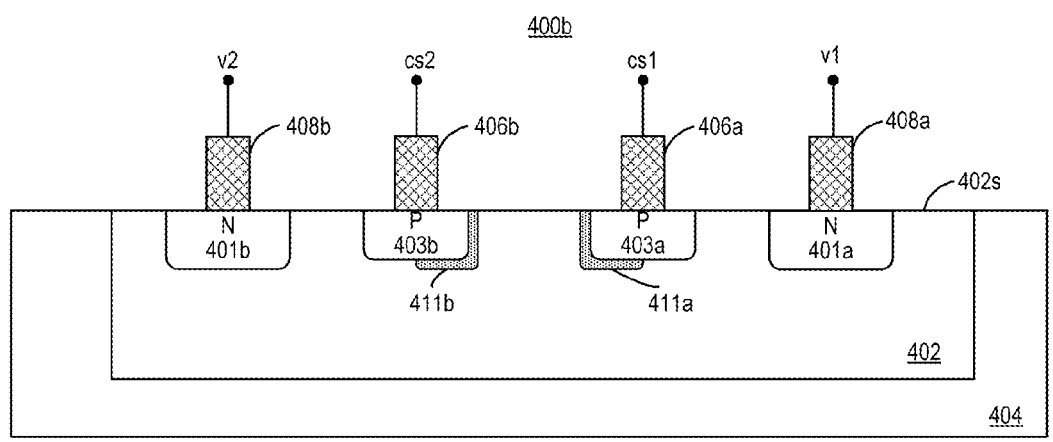

FIG. 4A illustrates a cross-sectional view of a photo-detecting apparatus with a lower leakage current and a lower dark current, according to some embodiments. The photo-detecting apparatus 400a includes control metal lines 406a, 406b and readout metal lines 408a, 408b. The control metal lines 406a, 406b and the readout metal lines 408a, 408b are electrically coupled to the surface 402s of the germanium-based light absorption material 402 supported by the substrate 404. The control metal lines 406a, 406b are respectively electrically coupled to the P-type regions 403a, 403b on the surface 402s, and the readout metal line 408a, 408b are respectively electrically coupled to the N-type regions 401a, 401b on the surface 402s. The operation of the apparatus in FIG. 4A is similar to the embodiments disclosed above. The embodiment of FIG. 4A adds N-wells 411a, 411b fully surrounding the P-type regions 403a, 403b. This may have the effect of reducing the leakage current between P-type regions 403a, 403b. In an alternative embodiment, the N-wells 411a, 411b can be added partially surrounding the P-type regions 403a, 403b as shown in FIG. 4B. This also has the effect of reducing the leakage current between P-type regions 403a, 403b.

Figure 4C:
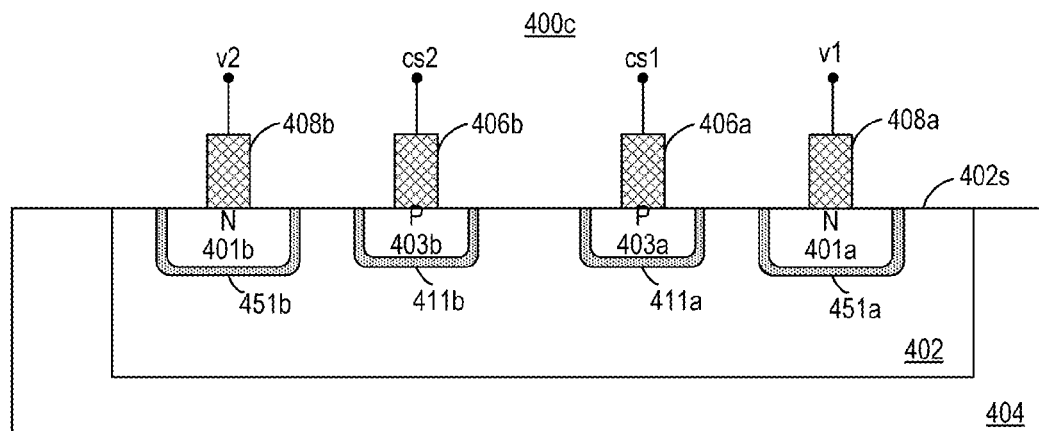
Figure 4D:
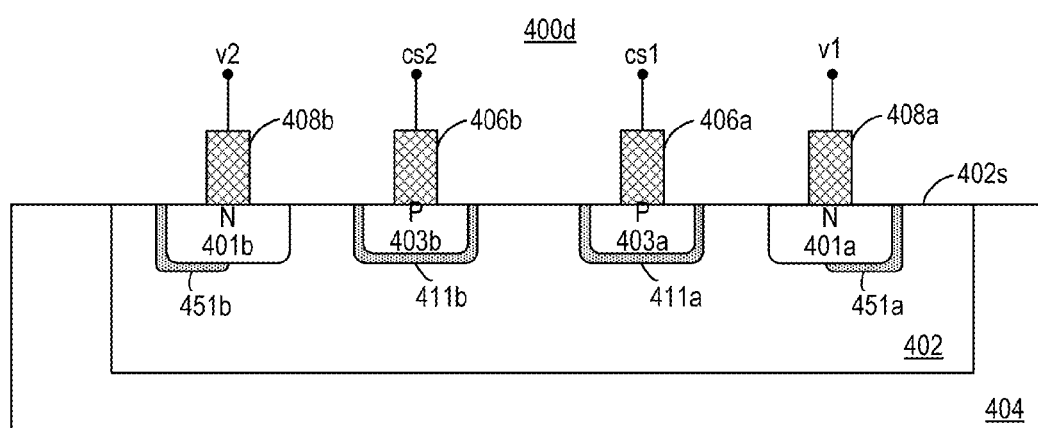

Further to the embodiments illustrated in FIG. 4A and FIG. 4B, P-wells may be added. The embodiment of FIG. 4C adds P-wells 451a, 451b fully surrounding the N-type regions 401a, 401b. This may have the effect of reducing the dark currents occurred at N-type regions 401a, 401b. In an alternative embodiment, the P-wells 451a, 451b can be added partially surrounding the N-type regions 401a, 401b as shown in FIG. 4D. This also has the effect of reducing the dark currents occurred at N-type regions 401a, 401b.

The embodiments illustrated in FIGS. 4A-4D apply N-wells and P-wells to reduce the leakage current and dark current, respectively. The person skilled in the art can change or modify the patterns of the N-wells 411a, 411b and/or P-wells 451a, 451b depending on the design requirements. For example, the N-well 411a can be designed fully surrounding the P-type regions 403a in an asymmetrical way (e.g., the left-hand side width of the N-well 411a is wider than the right-hand side width of the N-well 411a). Similarly, N-well 411b can also be designed fully surrounding the P-type regions 403b in an asymmetrical way (e.g., the right-hand side width of the N-well 411b is wider than the left-hand side width of the N-well 411b). Similar or modified implementations may also be applied to P-wells 451a, 451b.

Figure 4E:
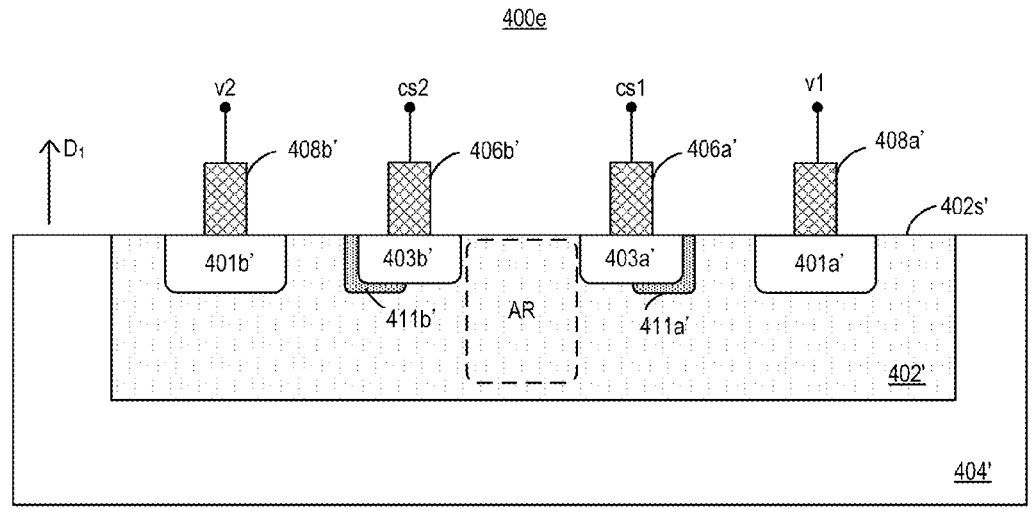

FIG. 4E illustrates a cross-sectional view of a photo-detecting apparatus, according to some embodiments. The photo-detecting apparatus 400e includes a substrate 404'. The photo-detecting apparatus 400e further includes a pixel (not labeled) including an absorption layer 402' supported by the substrate 404'. The pixel includes a first switch (not labeled) and a second switch (not labeled) electrically coupled to the absorption layer 402'. The first switch includes a control contact layer 406a' and a readout contact layer 408a'. The second switch includes a control contact layer 406b' and a readout contact layer 408b'. The control contact layers 406a', 406b' and the readout contact layers 408a', 408b' are over the first surface 402s' of the absorption layer 402' along a vertical direction D1. The first switch includes a first doped region 401a' under the readout contact layers 408a'. The second switch includes a first doped region 401b' under the readout contact layers 408b'. The photo-detecting apparatus 400e includes multiple repeating pixels. The photo-detecting apparatus 400e includes a pixel-array including multiple repeating pixels. In some embodiments, the pixel-array may be a one-dimensional or a two-dimensional array of pixels.

In some embodiments, the pixel further includes a first readout circuit (not shown) and a second readout circuit (not shown) electrically coupled to the first switch and the second switch respectively for processing the collected charges. The first readout circuit is electrically coupled to the readout contact layer 408a'. The second readout circuit is electrically coupled to the readout contact layer 408b'.

In some embodiments, the first doped regions 401a', 401b' are of a first conductivity type. In some embodiments, the first doped regions 401a', 401b' include a first dopant and a dopant profile. The peak dopant concentrations of the first doped regions 401a', 401b' depend on the material of the readout contact layers 408a', 408b' and the material of the absorption layer 102', for example, between $5 \times 10^{18}$ cm$^{-3}$ to $5 \times 10^{15}$ cm$^{-3}$. The first doped regions 401a', 401b' are for collecting the carriers generated from the absorption layer 402', which are further processed by the first readout circuit (not shown) and the second readout circuit (not shown) respectively based on the control of the two control signals cs1, cs2.

In some embodiments, the first switch further includes a second doped region 403a' under the control contact layers 406a'. The second switch further includes a second doped region 403b' under the control contact layers 406b'. The second doped regions 403a', 403b' are formed in the absorption layer 402' as well. In some embodiments, the second doped regions 403a', 403b' are of a second conductivity type different from the first conductivity type of the first doped regions 401b',401a'. In some embodiments, the second doped regions 403a', 403b' include a second dopant and a dopant profile. The peak dopant concentrations of the second doped regions 403a', 403b' depend on the material of the control contact layers 406b', 406a' and the material of the absorption layer 402', for example, between $1 \times 10^{17}$ cm$^{-3}$ to $5 \times 10^{20}$ cm$^{-3}$. The second doped regions 403a', 403b' form a Schottky or an Ohmic contact or a combination thereof with the control contact layers 406b', 406a'. The second doped regions 403a', 403b' are for modulating the carriers generated from the absorption layer 402' based on the control of the control signals cs1, cs2.

In some embodiments, the pixel further includes two counter-doped regions 411a', 411b'. The counter-doped region 411a' overlaps with at least a portion of the second doped region 403a'. The counter-doped region 411b' overlaps with at least a portion of the second doped region 403b'. In some embodiments, the counter-doped regions 411a', 411b' are formed in the absorption layer 402'. Each of the counter-doped regions 411a', 411b' has a conductivity type different from the second conductivity type of the second doped region 403a', 403b'. In some embodiments, the photo-detecting apparatus 400e is configured to process the collected holes for further application. In such an embodiment, the first doped regions 401b', 401a' are of p-type, the second doped region 403a', 403b' are of n-type, and the counter-doped regions 411b', 411a' are of p-type. In some embodiments, the counter-doped region 411b' overlaps with at least a portion of the second doped region 403b' nearer the first doped regions 401b'. In some embodiments, at least a portion of the counter-doped region 411b' is between the first doped regions 401b' and the second doped region 403b'. In some embodiments, the counter-doped region 411a' overlaps with at least a portion of the second doped region 403a' nearer the first doped regions 401a'. In some embodiments, at least a portion of the counter-doped region 411a' is between the first doped regions 401a' and the second doped region 403a'.

In some embodiments, the counter-doped regions 411a', 411b' serve as dark-current reduction regions for reducing the dark current of the photo-detecting apparatus 400e. Compared to a photo-detecting apparatus devoid of counter-doped regions 411a', 411b', the photo-detecting apparatus 400e including counter-doped regions 411a', 411b' overlapping at least a portion of the second doped regions 403a', 403b' has thinner depletion regions, and thus the photo-detecting apparatus 400e is with lower dark current.

In some embodiments, each of the counter-doped regions 411a', 411b' includes a dopant, and each of the counter-doped regions 411a', 411b' has a dopant profile with a peak dopant concentration. The peak dopant concentration is not less than $1\times10^{16}$ cm$^{-3}$. In some embodiment, the peak dopant concentrations of the counter-doped regions 411a', 411b' are lower than the peak dopant concentrations of the second doped regions 403b', 403a'. In some embodiments, the peak dopant concentration of each of the counter-doped regions 411a', 411b' is between $1\times10^{16}$ cm$^{-3}$ and $1\times10^{18}$ cm$^{-3}$.

Figure 4F:
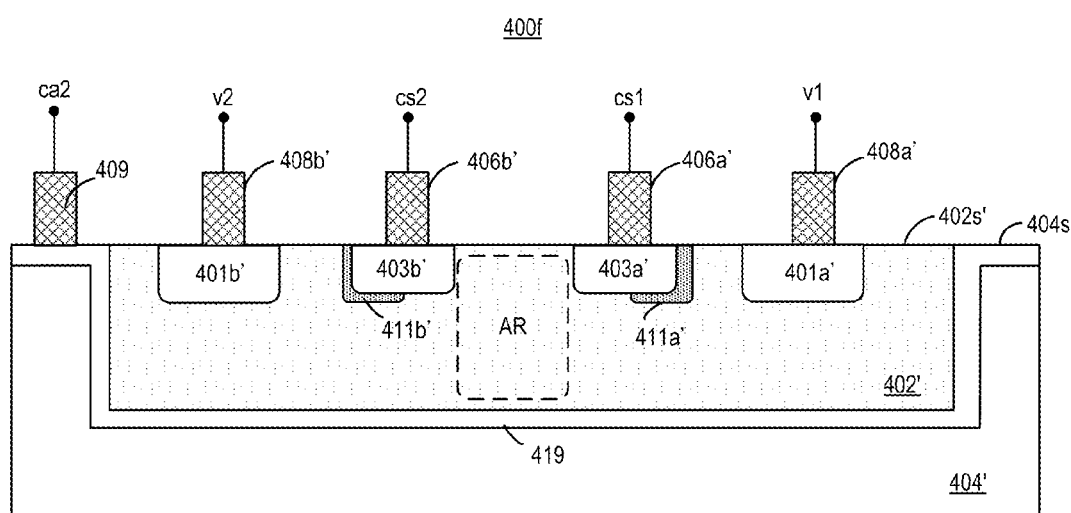

FIG. 4F illustrates a cross-sectional view of a photo-detecting apparatus, according to some embodiments. The photo-detecting apparatus 400f in FIG. 4F is similar to the photo-detecting apparatus in FIG. 4E, where the difference is described below. In some embodiments, the photo-detecting apparatus 400f further includes a blocking layer 419 surrounding at least a portion of the absorption layer 402', wherein the blocking layer 419 is of a conductivity type different from the first conductivity type of each of the first doped regions 401b', 401a'. The blocking layer 419 may block photo-generated charges in the absorption layer 402' from reaching the substrate 404', which increases the collection efficiency of photo-generated carriers of the photo-detecting apparatus 400f. The blocking layer 419 may also block photo-generated charges in the substrate 404' from reaching the absorption layer 402', which increases the speed of photo-generated carriers of the photo-detecting apparatus 400f. The blocking layer 419 may include a material the same as the material of the absorption layer 402', the same as the material of the substrate 404', a material as a combination of the material of the absorption layer 402' and the material of the substrate 404', or different from the material of the absorption layer 402' and the material of the substrate 404'. In some embodiments, the shape of the blocking layer 419 may be but not limited to a ring. In some embodiments, the blocking layer 419 includes a dopant and has a dopant profile with a peak dopant concentration ranging from $10^{15}$ cm$^{-3}$ to $10^{20}$ cm$^{-3}$. The blocking layer 419 may reduce the cross talk between two adjacent pixels.

In some embodiments, the blocking layer 419 extends to reach the first surface 404s of the substrate 404'. In some embodiments, photo-detecting apparatus 400f may further include a conductive layer 409 electrically connected to the blocking layer 419. The blocking layer 419 may be biased through the conductive layer 409 by a bias voltage ca2 to discharge carriers not collected by the first doped regions 401a', 401b'.

In some embodiments, the photo-detecting apparatus 400f is configured to process the collected holes for further application. In such an embodiment, the first doped regions 401b', 401a' are of p-type, the second doped region 403a', 403b' are of n-type, and the counter-doped regions 411b', 411a' are of p-type, and the blocking layer 419 is of n-type.

Figure 4G:
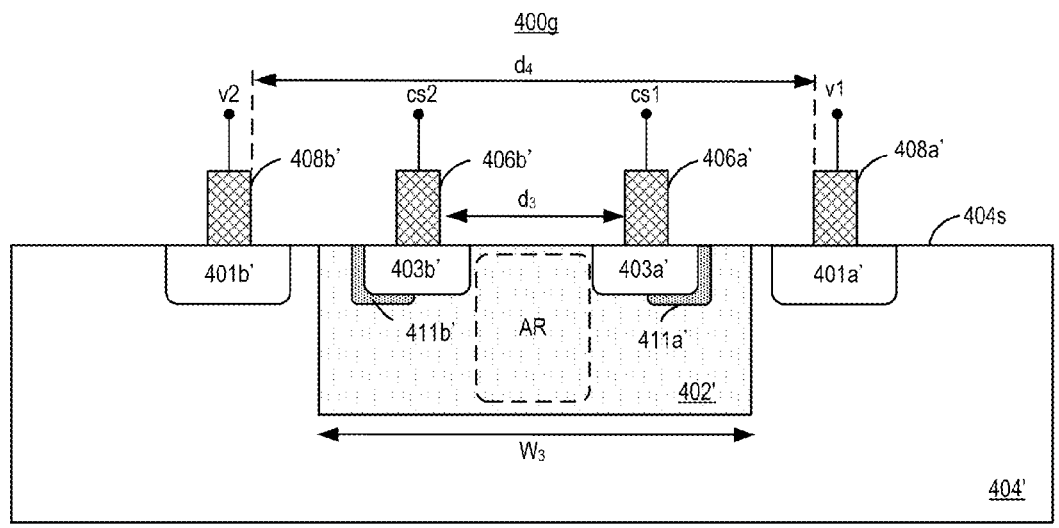

FIG. 4G illustrates a cross-sectional view of a photo-detecting apparatus, according to some embodiments. The photo-detecting apparatus 400g in FIG. 4G is similar to the photo-detecting apparatus 400e in FIG. 4E, where the difference is described below. The first doped regions 401b', 401a' are formed in the substrate 404'. The readout contact layers 408a', 408b' are formed over the first surface 404s of the substrate 404'. A distance $d_3$ between the control contact layers 406a', 406b' is less than a width $w_3$ of the absorption layer 402'. In some embodiments, a distance $d_4$ between the readout contact layers 408a', 408b' is greater than the width $w_3$ of the absorption layer 402'. In some embodiments, since the dark current of the substrate 404' is lower than the dark current of the absorption layer 402', by disposing the first doped regions 401b', 401a' in the substrate 404' can further reduce the dark current of the photo-detecting apparatus 400g.

Figure 4H:
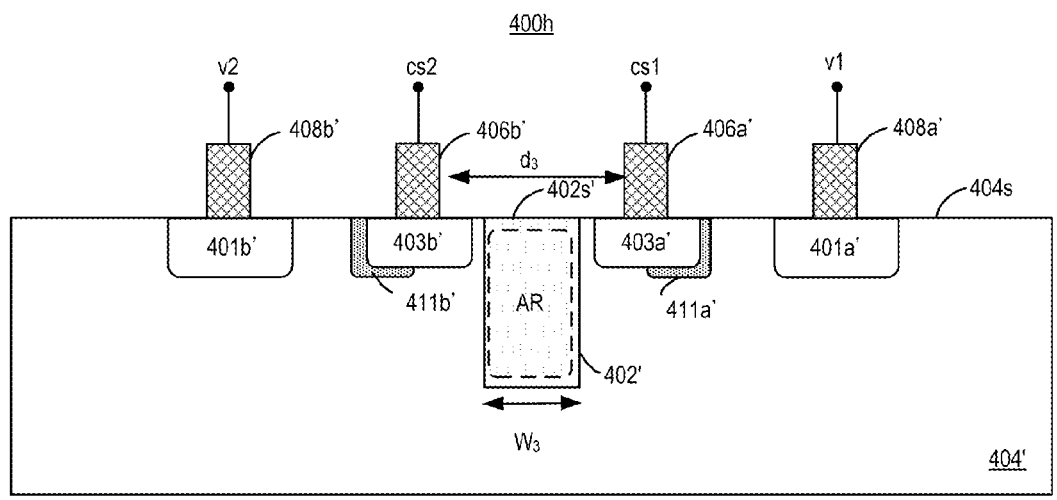

FIG. 4H illustrates a cross-sectional view of a photo-detecting apparatus, according to some embodiments. The photo-detecting apparatus 400h in FIG. 4H is similar to the photo-detecting apparatus 400g in FIG. 4G, where the difference is described below. The second doped regions 403b', 403a' are formed in the substrate 404'. The control contact layers 406a', 406b' are formed over the first surface 404s of the substrate 404'. In some embodiments, the counter-doped regions 411a', 411b' are formed in the substrate 404'. A distance $d_3$ between the control contact layers 406a', 406b' is greater than a width $w_3$ of the absorption layer 402'. In some embodiments, since the dark current of the substrate 404' is lower than the dark current of the absorption layer 402', by disposing the first doped regions 401b', 401a', the second doped regions 403b',403a' and the counter-doped regions 411a', 411b' in the substrate 404' can further reduce the dark current of the photo-detecting apparatus 400h.

Figure 5A:
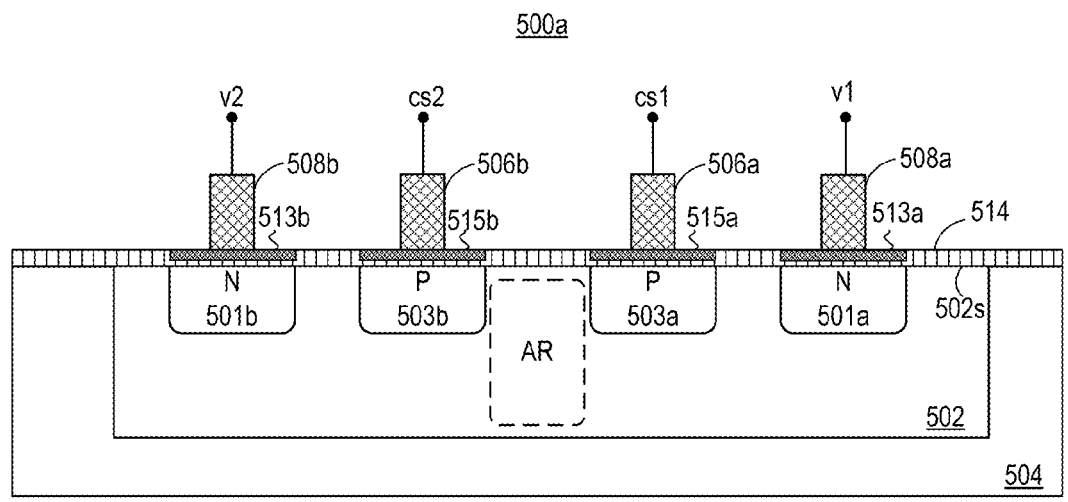
FIGS. 5A-5H illustrate a cross-sectional view of a photo-detecting apparatus with passivation layer, according to some embodiments.

FIG. 5A illustrates a cross-sectional view of a photo-detecting apparatus with passivation layer, according to some embodiments. The photo-detecting apparatus 500a includes control metal lines 506a, 506b and readout metal lines 508a, 508b. The control metal lines 506a, 506b and the readout metal lines 508a, 508b are electrically coupled to the surface 502s of the germanium-based light absorption material 502 supported by the substrate 504. The control metal lines 506a, 506b are respectively electrically coupled to the P-type regions 503a, 503b on the surface 502s, and the readout metal lines 508a, 508b are respectively electrically coupled to the N-type regions 501a, 501b on the surface 502s. The embodiment of FIG. 5A adds a passivation layer 514 (e.g., amorphous-silicon (a-Si), GeO$_x$, Al$_2$O$_3$, SiO$_2$) over the surface 502s, adds a silicide (e.g., NiSi$_2$, CoSi$_2$) 513a at the connection between the readout metal line 508a and the N-type region 501a, adds a silicide 513b at the connection between the readout metal line 508b and the N-type region 501b, adds a silicide 515a at the connection between the control metal line 506a and the P-type region 503a, and adds a silicide 515b at the connection between the control metal line 506b and the P-type region 503b.

In accordance with this embodiment, forming the passivation layer 514 over the germanium-based light absorption material 502 can terminate the dangling bonds on the surface 502s and so reduce the dark currents. On the other hand, adding the silicide (e.g., NiSi$_2$, CoSi$_2$) can also reduce the contact or junction resistance between the metal and semiconductor, which reduces the voltage drop and reduces power consumption accordingly.

In some embodiments, the passivation layer 514 is intrinsic. The term "intrinsic" means that the passivation layer 514 is without intentionally adding dopants. In some embodiments, a method for manufacturing the photo-detecting apparatus 500a includes steps of forming the N-type regions 501a,501b; forming the P-type region 503a, 503b; forming the passivation layer 514 over the surface 502s of the germanium-based light absorption material 502; and forming silicide 515a, 515b, 513a,513b in the passivation layer 514; wherein the step of forming the passivation layer 514 over the surface 502s of the germanium-based light absorption material 502 is after the step of forming the N-type regions 501a,501b, and the step of forming the P-type region 503a, 503b.

Figure 5B:
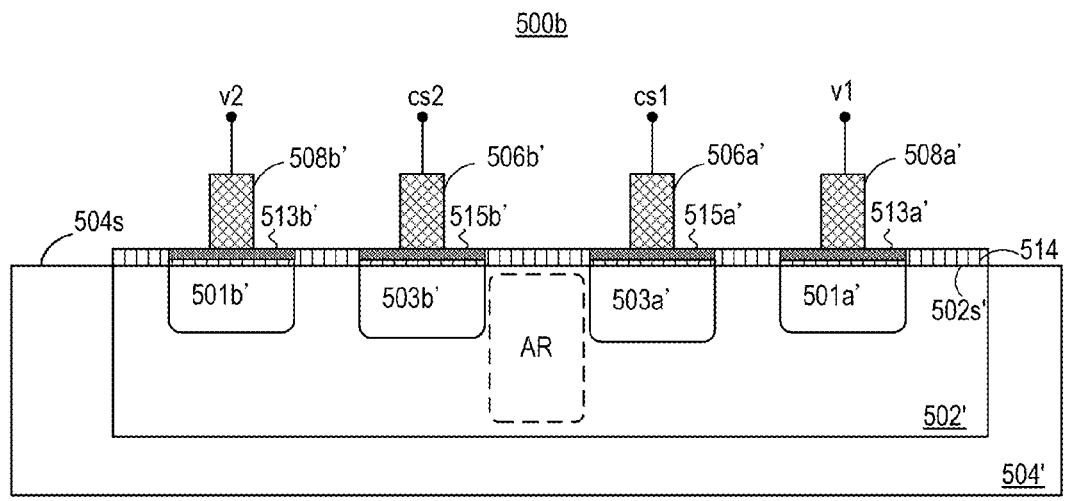

FIG. 5B illustrates a cross-sectional view of a photo-detecting apparatus, according to some embodiments. The photo-detecting apparatus 500b includes a substrate 504'. The photo-detecting apparatus further includes a pixel (not labeled) including an absorption layer 502' supported by the substrate 504'. The pixel includes an absorbed region AR in the absorption layer 502'. The absorbed region AR is a virtual area receiving an incoming optical signal. The pixel includes a first switch (not labeled) and a second switch (not labeled) electrically coupled to the absorption layer 502'. The first switch includes a control contact layer 506a' and a readout contact layer 508a'. The second switch includes a control contact layer 506b' and a readout contact layer 508b'. In some embodiments, the readout contact layers 508a', 508b', and the control contact layers 506a', 506b' are on a first surface 502s' of the absorption layer 502'. In some embodiments, a width of the absorbed region AR is less than a distance between the readout contact layers 508a', 508b'. In some embodiments, the readout contact layers 508a', 508b' are disposed at two opposite sides of the absorbed region AR. In some embodiments, a width of the absorbed region AR is less than a distance between the control contact layers 506a', 506b'. In some embodiments, the control contact layers 506a', 506b' are disposed at two opposite sides of the absorbed region AR. In some embodiments, the photo-detecting apparatus 500b includes multiple repeating pixels. The photo-detecting apparatus 500b includes a pixel-array including multiple repeating pixels. In some embodiments, the pixel-array may be a one-dimensional or a two-dimensional array of pixels.

The pixel further includes two control signals cs1, cs2 controlling the control contact layers 506a', 506b' for controlling the moving direction of the electrons or holes generated by the absorbed photons in the absorption layer 502'. For example, when voltages are used, if the control signal cs1 is biased against the control signal cs2, an electric field is created between the two portions right under the control contact layers 506a', 506b', and free charges drift towards one of the two portions right under the readout contact layers 508b' 508a' depending on the direction of the electric field.

In some embodiments, the pixel includes two capacitors (not shown). The readout contact layers 508a' is electrically coupled to one of the capacitors, and the readout contact layers 508b' is electrically coupled to the other capacitor.

The capacitors are for storing the carriers generated in the absorption layer 502' based on the control of the two control signals cs1, cs2. For example, due to a distance existing between the photo-detecting apparatus 500b and a target object (not shown), an optical signal has a phase delay with respect to a transmitted light transmitted by a transmitter (not shown). When the transmitted light is modulated by a modulation signal and the electron-hole pairs are demodulated through the control contact layers 506a', 506b' by a demodulation signal, the electrons or the holes stored in the capacitors will be varied according to the distance. Therefore, the photo-detecting apparatus 500b can obtain the distance information based on the voltage v1 on one of the capacitors and the voltage v2 on the other capacitor.

In some embodiments, the pixel further includes a first readout circuit (not shown) and a second readout circuit (not shown) electrically coupled to the first switch and the second switch respectively for processing the collected charges. The first readout circuit may include one of the capacitors. The second readout circuit may include the other capacitor. The first readout circuit is electrically coupled to the readout contact layer 508a'. The second readout circuit is electrically coupled to the readout contact layer 508b'.

In some embodiments, the first switch includes a first doped region 501a' under the readout contact layers 508a'. The second switch includes a first doped region 501b' under the readout contact layers 508b'. In some embodiments, the first doped regions 501a', 501b' are of a first conductivity type. In some embodiments, each of the first doped regions 501a', 501b' includes a first dopant and a dopant profile. The peak dopant concentrations of the first doped regions 501a', 501b' depend on the material of the readout contact layers 508a', 508b' and the material of the absorption layer 502', for example, between $5 \times 10^{18}$ cm$^{-3}$ to $5 \times 10^{20}$ cm$^{-3}$. The first doped regions 501a', 501b' are for collecting the carriers generated from the absorption layer 502', which are further processed by the first readout circuit (not shown) and the second readout circuit (not shown) respectively based on the control of the two control signals cs1, cs2.

In some embodiments, the first switch further includes a second doped region 503a' under the control contact layers 506a'. The second switch further includes a second doped region 503b' under the control contact layers 506b'. The second doped regions 503a', 503b' are formed in the absorption layer 502'. In some embodiments, the second doped regions 503a', 503b' are each of a second conductivity type different from the first conductivity type of the first doped regions 501b', 501a'. In some embodiments, each of the second doped regions 503a', 503b' includes a second dopant and a dopant profile. The peak dopant concentrations of the second doped regions 503a', 503b' depend on the material of the control contact layers 506b', 506a' and the material of the absorption layer 502', for example, between $1 \times 10^{17}$ cm$^{-3}$ to $5 \times 10^{20}$ cm$^{-3}$. The second doped regions 503a', 503b' forms a Schottky or an Ohmic contact or a combination thereof with the control contact layers 506b', 506a'. The second doped regions 503a', 503b' are for demodulating the carriers generated and flow from the absorption layer 502' based on the control of the control signals cs1, cs2.

In some embodiments, the pixel further incudes a passivation layer 514 over a first surface 502s' of the absorption layer 502'. In some embodiments, the passivation layer 514 further covers a portion of the first surface 504s of the substrate 504. In some embodiments, the absorption layer 502' is protruded from the first surface 504s of the substrate 504', and the passivation layer 514 further covers a sidewall of the absorption layer 502' exposed from the substrate 504'.

The passivation layer 514 may include amorphous silicon, poly silicon, epitaxial silicon, aluminum oxide (e.g., $Al_xO_y$), silicon oxide (e.g., $Si_xO_y$), Ge oxide (e.g., $Ge_xO_y$), germanium-silicon (e.g., GeSi), silicon nitride family (e.g., $Si_xN_y$), high-k materials (e.g. $HfO_x$, $ZnO_x$, $LaO_x$, $LaSiO_x$), and any combination thereof. The presence of the passivation layer 514 may have various effects. For example, the passivation layer 514 may act as a surface passivation layer to the absorption layer 502', which may reduce dark current or leakage current generated by defects occurred at the exposed surface of the absorption layer 502'. In some embodiments, the passivation layer 514 has a thickness not more than 100 nm. In some embodiments, a part of the first doped regions 501a', 501b' may be formed in the portions of the passivation layer 514 between the absorption layer 502' and the readout contact layers 508a', 508b' respectively. That is, the first dopants of the first doped regions 501a', 501b' may be in the portions of the passivation layer 514 between the absorption layer 502' and the readout contact layers 508a', 508b' respectively. In some embodiments, a part of the second doped regions 503a', 503b' may be formed in the portions of the passivation layer 514 between the absorption layer 502' and the control contact layer 506a', 506b' respectively. That is, the second dopants of the second doped regions 503a', 503b' may be in the portions of the passivation layer 514 between the absorption layer 502' and the control contact layer 506a', 506b' respectively.

In some embodiments, the pixel further incudes first silicide regions 513a', 513b' between the first doped regions 501a', 501b' and the readout contact layers 508a', 508b'. In some embodiments, the pixel further incudes second silicide regions 515a', 515b' between the second doped regions 503a', 503b' and the control contact layer 506a', 506b'. The first silicide regions 513a', 513b' and the second silicide regions 515a', 515b' include $M_xSi_y$, wherein M is metal, x and y are the number of metal and silicon atoms respectively. In some embodiments, M includes, but is not limited to Ni, Co, Ti, W, Cr, Ta, Pt or a combination thereof. The first silicide regions 513a', 513b' can reduce the contact or junction resistance between the readout contact layers 508a', 508b' and the absorption layer 502'. The second silicide regions 515a', 515b' can reduce the contact or junction resistance between the control contact layer 506a', 506b' and the absorption layer 502'. As a result, the voltage drop and the power consumption of the photo-detecting apparatus 500b can be reduced.

In some embodiments, a method for manufacturing the photo-detecting apparatus 500b includes steps of forming the passivation layer 514 over the first surface 502s' of the absorption layer 502'; forming the first doped regions 501a', 501b' in the absorption layer 502' and the passivation layer 514; forming the second doped regions 503a', 503b' in the absorption layer 502' and the passivation layer 514; forming the first silicide regions 513a', 513b' and the second silicide regions 515a', 515b' in the passivation layer 514. In some embodiments, the step of forming the passivation layer 514 over the first surface 502s' of the absorption layer 502' is before the step of forming the first doped regions 501a', 501b', and the step of forming the second doped regions 503a', 503b'.

Figure 5C:
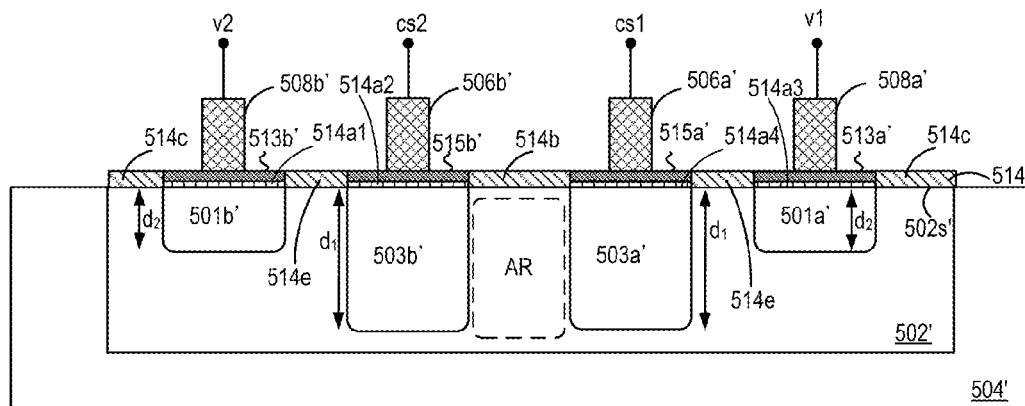

FIG. 5C illustrates a cross-sectional view of a photo-detecting apparatus, according to some embodiments. The photo-detecting apparatus 500c in FIG. 5C is similar to the photo-detecting apparatus in FIG. 5B, where the difference is described below. In some embodiments, the passivation layer 514 includes at least two regions with different properties. For example, as shown in FIG. 5C, the passivation layer 514 includes four first regions 514a1, 514a2, 514a3, 514a4 separated from each other. The first region 514a1 is between the first doped regions 501b' and the readout contact layer 508b'. In some embodiments, first region 514a1 is between the first doped region 501b' and the first silicide region 513b'. The first region 514a2 is between the second doped regions 503b' and the control contact layer 506b'. In some embodiments, first region 514a2 is between the second doped regions 503b' and the second silicide region 515b'. The first region 514a3 is between the first doped region 501a' and the readout contact layer 508a'. In some embodiments, first region 514a3 is between the first doped regions 501a' and the first silicide region 513a'. The first region 514a4 is between the second doped regions 503a' and the control contact layer 506a'. In some embodiments, first region 514a4 is between the second doped regions 503a' and the second silicide region 515a'. The passivation layer 514 further includes a second region 514b between and separating the two first regions 514a2, 514a4.

Each of the first regions 514a1, 514a2, 514a3, 514a4 includes a property. The second region 514b includes a property different from the property of the first regions 514a1, 514a2, 514a3, 514a4. In some embodiments, the property includes material or resistance. For example, the second region 514b has a resistance higher than that of the first regions 514a1, 514a2, 514a3, 514a4. In some embodiments, the second region 514b includes an insulating material. For example, the insulating material includes an insulating oxide material or an insulating nitride material. The insulating oxide material includes, but is not limited to, aluminum oxide (e.g., $Al_xO_y$), silicon oxide (e.g., $Si_xO_y$), Ge oxide (e.g., $Ge_xO_y$), $HfO_x$, $ZnO_x$, $LaO_x$, $LaSiO_x$ or any combination thereof. The insulating nitride material includes, but is not limited to silicon nitride family (e.g., $Si_xN_y$), germanium nitride family (e.g., $Ge_xN_y$). In some embodiments, the first regions 514a1, 514a2, 514a3, 514a4. include a semiconductor material including, but not limited to, amorphous silicon, poly silicon, epitaxial silicon, germanium-silicon (e.g., GeSi), or any combination thereof. The second region 514b can block the electrical conduction between the second doped regions 503a', 503b' through the passivation layer 514 and also block the electrical conduction between the second doped regions 503a', 503b' along the interface between the passivation layer 514 and the absorption layer 502'. As a result, the leakage current between the second doped regions 503a', 503b' can be reduced. In some embodiments, the passivation layer 514 further includes two third regions 514c from the cross-sectional view of the photo-detecting apparatus 500c. The third regions 514c cover a periphery part of the first surface 502s' of the absorption layer 502'. In some embodiments, each of the two third regions 514c includes a property different from the property of the first regions 514a1, 514a2, 514a3, 514a4. For example, each of the third regions 514c has a resistance higher than that of the first regions 514a1, 514a2, 514a3, 514a4. In some embodiments, the third regions 514c include an insulating material. In some embodiments, the third regions 514c and the second region 514b may be a continuous region surrounding the first regions 514a1, 514a2, 514a3, 514a4. In some embodiments, the third regions 514c are discrete regions and also separated from the second region 514b. In some embodiments, the material of the third regions 514c and the material of the second region 514b may be the same. The third regions 514c may further block the electrical conduction between the first doped regions 501a', 501b' through the periphery part of the passivation layer 514 and also block the electrical conduction between the first doped regions 501a', 501b' along the interface of the periphery part between the passivation layer 514 and the absorption layer 502'. In some embodiments, the passivation layer 514 further includes two fourth regions 514e from the cross-sectional view of the photo-detecting apparatus 500c. The fourth regions 514e are between two of the first regions 514a1, 514a2, 514a3, 514a4. In some embodiments, each of the two fourth regions 514e includes a property different from the property of the first regions 514a1, 514a2, 514a3, 514a4. For example, the fourth region 514e has a resistance higher than that of the first regions 514a1, 514a2, 514a3, 514a4. In some embodiments, the fourth regions 514e include an insulating material. In some embodiments, the fourth regions 514e, the third regions 514c and the second region 514b may be a continuous region surrounding the first regions 514a1, 514a2, 514a3, 514a4. In some embodiments, the fourth regions 514e are discrete regions and also separated from the second region 514b and the third region 514c. In some embodiments, the material of the fourth regions 514e, the material of the third regions 514c and the material of the second region 514b may be the same. The fourth regions 514e may further block the electrical conduction between the first doped regions 501a', 501b' through the part of the passivation layer 514 between the first regions 514a1, 514a2, 514a3, 514a4. As a result, the leakage current is further reduced. In some embodiments, the first regions 514a1, 514a2, 514a3, 514a4 are conductive regions. The second region 514b, the third region 514c and the fourth regions 514d are insulating regions.

In some embodiments, each of the second doped regions 503a', 503b' includes a depth d1. Each of the first doped regions 501a', 501b' includes a depth d2. The depth d1 of each of the second doped regions 503a', 503b' is greater than the depth d2 of each of the first doped regions 501a', 501b'. In some embodiments, the ratio of the depth d1 to the depth d2 is not less than 1.5. In some embodiments, the depth d1 is measured from the first surface 502s' of the absorption layer 502' to the position where the second dopant is of a background concentration, such as $1 \times 10^{15}$ $cm^{-3}$. In some embodiments, the depth d2 is measured from the first surface 502s' of the absorption layer 502' to the position where the first dopant is of a background concentration, such as $1 \times 10^{15}$ $cm^{-3}$. Since the depth d1 of each of the second doped regions 503a', 503b' is greater than the depth d2 of each of the first doped regions 501a', 501b', the modulation bandwidth can be kept satisfied.

Figure 5D:
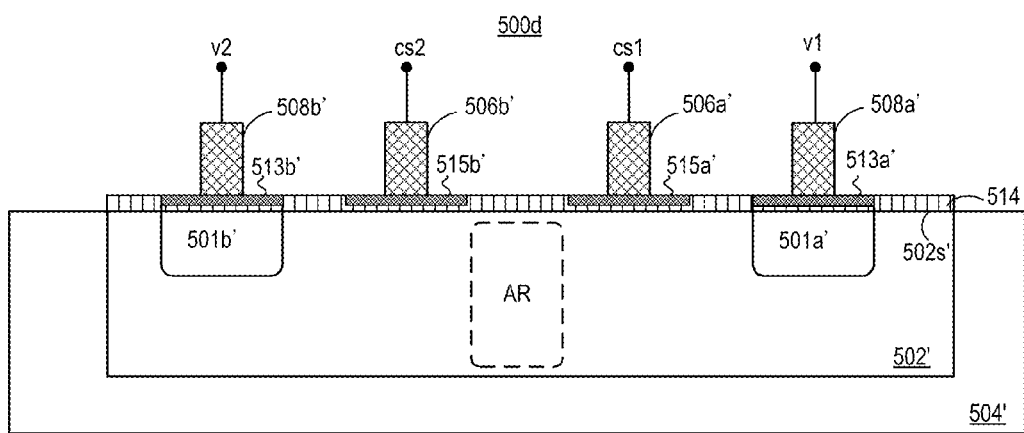

FIG. 5D illustrates a cross-sectional view of a photo-detecting apparatus, according to some embodiments. The photo-detecting apparatus 500d in FIG. 5D is similar to the photo-detecting apparatus in FIG. 5B, where the difference is described below. The photo-detecting apparatus 500d may be devoid of second doped regions 503a', 503b'. That is, the regions of the absorption layer 502' right under the control contact layers 506a', 506b' may be intrinsic or include a dopant and has a dopant profile with a peak dopant concentration below approximately $1 \times 10^{15}$ $cm^{-3}$. The term "intrinsic" means that the regions of the semiconductor material, such as the absorption layer 502' and/or the passivation layer 514 right under the control contact layers 506a', 506b' are without intentionally adding dopants. In some embodiments, the control contact layers 506a', 506b' on the absorption layer 502' may lead to formation of a Schottky contact, an Ohmic contact, or a combination thereof having an intermediate characteristic between the two, depending on various factors including the material of the absorption layer 502', the material of the control contact layers 506a', 506b', the material of the passivation layer 514, the material of the second silicide regions 515a', 515b', and the impurity or defect level of the absorption layer 502'.

Figure 5E:
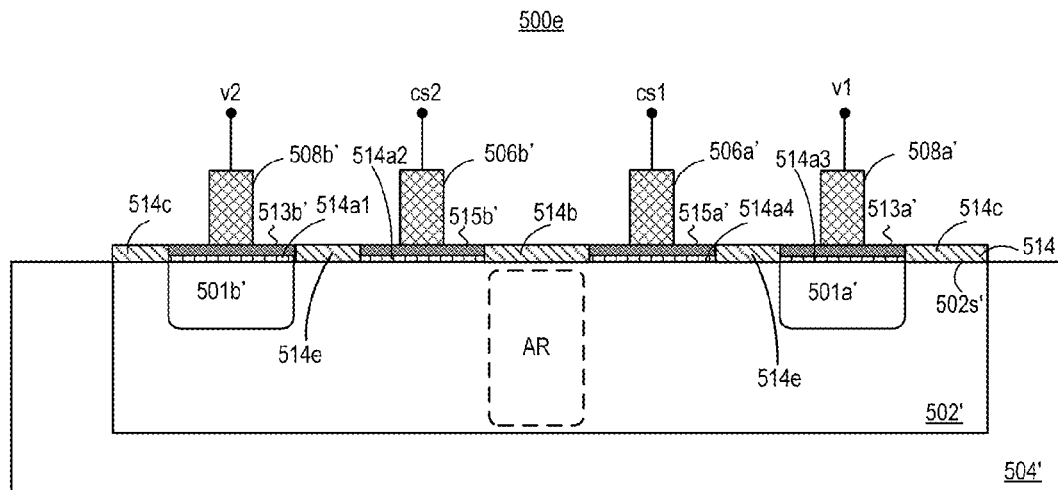

FIG. 5E illustrates a cross-sectional view of a photo-detecting apparatus, according to some embodiments. The photo-detecting apparatus 500e in FIG. 5E is similar to the photo-detecting apparatus 500c in FIG. 5C, where the difference is described below. The photo-detecting apparatus 500e may be devoid of the second doped regions 503a', 503b', which is similar to described in FIG. 5D.

Figure 5F:
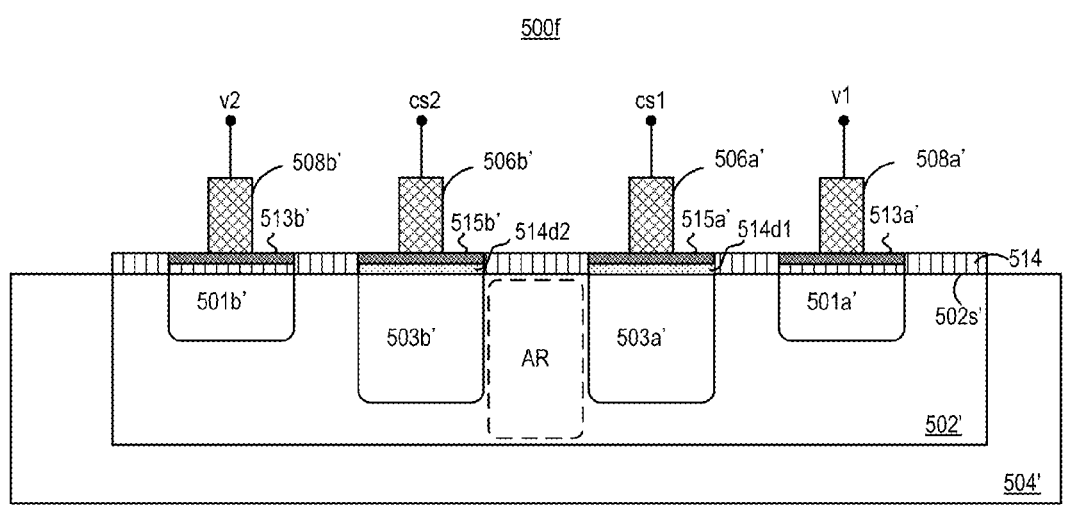

FIG. 5F illustrates a cross-sectional view of a photo-detecting apparatus, according to some embodiments. The photo-detecting apparatus 500f in FIG. 5F is similar to the photo-detecting apparatus 500b in FIG. 5B, where the difference is described below. The passivation layer 514 includes two intermediate regions 514d1, 514d2 separated from each other. The intermediate region 514d1 is between second doped region 503a' and the control contact layers 506a'. In some embodiments, the passivation layer 514 includes semiconductor material. In some embodiments, the intermediate region 514d1 is between second doped region 503a' and the second silicide regions 515a'. The intermediate region 514d2 is between second doped region 503b' and the control contact layers 506b'. In some embodiments, the intermediate region 514d2 is between second doped region 503b' and the second silicide regions 515b'. In some embodiments, the intermediate regions 514d1, 514d2 may be intrinsic. In some embodiments, the intermediate regions 514d1, 514d2 is of a conductivity type the same or different from the second conductivity type of the second doped regions 503a', 503b'. In some embodiments, each of the intermediate regions 514d1, 514d2 includes a dopant and a dopant profile. The peak dopant concentrations of the intermediate regions 514d1, 514d2 is less than the peak dopant concentrations of the second doped regions 503a', 503b'. In some embodiments, the peak dopant concentrations of the intermediate regions 514d1, 514d2 is between $5 \times 10^{16}$ $cm^{-3}$ to $5 \times 10^{17}$ $cm^{-3}$. Since the peak dopant concentrations of the intermediate regions 514d1, 514d2 is less than the peak dopant concentrations of the second doped regions 503a', 503b', the intermediate regions 514d1, 514d2 can block the electrical conduction between the second doped regions 503a',503b' through the passivation layer 514 and also block the electrical conduction between the second doped regions 503a', 503b' along the interface between the passivation layer 514 and the absorption layer 502'.

In some embodiments, a method for manufacturing the photo-detecting apparatus 500f includes steps of forming the first doped regions 501a', 501b'; forming the second doped regions 503a', 503b' in the absorption layer 502'; forming the passivation layer 514 over the first surface 502s' of the absorption layer 502'.

In some embodiments, the step of forming the passivation layer 514 over the first surface 502s' of the absorption layer 502' includes forming a semiconductor layer over the first surface 502s' of the absorption layer 502'; and forming the intermediate regions 514d1, 514d2 in the semiconductor layer by any suitable method, such as doping dopants in the part of the semiconductor layer over the second doped regions 503a', 503b' respectively.

In some embodiments, the method for manufacturing the photo-detecting apparatus 500f further includes forming the first silicide regions 513a', 513b' and the second silicide regions 515a', 515b' in the passivation layer 514.

In some embodiments, the step of forming the first doped regions 501a', 501b' includes doping a first dopant in the absorption layer 502' before the step of forming the passivation layer 514 over the first surface 502s' of the absorption layer 502'. In some embodiments, the step of forming the first doped regions 501a', 501b' further includes doping a first dopant in the passivation layer 514 after the step of forming the passivation layer 514 over the first surface 502s' of the absorption layer 502'.

Figure 5G:
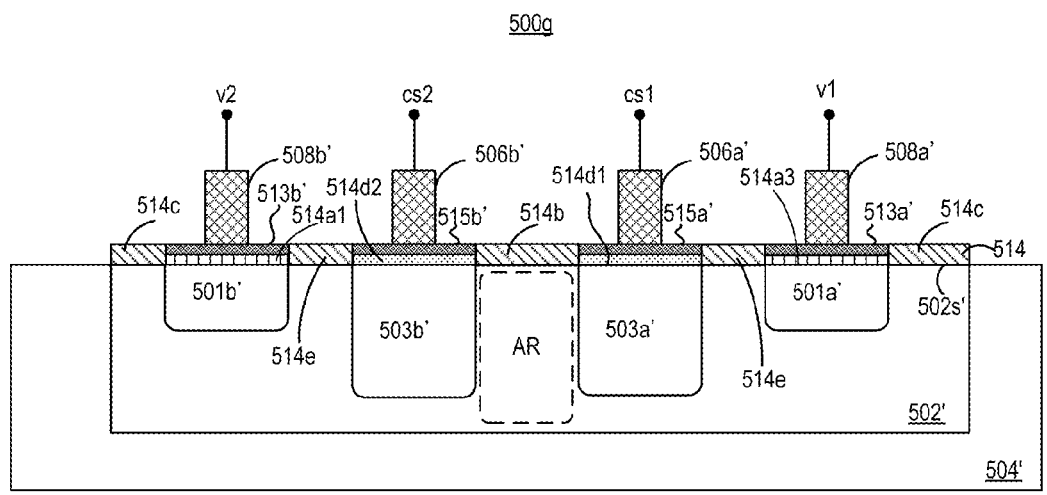

FIG. 5G illustrates a cross-sectional view of a photo-detecting apparatus, according to some embodiments. The photo-detecting apparatus 500g in FIG. 5G is similar to the photo-detecting apparatus 500c in FIG. 5C, where the difference is described below. The passivation layer 514 includes two intermediate regions 514d1, 514d2 similar to the intermediate regions 514d1, 514d2 described in FIG. 5F. By the combination of the second region 514b and the intermediate regions 514d1, 514d2, the leakage current between the second doped regions 503a' 503b' can be further reduced.

Figure 5H:
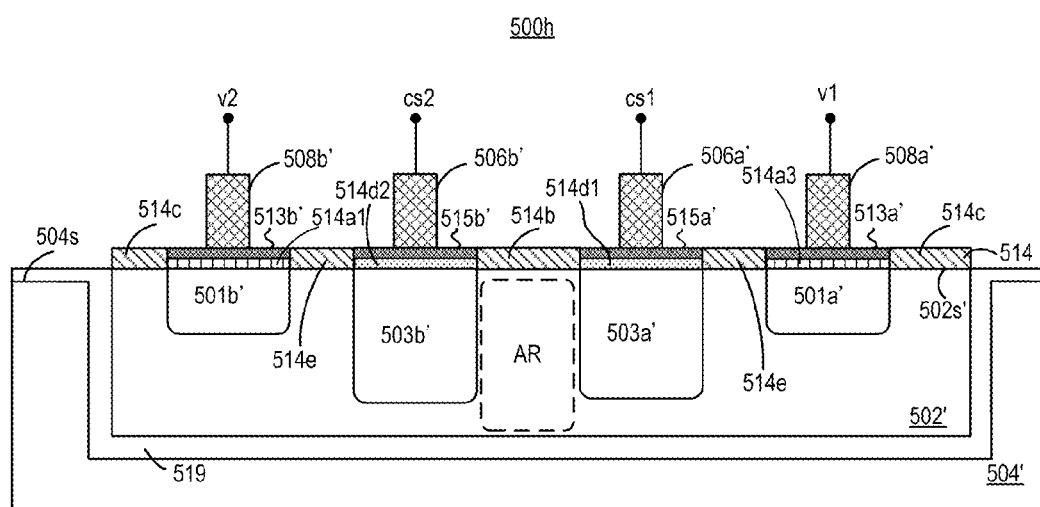

FIG. 5H illustrates a cross-sectional view of a photo-detecting apparatus, according to some embodiments. The photo-detecting apparatus 500h in FIG. 5H is similar to the photo-detecting apparatus 500g in FIG. 5G, where the difference is described below. The photo-detecting apparatus 500h further includes a blocking layer 519 surrounding at least a portion of the absorption layer 502'. In some embodiments, the blocking layer 519 is of a conductivity type the same as a conductivity type of the absorption layer 502'. The blocking layer 519 may block photo-generated charges in the absorption layer 502' from reaching the substrate 504', which increases the collection efficiency of photo-generated carriers of the photo-detecting apparatus 500h. The blocking layer 519 may also block photo-generated charges in the substrate 504' from reaching the absorption layer 502', which increases the speed of photo-generated carriers of the photo-detecting apparatus 500h. The blocking layer 519 may include a material the same as the material of the absorption layer 502', the same as the material of the substrate 504', a material as a combination of the material of the absorption layer 502' and the material of the substrate 504', or different from the material of the absorption layer 502' and the material of the substrate 504'. In some embodiments, the shape of the blocking layer 519 may be but not limited to a ring. In some embodiments, the blocking layer 519 may reach the first surface 504s of the substrate 504'. In some embodiments, the blocking layer 519 includes a dopant and has a dopant profile with a peak dopant concentration ranging from $1 \times 10^{15}$ cm$^{-3}$ to $1 \times 10^{20}$ cm$^{-3}$. The blocking layer 519 may reduce the cross talk between two adjacent pixels.

In some embodiments, the photo-detecting apparatus 500h further includes a conductive layer (not shown) electrically connected to the blocking layer 519. The blocking layer 519 may be biased through the conductive layer by a bias voltage to discharge carriers not collected by the first doped regions 501a', 501b'.

Figure 6A:
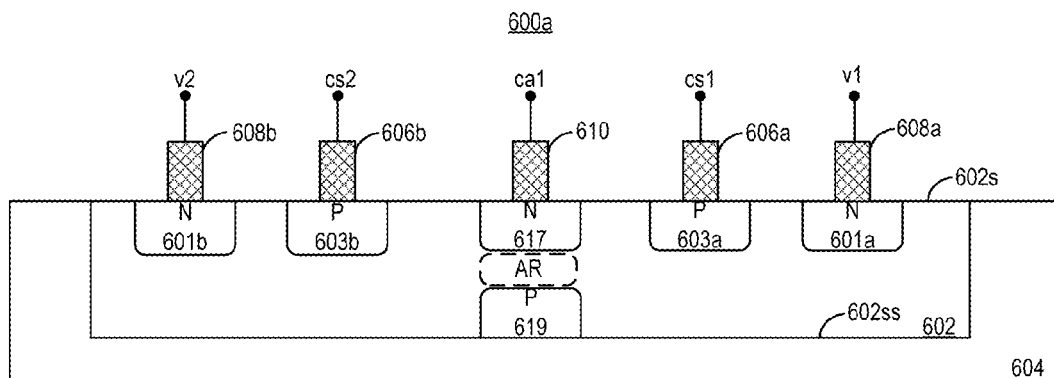
FIGS. 6A-6C illustrate cross-sectional views of a photo-detecting apparatus with boosted charge transfer speed, according to some embodiments.

FIG. 6A illustrates a cross-sectional view of a photo-detecting apparatus with boosted charge transfer speed, according to some embodiments. The photo-detecting apparatus 600a includes control metal lines 606a, 606b and readout metal lines 608a, 608b. The control metal lines 606a, 606b and the readout metal lines 608a, 608b are electrically coupled to the surface 602s of the germanium-based light absorption material 602. The control metal lines 606a, 606b are respectively electrically coupled to the P-type regions 603a, 603b on the surface 602s, and the readout metal line 608a, 608b are respectively electrically coupled to the N-type regions 601a, 601b on the surface 602s. The embodiment of FIG. 6A adds an N-type region 617 on the surface 602s and a P-type region 619 on the surface 602ss. The N-type region 617 and P-type region 619 are formed substantially on the center of the germanium-based light absorption material 602, which is a location that the optical signal IL may pass through. Due to the fact that the N-type region 617 and P-type region 619 are collectively formed as a PN-junction, there are built-in vertical electrical fields established between N-type region 617 and P-type region 619, which may assist separating the electron-hole pairs generated by the absorbed photons, where the electrons tends to move toward the N-type region 617 and the holes tends to move toward the P-type region 619. The N-type region 617 is operated to collect the electrons and the P-type region 619 is operated to collect the holes. The electrons stored in the N-type region 617 may be moved to N-type region 601a or N-type region 601b according to the control signals cs1, cs2. Notably, the metal line 610 can be floating or be biased by a bias voltage ca1 depending on the operation of photo-detecting apparatus 600a. In one implementation, doping concentration of the N-type regions 601a, 601b are higher than a doping concentration of the N-type region 617.

Figure 6B:
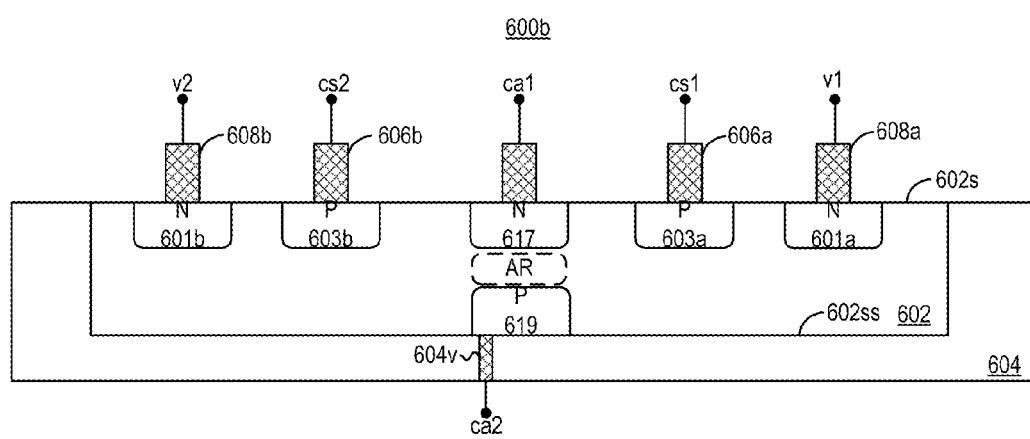

FIG. 6B illustrates a cross-sectional view of a photo-detecting apparatus with boosted charge transfer speed, according to some embodiments. This embodiment is similar to the photo-detecting apparatus 600a. The difference is that the P-type region 619 can be biased though a silicon via 604v, in which the holes collected in the P-type region 619 can be discharged through the silicon via 604v, which is biased by a bias voltage ca2 thereon.

Figure 6C:
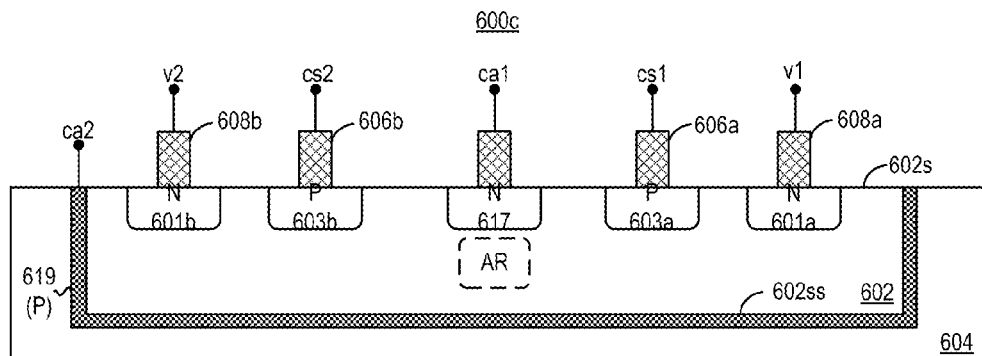

FIG. 6C illustrates a cross-sectional view of a photo-detecting apparatus with boosted charge transfer speed, according to some embodiments. The embodiment of FIG. 6C is similar to the photo-detecting apparatus 600b. The difference is that a P-type region 619 is formed as a U-shape or a well-shape underneath and surrounding the germanium-based light absorption material 602. Also, this P-type region 619 is electrically coupled to a bias voltage ca2. Therefore, the photo-generated holes can be collected and discharged by the P-type region 619.

Figure 6D:
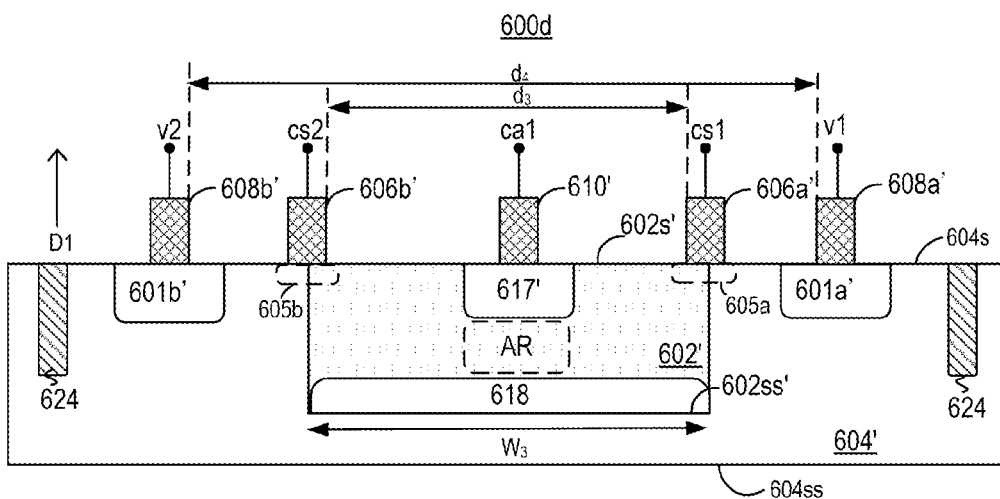
FIGS. 6D-6V illustrate cross-sectional views of a photo-detecting apparatus, according to some embodiments.

FIG. 6D illustrates a cross-sectional view of a photo-detecting apparatus, according to some embodiments. The photo-detecting apparatus 600d includes a substrate 604'. The photo-detecting apparatus further includes a pixel (not labeled) including an absorption layer 602' supported by a substrate 604'. The pixel includes an absorbed region AR in the absorption layer 602' and defined by a light shield (not shown). The absorption layer 602' includes a first surface 602s' and a second surface 602ss' opposite to the first surface 602s'. The absorbed region AR is a virtual area receiving an optical signal incoming through an optical window of the light shield. The pixel includes a first switch (not labeled) and a second switch (not labeled) electrically coupled to the absorption layer 602'. The first switch includes a control contact layer 606a' and a readout contact layer 608a'. The second switch includes a control contact layer 606b' and a readout contact layer 608b'. In some embodiments, the readout contact layers 608a', 608b' are on a first surface 604s of the substrate 604'. In some embodiments, the readout contact layers 608a', 608b' are disposed at two opposite sides of the absorbed region AR. In some embodiments, a width of the absorbed region AR is less than a distance $d_3$ between the control contact layers 606a', 606b'. In some embodiments, the control contact layers 606a', 606b' are disposed at two opposite sides of the absorbed region AR. In some embodiments, the first surface 602s' of the absorption layer 602' is substantially flush with the first surface 604s of the substrate 604'. The photo-detecting apparatus 600d includes multiple repeating pixels. The photo-detecting apparatus 600d includes a pixel-array including multiple repeating pixels. In some embodiments, the pixel-array may be a one-dimensional or a two-dimensional array of pixels.

In some embodiments, the control contact layers 606a', 606b' are on both of the first surface 604s of the substrate 604' and the first surface 602s' of the absorption layer 602'. In other words, a part of the control contact layers 606a', 606b' is over the first surface 604s' of the substrate 604' and the other part of the control contact layers 606a', 606b' is over the first surface 602s' of the absorption layer 602'. In some embodiments, the control contact layers 606a', 606b' are on a part of the interface between the substrate 604' and the absorption layer 602'. In some embodiments, a distance $d_3$ between the control contact layers 606a', 606b' is less than a width $w_3$ of the absorption layer 602'. In some embodiments, a distance $d_4$ between the readout contact layers 608a', 608b' is greater than the width $w_3$ of the absorption layer 602'.

In some embodiments, un-doped regions 605a, 605b are right under the control contact layers 606a', 606b'. That is, the portions of the absorption layer 602' and the substrate 604' right under the control contact layers 606a', 606b' may be intrinsic or include a dopant and has a dopant profile with a peak dopant concentration below approximately $1 \times 10^{15}$ cm$^{-3}$. The term "intrinsic" means that the portions of the semiconductor material right under the control contact layers 606a', 606b' are without intentionally adding dopants. In some embodiments, the control contact layers 606a', 606b' on the absorption layer 602' and the substrate 604' may lead to formation of a Schottky contact, an Ohmic contact, or a combination thereof having an intermediate characteristic between the two, depending on various factors including the material of the absorption layer 602', the material of the substrate 604', the material of the control contact layers 606a', 606b', and the impurity or defect level of the absorption layer 602' as well as the substrate 604'.

The pixel further includes two control signals cs1, cs2 controlling the control contact layers 606a', 606b' for controlling the moving direction of the electrons or holes generated by the absorbed photons in the absorption layer 602'. For example, when voltages are used, if the control signal cs1 is biased against the control signal cs2, an electric field is created between the two portions right under the control contact layers 606a', 606b', and free charges drift towards one of the two portions right under the readout contact layers 608b' 608a' depending on the direction of the electric field.

In some embodiments, the pixel further includes a first readout circuit (not shown) and a second readout circuit (not shown) electrically coupled to the first switch and the second switch respectively for processing the collected charges. The first readout circuit is electrically coupled to the readout contact layer 608a'. The second readout circuit is electrically coupled to the readout contact layer 608b'.

In some embodiments, the first switch includes a first doped region 601a' under the readout contact layers 608a'. The second switch includes a first doped region 601b under the readout contact layers 608b'.

In some embodiments, the first doped regions 601a', 601b' are of a first conductivity type. In some embodiments, each of the first doped regions 601a', 601b' include a first dopant and a dopant profile. The peak dopant concentrations of the first doped regions 601a', 601b' depend on the material of the readout contact layers 608a', 608b' and the material of the absorption layer 602', for example, between $5 \times 10^{18}$ cm$^{-3}$ to $5 \times 10^{20}$ cm$^{-3}$. The first doped regions 601a', 601b' are for collecting the carriers generated from the absorbed region AR in the absorption layer 602', which are further processed by the first readout circuit (not shown) and the second readout circuit (not shown) respectively based on the control of the two control signals cs1, cs2.

The pixel of the photo-detecting apparatus 600d further includes a third doped region 617' in the absorption layer 602'. The third doped region 617' is of a third conductivity type the same as the first conductivity type of the first doped regions 601a', 601b'. The pixel of the photo-detecting apparatus 600d further includes a fourth doped region 618 in the absorption layer 602'. In some embodiments, the fourth doped region 618 is between the third doped region 617' and the second surface 602ss'. In some embodiments, the third doped region 617' includes a third dopant and has a dopant profile with a peak between $1 \times 10^{18}$ cm$^{-3}$ and $5 \times 10^{20}$ cm$^{-3}$. The peak dopant concentration of the third doped region 617' is closer to the first surface 602s' of the absorption layer 602' than the second surface 602ss' of the absorption layer 602'. In some embodiments, a distance between a location of the third doped region 617' having the peak dopant concentration and the first surface 602s' of the absorption layer 602' is not more than 50 nm. In some embodiments, the fourth doped region 618 includes a fourth dopant and is of a fourth conductivity type different from the third conductivity type of the third doped region 617'. In some embodiments, the fourth doped region 618 includes a fourth dopant and has a dopant profile with a peak dopant concentration between $1 \times 10^{18}$ cm$^{-3}$ and $5 \times 10^{20}$ cm$^{-3}$. The peak dopant concentration of the fourth doped region 618 is closer to the second surface 602ss' of the absorption layer 602' than the first surface 602s' of the absorption layer 602'.

Since the third doped region 617' and fourth doped region 618 are collectively formed as a vertical photodiode, there is a built-in vertical electrical field established between third doped region 617' and fourth doped region 618, which may assist in separating the electron-hole pairs generated by the absorbed photons, for example, when the third doped region 617' is of n-type and the fourth doped region 618 is of p-type, the electrons tends to move toward the third doped region 617' and the holes tends to move toward the fourth doped region 618. The third doped region 617' is operated to collect the electrons and the fourth doped region 618 is operated to collect the holes. The electrons stored in the third doped region 617' may be moved to first doped region 601b' or the first doped region 601a' based on the control signals cs1, cs2. Therefore, the quantum efficiency of the photo-detecting apparatus 600d is higher and the amount of the carriers moving toward the first doped region 601b' or the first doped region 601a' is also higher.

In some embodiment, the photo-detecting apparatus 600d further includes an isolation region 624 at least disposed at two opposite sides of the absorption layer 602' from a cross-sectional view of the photo-detecting apparatus 600d. The isolation region 624 is in the substrate 604' and physically separated from the absorption layer 602'. In some embodiments, the isolation region 624 is a trench filled with a dielectric material or an insulating material to serve as a region of high electrical resistance between the two adjacent pixels, impeding a flow of current across the isolation region 624 and improving electrical isolation between the adjacent pixels. The dielectric material or an insulating material may include, but is not limited to oxide material including $SiO_2$ or nitride material including $Si_3N_4$ or silicon material including amorphous-Si, poly-Si, monocrystalline-Si or epitaxial-Si.

In some embodiments, the isolation region 624 extends from a first surface 604s of the substrate 604' and extends into a predetermined depth from the first surface 604s. In some embodiments, the isolation region 624 extends from a second surface 604ss of the substrate 604' and extends into a predetermined depth from the second surface 604ss. In some embodiments, the isolation region 624 penetrates though the substrate 604' from the first surface 604s to the second surface 604ss.

In some embodiments, the isolation region 624 is a doped region having a conductivity type. The conductivity type of the isolation region 624 can be different from or the same as the first conductivity type of the first doped regions 601a', 601b'. The doping of the isolation region 624 may create a bandgap offset-induced potential energy barrier that impedes a flow of current across the isolation region 624 and improving electrical isolation between the adjacent pixels. In some embodiments, the isolation region 624 includes a semiconductor material that is different from the material of the substrate 604'. An interface between two different semiconductor materials formed between the substrate 604' and the isolation region 624 may create a bandgap offset-induced energy barrier that impedes a flow of current across the isolation region 624 and improving electrical isolation between the adjacent pixels. In some embodiments, the shape of the isolation region 624 may be a ring. In some embodiments, the isolation region 624 may include two discrete regions disposed at the two opposite sides of the absorption layer 602'.

In some embodiments, the photo-detecting apparatus 600d further includes a conductive layer 610' on the first surface 602s' of the absorption layer 602'. The conductive layer 610' is on the third doped region 617'. The conductive layer 610' can be floating or be biased by a bias voltage ca1 depending on the operation of photo-detecting apparatus 600d.

Figure 6E:
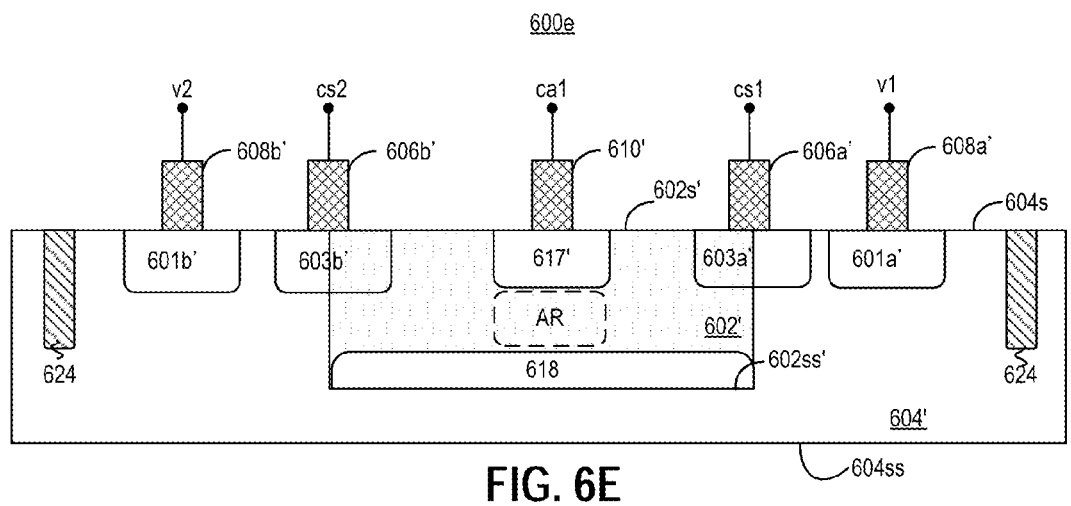

FIG. 6E illustrates a cross-sectional view of a photo-detecting apparatus, according to some embodiments. The photo-detecting apparatus 600e in FIG. 6E is similar to the photo-detecting apparatus 600d in FIG. 6D, where the difference is described below. In some embodiments, the first switch further includes a second doped region 603a' under the control contact layers 606a'. The second switch further includes a second doped region 603b' under the control contact layers 606b'. In some embodiments, the third doped region 617 is separated from the second doped regions 603a' 603b'. In some embodiments, the third doped region 617' is between the second doped regions 603a', 603b'. In some embodiments, a part of each of the second doped regions 603a', 603b' is formed in the absorption layer 602', and the other part of the second doped regions 603a', 603b' is formed in the substrate 604'. The second doped regions 603a', 603b are formed in both of the absorption layer 602' and the substrate 604'. In some embodiments, each of the second doped regions 603a', 603b' covers a part of the interface between the substrate 604' and the absorption layer 602'. In some embodiments, the second doped regions 603a', 603b' are of a second conductivity type different from the first conductivity type of the first doped regions 601b',603b'. In some embodiments, the second doped regions 603a', 603b' include a second dopant and a dopant profile. The peak dopant concentrations of the second doped regions 603a', 603b depend on the material of the control contact layers 606b', 606a' and the material of the absorption layer 602' and the material of the substrate 604', for example, between $1 \times 10^{17}$ cm$^{-3}$ to $5 \times 10^{20}$ cm$^{-3}$. In some embodiments, a concentration at the interface between the substrate 604' and the absorption layer 602' and covered by the second doped regions 603a', 603b' is between $1 \times 10^{17}$ cm$^{-3}$ to $5 \times 10^{20}$ cm$^{-3}$. The second doped regions 603a', 603b' forms a Schottky or an Ohmic contact or a combination thereof with the control contact layers 606b', 606a'. The second doped regions 603a', 603b' are for demodulating the carriers generated from the absorption layer 602' based on the control of the control signals cs1, cs2. By forming the second doped regions 603a', 603b' covering the interface between the substrate 604' and the absorption layer 602', the photo-detecting apparatus 600e can with a satisfied dark current and demodulation contrast at the same time. In some embodiments, the control contact layers 606b', 606a' can be entirely formed over the absorption layer 602' or be entirely formed over the substrate 604'.

Figure 6F:
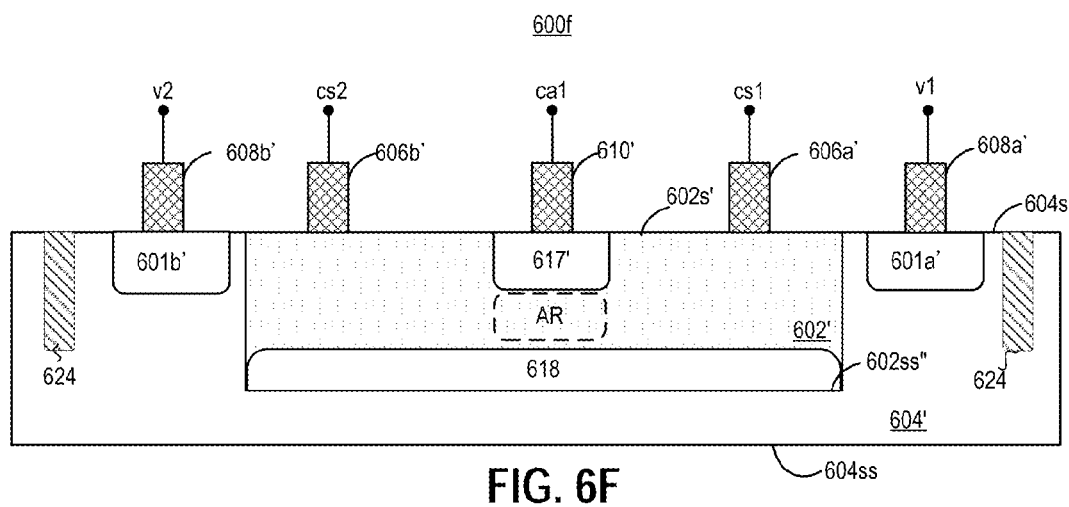

FIG. 6F illustrates a cross-sectional view of a photo-detecting apparatus, according to some embodiments. The photo-detecting apparatus 600f in FIG. 6F is similar to the photo-detecting apparatus 600d in FIG. 6D, where the difference is described below. The control contact layers 606a', 606b' are entirely formed on the first surface 602s' of the absorption layer 602'.

Figure 6G:
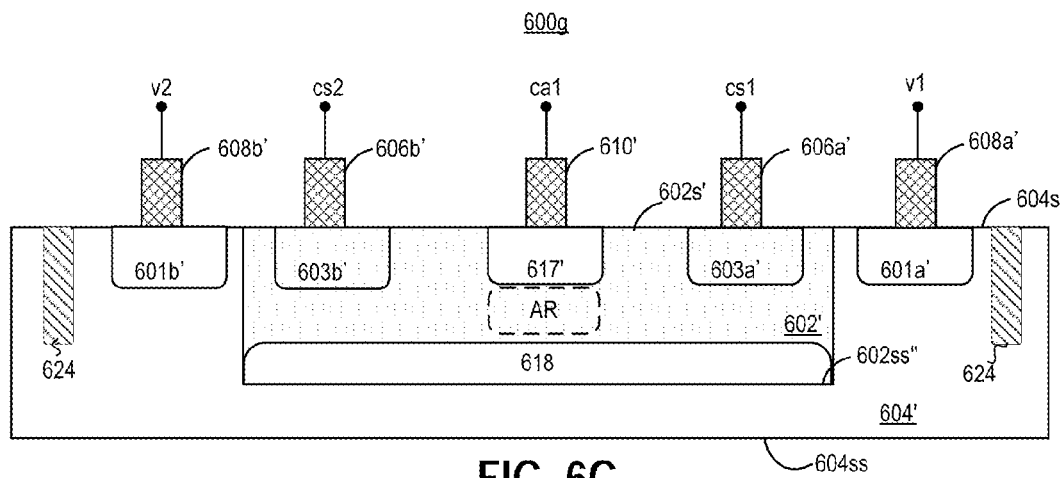

FIG. 6G illustrates a cross-sectional view of a photo-detecting apparatus, according to some embodiments. The photo-detecting apparatus 600g in FIG. 6G is similar to the photo-detecting apparatus 600f in FIG. 6F, where the difference is described below. In some embodiments, the first switch further includes a second doped region 603a' under the control contact layers 606a'. The second switch further includes a second doped region 603b' under the control contact layers 606b'. The second doped regions 603a', 603b' in FIG. 6G are similar to the second doped regions mentioned before, such as second doped regions 603a', 603b' as described in FIG. 6E, except that the second doped regions 603a', 603b' in FIG. 6G are entirely formed in the absorption layer 602'.

Figure 6H:
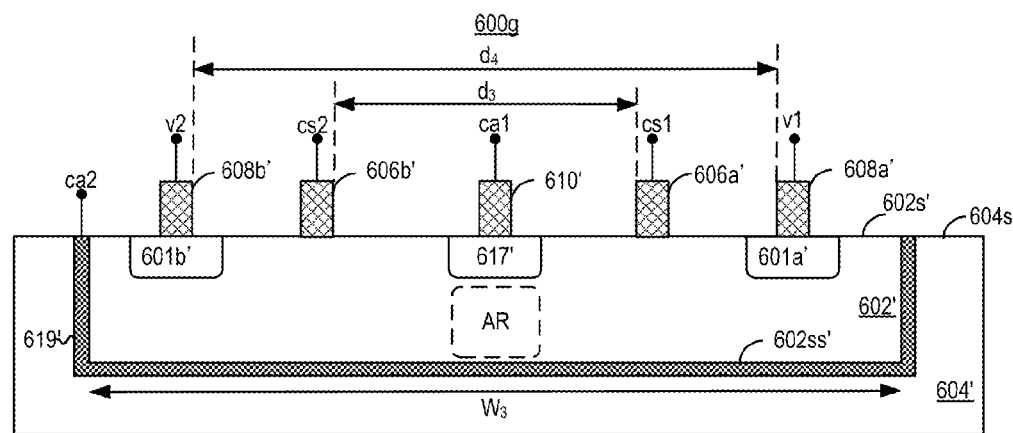

FIG. 6H illustrates a cross-sectional view of a photo-detecting apparatus, according to some embodiments. The photo-detecting apparatus 600h in FIG. 6H is similar to the photo-detecting apparatus 600d in FIG. 6D, where the difference is described below. In some embodiments, a distance $d_4$ between the readout contact layers 608a', 608b' is less than the width $w_3$ of the absorption layer 602'. In some embodiments, the photo-detecting apparatus 600g is devoid of the fourth doped region 618 as described in FIG. 6D. In some embodiments, the photo-detecting apparatus 600g further includes a blocking layer 619' surrounding at least a portion of the absorption layer 602'. In some embodiments, the blocking layer 619' is of a conductivity type the same as a conductivity type of the absorption layer 602. The blocking layer 619' may block photo-generated charges in the absorption layer 602' from reaching the substrate 604', which increases the collection efficiency of photo-generated carriers of the photo-detecting apparatus 600g. The blocking layer 619' may also block photo-generated charges in the substrate 604' from reaching the absorption layer 602', which increases the speed of photo-generated carriers of the photo-detecting apparatus 600g. The blocking layer 619' may include a material the same as the material of the absorption layer 602', the same as the material of the substrate 604', a material as a combination of the material of the absorption layer 602' and the material of the substrate 604', or different from the material of the absorption layer 602' and the material of the substrate 604'. In some embodiments, the shape of the blocking layer 619' may be but not limited to a ring. In some embodiments, the blocking layer 619' may reach the first surface 604s of the substrate 604'.

Since the third doped region 617' and blocking layer 619' are collectively formed as a vertical photodiode, there is a built-in vertical electrical field established between third doped region 617' and the blocking layer 619', which may assist in separating the electron-hole pairs generated by the absorbed photons in the absorption layer 602', for example, when the third doped region 617' is of n-type and the blocking layer 619' is of p-type, the electrons tend to move toward the third doped region 617' and the holes tends to move toward the blocking layer 619'. The third doped region 617' is operated to collect the electrons and serves as a preliminary collector. The blocking layer 619' is operated to collect the holes. The electrons stored in the third doped region 617' may be further moved to first doped region 601b' or the first doped region 601a' based on the control signals cs1, cs2. In some embodiments, the blocking layer 619' may be biased by a bias voltage ca2 to discharge carriers not collected by the first doped regions 601a', 601b'. Accordingly, the demodulation contrast of the photo-detecting apparatus 600g is improved.

Figure 6I:
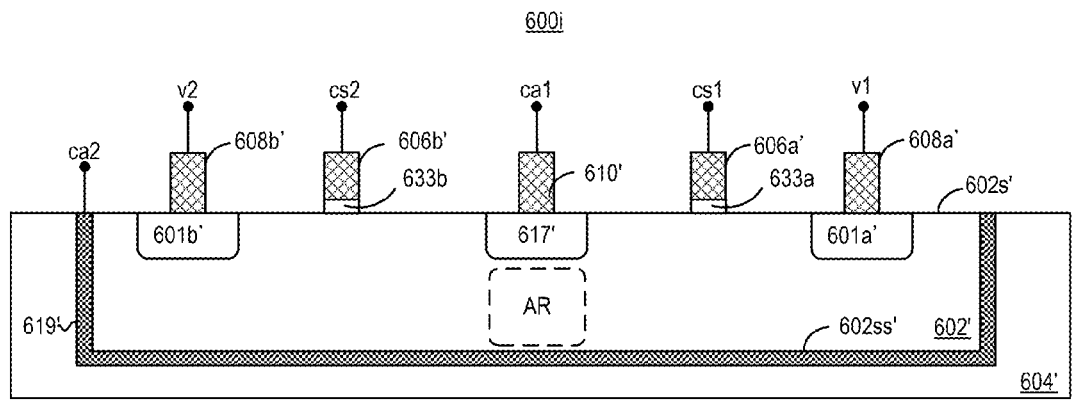

FIG. 6I illustrates a cross-sectional view of a photo-detecting apparatus, according to some embodiments. The photo-detecting apparatus 600i in FIG. 6I is similar to the photo-detecting apparatus 600g in FIG. 6G, where the difference is described below. In some embodiments, the first switch further includes a first dielectric layer 633a between the absorption layer 602' and the control contact layer 606a. The second switch may further include a second dielectric layer 633b between the absorption layer 602' and the control contact layer 606b. The first dielectric layer 633a prevents direct current conduction from the control contact layer 606a' to the absorption layer 602', but allows an electric field to be established within the absorption layer 602' in response to an application of a voltage to the control contact layer 606a'. The second dielectric layer 633b prevents direct current conduction from the control contact layer 606b' to the absorption layer 602' but allows an electric field to be established within the absorption layer 602' in response to an application of a voltage to the control contact layer 606b'. The established electric field may attract or repel charge carriers within the absorption layer 602'.

Figure 6J:
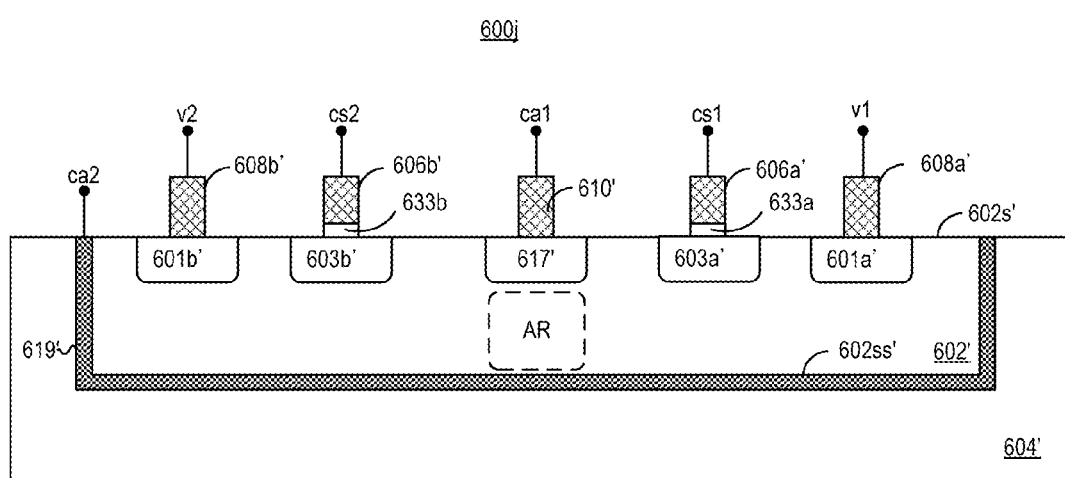

FIG. 6J illustrates a cross-sectional view of a photo-detecting apparatus, according to some embodiments. The photo-detecting apparatus 600j in FIG. 6J is similar to the photo-detecting apparatus 600i in FIG. 6I, where the difference is described below. In some embodiments, the first switch further includes a second doped region 603a' under the first dielectric layer 633a. The second switch further includes a second doped region 603b' under the second dielectric layer 633b. The second doped regions 603a', 603b' are similar to the second doped regions mentioned before, such as the second doped regions 603a', 603b' as described in FIG. 6G.

Figure 6K:
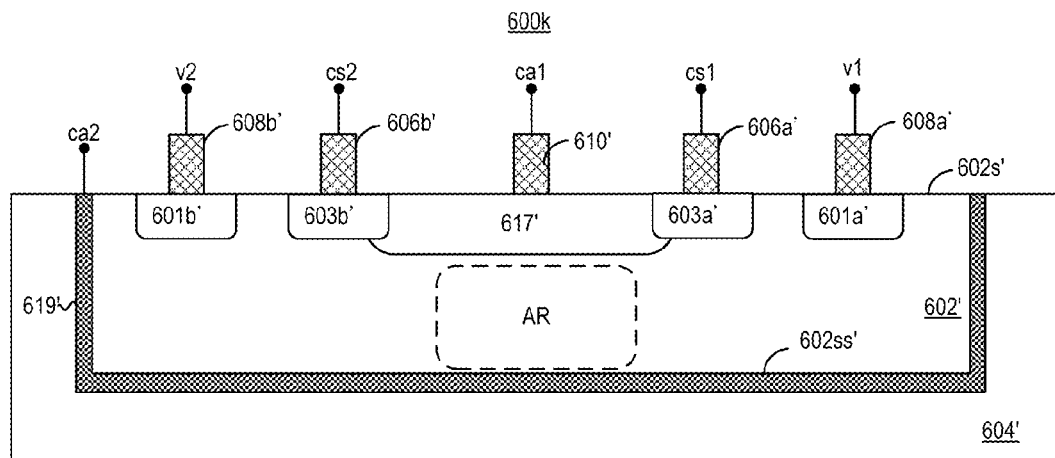

FIG. 6K illustrates a cross-sectional view of a photo-detecting apparatus, according to some embodiments. The photo-detecting apparatus 600k in FIG. 6K is similar to the photo-detecting apparatus 600h in FIG. 6H, where the difference is described below. In some embodiments, the third doped region 617' overlaps with a portion of the second doped region 603a' farther from the first doped region 601a' of the first switch. The third doped region 617' also overlaps with a part of the second doped region 603b' farther from the first doped region 601b' of the second switch. In some embodiments, the part of the second doped region 603a' farther from the first doped region 601a' includes both of the third dopant and the second dopant, wherein the third dopant is different from the second dopant. Similarly, the part of the second doped region 603b' farther from the first doped region 601b' includes both of the third dopant and the second dopant.

Figure 6L:
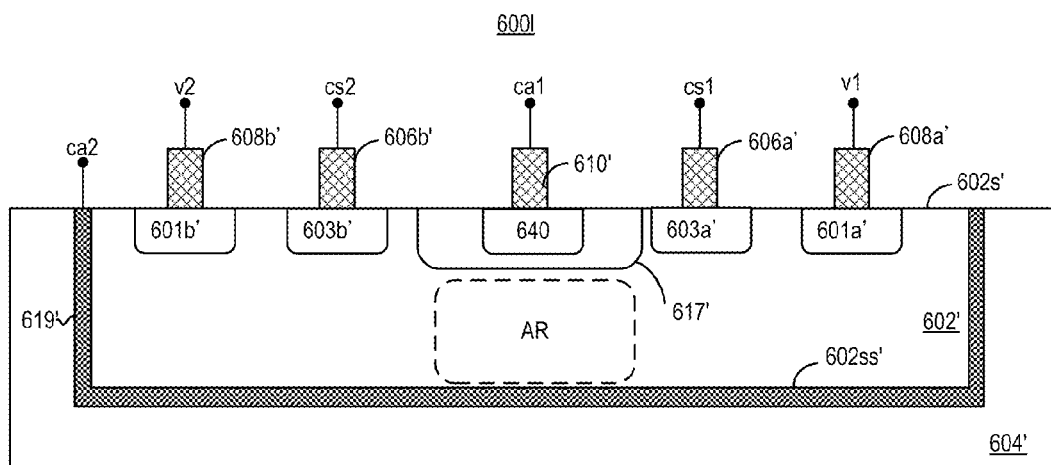

FIG. 6L illustrates a cross-sectional view of a photo-detecting apparatus, according to some embodiments. The photo-detecting apparatus 600l in FIG. 6L is similar to the photo-detecting apparatus 600h in FIG. 6H, where the difference is described below. In some embodiments, the absorption layer 602' of each pixel includes a hinder region 640. The hinder region 640 is between the second doped regions 603a', 603b' and is entirely overlapped with the third doped region 617'. In some embodiments, the hinder region 640 includes a dopant and is of a conductivity type different from the third conductivity type of the third doped region 617. In some embodiments, the hinder region 640 has a dopant and a dopant profile with a peak dopant concentration higher than the peak dopant concentration the third doped region 617. In some embodiments, the peak dopant concentration of the hinder region 640 is between $1\times10^{18}$a $cm^{-3}$ and $5\times10^{20}$ $cm^{-3}$.

The hinder region 640 can block the carriers to be collected from reaching the first surface 602s' of the absorption layer 602'. As a result, a surface leakage current between the two second doped regions 603a', 603b' of the photo-detecting apparatus 600l is reduced.

Figure 6M:
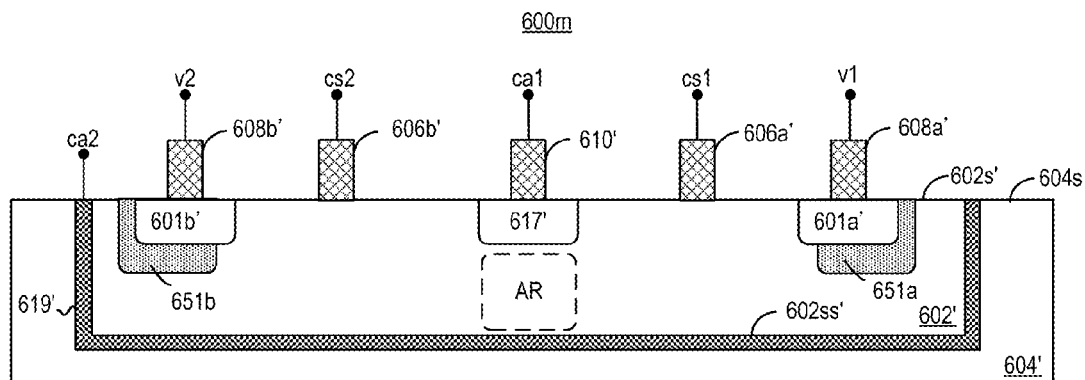

FIG. 6M illustrates a cross-sectional view of a photo-detecting apparatus, according to some embodiments. The photo-detecting apparatus 600m in FIG. 6M is similar to the photo-detecting apparatus 600g in FIG. 6G, where the difference is described below. In some embodiments, the pixel of the photo-detecting apparatus 600m further includes two counter-doped regions 651a, 651b in the absorption layer 602'. Each of the counter-doped regions 651a, 651b has a conductivity type different from the first conductivity type of the first doped regions 601a', 601b'. For example, if the photo-detecting apparatus is configured to process the collected electrons for further application, the first doped regions 601a', 601b' are of n-type, the third doped region 617' is of n-type, and the counter-doped regions 651a, 651b are of p-type. In some embodiments, the counter-doped regions 651a, 651b overlaps with a portion of the first doped region 601a', 601b' father from the third doped region 617', and the other portions of the first doped regions 601a', 601b' are not overlapped with the counter-doped region 651a, 651b. In some embodiments, each of the first doped regions 601a', 601b' is entirely overlapped with the respective counter-doped region 651a, 651b.

In some embodiments, each of the counter-doped regions 651a, 651b includes a dopant and a dopant profile with a peak dopant concentration. The peak dopant concentration is not less than $1\times10^{16}$ $cm^{-3}$. In some embodiment, the peak dopant concentrations of the counter-doped region 651a, 651b are lower than the peak dopant concentrations of the first doped regions 601b', 601a'. In some embodiments, the peak dopant concentration of the counter-doped region 651a, 651b is between $1\times10^{16}$ $cm^{-3}$ and $1\times10^{19}$ $cm^{-3}$. In some embodiments, the counter-doped regions 651a, 651b serve as dark-current reduction regions for reducing the dark current of the photo-detecting apparatus 600m. Compared to a photo-detecting apparatus devoid of counter-doped region 651a, 651b, the photo-detecting apparatus including counter-doped region 651a, 651b overlapping at least a portion of the first doped regions 601a', 601b' has thinner depletion regions in the absorption layer 602, and thus the photo-detecting apparatus 600m is with lower dark current.

Figure 6N:
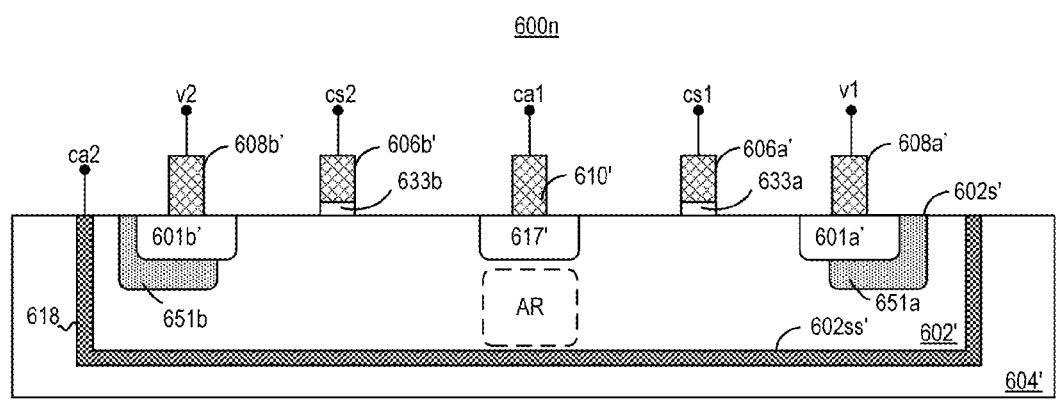

FIG. 6N illustrates a cross-sectional view of a photo-detecting apparatus, according to some embodiments. The photo-detecting apparatus 600n in FIG. 6N is similar to the photo-detecting apparatus 600m in FIG. 6M, where the difference is described below. In some embodiments, the first switch further includes a first dielectric layer 633a between the absorption layer 602' and the control contact layer 606a'. The second switch may further include a second dielectric layer 633b between the absorption layer 602' and the control contact layer 606b'. The first dielectric layer 633a and the second dielectric layer 633b are similar to the first dielectric layer 633a and the second dielectric layer 633b as described in FIG. 6I.

Figure 6O:
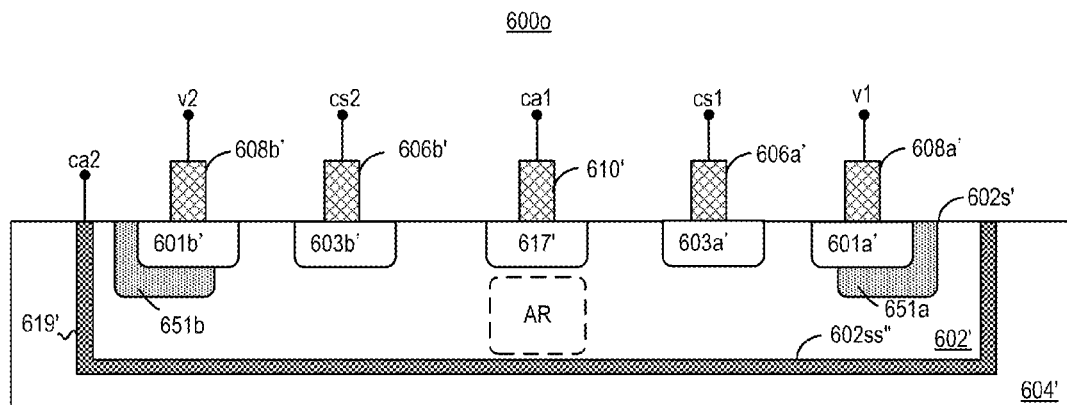

FIG. 6O illustrates a cross-sectional view of a photo-detecting apparatus, according to some embodiments. The photo-detecting apparatus 600o in FIG. 6O is similar to the photo-detecting apparatus 600m in FIG. 6M, where the difference is described below. In some embodiments, the first switch further includes a second doped region 603a' under the control contact layers 606a'. The second switch further includes a second doped region 603b' under the control contact layers 606b'. The second doped regions 603a', 603b' are similar to the second doped regions mentioned before, such as the second doped regions 603a', 603b' as described in FIG. 6G.

Figure 6P:
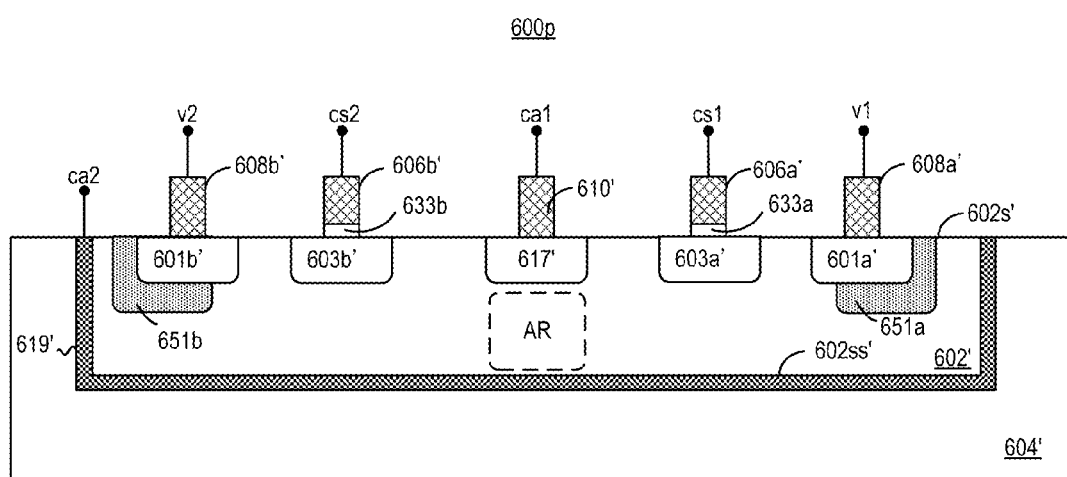

FIG. 6P illustrates a cross-sectional view of a photo-detecting apparatus, according to some embodiments. The photo-detecting apparatus 600p in FIG. 6P is similar to the photo-detecting apparatus 600o in FIG. 6O, where the difference is described below. In some embodiments, the first switch further includes a first dielectric layer 633a between the absorption layer 602' and the control contact layer 606a'. The second switch may further include a second dielectric layer 633b between the absorption layer 602' and the control contact layer 606b'. The first dielectric layer 633a and the second dielectric layer 633b are similar to the first dielectric layer 633a and the second dielectric layer 633b as described in FIG. 6I.

Figure 6Q:
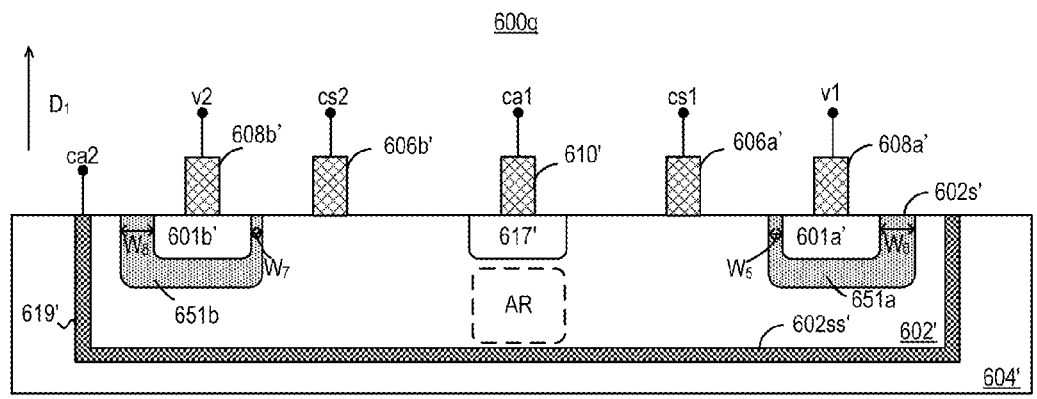

FIG. 6Q illustrates a cross-sectional view of a photo-detecting apparatus, according to some embodiments. The photo-detecting apparatus 600q in FIG. 6Q is similar to the photo-detecting apparatus 600m in FIG. 6M, where the difference is described below. In some embodiments, the entire first doped region 601a' is overlapped with the counter-doped region 651a. In some embodiments, the counter-doped region 651a is an asymmetric profile relative to the first doped region 601a' from the cross-sectional view of the photo-detecting device 600q. The asymmetric profile of the counter-doped region 651a is relative to the first doped region 601a'. In some embodiments, the counter-doped region 651a includes a first portion (not labeled) and a second portion (not labeled). The first portion is closer to the third doped region 617' than the second portion is. The first portion has a first width $W_5$, and the second portion has a second width $W_6$ greater than the first width $W_5$. In some embodiments, the entire first doped region 601b' is overlapped with the counter-doped region 651b. In some embodiments, the counter-doped region 651b is an asymmetric profile relative to the first doped region 601b' from the cross-sectional view of the photo-detecting device 600q. The asymmetric profile of the counter-doped region 651b is relative to the first doped region 601b'. In some embodiments, the counter-doped region 651b includes a first portion (not labeled) and a second portion (not labeled). The first portion is closer to the third doped region 617' than the second portion is. The first portion has a first width $W_7$, and the second portion has a second width $W_8$ greater than the first width $W_7$. In some embodiments, the first switch further includes a first dielectric layer 633a between the absorption layer 602' and the control contact layer 606a'. In some embodiments, the second switch may further include a second dielectric layer 633b between the absorption layer 602' and the control contact layer 606b'. The first dielectric layer 633a and the second dielectric layer 633b are similar to the first dielectric layer and the second dielectric layer respectively as mentioned before, such as the first dielectric layer 633a and the second dielectric layer 633b as described in FIG. 6I.

Figure 6R:
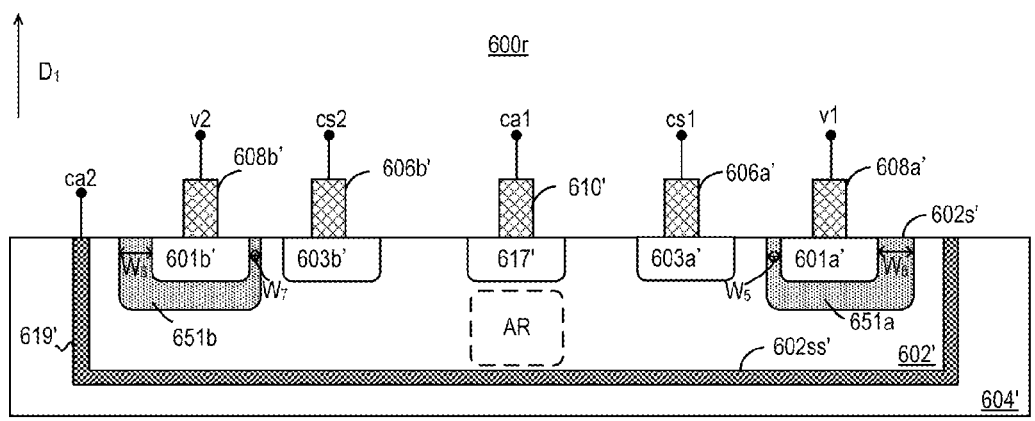

FIG. 6R illustrates a cross-sectional view of a photo-detecting apparatus, according to some embodiments. The photo-detecting apparatus 600r in FIG. 6R is similar to the photo-detecting apparatus 600q in FIG. 6Q, where the difference is described below. In some embodiments, the first switch further includes a second doped regions 603a' under the control contact layers 606a'. The second switch further includes a second doped regions 603b' under the control contact layers 606b'. The second doped regions 603a', 603b' are similar to the second doped regions as mentioned before, such as the second doped regions 603a', 603b' as described in FIG. 6G. In some embodiments, the first switch further includes a first dielectric layer 633a between the second doped regions 603a' and the control contact layer 606a'. In some embodiments, the second switch may further include a second dielectric layer 633b between the second doped regions 603b' and the control contact layer 606b'. The first dielectric layer 633a and the second dielectric layer 633b are similar to the first dielectric layer and the second dielectric layer mentioned before, such as the first dielectric layer 633a and the second dielectric layer 633b as described in FIG. 6I.

Figure 6S:
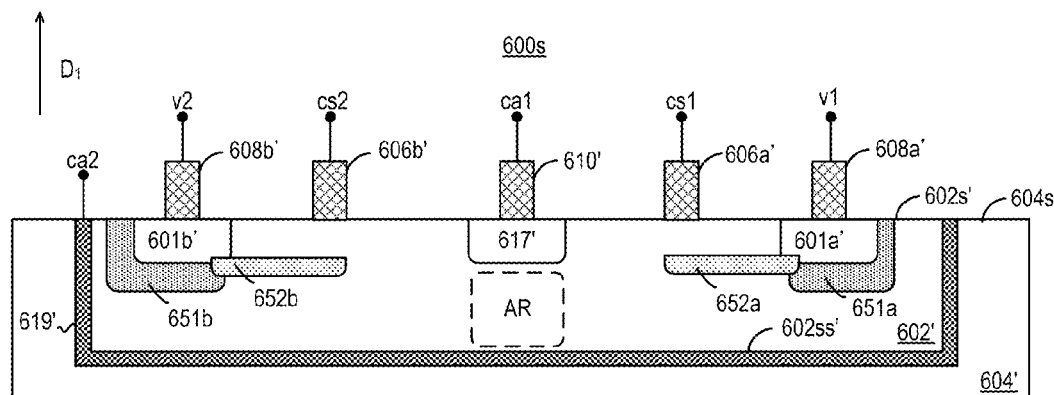

FIG. 6S illustrates a cross-sectional view of a photo-detecting apparatus, according to some embodiments. The photo-detecting apparatus 600s in FIG. 6S is similar to the photo-detecting apparatus 600m in FIG. 6M, where the difference is described below. The pixel of the photo-detecting apparatus 600s further includes two buried counter-doped regions 652a, 652b in the absorption layer 602'. In some embodiments, the buried counter-doped region regions 652a, 652b are separated from the first surface 602s' of the absorption layer 602'. In some embodiments, the buried counter-doped region 652a is overlapped with the counter-doped region 651a. In some embodiments, the buried counter-doped region 652b is overlapped with the counter-doped region 651b. The counter-doped region 651a, 651b and the buried counter-doped region regions 652a, 652b can be formed in different steps such as by different masks. In some embodiments, the buried counter-doped region 652a extends from the counter-doped region 651a toward the third doped region 617'. In some embodiments, the buried counter-doped region 652b extends from the counter-doped region 651b toward the third doped region 617'. In some embodiments, a part of the buried counter-doped region 652a is between the control contact layer 606a' and the second surface 602ss'. In some embodiments, a part of the buried counter-doped region 652b is between the control contact layer 606b' and the second surface 602ss'. In some embodiments, each of the buried counter-doped regions 652a,652b is of a conductivity type different from the first conductivity type of the first doped regions 601b',601a'. In some embodiments, each of the buried counter-doped regions 652a, 652b includes a dopant and a dopant profile with a peak dopant concentration. The peak dopant concentration is not less than $1\times10^{16}$ cm$^{-3}$. In some embodiment, the peak dopant concentrations of the buried counter-doped regions 652a, 652b are lower than the peak dopant concentrations of the first doped regions 601b', 601a'. In some embodiments, the peak dopant concentration of the buried counter-doped regions 652a, 652b is between $1\times10^{16}$ cm$^{-3}$ and $1\times10^{19}$ cm$^{-3}$. In some embodiments, a distance between the first surface 602s' of the absorption layer 602' and a location of the buried counter-doped regions 652a,652b with the peak dopant concentration is not less than 50 nm. In some embodiments, the distance between the second surface 602ss' and the location of the buried counter-doped regions 652a,652b with the peak dopant concentration is not less than 50 nm, or not less than 300 nm. In some embodiments, a distance between the first surface 602s' of the absorption layer 602' and a location of the buried counter-doped regions 652a, 652b having the peak dopant concentration is less than a distance between the second surface 602ss' and the location of the buried counter-doped regions 652a, 652b having the peak dopant concentration. In some embodiments, the distance between the first surface 602s' of the absorption layer 602' and the buried counter-doped regions 652a, 652b having the peak dopant concentration of is between 50 nm and 400 nm. The dopant profile of each of the buried counter-doped regions 652a, 652b can be controlled by any suitable method, such as by implantation including providing multiple implant doses and energies. In some embodiments, the dopants of the buried counter-doped regions 652a, 652b and the dopants of the counter-doped regions 651a, 651b can be the same.

By the combination of the buried counter-doped regions 652a, 652b and the counter-doped regions 651a, 651b, the flow of the carriers in the absorption layer 602' can be restricted in a certain path, and thus bulk dark current injection is reduced. For example, when the third doped region 617' is of n-type and the blocking layer 619' is of p-type, the electrons tend to move toward the third doped region 617' and the holes tends to move toward the blocking layer 619'. The third doped region 617' is operated to collect the electrons and serves as a preliminary collector. The electrons stored in the third doped region 617' may be further moved to first doped region 601b' or the first doped region 601a' through the regions between the first surface 602s' of the absorption layer 602' and the buried counter-doped regions 652a, 652b based on the control signals cs1, cs2. As a result, the dark current of the photo-detecting apparatus 600S is further reduced.

Figure 6T:
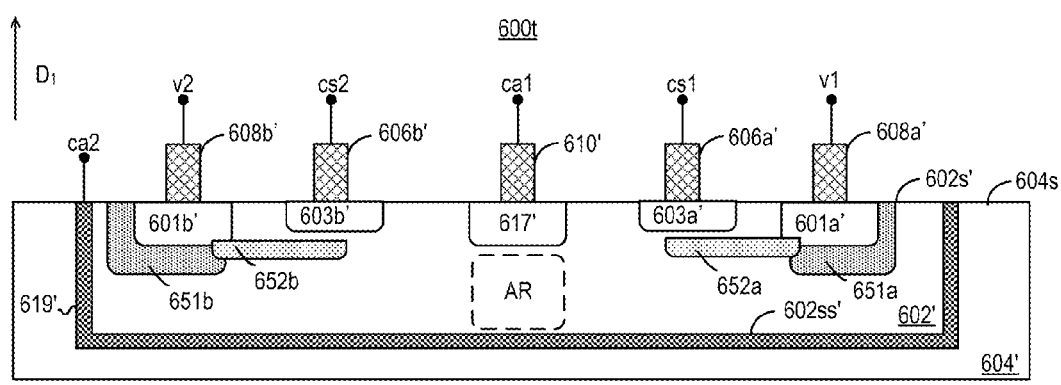

FIG. 6T illustrates a cross-sectional view of a photo-detecting apparatus, according to some embodiments. The photo-detecting apparatus 600t in FIG. 6T is similar to the photo-detecting apparatus 600s in FIG. 6S, where the difference is described below. In some embodiments, the first switch further includes a second doped region 603a' under the control contact layers 606a'. The second switch further includes a second doped region 603b' under the control contact layers 606b'. The second doped regions 603a', 603b' are similar to the second doped regions mentioned before, such as the second doped regions 603a', 603b' as described in FIG. 6G. In some embodiments, the first switch further includes a first dielectric layer 633a between the second doped regions 603a' and the control contact layer 606a'. In some embodiments, the second switch may further include a second dielectric layer 633b between the second doped regions 603b' and the control contact layer 606b'. The first dielectric layer 633a and the second dielectric layer 633b are similar to the first dielectric layer and the second dielectric layer mentioned before such as first dielectric layer 633a and the second dielectric layer 633b as described in FIG. 6I.

Figure 6U:
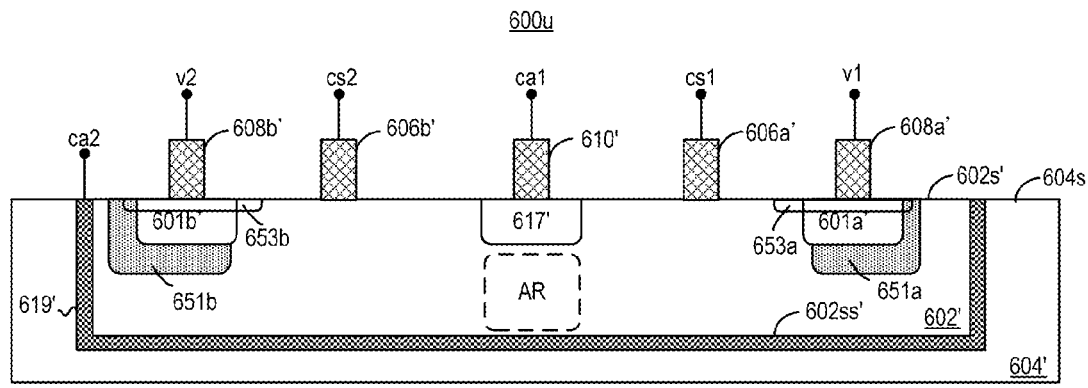

FIG. 6U illustrates a cross-sectional view of a photo-detecting apparatus, according to some embodiments. The photo-detecting apparatus 600u in FIG. 6U is similar to the photo-detecting apparatus 600m in FIG. 6M, where the difference is described below. The pixel of the photo-detecting apparatus 600u further includes shallow counter doped region 653a, 653b in the absorption layer 602'. In some embodiments, the shallow counter doped regions 653a, 653b are under the respective readout contact layers 608a', 608b' along the vertical direction D1. In some embodiments, the shallow counter doped region 653a is overlapped with the counter-doped region 651a and with the first doped regions 601a'. In some embodiments, the shallow counter doped region 653b is overlapped with the counter-doped region 651b and with the first doped regions 601b'. The counter-doped region 651a, 651b and the shallow counter doped region 653a, 653b can be formed in different steps such as by different masks. In some embodiments, each of the shallow counter doped regions 653a, 653b is of a conductivity type different from the first conductivity type of the first doped regions 601b', 601a'. In some embodiments, each of the shallow counter doped region 653a, 653b includes a dopant and a dopant profile with a peak dopant concentration. The peak dopant concentration is not less than $1\times10^{15}$ cm$^{-3}$. In some embodiment, the peak dopant concentrations of the shallow counter doped region 653a, 653b are lower than the peak dopant concentrations of the first doped regions 601b', 601a'. In some embodiments, the peak dopant concentration of the shallow counter doped region 653a, 653b is between $1\times10^{15}$ cm$^{-3}$ and $1\times10^{18}$ cm$^{-3}$ or between $1\times10^{16}$ cm$^{-3}$ and $5\times10^{17}$ cm$^{-3}$. In some embodiments, a distance between the first surface 602s' of the absorption layer 602' and the shallow counter doped region 653a, 653b having the peak dopant concentration is not more than 50 nm. In some embodiments, the dopants of the shallow counter doped region 653a, 653b and the dopants of the counter-doped regions 651a, 651b can be the same. The shallow counter doped region 653a, 653b can passivate the surface defects present at the first surface 602s' of the absorption layer 602'. Besides, the shallow counter doped region 653a, 653b can further modify the depletion regions near the first surface 602s' of the absorption layer 602'. As a result, the dark current of the photo-detecting apparatus 600u can be further reduced.

Figure 6V:
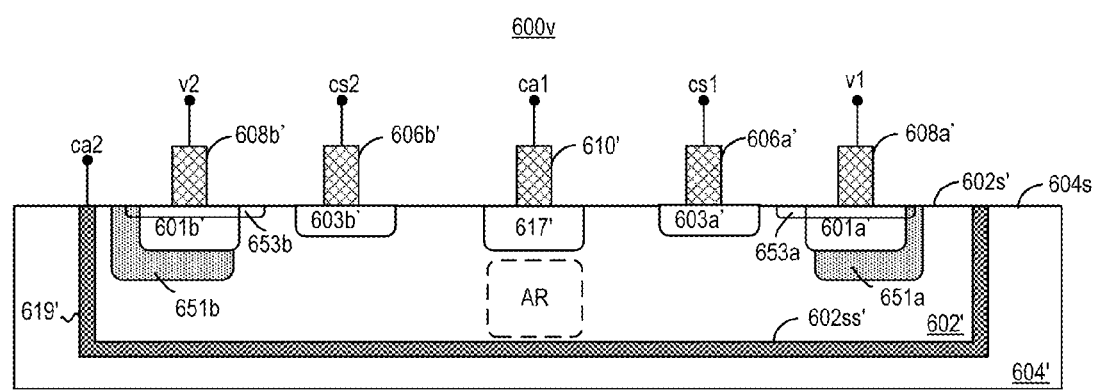

FIG. 6V illustrates a cross-sectional view of a photo-detecting apparatus, according to some embodiments. The photo-detecting apparatus 600v in FIG. 6V is similar to the photo-detecting apparatus 600u in FIG. 6U, where the difference is described below. In some embodiments, the first switch further includes a second doped region 603a' under the control contact layers 606a'. The second switch further includes a second doped region 603b' under the control contact layers 606b'. The second doped regions 603a', 603b' are similar to the second doped regions mentioned before, such as the second doped regions 603a', 603b' as described in FIG. 6G. In some embodiments, the first switch further includes a first dielectric layer 633a between the second doped regions 603a' and the control contact layer 606a'. In some embodiments, the second switch may further include a second dielectric layer 633b between the second doped regions 603b' and the control contact layer 606b'. The first dielectric layer 633a and the second dielectric layer 633b are similar to the first dielectric layer and the second dielectric layer mentioned before such as the first dielectric layer 633a and the second dielectric layer 633b as described in FIG. 6I.

In some embodiments, photo-detecting apparatus 600g through 600v may also include an isolation region (not shown) as described in FIG. 6D. In some embodiments, the conductivity type of the isolation region is different from the conductivity type of the blocking layer 619'. For example, if the conductivity type of the blocking layer 619' is p-type, the conductivity type of the isolation region is n-type. The isolation region is separated from the blocking layer 619'.

Figure 7A:
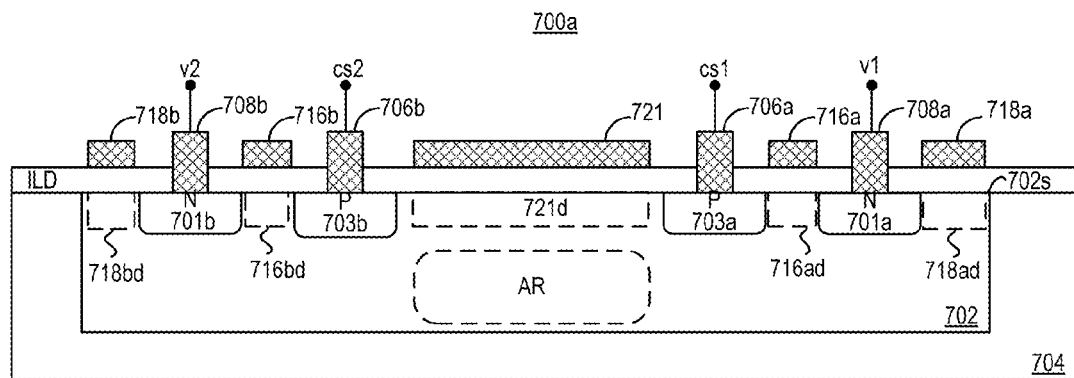
FIGS. 7A-7B illustrate cross-sectional views of a photo-detecting apparatus with surface depletion mode, according to some embodiments.

FIG. 7A illustrates a cross-sectional view of a photo-detecting apparatus with surface depletion mode, according to some embodiments. The photo-detecting apparatus 700a includes control metal lines 706a, 706b and readout metal lines 708a, 708b. The control metal lines 706a, 706b and the readout metal lines 708a, 708b are electrically coupled to the surface 702s of the germanium-based light absorption material 702. The control metal lines 706a, 706b are respectively electrically coupled to the P-type regions 703a, 703b on the surface 702s, and the readout metal line 708a, 708b are respectively electrically coupled to the N-type regions 701a, 701b on the surface 702s. This embodiment forms an interlayer dielectric ILD on the surface 702s and forms metals 721, 716a, 716b, 718a, 718b on the interlayer dielectric ILD. These metals 721, 716a, 716b, 718a, 718b can be biased to generate the depletion regions 721d, 716ad, 716bd, 718ad, 718bd. The biases applied on the metals 721, 716a, 716b, 718a, 718b can be different or the same, or have some of the metals 721, 716a, 716b, 718a, 718b floating.

The depletion region 712d can reduce the dark current between the P-type region 703a and the P-type region 703b. The depletion region 716ad can reduce the dark current between the P-type region 703a and the N-type region 701a. The depletion region 716bd can reduce the dark current between the P-type region 703b and the N-type region 701b. The depletion region 718a can reduce the dark current between N-type region 701a and another pixel (Not shown in FIG. 7A). The depletion region 718b can reduce the dark current between N-type region 701b and another pixel (Not shown in FIG. 7A). Therefore, by forming these surface depletion regions, the power consumption and the noise generation can be reduced.

As mentioned, the metals 721, 716a, 716b, 718a, 718b can be biased to generate the depletion regions 721d, 716ad, 716bd, 718ad, and 718bd. In other applications, the metals 721, 716a, 716b, 718a, 718b can be biased to make the corresponding regions 721d, 716ad, 716bd, 718ad, 718bd into accumulation or inversion, other than depletion.

In addition to the leakage reduction, the metals 721, 716a, 716b, 718a, 718b can reflect the residual optical signal IL into the germanium-based light absorption material 702 so as to be converted into electron-hole pairs accordingly. These metals 721, 716a, 716b, 718a, 718b serve like a mirror reflecting the light not being completely absorbed and converted by the germanium-based light absorption material 702 back to the germanium-based light absorption material 702 for absorption again. This would increase the overall absorption efficiency and therefore increase the system performance.

Figure 7B:
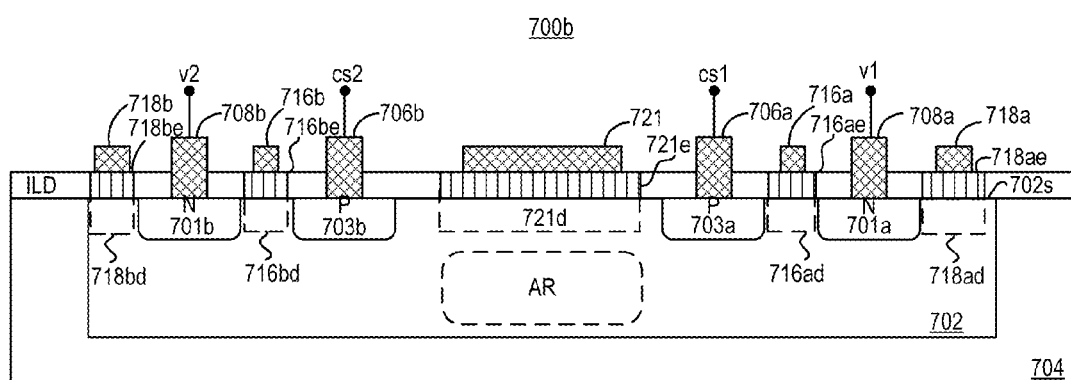

Furthermore, an alternative embodiment of the present disclosure is illustrated in FIG. 7B. Compared to FIG. 7A, this embodiment adds polarized dielectrics 721e, 716ae, 716be, 718ae, 718be (e.g., HfO2) as shown in FIG. 7B. Since there are dipole existing in the polarized dielectrics 721c, 716ae, 716be, 718ae, 718be, the depletion/accumulation/inversion regions 721d, 716ad, 716bd, 718ad, 718bd may be generated without biasing or biasing the metals 721, 716a, 716b, 718a, 718b at a small bias.

Figure 7C:
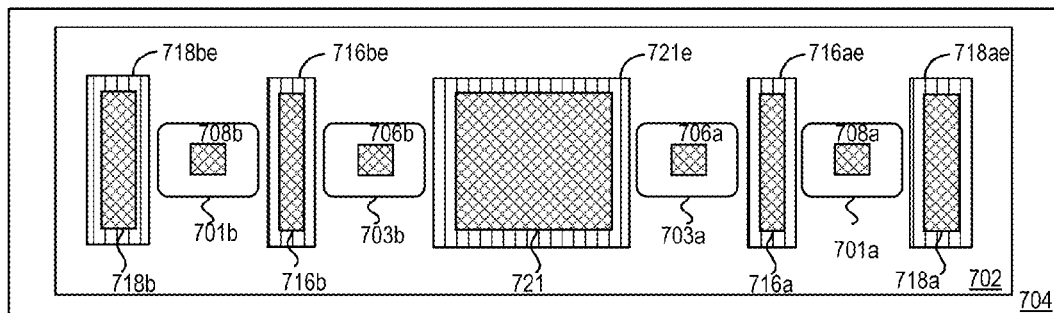
FIGS. 7C-7D illustrate planar views of a photo-detecting apparatus with surface depletion mode, according to some embodiments.
Figure 7D:
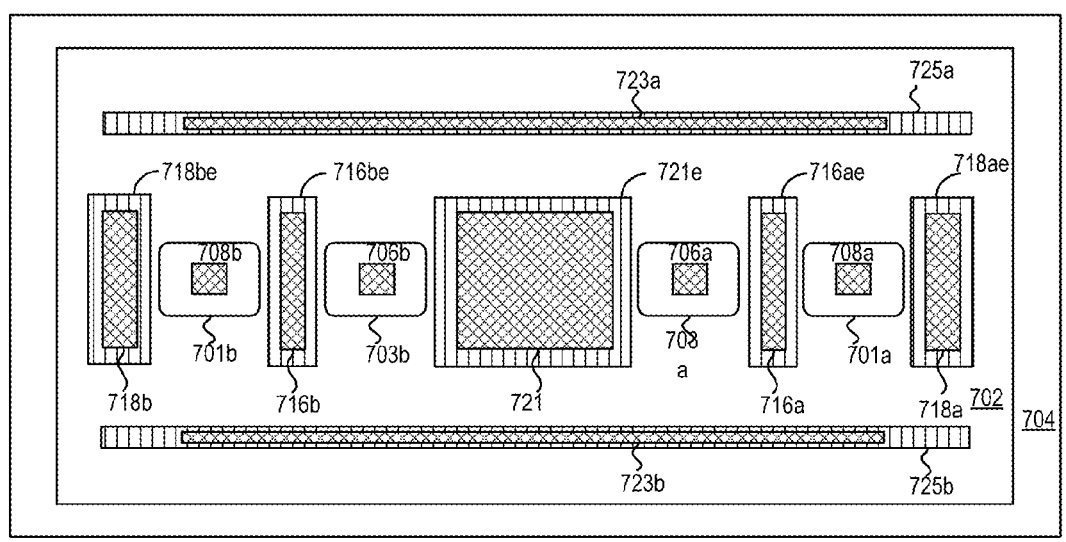

FIG. 7C illustrates a planar view of the photo-detecting apparatus 700B. It is noted that the metals 721, 716a, 716b, 718a, 718b and the polarized dielectrics 721c, 716ae, 716be, 718ae, 718be can be formed optionally. The device implementer can design a photo-detecting apparatus to include these elements or not based on different scenarios. Furthermore, in addition to adding the metals and polarized dielectrics in vertical direction as shown in FIG. 7C, there is also an alternative embodiment as shown in FIG. 7D, in which the metals 723a, 723b, and polarized dielectrics 725a, 725b are added in the horizontal direction.

Figure 8A:
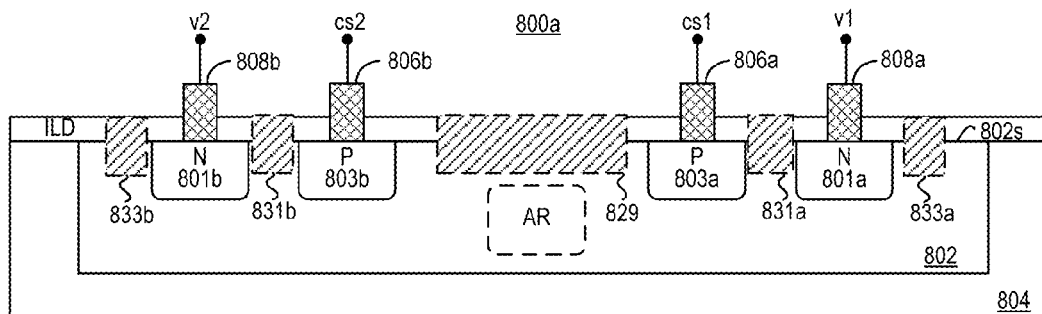
FIG. 8A illustrates a cross-sectional view of a photo-detecting apparatus with surface ion implantation, according to some embodiments.

FIG. 8A illustrates a cross-sectional view of a photo-detecting apparatus with surface ion implantation, according to some embodiments. The photo-detecting apparatus 800a includes control metal lines 806a, 806b and readout metal lines 808a, 808b. The control metal lines 806a, 806b and the readout metal lines 808a, 808b are electrically coupled to the surface 802s of the germanium-based light absorption material 802. The control metal lines 806a, 806b are respectively electrically coupled to the P-type regions 803a, 803b on the surface 802s, and the readout metal lines 808a, 808b are respectively electrically coupled to the N-type regions 801a, 801b on the surface 802s. In order to have a high surface resistance for a suppression of the surface leakage current, this embodiment utilizes neutral ion implantation as a surface treatment. As shown in this figure, the ion-processed regions 829, 831a, 831b, 833a, 833b are ion implanted (e.g., Si, Ge, C, H2), in which accelerated ions collide with the substance and make damage to the atomic periodicity or the crystalline structure in the area of implantation. The lattice damage such as atomic vacancies and interstitials breaks the periodic potential seen by electron envelope function, so the electrons/holes gain higher probability being scattered. This effect results into a lower mobility and hence a higher resistance.

Figure 8B:
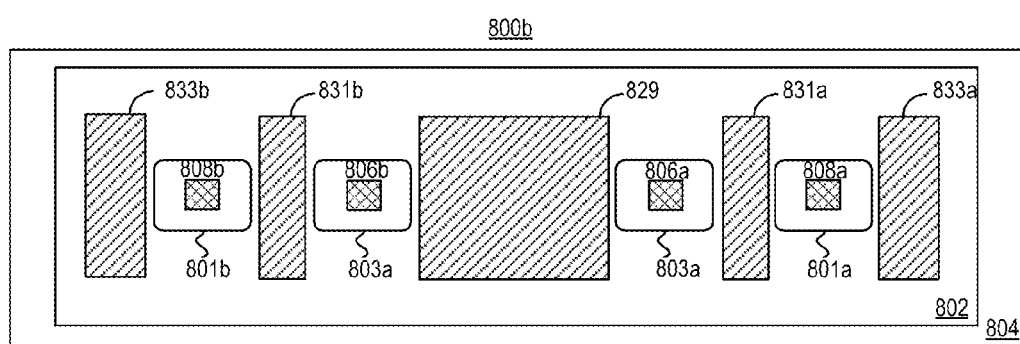
FIG. 8B illustrates a planar view of a photo-detecting apparatus with surface ion implantation, according to some embodiments.

FIG. 8B illustrates a planar view of a photo-detecting apparatus 800a with surface ion implantation, according to some embodiments. As shown in the figure, the ion-processed regions 829, 831a, 831b, 833a, 833b are vertically formed between the doped areas 801a, 801b, 803a, 803b. In some implementations, the ion-processed region(s) can be formed in other place(s), so the present embodiment is a reference rather than a limit.

Figure 9A:
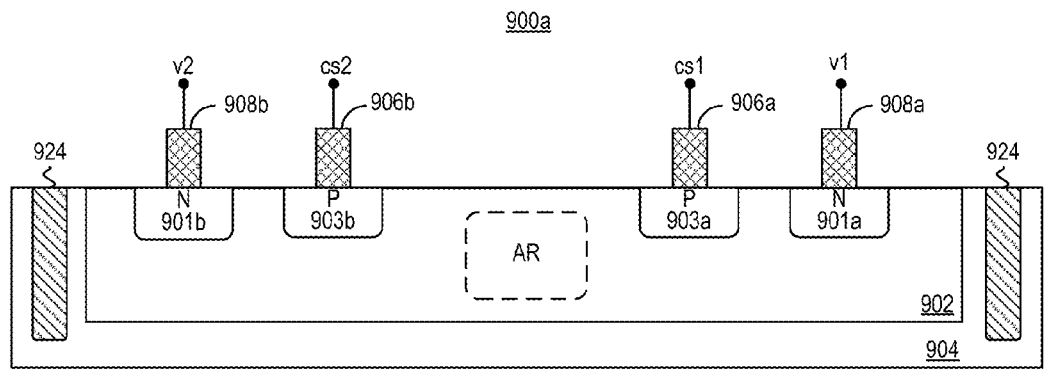
FIG. 9A illustrates a cross-sectional view of a photo-detecting apparatus with pixel to pixel isolation, according to some embodiments.

FIG. 9A illustrates a cross-sectional view of a photo-detecting apparatus with pixel to pixel isolation. The photo-detecting apparatus 900a includes control metal lines 906a, 906b and readout metal lines 908a, 908b. The control metal lines 906a, 906b and the readout metal lines 908a, 908b are electrically coupled to the surface 902s of the germanium-based light absorption material 902. The control metal lines 906a, 906b are respectively electrically coupled to the P-type regions 903a, 903b on the surface 902s, and the readout metal line 908a, 908b are respectively electrically coupled to the N-type regions 901a, 901b on the surface 902s. This embodiment includes an isolation region 924, which is formed as a ring surrounding the germanium-based light absorption material 902. In one implantation, the isolation region 924 is an N-type region. It depends on the types of the germanium-based light absorption material 902, the semiconductor substrate 904, and other factors, and the isolation region 924 may be implemented by a P-type region. With this isolation region 924, the photo-detecting apparatus 900a has the effect of reducing the cross-talk signals and/or powers to neighbor devices.

Figure 9B:
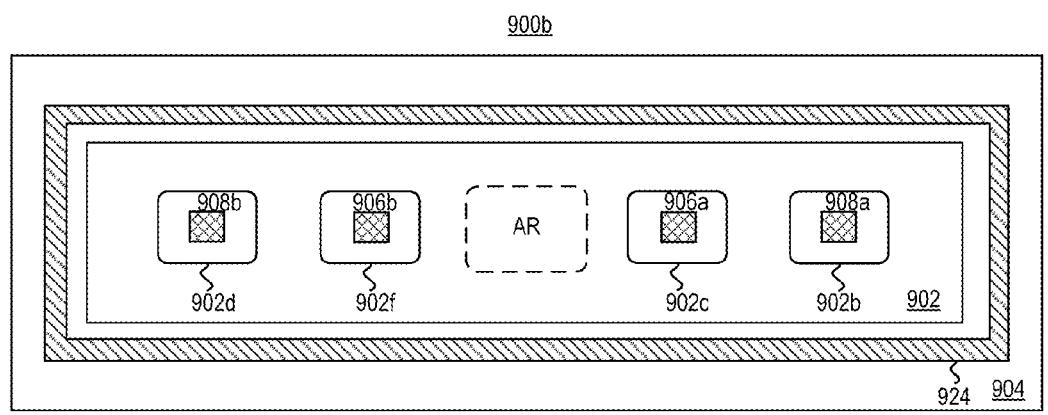
FIG. 9B illustrates a planar view of a photo-detecting apparatus with pixel to pixel isolation, according to some embodiments.

FIG. 9B illustrates a planar view of the photo-detecting apparatus 900a with pixel to pixel isolation. As shown in the figure, the isolation region 924 forms an entire ring. In other implementations, the isolation region 924 may be fragmented or discontinued.

Figure 9C:
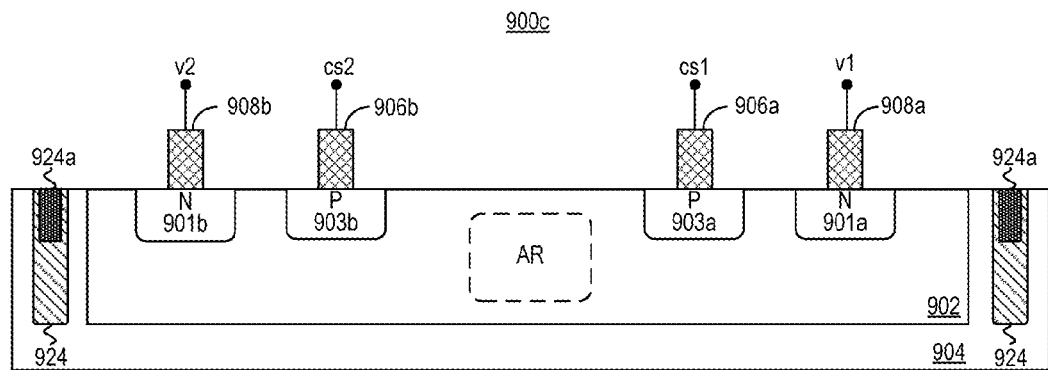
FIGS. 9C-9E illustrate cross-sectional views of a photo-detecting apparatus with pixel to pixel isolation, according to some embodiments.

FIG. 9C illustrates a cross-sectional view of a photo-detecting apparatus with pixel to pixel isolation. The photo-detecting apparatus 900c forms an additional narrow and shallow isolation region 924a inside isolation region 924. The doping concentration of the isolation region 924 and the doping concentration of the isolation region 924a are different. This may be applied to inhibit the crosstalk through surface conduction paths.

Figure 9D:
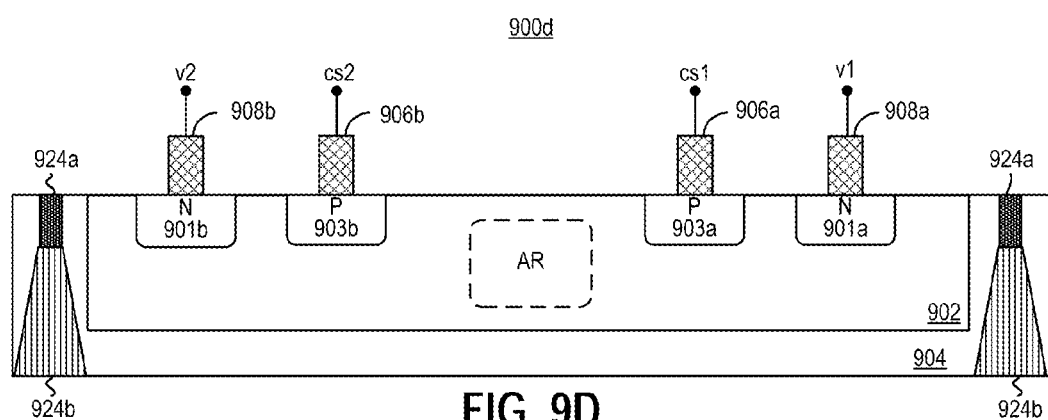

FIG. 9D illustrates a cross-sectional view of a photo-detecting apparatus with pixel to pixel isolation. The photo-detecting apparatus 900d forms an additional trench isolation region 924b extending from the isolation region 924a to the bottom surface of the semiconductor substrate 904. The trench isolation region 924b may be an oxide trench, in which block the electrical path between the germanium-based light absorption material 902 and adjacent devices.

Figure 9E:
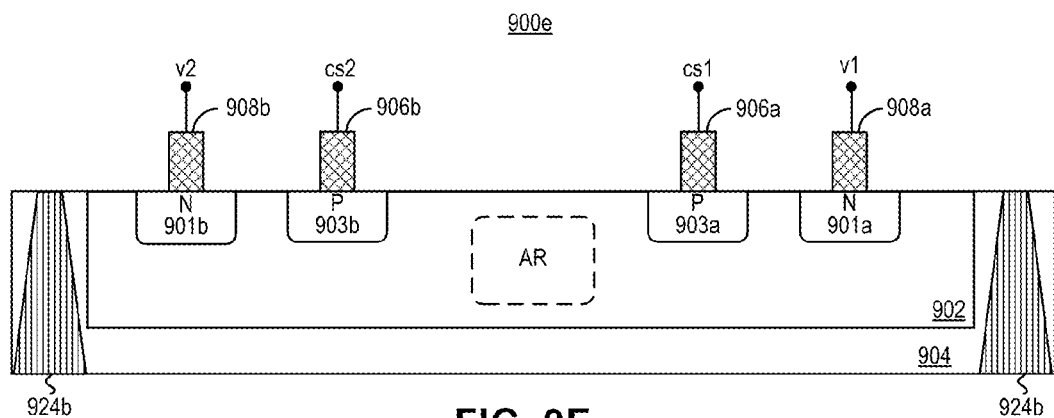

FIG. 9E illustrates a cross-sectional view of a photo-detecting apparatus with pixel to pixel isolation. The photo-detecting apparatus 900e forms a trench isolation region 924b extending from the top surface of the semiconductor substrate 904 to the bottom surface of the semiconductor substrate 904. The trench isolation region 924a may be an oxide trench, which blocks the electrical path between the germanium-based light absorption material 902 and adjacent devices.

Figure 10A:
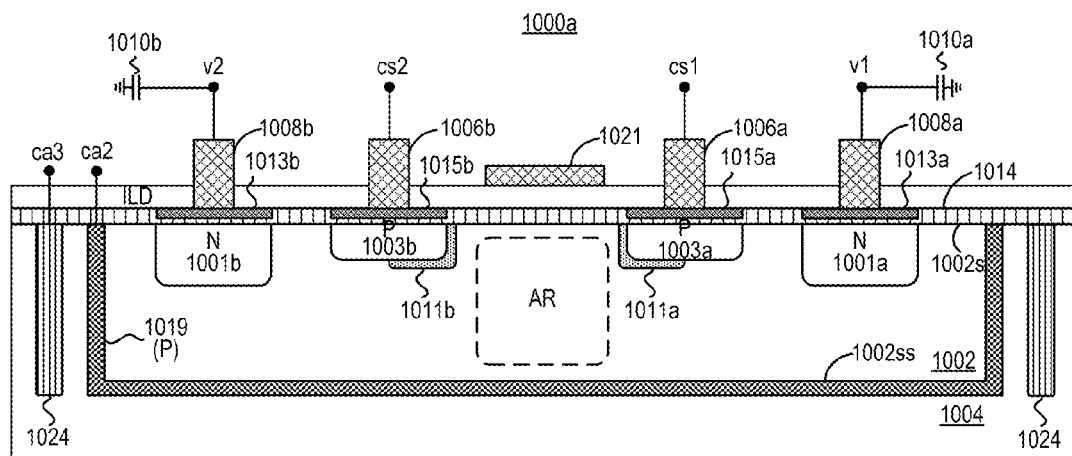
FIGS. 10A-10D illustrate cross-sectional views of a photo-detecting apparatus, according to some embodiments.

FIG. 10A illustrates a cross-sectional view of a photo-detecting apparatus, according to some embodiments. The embodiment of FIG. 10A includes and combines elements from the above embodiments. The photo-detecting apparatus 1000a includes control metal lines 1006a, 1006b and readout metal lines 1008a, 1008b. The control metal lines 1006a, 1006b and the readout metal lines 1008a, 1008b are electrically coupled to the surface 1002s of the germanium-based light absorption material 1002. The control metal lines 1006a, 1006b are respectively electrically coupled to the P-type regions 1003a, 1003b on the surface 1002s. The readout metal lines 1008a, 1008b are respectively electrically coupled to the N-type regions 1001a, 1001b on the surface 1002s. Similarly, the photo-detecting apparatus 1000a is able to obtain a distance information by the optical signal IL. Specifically, when the optical signal IL is incoming to the absorbed region AR, it will be converted into electron-hole pairs and then separated by the electrical field generated between the P-type regions 1003a, 1003b. The electrons may move toward either N-type region 1001a or N-type region 1001b according to the control signals cs1, cs2. In some implementations, the control signals cs1 and cs2 are differential voltage signals. In some implementations, one of the control signals cs1 and cs2 is a constant voltage signal (e.g., 0.5 v) and the other control signal is a time-varying voltage signal (e.g., sinusoid signal, clock signal or pulse signal; in-between 0V and 1V). Due to a distance existing between the photo-detecting apparatus 1000a and the target object (not shown in FIG. 10A), the optical signal IL has a phase delay with respect to the transmitted light transmitted by a transmitter (not shown in FIG. 10A). The transmitted light is modulated by a modulation signal and the electron-hole pairs are demodulated through the control metal lines 1006a and 1006b by another modulation signal. The electrons or the holes stored in the capacitor 1010a and capacitor 1010b will be varied according to the distance. Therefore, the photo-detecting apparatus 1000a can obtain the distance information based on the voltage v1 on the capacitor 1010a and the voltage v2 on the capacitor 1010b. According to one embodiment, the distance information can be derived based on calculations with voltage v1 and voltage v2 as input variables. For one example, in a pulse time-of-flight configuration, voltage ratios related to voltage v1 and voltage v2 are used as input variables. In another example, in a continuous-wave time-of-flight configuration, in-phase and quadrature voltages related voltage v1 and voltage v2 are used as input variables.

In addition to detecting the distance, this photo-detecting apparatus 1000a includes a different depth design for N-type regions 1001a, 1001b and P-type regions 1003a, 1003b, and also adds N-well 1011a, 1011b, which may reduce the leakage current between the P-type region 1003a and the P-type region 1003b. Second, the photo-detecting apparatus 1000a includes a well-shape P-type region 1019 covering the germanium-based light absorption material 1002, which may collect and discharge the holes through the bias voltage ca2. Third, the photo-detecting apparatus 1000a includes the passivation layer 1014 and inter-layer dielectric ILD to process the surface 1002s to the defects existing on the surface 1002s. Fourth, the photo-detecting apparatus 1000a includes the metal 1021, which may or may not be biased to generate the accumulation, inversion, or depletion on the surface 1002s. Moreover, the metal 1021 can be used as a mirror to reflect the residual optical signal IL back into the germanium-based light absorption material 1002 to be converted to electron-hole pairs. Fifth, the photo-detecting apparatus 1000a adds silicides 1013a, 1013b, 1015a, 1015b to reduce the voltage drop. Sixth, the photo-detecting apparatus 1000a can add the isolation region 1024, either implemented by doping materials or insulating oxides. The isolation region 1024 may be electrically coupled to a bias voltage ca3. In some implementations, the isolation region 1024 and the P-type region 1019 may be electrically coupled together by a metal layer, and the metal layer is left floated or being electrically coupled to a voltage source.

Figure 10B:
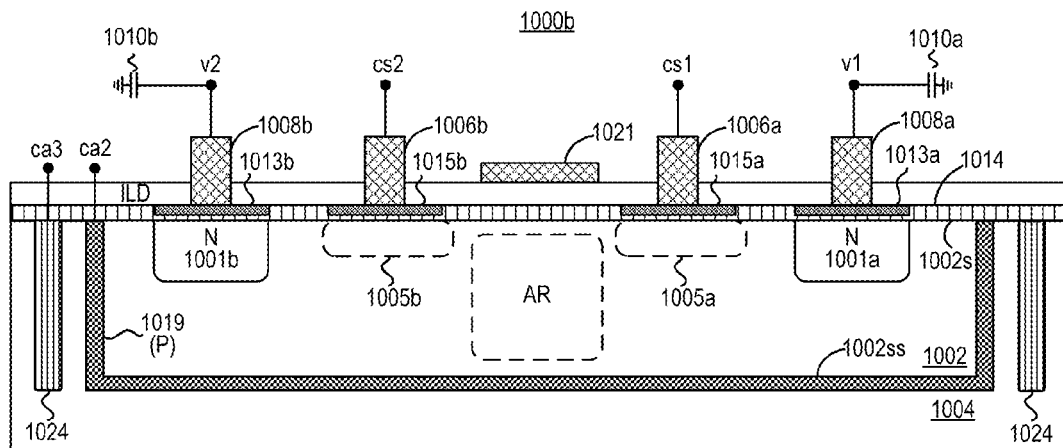

FIG. 10B illustrates a cross-sectional view of a photo-detecting apparatus, according to some embodiments. The structure of the photo-detecting apparatus 1000b is similar to the photo-detecting apparatus 1000a. The difference is that the control metal lines 1006a, 1006b in FIG. 10B are electrically coupled to the un-doped regions 1005a, 1005b.

Figure 10C:
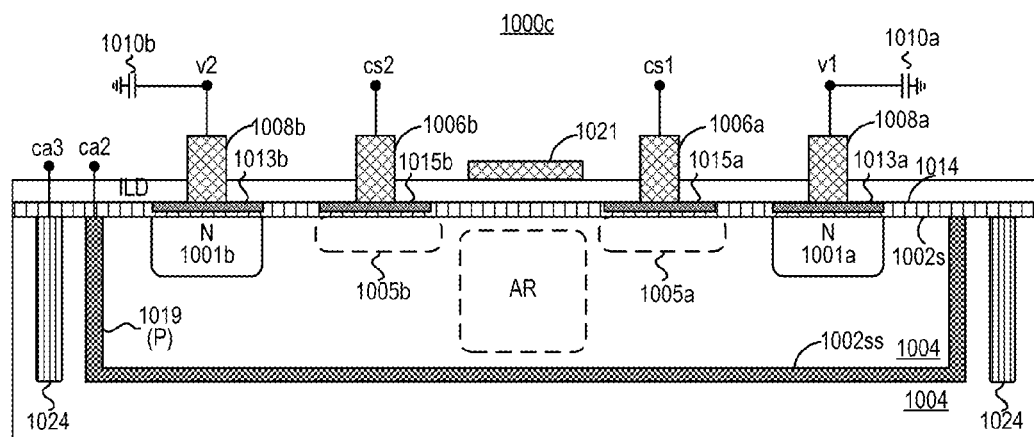
Figure 10D:
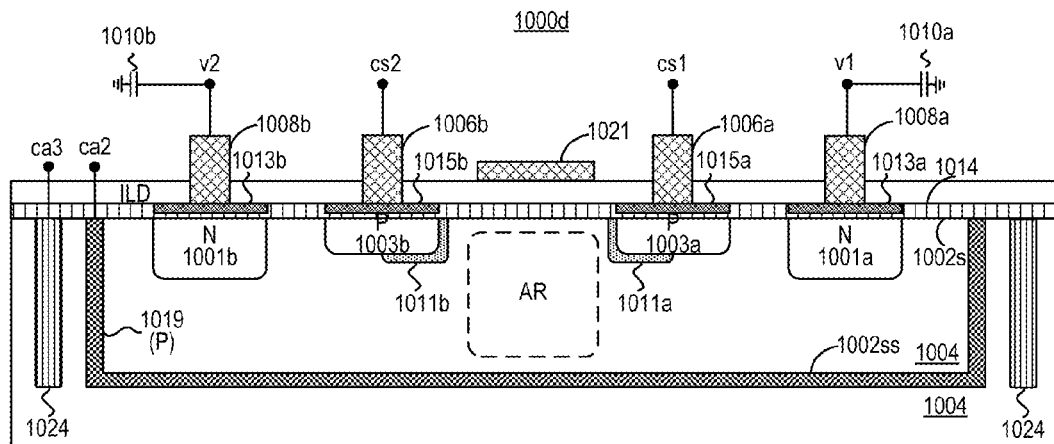

Furthermore, although the above-mentioned embodiments use a germanium-based light absorption material 1002 to absorb the optical signal IL, one embodiment without germanium-based light absorption material 1002 may be implemented. As shown in FIG. 10C, photo-detecting apparatus 1000c can use the semiconductor substrate 1004 as the light absorption material. In some implementations, the semiconductor substrate 1004 can be silicon, silicon-germanium, germanium, or III-V compounds. Besides, P-type regions 1003a, 1003b and N-wells 1011a, 1011b may be added on the surface 1002s of the semiconductor substrate 1004, as the embodiment illustrated in FIG. 10D.

The photo-detecting apparatuses 1000a, 1000b, 1000c and 1000d are illustrated to show the possible combinations from embodiments (FIG. 1A to FIG. 9E) disclosed above. It is understood that the device implementer can arbitrarily combine two or more above embodiments to implement other photo-detecting apparatus(s) and numerous combinations may be implemented.

It is noted that the doping concentrations for the doped regions shown in the embodiments can be properly designed. Take the embodiment of FIG. 10A as an example, the doping concentrations of the N-type regions 1001a, 1001b and the doping concentrations of the P-type regions 1003a, 1003b could be different. In one implementation, the P-type regions 1003a, 1003b are lightly doped and N-type regions 1001a, 1001b are highly doped. In general, the doping concentration for the lightly doping may range from $10^{16}/cm^3$ or less to $10^{18}/cm^3$, and the doping concentration for the highly doping may range from $10^{18}/cm^3$ to $10^{20}/cm^3$ or more. Through the doping concentration adjustment, the Schottky contacts can be formed between the control metal lines 1006a, 1006b and the P-type regions 1003a, 1003b respectively; and the Ohmic contacts can be formed between the readout metal lines 1008a, 1008b and N-type regions 1001a, 1001b respectively. In this scenario, the resistances between control metal lines 1006a, 1006b and the P-type regions 1003a, 1003b are higher than the resistances between readout metal lines 1008a, 1008b and the N-type regions 1001a, 1001b.

On the other hands, the doping type for those doped regions can also be implemented in different ways. Take the embodiment of FIG. 10A as an example, The P-type regions 1003a, 1003b can be replaced by N-type if the regions 1003a, 1003b are doped with N-type dopants. Similarly, the N-type regions 1001a, 1001b can be replaced by P-type if the regions 1001a, 1001b are doped with P-type dopants. Therefore, it is possible to implement an embodiment that the doped regions 1001a, 1001b, 1003a and 1003b all are doped with same type dopants.

Figure 11A:
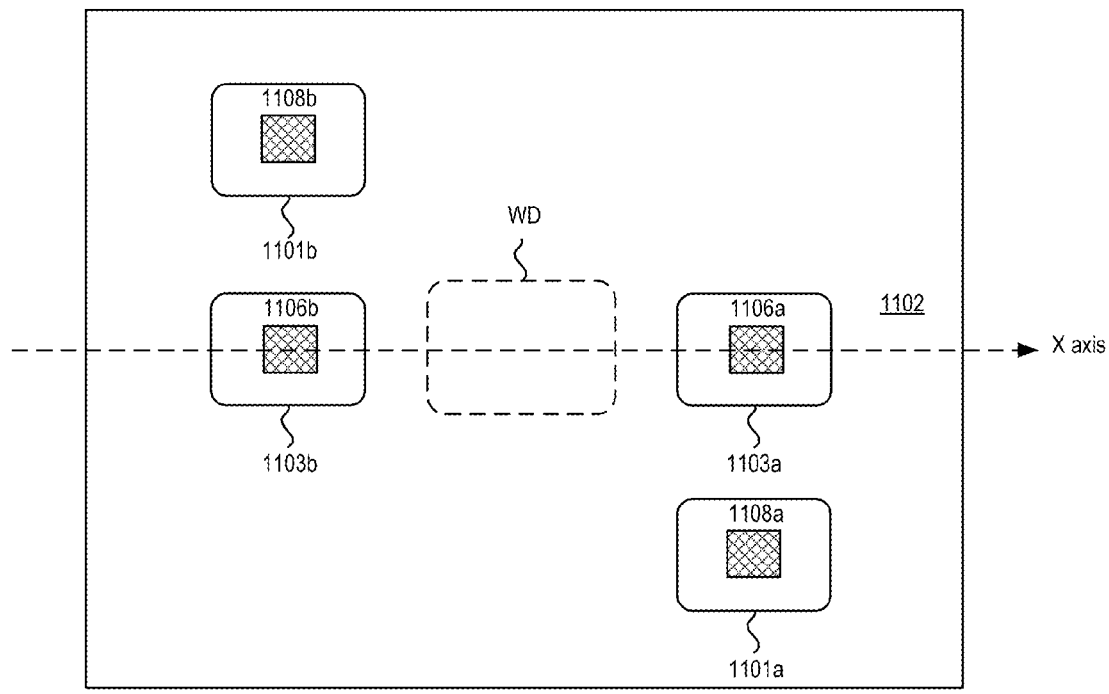
FIGS. 11A-11E illustrate planar views of a photo-detecting apparatus with chip size miniaturization, according to some embodiments.

Please refer to FIG. 11A, which illustrates a planar view of a photo-detecting apparatus, according to some embodiments. The photo-detecting apparatus 1100a includes the layout positions for control metal lines 1106a, 1106b, readout metal lines 1108a, 1108b, N-type regions 1001a, 1001b and P-type regions 1003a, 1003b on the germanium-based light absorption material 1102. In this embodiment, the control metal lines 1106a, 1106b are positioned on the axis X axis, however, readout metal lines 1108a, 1108b are not positioned on the axis X axis. In this embodiment, the four terminals are not on the same axis, which may reduce the area of the photo-detecting apparatus 1100a. The geometric relations between each element are shown in FIG. 11A.

Figure 11B:
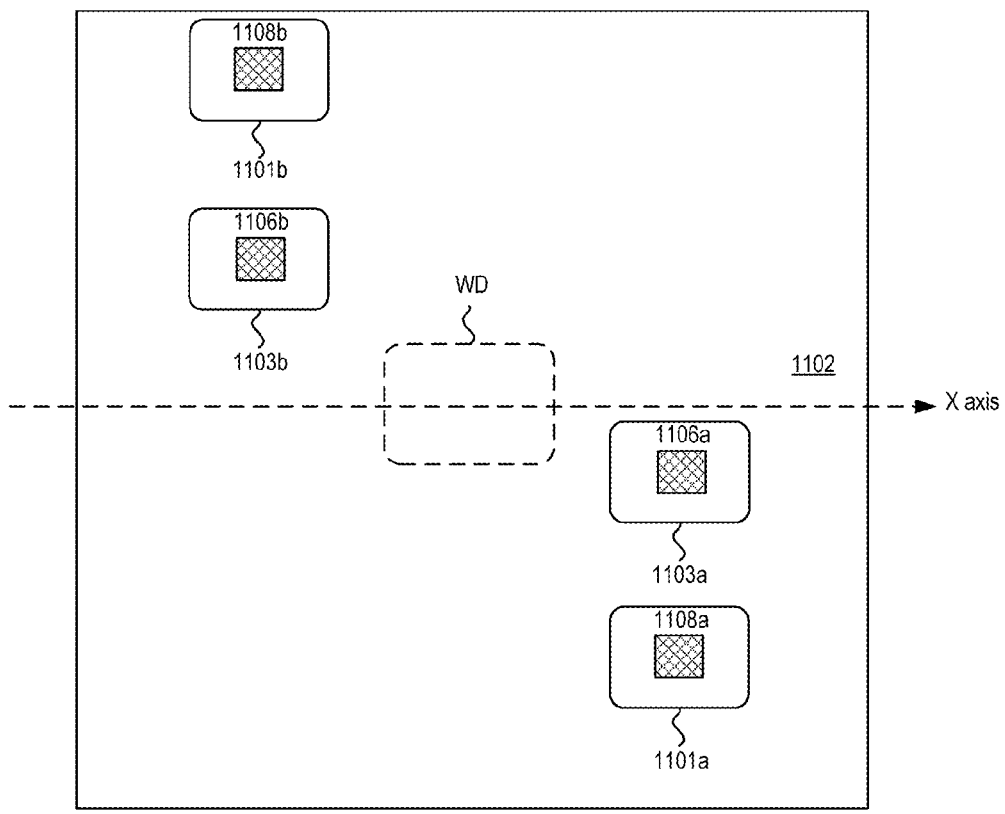

FIG. 11B illustrates a planar view of a photo-detecting apparatus, according to some embodiments. Compared to FIG. 11A, the control metal lines 1106a, 1106b are not positioned on the axis X axis, but respectively aligned with readout metal lines 1108a, 1108b in the direction perpendicular to the axis X axis. Similarly, the geometric relations between each element are shown in FIG. 11B.

Figure 11C:
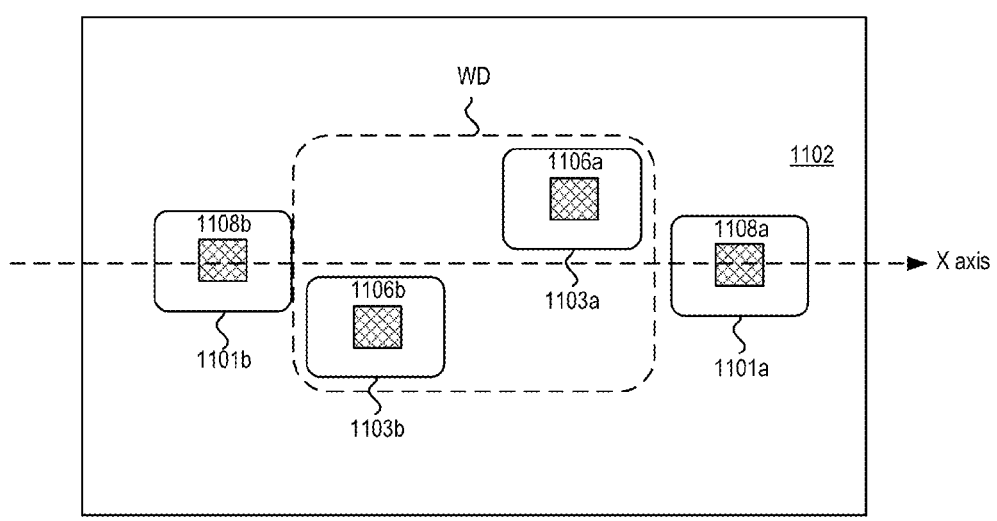

FIG. 11C illustrates a planar view of a photo-detecting apparatus, according to some embodiments. The control metal lines 1106a, 1106b are formed above the absorbed region AR and opposing each other in a diagonal direction in the optical window WD. The readout metal lines 1108a, 1108b are formed on the axis X axis.

Figure 11D:
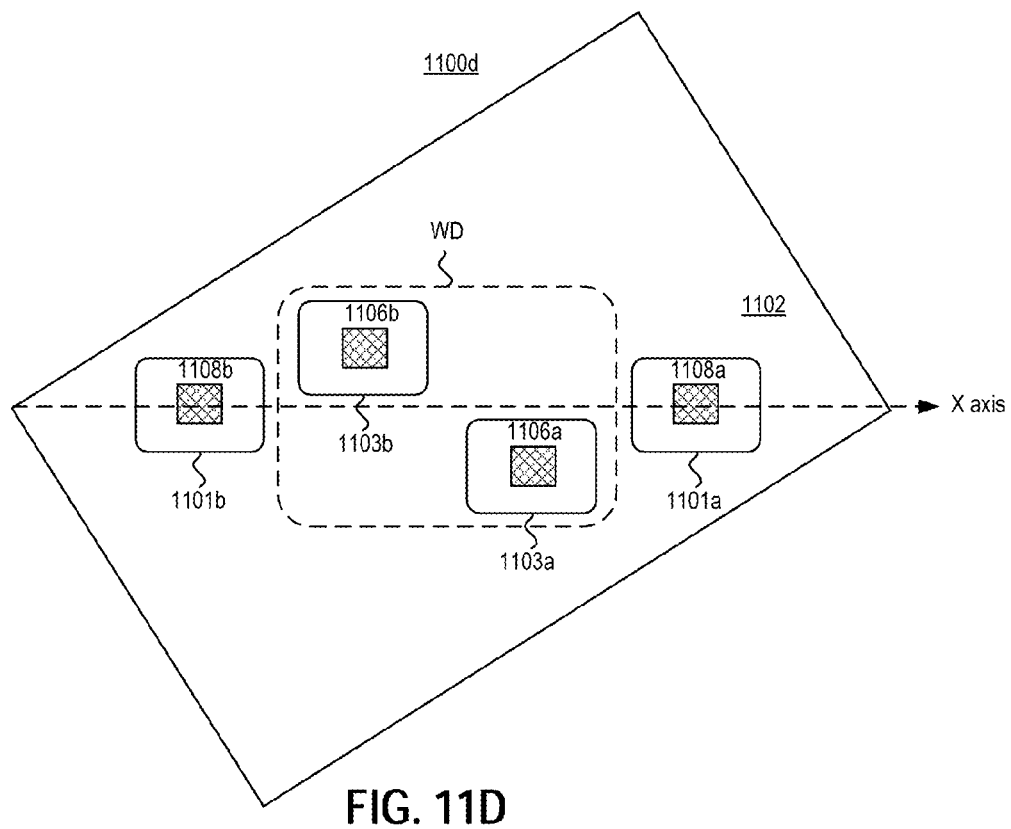

FIG. 11D illustrates a planar view of a photo-detecting apparatus, according to some embodiments. The photo-detecting apparatus in FIG. 11D is similar to that in FIG. 11C, but the germanium-based light absorption material 1102 is rotated so that the axis X axis is in a diagonal direction in the germanium-based light absorption material 1102. It may also reduce the overall area of the photo-detecting apparatus.

Figure 11E:
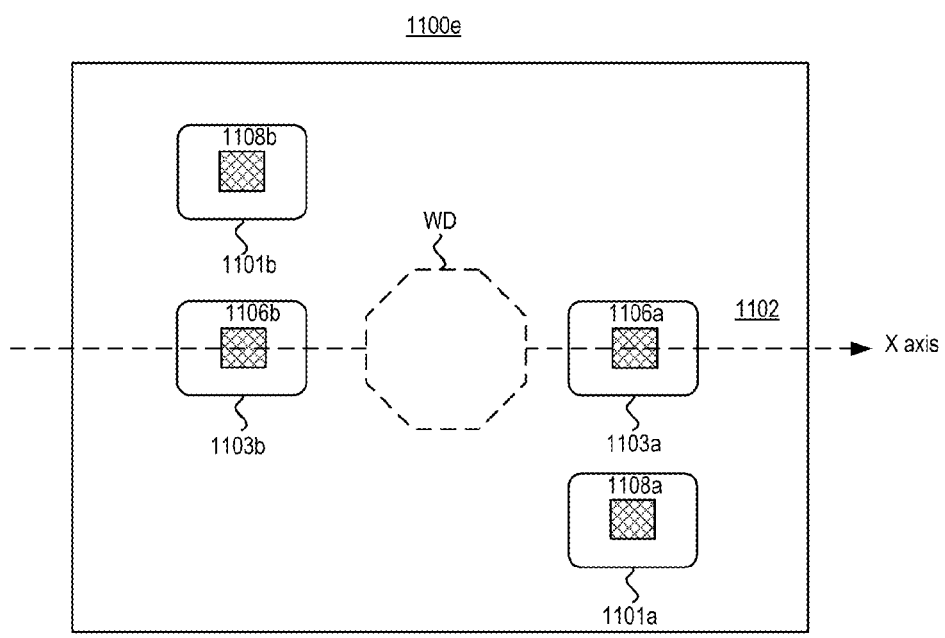

FIG. 11E illustrates a planar view of a photo-detecting apparatus, according to some embodiments. The difference between this embodiment and previous embodiments is the optical window WD can be designed as an Octagon. It can also be designed as other shapes (e.g. circle and hexagon etc.).

FIG. 11A-FIG. 11D illustrates some embodiments by adjusting the layout positions for control metal lines 1106a, 1106b, readout metal lines 1108a, 1108b, N-type regions 1001a, 1001b, and P-type regions 1003a, 1003b. The implementer can also design different geometric relations for these elements to reduce or minimize the chip area. These alternative embodiments are illustrated as a reference, not a limit.

The photo-detecting apparatuses described above use a single photodetector as an embodiment, which is for single-pixel applications. The photo-detecting apparatuses described below are the embodiments for multiple-pixel applications (e.g., image pixel array or image sensor).

In some implementations, the photo-detecting apparatus can be designed to receive the same or different optical signals, e.g., with the same or different wavelengths, with the same or multiple modulations, or being operated at different time frames.

Figure 12A:
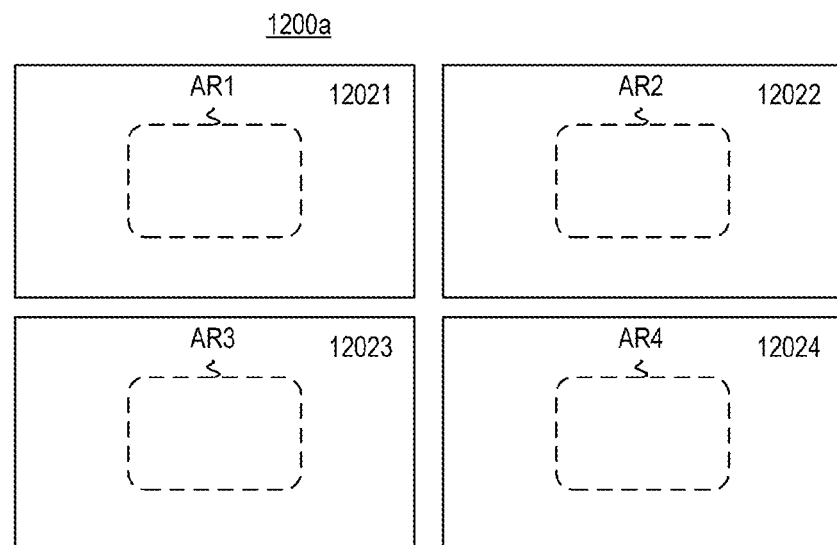
FIGS. 12A-12B illustrate planar views of array configurations of a photo-detecting apparatus, according to some embodiments.

Please refer to FIG. 12A. The photo-detecting apparatus 1200a comprises a pixel array, which includes four pixels 12021, 12022, 12023, 12024 as an example. Each pixel is a photodetector in accordance with the embodiments described herein. In one embodiment, optical signal IL that contains optical wavelength $\lambda_1$ is received by the pixels 12021, 12024 in this array, and optical signal IL that contains optical wavelength $\lambda_2$ is received by pixels 12022, 12023 in this array. In an alternative embodiment, there is only one optical wavelength $\lambda$ but having multiple modulation frequencies $f_{mod1}$ and $f_{mod2}$ (or more). For example, the pixels 12021, 12024 are applied with modulation frequency $f_{mod1}$ to demodulate this frequency component in the optical signal IL, and the pixels 12022, 12023 are applied with modulation frequency $f_{mod2}$ to demodulate this frequency component in the optical signal IL. In an alternative embodiment, similarly, there is only one optical wavelength $\lambda$ but having multiple modulation frequencies $f_{mod1}$ and $f_{mod2}$ (or more). However, at time $t_1$, the pixels in the array are driven by modulation frequency $f_{mod1}$ to demodulate this frequency component in the optical signal, while at another time $t_2$, the pixels in the array are driven by modulation frequency $f_{mod2}$ to demodulate this frequency component in the optical signal IL, and thus the pixel array 1200a is operated under time multiplexing mode.

In an alternative embodiment, optical wavelengths $\lambda_1$ and $\lambda_2$ are respectively modulated by $f_{mod1}$ and $f_{mod2}$, and then collected by pixel array 1200a. At time $t_1$, the pixel array 1200a is operated at $f_{mod1}$ to demodulate the optical signal in $\lambda_1$; while at time $t_2$, the pixel array 1200a is operated at $f_{mod2}$ to demodulate the optical signal in $\lambda_2$. In an alternative embodiment, an optical signal IL with optical wavelength $\lambda_1$ and $\lambda_2$ is modulated by $f_{mod1}$ and $f_{mod2}$, respectively, and the pixels 12021, 12024 are driven by $f_{mod1}$ while the pixels 12022, 12023 are driven by $f_{mod2}$ to demodulate the incoming modulated optical signal IL simultaneously. Those of skills in the art will readily recognize that other combinations of optical wavelength, modulation scheme and time division may be implemented.

Figure 12B:
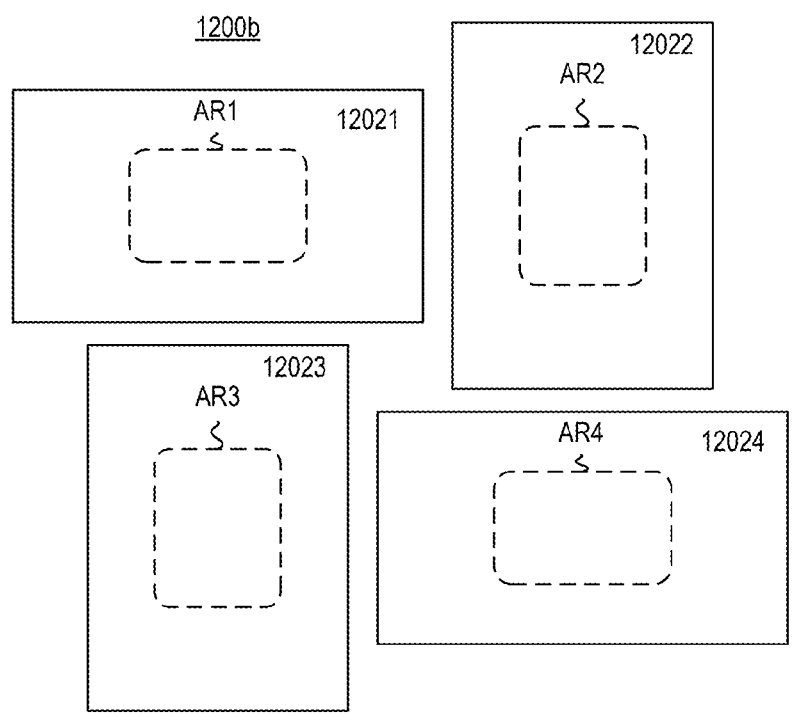

Please refer to FIG. 12B. The photo-detecting apparatus 1200b includes four pixels 12021, 12022, 12023, 12024. Each pixel is a photodetector and may use the embodiments disclosed above. In addition to the layout shown in FIG. 12A, the pixels 12021, 12022, 12023, 12024 can be arranged in a staggered layout as shown in FIG. 12B, in which the width and length of each pixel are placed in directions perpendicular to the width and length of the adjacent pixels.

Figure 13A:
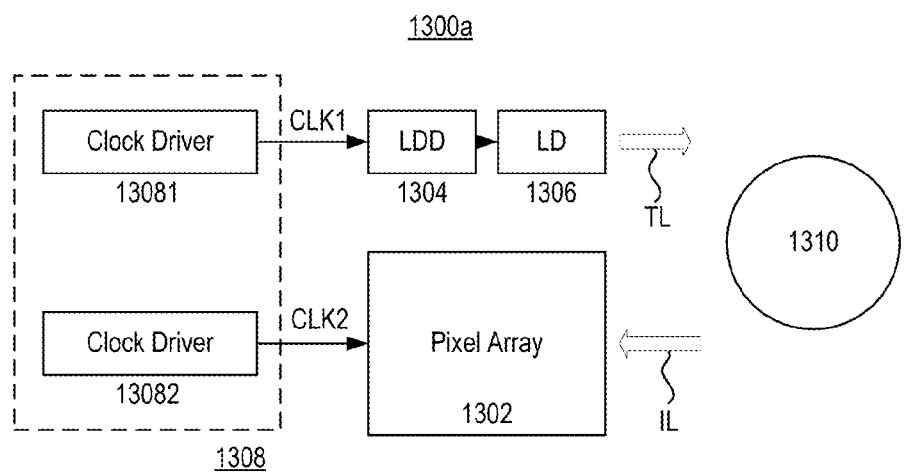
FIG. 13A-13E illustrate blocks and timing diagrams of a photo-detecting apparatus using modulation schemes with phase changes, according to some embodiments.

FIG. 13A illustrates a block diagram of a photo-detecting apparatus 1300a using modulation schemes with phase changes, according to some embodiments. The photo-detecting apparatus 1300a is an indirect time-of-flight based depth image sensor capable of detecting a distance information with the targeted object 1310. The photo-detecting apparatus 1300a includes a pixel array 1302, laser diode driver 1304, laser diode 1306, and clock driving circuit 1308 including clock drivers 13081, 13082. The pixel array 1302 includes a plurality of photodetectors in accordance with the embodiments disclosed herein. In general, the sensor chip generates and sends out the clock signals for 1) modulating the transmitted optical signal by the laser diode driver 1304 and 2) demodulating the received/absorbed optical signal by the pixel array 1302. To obtain the depth information, all photodetectors in an entire pixel array are demodulated by referencing the same clock, which changes to possible four quadrature phases, e.g., 0°, 90°, 180° and 270°, in a temporal sequence and there is no phase change at the transmitter side. However, in this embodiment, the 4-quadrature phase changes are implemented at the transmitter side, and there is no phase change at the receiving side, as explained in the following.

Figure 13B:
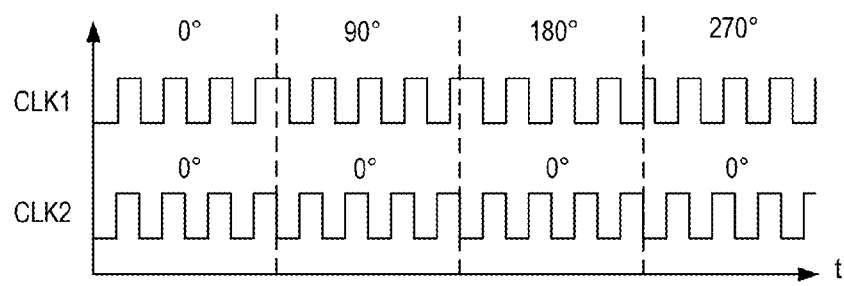

Please refer to FIG. 13B, which depicts a timing diagram of the clock signals CLK1, CLK2 generated by clock drivers 13081, 13082, respectively. The clock signal CLK1 is a modulation signal with 4-quadrature phase changes, e.g., 0°, 90°, 180° and 270°, and clock signal CLK2 is a demodulation signal without phase change. Specifically, the clock signal CLK1 drives the laser diode diver 1304 so that the laser diode 1306 can generate the modulated transmitted light TL. The clock signal CLK2 and its reversed signal CLK2' (not shown in FIG. 13B) are used as the control signal cs1 and control signal cs2 (shown in the above embodiments), respectively, for demodulation. In other words, the control signal cs1 and control signal cs2 in this embodiment are differential signals. This embodiment may avoid the possible temporal coherence inherent in an image sensor due to parasitic resistance-capacitance induced memory effects.

Figure 13C:
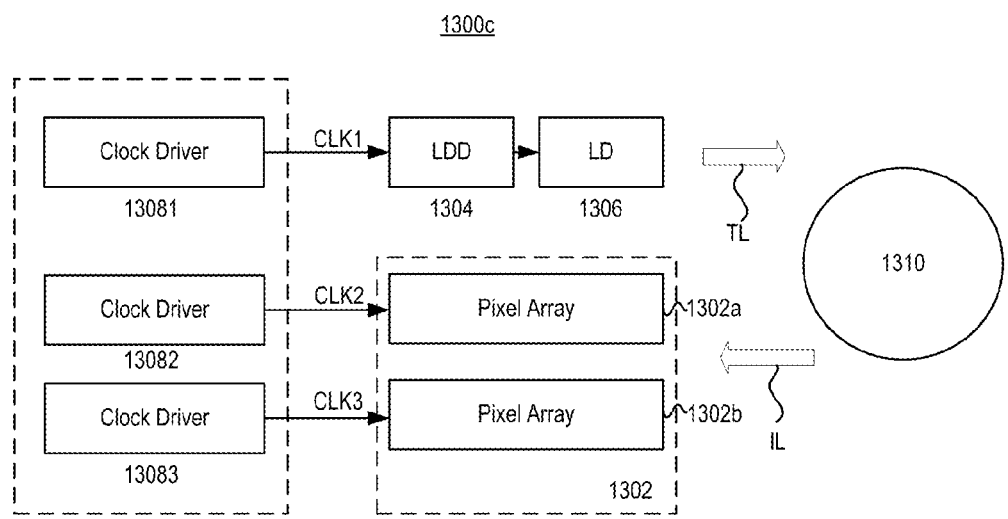
Figure 13D:
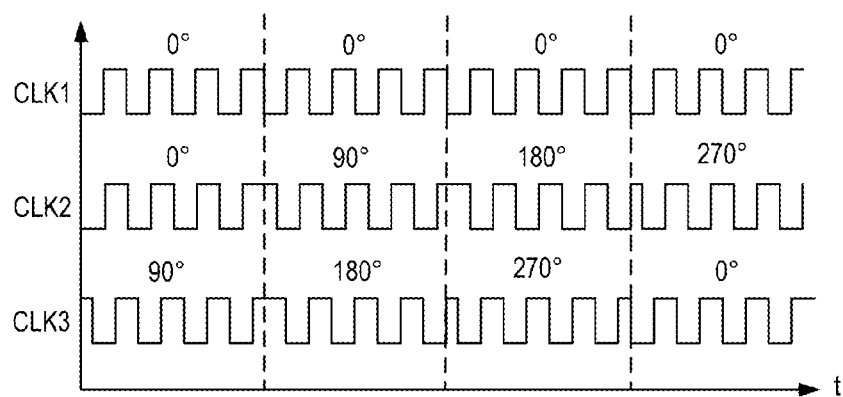

Please refer to FIG. 13C and FIG. 13D. Compared to the FIG. 13A, the photo-detecting apparatus 1300c uses two demodulation schemes at the receiving side. The pixel array 1302 includes two portions, the first pixel array 1302a and the second pixel array 1302b. The first demodulation scheme applied to the first pixel array 1302a and the second demodulation scheme applied to the second pixel array 1302b are different in temporal sequence. For example, the first pixel array 1302a is applied with the first demodulation scheme, in which the phase changes in temporal sequence are 0°, 90°, 180° and 270°. The second pixel array 1302a is applied with the second demodulation scheme, in which the phase changes in temporal sequence are 90°, 180°, 270° and 0°. The net effect is the phase changes in the first pixel array 1302a are in phase quadrature to the phase changes in the second pixel array 1302b, while there are no phase changes at the transmitting side. This operation may reduce the max instantaneous current drawn from the power supply if the demodulation waveform is not an ideal square wave.

Figure 13E:
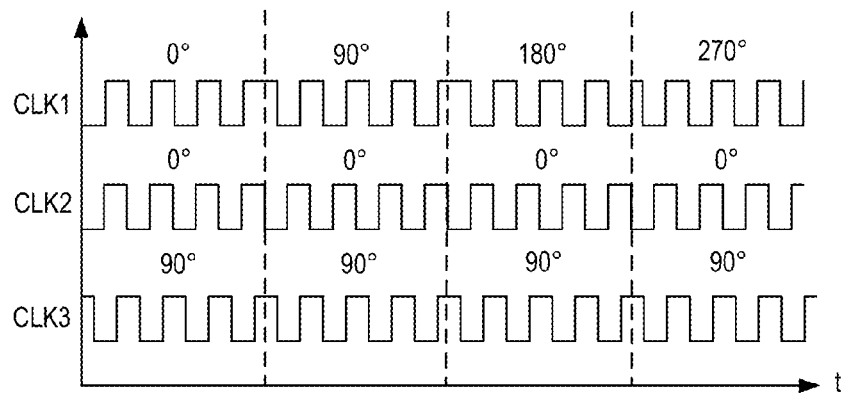

Please refer to FIG. 13E, which shows a modulation scheme using the photo-detecting apparatus 1300c. Compared to FIG. 13D, this embodiment applies phase changes to the transmitting side, but does not apply phase changes to the two different pixel arrays 1302a, 1302b at the receiving side, except setting two different constant phases to the two different pixel arrays 1302a, 1302b, and the two different constant phases are in phase quadrature to each other. For example, the modulation signal at the transmitting side is the clock signal CLK1, in which the phase changes in temporal sequence are 0°, 90°, 180°, and 270°. The demodulation signals at the receiving side are clock signals CLK2, CLK3. The clock signal CLK2 is used to demodulate the incident optical signal IL absorbed by pixel array 1302a, which has a constant phase of 0°. The clock signal CLK3 is used to demodulate the incident optical signal IL absorbed by pixel array 1302b, which has a constant phase of 90°.

Although the embodiments illustrated in FIG. 13A-13E use clock signals with a 50% duty cycle as the modulation and demodulation signals, in other possible implementations, the duty cycle can be different (e.g. 30% duty cycle). In some implementations, sinusoidal wave is used as the modulation and demodulation signals instead of square wave.

Figure 14:
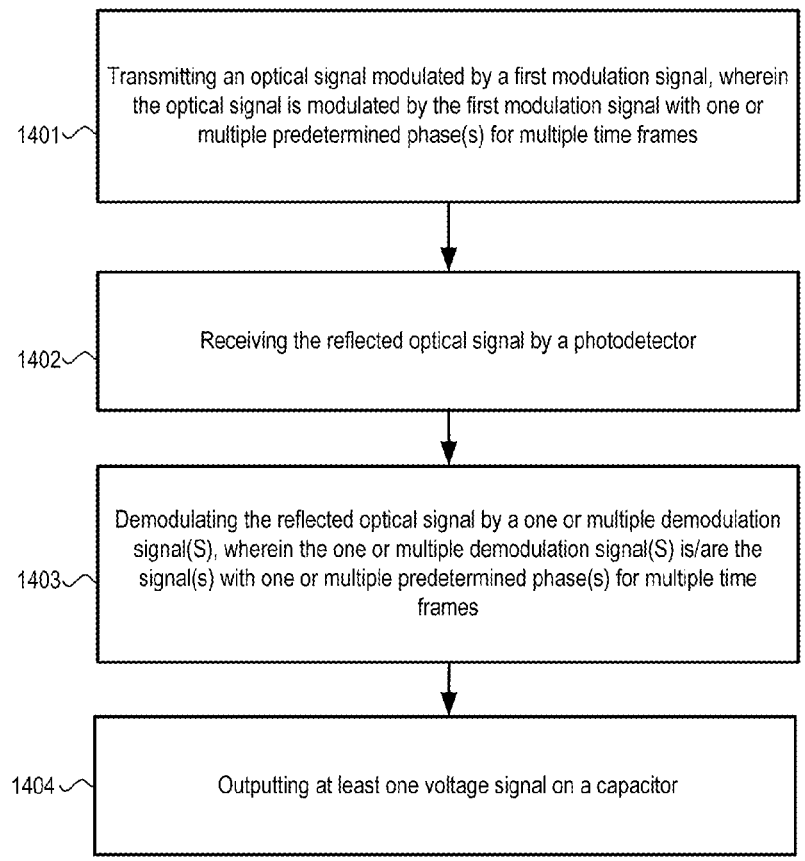
FIG. 14 illustrates a process for using the photo-detecting apparatus using modulation schemes with phase changes, according to some embodiments.

FIG. 14 illustrates a process for using the photo-detecting apparatus using modulation schemes with phase changes, according to some embodiments. Other entities perform some or all of the steps of the process in other embodiments. Likewise, embodiments may include different and/or additional steps, or perform the steps in different orders.

In the embodiment of FIG. 14, the photo-detecting method comprises step 1401: transmitting an optical signal modulated by a first modulation signal, wherein the optical signal is modulated by the first modulation signal with one or multiple predetermined phase(s) for multiple time frames; step 1402: receiving the reflected optical signal by a photodetector; step 1403: demodulating the reflected optical signal by one or multiple demodulation signal(s), wherein the one or multiple demodulation signal(s) is/are the signal (s) with one or multiple predetermined phase(s) for multiple time frames; and step 1404: outputting at least one voltage signal on a capacitor. In this method, the photodetector may use the embodiments mentioned in the present disclosure or its variants.

Figure 15A:
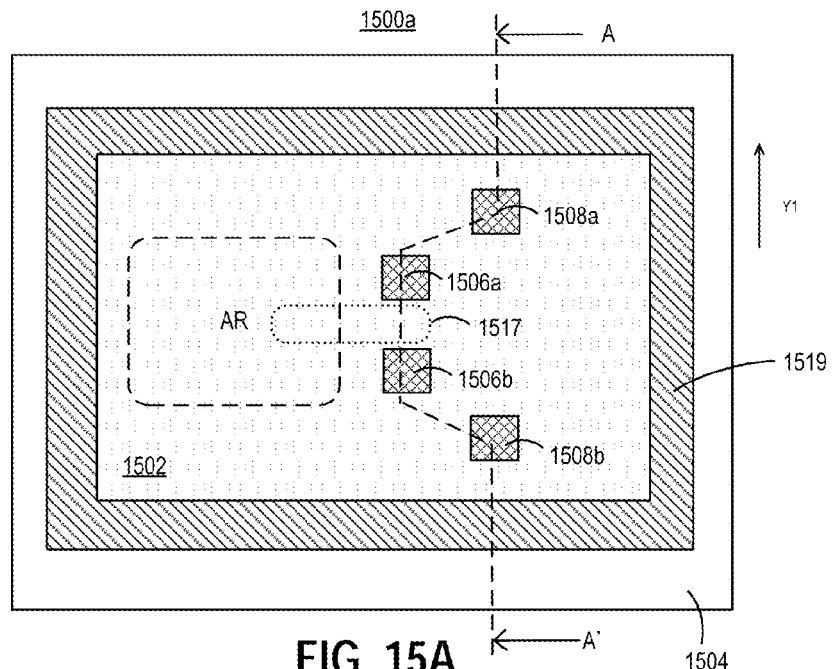
FIGS. 15A-15B illustrate a top view of a photo-detecting apparatus, according to some embodiments.

FIG. 15A illustrates a top view of a photo-detecting apparatus, according to some embodiments. The photo-detecting apparatus 1500a includes a substrate 1504. The photo-detecting apparatus 1500a further includes a pixel (not labeled) including an absorption layer 1502 supported by a substrate 1504. The pixel further includes an absorbed region AR in the absorption layer 1502 and defined by a light shield (not shown). The absorbed region AR is a virtual area receiving the optical signal incoming through the light shield. The pixel includes a first switch (not labeled) and a second switch (not labeled) electrically coupled to the absorption layer 1502. The first switch includes a control contact layer 1506a and a readout contact layer 1508a. The second switch includes a control contact layer 1506b and a readout contact layer 1508b. In some embodiments, the readout contact layers 1508a, 1508b, the control contact layers 1506a, 1506b are formed over a first surface of the absorption layer 1502. In some embodiments, the readout contact layers 1508a, 1508b, and the control contact layers 1506a, 1506b are formed at the same side of the absorbed region AR. In some embodiments, a distance between the readout contact layers 1508a, 1508b along a Y direction Y1 is greater than a distance between the control contact layers 1506a, 1506b along a Y direction Y1 from the top view of the photo-detecting apparatus 1500a. In some embodiments, the control contact layers 1506a, 1506b are closer to the absorbed region AR than the readout contact layers 1508a, 1508b is along a direction substantially perpendicular to the Y direction Y1 from the top view of the photo-detecting apparatus 1500a.

In some embodiments, the pixel further includes a first readout circuit (not shown) and a second readout circuit (not shown) electrically coupled to the first switch and the second switch respectively for processing the collected charges. The first readout circuit is electrically coupled to the readout contact layer 1508a. The second readout circuit is electrically coupled to the readout contact layer 1508b.

The pixel may also include control signals (not shown) controlling the control contact layers 1506a, 1506b, as described in the embodiments mentioned before.

In some embodiments, the pixel further includes a guiding region 1517 formed in the absorption layer 1502 and between the first switch and the second switch. In some embodiments, the guiding region 1517 is between the portions of the absorption layer 1502 right under the control contact layers 1506a, 1506b. In some embodiments, a part of the guiding region 1517 is in the absorbed region AR. That is, the guiding region 1517 is overlapped with the absorbed region AR along a direction substantially perpendicular to the first surface of the absorption layer 1502. In some embodiments, the guiding region 1517 is of a conductivity type. In some embodiments, if the photo-detecting apparatus is configured to collects electrons, the guiding region 1517 is of n-type. In some embodiments, if the photo-detecting apparatus is configured to collects holes, the guiding region 1517 is of p-type. In some embodiments, the guiding region 1517 is not coupled to any external control and thus is floated.

In some embodiments, the guiding region 1517 includes a dopant and has a dopant profile with a peak dopant concentration not less than $1 \times 10^{15}$ cm$^{-3}$. In some embodiments, the peak dopant concentration of the guiding region 1517 is between $1 \times 10^{15}$ cm$^{-3}$ and $1 \times 10^{17}$ cm$^{-3}$.

The guiding region 1517 is for facilitating the carriers flowing from the absorbed region AR toward the direction where the first switch and the second switch disposed first, and then the carriers are demodulated through the control contact layers 1506a, 1506b based on the control of the two control signals (not shown).

The photo-detecting apparatus 1500a includes multiple repeating pixels. The photo-detecting apparatus 1500a includes a pixel-array including multiple repeating pixels. In some embodiments, the pixel-array may be a one-dimensional or a two-dimensional array of pixels.

In some embodiments, the photo-detecting apparatus 1500a further includes a blocking layer 1519 surrounding at least a portion of the absorption layer 1502. The blocking layer 1519 is of a conductivity type. In some embodiments, the blocking layer 1519 is of a conductivity type the same as a conductivity type of the absorption layer 1502. The blocking layer 1519 may block photo-generated charges in the absorption layer 1502 from reaching the substrate 1504, which increases the collection efficiency of photo-generated carriers of the photo-detecting apparatus 1500a. The blocking layer 1519 may also block photo-generated charges in the substrate 1504 from reaching the absorption layer 1502', which increases the speed of photo-generated carriers of the photo-detecting apparatus 1500a. The blocking layer 1519 may include a material the same as the material of the absorption layer 1502, the same as the material of the substrate 1504, a material as a combination of the material of the absorption region 1502 and the material of the substrate 1504, or different from the material of the absorption layer 1502 and the material of the substrate 1504. In some embodiments, the shape of the blocking layer 1519 may be but not limited to a ring. In some embodiments, the blocking layer 1519 includes a dopant and has a dopant profile with a peak dopant concentration ranging from $10^{15}$ cm$^{-3}$ to $10^{20}$ cm$^{-3}$. The blocking layer 1519 may reduce the cross talk between two adjacent pixels.

Figure 15B:
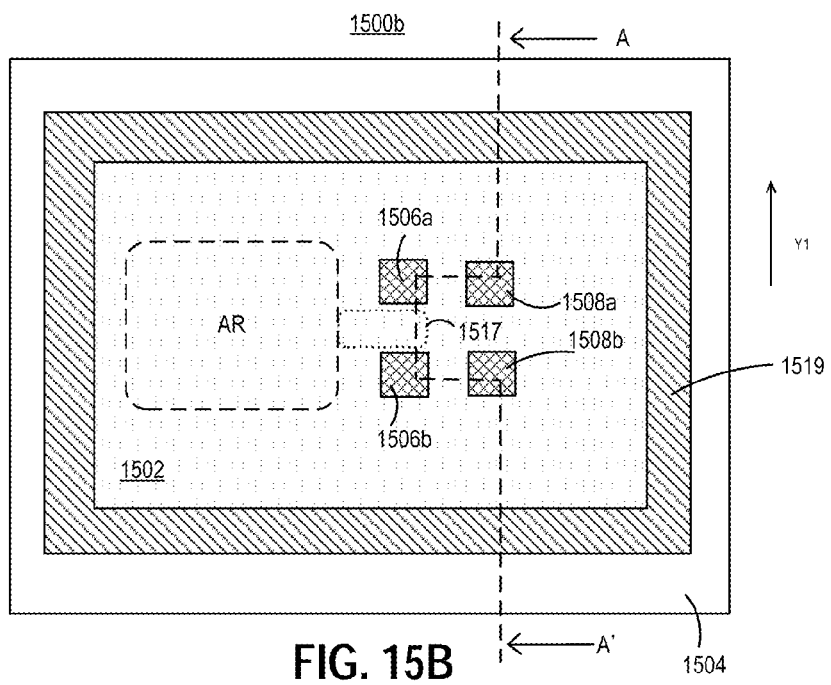

FIG. 15B illustrates a top view of a photo-detecting apparatus, according to some embodiments. The photo-detecting apparatus 1500b in FIG. 15B is similar to the photo-detecting apparatus 1500a in FIG. 15A, where the difference is described below. In some embodiments, the distance between the readout contact layers 1508a, 1508b along a Y direction Y1 can be substantially the same as the distance between the control contact layers 1506a, 1506b along a Y direction Y1. In some embodiments, the control contact layer 1506a is between the absorbed region AR and the readout contact layer 1508a. In some embodiments, the control contact layer 1506b is between the absorbed region AR and the readout contact layer 1508b. In some embodiments, the guiding region 1517 may be adjacent to the absorbed region AR and not overlapped with the absorbed region AR.

Figure 15C:
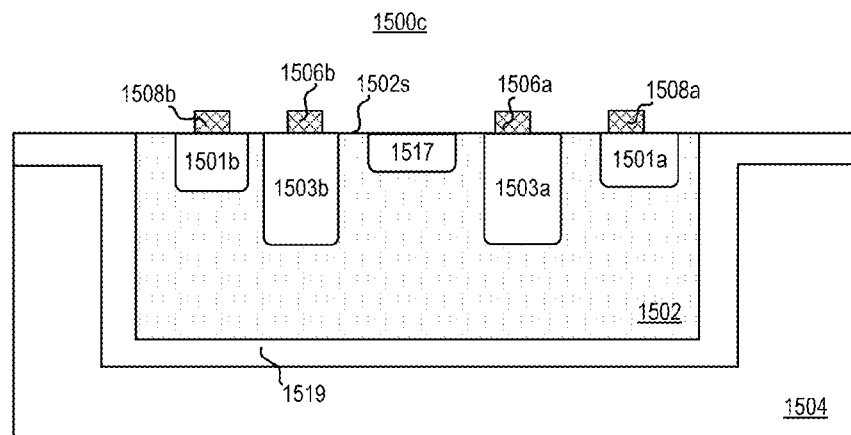
FIGS. 15C-15D illustrate cross-sectional views of a photo-detecting apparatus, according to some embodiments.

FIG. 15C illustrates a cross-sectional view of a photo-detecting apparatus, according to some embodiments. In some embodiments, FIG. 15C illustrates a cross-sectional view along an A-A' line in FIG. 15A or in FIG. 15B. In some embodiments, the cross-sectional view shown in FIG. 15C may be a cross-sectional view along any possible cross-sectional line of a photo-detecting apparatus. In some embodiments, the first switch further includes a first doped region 1501a under the readout contact layers 1508a. The second switch further includes a first doped region 1501b under the readout contact layers 1508b. In some embodiments, the first doped regions 1501a, 1501b are of a first conductivity type. In some embodiments, the first doped regions 1501a, 1501b include a first dopant. The peak dopant concentrations of the first doped regions 1501a, 1501b depend on the material of the readout contact layers 1508a, 1508b and the material of the absorption layer 1502, for example, between $5 \times 10^{18}$ cm$^{-3}$ to $5 \times 10^{20}$ cm$^{-3}$. The first doped regions 1501a, 1501b are for collecting the carriers generated from the absorption layer 1502, which are further processed by the first readout circuit (not shown) and the second readout circuit (not shown) respectively based on the control of the two control signals (not shown).

In some embodiments, the blocking layer 1519 is of a conductivity type different from the first conductivity type of each of the first doped regions 1501b, 1501a. In some embodiments, the peak dopant concentration of the guiding region 1517 is lower than the peak dopant concentration of the first doped regions 1501a, 1501b. In some embodiments, the photo-detecting apparatus 1500c further includes a conductive layer (not shown) electrically coupled to the blocking layer 1619. In some embodiments, the blocking layer 1519 may be biased by a bias voltage through the conductive layer to discharge carriers not collected by the first doped regions 1501a, 1501b.

In some embodiments, the first switch further includes a second doped region 1503a under the control contact layer 1506a. The second switch further includes a second doped region 1503b under the control contact layer 1506b. In some embodiments, the second doped regions 1503a, 1503b are of a second conductivity type different from the first conductivity type of the first doped regions 1501b, 1501a. In some embodiments, the second doped regions 1503a, 1503b include a second dopant. The peak dopant concentrations of the second doped regions 1503a, 1503b depend on the material of the control contact layers 1506b, 1506a and the material of the absorption layer 1502, for example, between $1 \times 10^{17}$ cm$^{-3}$ to $5 \times 10^{20}$ cm$^{-3}$. The second doped regions 1503a, 1503b forms a Schottky or an Ohmic contact or a combination thereof with the control contact layers 1506b, 1506a. The second doped regions 1503a, 1503b are for demodulating the carriers generated from the absorption layer 1502 based on the control of the control signals (not shown). In some embodiments, the guiding region 1517 is between the second doped regions 1503a, 1503b.

In some embodiments, each of the second doped regions 1503*a*, 1503*b* has a depth greater than a depth of each of the first doped regions 1501*a*, 1501*b*. The depth is measured from the first surface 1502' of the absorption layer 1502 to a position where the dopant reaches a background concentration, such as $1 \times 10^{15}$ cm$^{-3}$. In some embodiments, the guiding region 1517 has a depth not more than the depth of each of the second doped regions 1503*a*, 1503*b*.

In some embodiments, the guiding region 1517 may be floated. In some embodiments, the photo-detecting apparatus 1500*c* may further include a conductive layer (not shown) electrically connected to the guiding region 1517. In some embodiments, the guiding region 1517 may be biased through the conductive layer by a bias voltage. In some embodiments, the guiding region 1517 and the blocking layer 1519 are collectively formed as a vertical photodiode, there is a built-in vertical electrical field established between the guiding region 1517 and the blocking layer 1519, which may assist in separating the electron-hole pairs generated by the absorbed photons in the absorption layer 1502. The term "vertical" is a direction substantially perpendicular to the first surface of the absorption layer 1502.

Figure 15D:
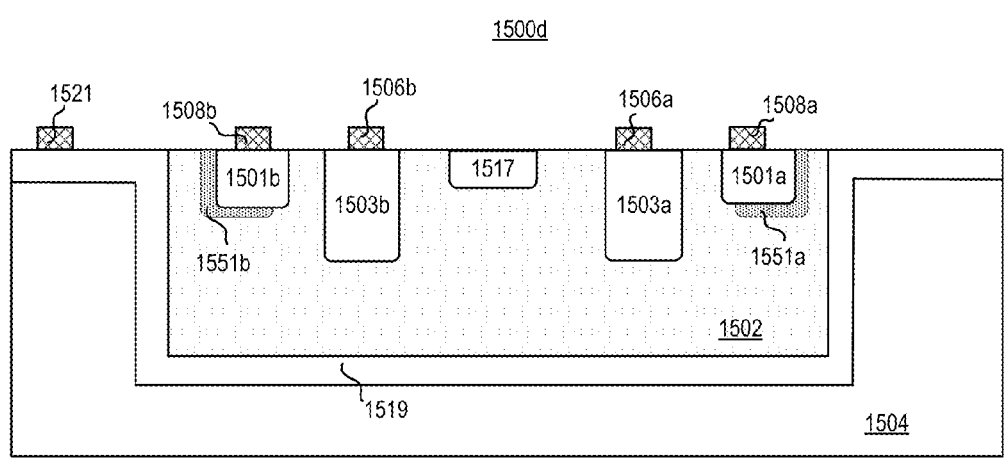

FIG. 15D illustrates a cross-sectional view of a photo-detecting apparatus, according to some embodiments. In some embodiments, the cross-sectional view shown in FIG. 15D may be a cross-sectional view along any possible cross-sectional line of a photo-detecting apparatus. The photo-detecting apparatus 1500*d* in FIG. 15D is similar to the photo-detecting apparatus 1500*c* in FIG. 15C, where the difference is described below. In some embodiments, the photo-detecting apparatus further 1500*d* includes two counter-doped regions 1551*a*, 1551*b*. In some embodiments, the counter-doped regions 1551*a*, 1551*b* are formed in the absorption layer 1502. In some embodiments, the counter-doped region 1551*a* overlaps with at least a portion of the first doped region 1501*a*. The counter-doped region 1551*b* overlaps with at least a portion of the first doped region 1501*b*. In some embodiments, the counter-doped regions 1551*a*, 1551*b* overlaps with a portion of the first doped region 1501*a*, 1501*b* father from the control contact layers 1506*a*, 1506*b*, and the other portions of the first doped regions 1501*a*, 1501*b* are not overlapped with the counter-doped region 1551*a*, 1551*b*. In some embodiments, each of the first doped regions 1501*a*, 1501*b* is entirely overlapped with respective counter-doped region 1551*a*, 1551*b*.

Each of the counter-doped regions 1551*a*, 1551*b* has a conductivity type different from the first conductivity type of the first doped region 1501*a*, 1501*b*. For example, if the first doped regions 1501*a*, 1501*b* are of n-type, the counter-doped regions 1551*a*, 1551*b* are of p-type. In some embodiments, each of the counter-doped regions 1551*a*, 1551*b* includes a dopant having a peak dopant concentration. The peak dopant concentration is not less than $1 \times 10^{16}$ cm$^{-3}$. In some embodiment, the peak dopant concentrations of the counter-doped regions 1551*a*, 1551*b* are lower than the peak dopant concentrations of the first doped regions 1501*b*, 1501*a*. In some embodiments, the peak dopant concentration of each of the counter-doped regions 1551*a*, 1551*b* is between $1 \times 10^{16}$ cm$^{-3}$ and $1 \times 10^{19}$ cm$^{-3}$. In some embodiments, the counter-doped regions 1551*a*, 1551*b* serve as dark-current reduction regions for reducing the dark current of the photo-detecting apparatus 1500*d*. Compared to a photo-detecting apparatus devoid of counter-doped region 1551*a*, 1551*b*, the photo-detecting apparatus 1500*d* including counter-doped region 1551*a*, 1551*b* overlapped with at least a portion of the first doped region 1501*a*, 1501*b* has thinner depletion regions in the absorption layer 1502, and thus the photo-detecting apparatus 1500*d* is with lower dark current.

In some embodiments, the counter-doped regions 1551*a*, 1551*b* may reduce the coupling between the two first doped regions 1501*a*, 1501*b*.

In some embodiments, the photo-detecting apparatus 1500*d* may further include a conductive layer 1521 electrically connected to the blocking layer 1519. The blocking layer 1519 may be biased through the conductive layer 1521 by a bias voltage to discharge carriers not collected by the first doped regions 1501*a*, 1501*b*. In some embodiments, the blocking layer 1519 may be biased and thus provides a vertical electric field between the blocking layer 1519 and the guiding region 1517, which may assist in separating the electron-hole pairs generated in the absorbed region AR. In some embodiments, the photo-detecting apparatus 1500*d* may further include another conductive layer (not shown) electrically connected to the guiding region 1517 to bias the guiding region 1517, which further enhances the vertical electric field between the blocking layer 1519 and the guiding region 1517.

Figure 15E:
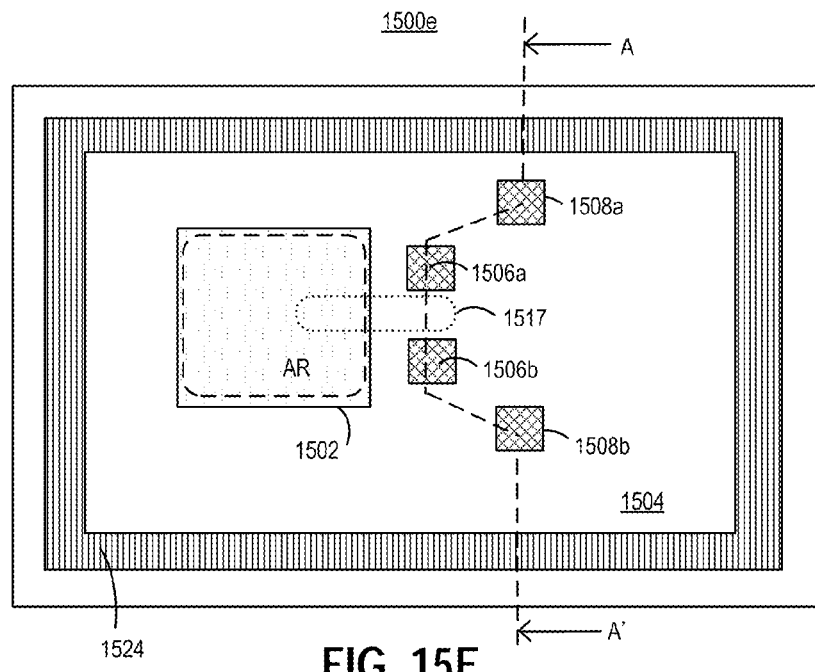
FIG. 15E illustrates a top view of a photo-detecting apparatus, according to some embodiments.

FIG. 15E illustrates a top view of a photo-detecting apparatus, according to some embodiments. The photo-detecting apparatus 1500*e* in FIG. 15E is similar to the photo-detecting apparatus in FIG. 15A, where the difference is described below. The photo-detecting apparatus 1500*e* is devoid of a blocking layer 1519. The readout contact layers 1508*a*, 1508*b*, the control contact layers 1506*a*, 1506*b* are formed over a first surface of the substrate 1504. The guiding region 1517 is formed in both of the absorption layer 1502 and the substrate 1504. In other words, a portion of the guiding region 1517 is in the absorption layer 1502, the other portion of the guiding region 1517 is in the substrate 1504. In some embodiments, the guiding region 1517 covers a part of the interface between the substrate 1504 and the absorption layer 1502. In some embodiments, the photo-detecting apparatus 1500*e* further includes an isolation region 1524 formed in the substrate 1504 and surrounding the absorption layer 1502, the readout contact layers 1508*a*, 1508*b*, and the control contact layers 1506*a*, 1506*b* from the top view of the photo-detecting apparatus 1500*e*. The isolation region 1524 is separated from the absorption layer 1502. In some embodiments, the isolation region 1524 is a trench filled with a dielectric material or an insulating material to serve as a region of high electrical resistance between the two adjacent pixels, impeding a flow of current across the isolation region 1524 and improving electrical isolation between the adjacent pixels. The dielectric material or an insulating material may include, but is not limited to oxide material including SiO$_2$ or nitride material including Si$_3$N$_4$ or silicon material including amorphous-Si, poly-Si, monocrystalline-Si or epitaxial-Si. In some embodiments, from a cross-sectional; view of the photo-detecting apparatus 1500*e*, the isolation region 1524 extends from a first surface (not labeled) of the substrate 1504' and extends into a predetermined depth from the first surface. In some embodiments, the isolation region 1524 extends from a second surface (not shown) of the substrate 1504 and extends into a predetermined depth from the second surface. In some embodiments, the isolation region 1524 penetrates though the substrate 1504 from the first surface to the second surface.

In some embodiments, the isolation region 1524 is a doped region having a conductivity type. The doping of the isolation region 1524 may create a bandgap offset-induced potential energy barrier that impedes a flow of current across the isolation region 1524 and improving electrical isolation between the adjacent pixels of the photo-detecting apparatus 1500*e*. In some embodiments, the isolation region 1524 includes a semiconductor material that is different from the material of the substrate 1504. An interface between two different semiconductor materials formed between the substrate 1504 and the isolation region 1524 may create a bandgap offset-induced energy barrier that impedes a flow of current across the isolation region 1524 and improving electrical isolation between the adjacent pixels of the photo-detecting apparatus 1500*e*. In some embodiments, the shape of the isolation region 1524 may be a ring. In some embodiments, the isolation region 1524 may include two discrete regions disposed at the two opposite sides of the absorption layer 1502'.

Figure 15F:
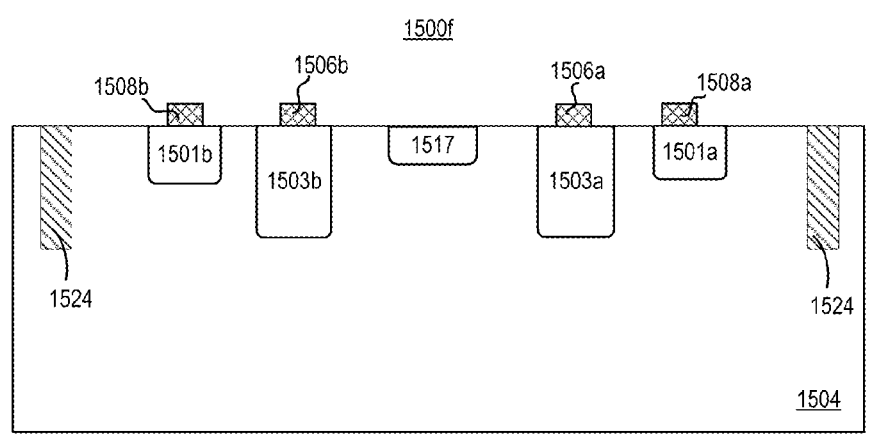
FIG. 15F illustrates cross-sectional views of a photo-detecting apparatus, according to some embodiments.

FIG. 15F illustrates a cross-sectional view of a photo-detecting apparatus, according to some embodiments. In some embodiments, FIG. 15F illustrates a cross-sectional view along an A-A' line in FIG. 15E. In some embodiments, the cross-sectional view shown in FIG. 15F may be a cross-sectional view along any possible cross-sectional line of a photo-detecting apparatus. In some embodiments, the first switch of the photo-detecting apparatus 1500*f* further includes a first doped region 1501*a*, which is similar to the first doped region as mentioned before, such as the first doped region 1501*a* as described in FIG. 15C. In some embodiments, the second switch further includes a first doped region 1501*b*, which is similar to the first doped region as mentioned before, such as first doped region 1501*b* as described in FIG. 15C. In some embodiments, the first switch further includes a second doped region 1503*a*, which is similar to the second doped region as mentioned before, such as the second doped region 1503*a* as described in FIG. 15C. In some embodiments, the second switch includes a second doped region 1503*b*, which is similar to the second doped region as mentioned before, such as the second doped region 1503*b* as described in FIG. 15C. The guiding region 1517 is between the second doped regions 1503*a*, 1503*b*. In some embodiments, the conductivity type of the isolation region 1524 can be different from or the same as the first conductivity type of the first doped regions 1501*a*, 1501*b*.

Figure 15G:
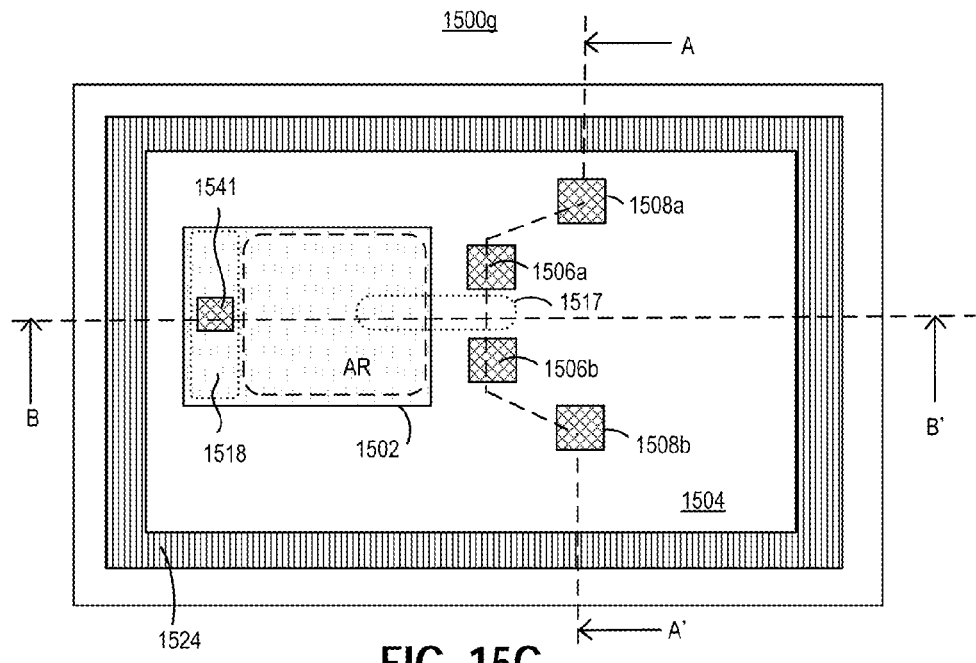
FIG. 15G illustrates a top view of a photo-detecting apparatus, according to some embodiments.

FIG. 15G illustrates a top view of a photo-detecting apparatus, according to some embodiments. The photo-detecting apparatus 1500*g* in FIG. 15G is similar to the photo-detecting apparatus 1500*e* in FIG. 15E, where the difference is described below. In some embodiments, the pixel of the photo-detecting apparatus further includes a discharging region 1518 formed in the absorption layer 1502. In some embodiments, the discharging region 1518 is disposed at a side of the absorbed region AR opposite to the side of the absorbed region AR where the first switch and the second switch are disposed. In some embodiments, the absorbed region AR is between the discharging region 1518 and the control contact layer 1506*a* or the control contact layer 1506*b*.

The discharging region 1518 is of a conductivity type different from conductivity type of the guiding region 1517. In some embodiments, the discharging region 1518 includes a dopant and has a dopant profile with a peak dopant concentration ranging from $1\times10^{18}$ cm$^{-3}$ to $5\times10^{20}$ cm$^{-3}$. The discharging region 1518 is for discharging the carriers not collected by the first doped regions 1501*a*, 1501 *b* during the operation of the photo-detecting apparatus 1500*g*. Therefore, the photo-detecting apparatus 1500*g* is with improved reliability and quantum efficiency. In some embodiments, the pixel of the photo-detecting apparatus 1500*g* further includes a conductive layer 1541 electrically coupled to the discharging region 1518 and disposed over the absorption layer 1502 for biasing the discharging region 1518. For example, if the photo-detecting apparatus 1500*g* is configured to collect electrons, the holes may be discharged through the discharging region 1518 and the conductive layer 1541.

Figure 15H:
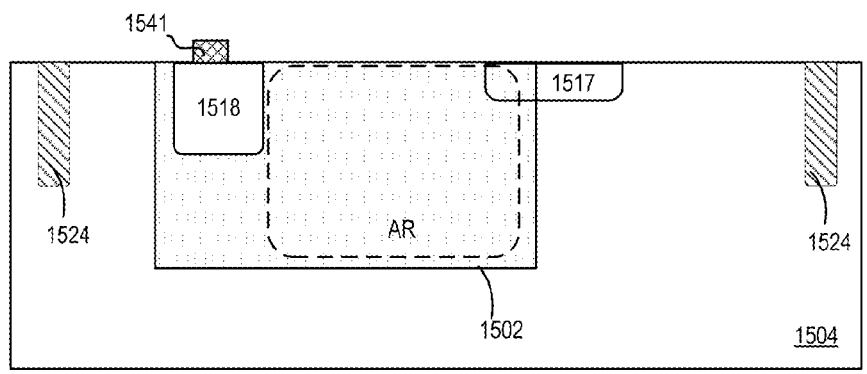
FIG. 15H illustrates cross-sectional views of a photo-detecting apparatus, according to some embodiments.

FIG. 15H illustrates a cross-sectional view of a photo-detecting apparatus, according to some embodiments. In some embodiments, FIG. 15H illustrates a cross-sectional view along a B-B' line in FIG. 15G. In some embodiments, the cross-sectional view shown in FIG. 15H may be a cross-sectional view along any possible cross-sectional line of a photo-detecting apparatus.

Figure 15I:
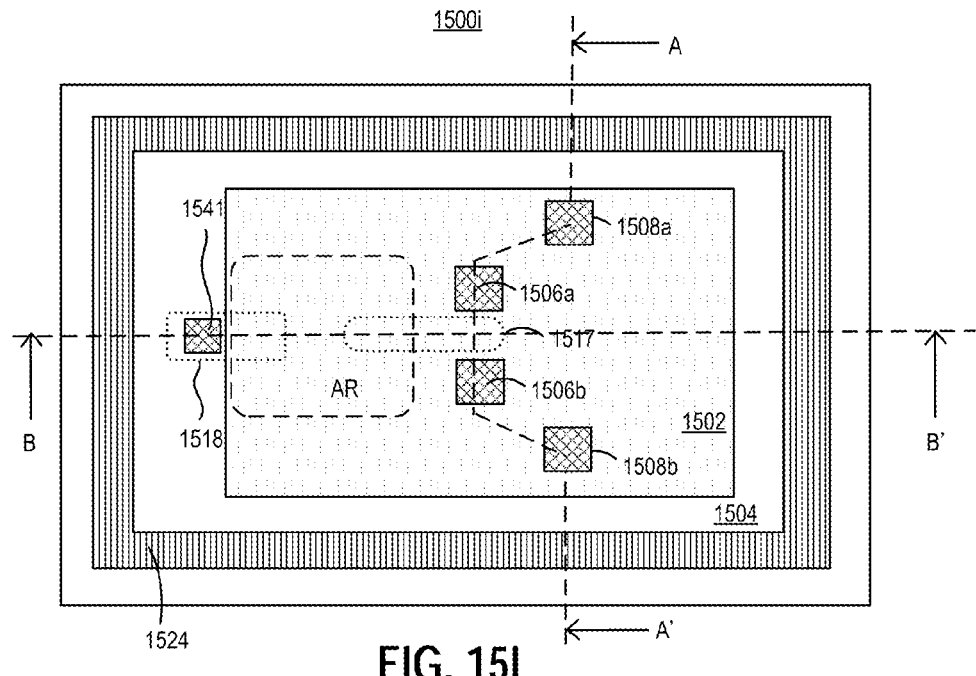
FIG. 15I illustrates a top view of a photo-detecting apparatus, according to some embodiments.

FIG. 15I illustrates a top view of a photo-detecting apparatus, according to some embodiments. The photo-detecting apparatus 1500*i* in FIG. 15I is similar to the photo-detecting apparatus 1500*a* in FIG. 15A, where the difference is described below. In some embodiments, the pixel of the photo-detecting apparatus 1500*i* further includes a discharging region 1518, which is similar to the discharging region 1518 described in FIG. 15G. Where the difference is described below. The discharging region 1518 is formed in both of the absorption layer 1502 and the substrate 1504. In other words, a portion of the discharging region 1518 is in the absorption layer 1502, the other portion of the discharging region 1518 is in the substrate 1504. The pixel of the photo-detecting apparatus 1500*i* further includes a conductive layer 1541 electrically coupled to the discharging region 1518 for biasing the discharging region 1518, as described in FIG. 15G. The conductive layer 1541 is disposed over the substrate 1504 and overlapped with the discharging region 1518.

Figure 15J:
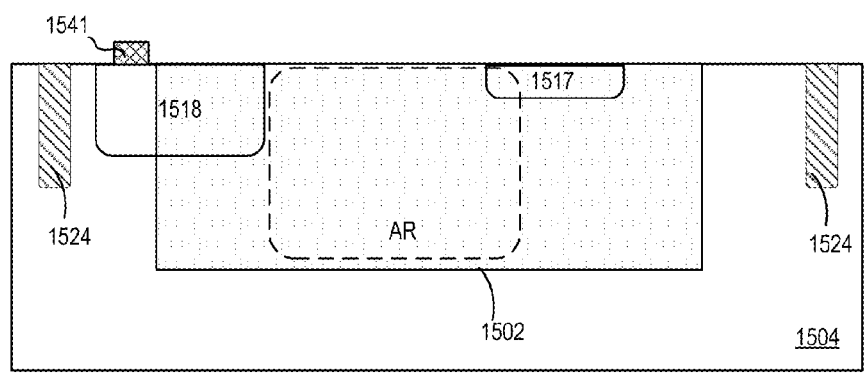
FIG. 15J illustrates cross-sectional views of a photo-detecting apparatus, according to some embodiments.

FIG. 15J illustrates a cross-sectional view of a photo-detecting apparatus, according to some embodiments. In some embodiments, FIG. 15J illustrates a cross-sectional view along a B-B' line in FIG. 15I. In some embodiments, the cross-sectional view shown in FIG. 15J may be a cross-sectional view along any possible cross-sectional line of a photo-detecting apparatus.

Figure 15K:
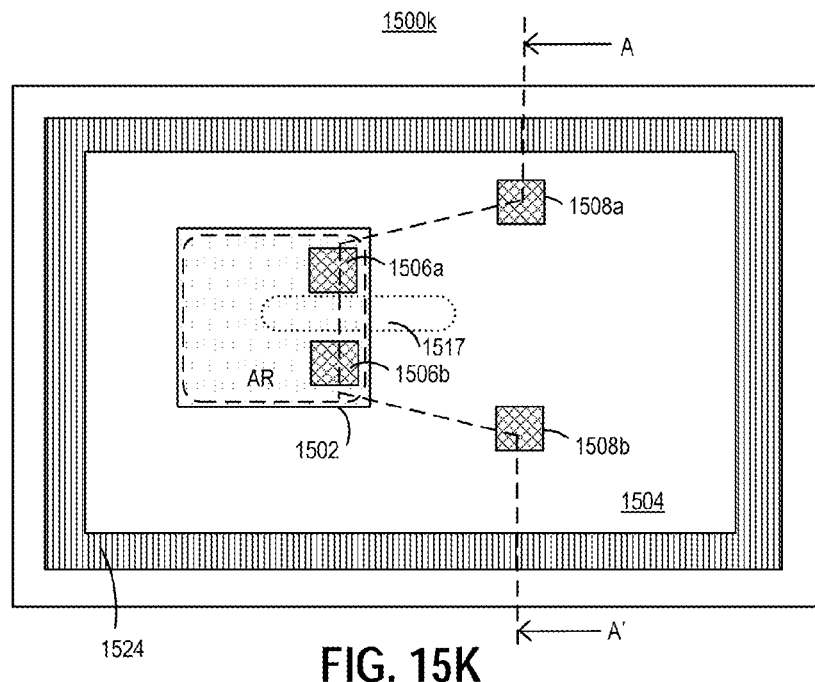
FIG. 15K illustrates a top view of a photo-detecting apparatus, according to some embodiments.

FIG. 15K illustrates a top view of a photo-detecting apparatus, according to some embodiments. The photo-detecting apparatus 1500*k* in FIG. 15K is similar to the photo-detecting apparatus 1500*e* in FIG. 15E, where the difference is described below. In some embodiments, the control contact layers 1506*a*, 1506*b* are over a first surface of the absorption layer 1502, which may increase the lateral electric field between the portions in the absorption layer 1502 right under the control contact layers 1506*a*, 1506*b*. In some embodiments, the pixel of the photo-detecting apparatus 1500*k* may further include a discharging region 1518 as described in FIG. 15G or in FIG. 15I. In some embodiments, the photo-detecting apparatus 1500*k* may further include a conductive layer 1541 as described in FIG. 15G or in FIG. 15I.

Figure 15L:
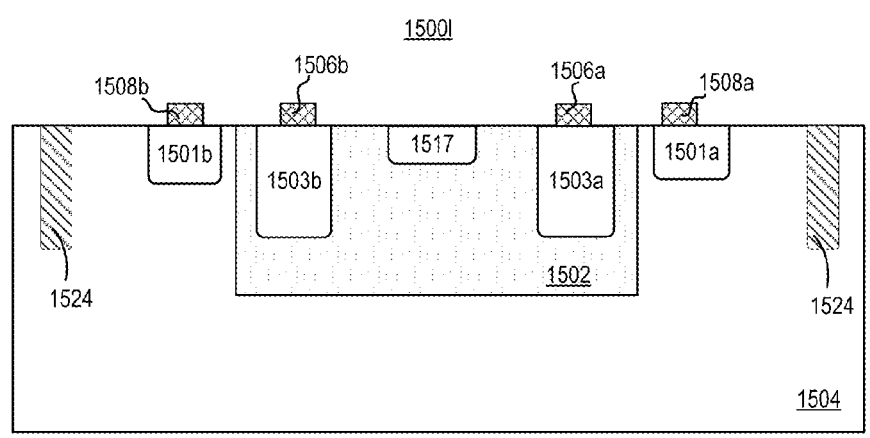
FIG. 15L illustrates cross-sectional views of a photo-detecting apparatus, according to some embodiments.

FIG. 15L illustrates a cross-sectional view of a photo-detecting apparatus, according to some embodiments. In some embodiments, FIG. 15L illustrates a cross-sectional view along a A-A' line in FIG. 15K. In some embodiments, the cross-sectional view shown in FIG. 15L may be a cross-sectional view along any possible cross-sectional line of a photo-detecting apparatus. In some embodiments, the first switch further includes a first doped region 1501*a*, which is similar to the first doped region as mentioned before, such as the first doped regions 1501*a* as described in FIG. 15C. In some embodiments, the second switch further includes a first doped region 1501*b*, which is similar to the first doped region as mentioned before, such as the first doped regions 1501b as described in FIG. 15C. In some embodiments, the first switch further includes a second doped region 1503a, which is similar to the second doped region as mentioned before, such as the second doped regions 1503a as described in FIG. 15C. In some embodiments, the second switch includes a second doped region 1503b, which is similar to the second doped region as mentioned before, such as the second doped regions 1503b as described in FIG. 15C. The guiding region 1517 is between the second doped regions 1503a, 1503b.

Figure 16A:
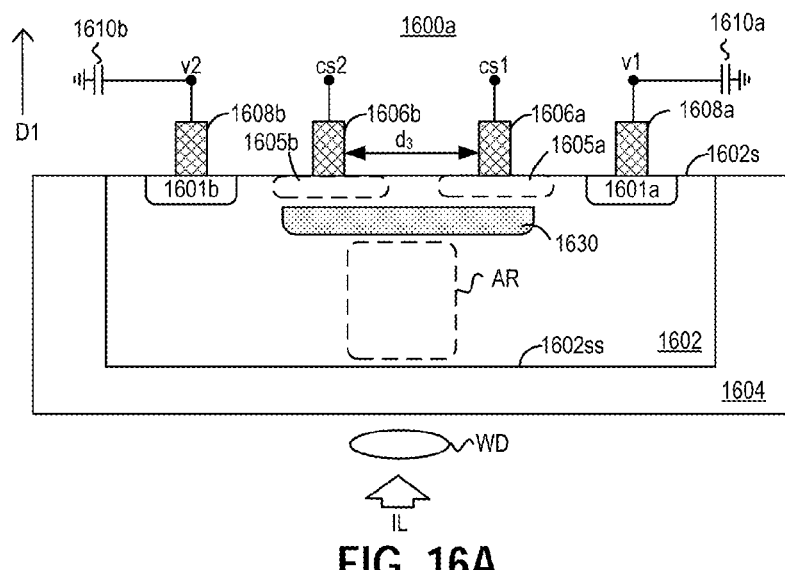
FIGS. 16A-16M illustrate cross-sectional views of a photo-detecting apparatus, according to some embodiments.

FIG. 16A illustrates a cross-sectional view of a photo-detecting apparatus, according to some embodiments. The photo-detecting apparatus 1600a includes a substrate 1604. The photo-detecting apparatus 1600a further includes a pixel including an absorption layer 1602 supported by the substrate 1604. The pixel includes an absorbed region AR similar to the absorbed region AR mentioned before, such as the absorbed region AR as described in FIG. 15A. The pixel includes a first switch (not labeled) and a second switch (not labeled) electrically coupled to the absorption layer 1602. The first switch includes a control contact layer 1606a and a readout contact layer 1608a. The second switch includes a control contact layer 1606b and a readout contact layer 1608b. In some embodiments, the readout contact layers 1608a, 1608b and the control contact layer 1606a, 1606b are formed over a first surface 1602s of the absorption layer 1602. In some embodiments, a width of the absorbed region AR is less than a distance between the readout contact layers 1608a, 1608b. In some embodiments, the readout contact layers 1608a, 1608b are disposed at two opposite sides of the absorbed region AR.

The photo-detecting apparatus 1600a includes multiple repeating pixels. The photo-detecting apparatus 1600a includes a pixel-array including multiple repeating pixels. In some embodiments, the pixel-array may be a one-dimensional or a two-dimensional array of pixels.

In some embodiments, un-doped regions 1605a, 1605b are right under the control contact layers 1606a, 1606b. That is, the portions of the absorption layer 1602 right under the control contact layers 1606a, 1606b may be intrinsic or include a dopant and has a dopant profile with a peak dopant concentration below approximately $1\times10^{15}$ cm$^{-3}$. The term "intrinsic" means that the portions of the absorption layer 1602 right under the control contact layers 1606a, 1606b are without intentionally adding dopants. In some embodiments, the control contact layers 1606a, 1606b on the absorption layer 1602 may lead to formation of a Schottky contact, an Ohmic contact, or a combination thereof having an intermediate characteristic between the two, depending on various factors including the material of the absorption layer 1602, the material of the control contact layers 1606a, 1606b, and the impurity or defect level of the absorption layer 1602.

In some embodiments, the pixel further includes two control signals cs1, cs2 controlling the control contact layers 1606a, 1606b for controlling the moving direction of the electrons or holes generated by the absorbed photons in the absorption layer 1602. For example, when voltages are used, if the control signal cs1 is biased against the control signal cs2, an electric field is created between the two un-doped regions 1605a, 1605b right under the control contact layers 1606a, 1606b, and free charges drift towards one of the two un-doped region 1605a, 1605b depending on the direction of the electric field.

In some embodiments, the pixel includes two capacitors 1610a, 1610b. The readout contact layers 1608a is electrically coupled to the capacitor 1610a, and the readout contact layers 1608b is electrically coupled to the capacitor 1610b. The capacitors 1610a, 1610b are similar to the capacitors as described before. In some embodiments, the pixel further includes a first readout circuit and a second readout circuit electrically coupled to the first switch and the second switch respectively for processing the collected charges. The first readout circuit may include the capacitor 1610a The second readout circuit may include the capacitor 1610b. The first readout circuit is electrically coupled to the readout contact layer 1608a. The second readout circuit is electrically coupled to the readout contact layer 1608b.

In some embodiments, the first switch includes a first doped region 1601a in the absorption layer 1602 and under the readout contact layers 1608a. The second switch includes a first doped region 1601b in the absorption layer 1602 and under the readout contact layers 1608b. In some embodiments, the first doped region 1601a is similar to the first doped region as mentioned before, such as the first doped regions 1501a as described in FIG. 15C. In some embodiments, the first doped region 1601b is similar to the first doped region as mentioned before, such as the first doped regions 1501b as described in FIG. 15C.

The pixel of the photo-detecting apparatus 1600a further includes a channel region 1630 in the absorption layer 1602. In some embodiments, the channel region 1630 is arranged between the two switches and the second surface 1602ss of the absorption layer 1602 along a direction substantially perpendicular to the first surface 1602s of the absorption layer 1602.

The channel region 1630 is under the control contact layers 1606a, 1606b along a vertical direction D1. The channel region 1630 includes a dopant and is of a conductivity type the same as the first conductivity type of the first doped regions 1601a, 1601b. In some embodiments, the channel region 1630 includes a dopant and has a dopant profile with peak dopant concentration not less than $1\times10^{15}$ cm$^{-3}$. In some embodiments, the peak dopant concentration of the channel region 1630 is between $1\times10^{15}$ cm$^{-3}$ and $5\times10^{17}$ cm$^{-3}$. In some embodiments, the peak dopant concentration of the channel region 1630 lies in the absorption layer 1602. The channel region 1630 is a buried region in the absorption layer 1602. In some embodiments, the distance between the first surface 1602s and the location of the channel region 1630 having the peak dopant concentration is not less than 30 nm. In some embodiments, the distance between the second surface 1602ss and the location of the channel region 1630 having the peak dopant concentration is not less than 30 nm. In some embodiments, a distance between the first surface 1602s of the absorption layer 1602 and a location of the channel region 1630 having the peak dopant concentration is less than a distance between the second surface 1602ss and the location of the channel region 1630 having the peak dopant concentration.

In some embodiments, the distance between the first surface 1602s of the absorption layer 1602 and a location of the channel region 1630 having the peak dopant concentration of the channel region 1630 is between 50 nm and 650 nm. The dopant profile of the channel region 1630 can be controlled by any suitable method, such as by implantation including providing multiple implant doses and energies. In some embodiments, a width of the channel region 1630 is greater than a distance $d_3$ between the control contact layers 1606a, 1606b for lowering the leakage current between the two control contact layers 1606a, 1606b of the photo-detecting apparatus 1600a. In some embodiments, the width of the channel region 1630 is between 10 nm and 500 nm.

The channel region 1630 facilitates the carriers generated from the absorption layer 1602 flowing toward the first doped region 1601a or the first doped region 1601b without reaching the first surface 1602s of the absorption layer 1602. As a result, the carriers accumulated between the portions under the control contact layers 1606a, 1606b are less. Accordingly, the demodulation contrast is improved and the leakage current between the two control contact layers 1606a, 1606b of the photo-detecting apparatus 1600a is lower.

In some embodiments, the channel region 1630 may be overlapped with the first doped regions 1601a, 1601b. That is, the channel region 1630 may be connected to the first doped regions 1601a, 1601b. If the first switch is switched on and the second switch is switched off, the carriers can be pushed to flow toward the first doped region 1601a by biasing the first doped region 1601b of the second switch. That is, through the voltage control, there is a disconnection between the channel region 1630 and the first doped region of the switch that is turned off for the carriers, and thus the carriers will not flow into the first doped region of the switch that is turned off.

In some embodiments, the channel region 1630 is separated from the first doped regions 1601a, 1601b for reducing the leakage current between the first doped regions 1601a, 1601b.

Figure 16B:
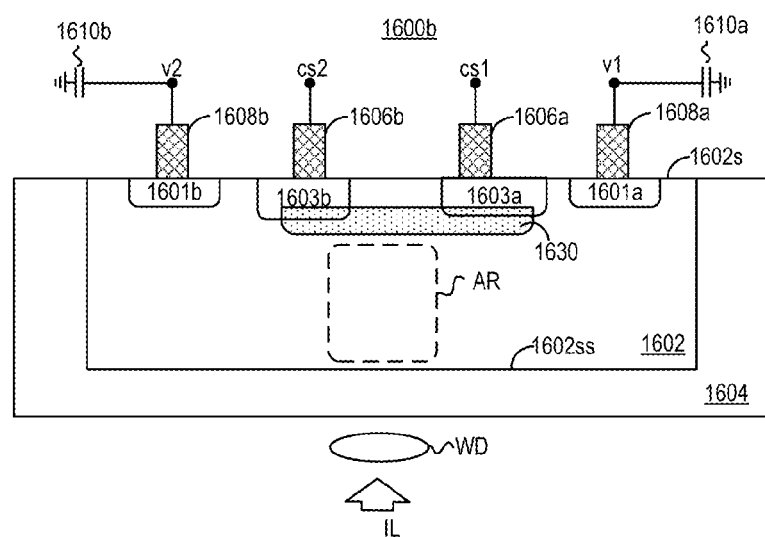

FIG. 16B illustrates a cross-sectional view of a photo-detecting apparatus, according to some embodiments. The photo-detecting apparatus 1600b in FIG. 16B is similar to the photo-detecting apparatus 1600a in FIG. 16A, where the difference is described below. In some embodiments, the first switch further includes a second doped region 1603a in the absorption layer 1602 and under the control contact layer 1606a. The second switch further includes a second doped region 1603b in the absorption layer 1602 and under the control contact layers 1606b. The second doped region 1503a is similar to the second doped region as mentioned before, such as the second doped regions 1503a as described in FIG. 15C. The second doped region 1503b is similar to the second doped region as mentioned before, such as the second doped regions 1503b as described in FIG. 15C. In some embodiments, the channel region 1630 is overlapped with the second doped regions 1603a, 1603b. That is, the overlapped area may include the dopant of the channel region 1630 and the dopant of the second doped regions 1603a, 1603b, wherein the two dopants are different.

Figure 16C:
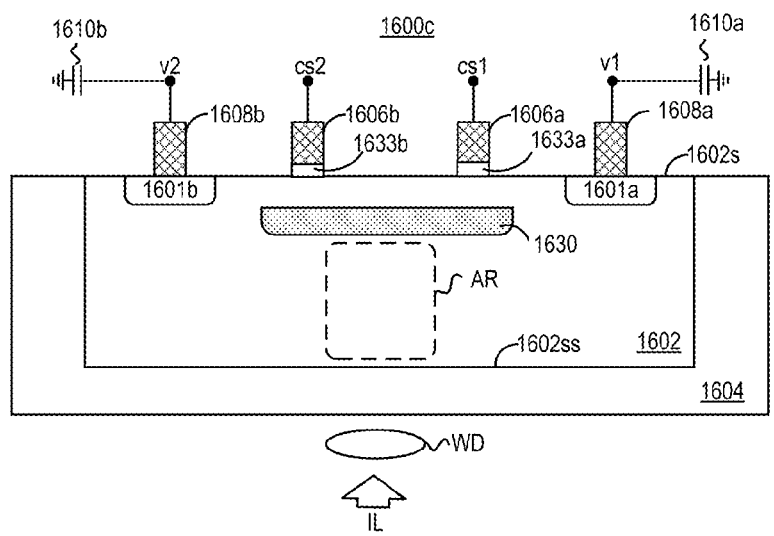

FIG. 16C illustrates a cross-sectional view of a photo-detecting apparatus, according to some embodiments. The photo-detecting apparatus 1600c in FIG. 16C is similar to the photo-detecting apparatus 1600a in FIG. 16A, where the difference is described below. In some embodiments, the first switch further includes a first dielectric layer 1633a between the absorption layer 1602 and the control contact layer 1606a. The second switch may further include a second dielectric layer 1633b between the absorption layer 1602 and the control contact layer 1606b.

The first dielectric layer 1633a prevents direct current conduction from the control contact layer 1606a to the absorption layer 1602, but allows an electric field to be established within the absorption layer 1602 in response to an application of a voltage to the control contact layer 1606a. The second dielectric layer 1633b prevents direct current conduction from the control contact layer 1606b to the absorption layer 1602 but allows an electric field to be established within the absorption layer 1602 in response to an application of a voltage to the control contact layer 1606b. The established electric field may attract or repel charge carriers within the absorption layer 1602.

Figure 16D:
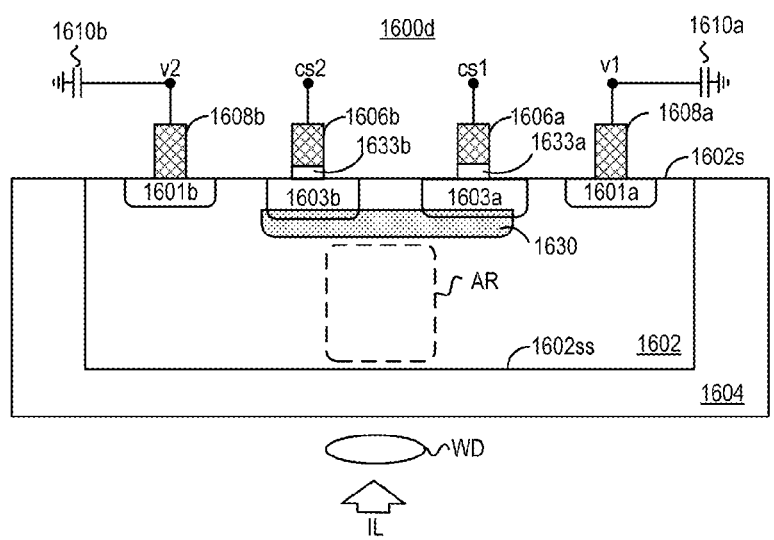

FIG. 16D illustrates a cross-sectional view of a photo-detecting apparatus, according to some embodiments. The photo-detecting apparatus 1600d in FIG. 16D is similar to the photo-detecting apparatus 1600c in FIG. 16C, where the difference is described below. In some embodiments, the first switch further includes a second doped region 1603a under the first dielectric layer 1633a. The second switch further includes a second doped region 1603b under the second dielectric layer 1633b. The second doped regions 1603a, 1603b are similar to the second doped regions as mentioned before, such as the second doped regions 1603a, 1603b as described in FIG. 16B.

Figure 16E:
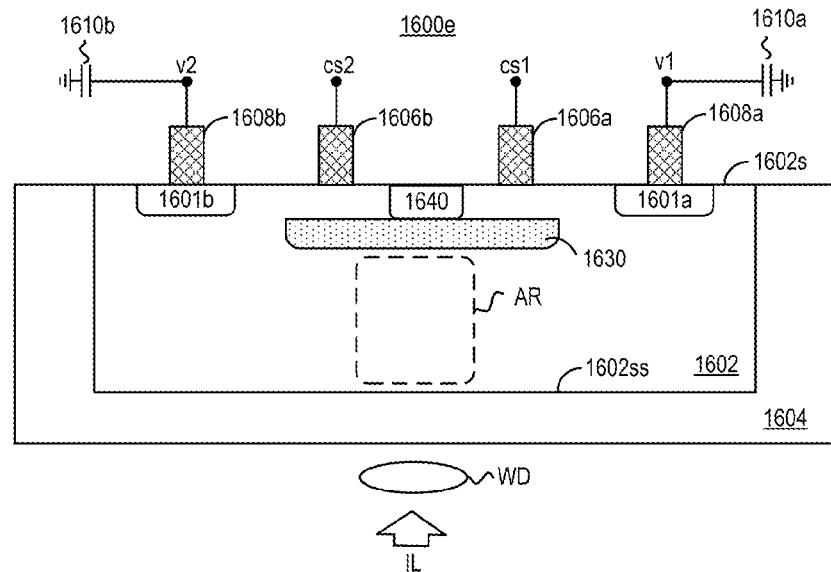

FIG. 16E illustrates a cross-sectional view of a photo-detecting apparatus, according to some embodiments. The photo-detecting apparatus 1600e in FIG. 16E is similar to the photo-detecting apparatus 1600a in FIG. 16A, where the difference is described below. In some embodiments, the absorption layer 1602 of the pixel includes a hinder region 1640. The hinder region 1640 is between the first doped regions 1601a, 1601b. The hinder region 1640 is between the first surface 1602s and the channel region 1630.

In some embodiments, the hinder region 1640 includes a dopant and is of a conductivity type. In some embodiments, the hinder region 1640 has a dopant profile with a peak dopant concentration different from the peak dopant concentration of the channel region 1630. In some embodiments, the conductivity type of the hinder region 1640 is the same as the conductivity type of the channel region 1630, and the peak dopant concentration of the hinder region 1640 is lower than the peak dopant concentration of the channel region 1630. For example, if the photo-detecting apparatus 1600e is configured to process the collected electrons for further application. the first doped regions 1601b, 1601a are of n-type, the channel region 1630 is of n-type, the hinder region 1640 is of n-type, and the peak dopant concentration of the hinder region 1640 is lower than the peak dopant concentration of the channel region 1630.

In some embodiments, the conductivity type of the hinder region 1640 is different from the conductivity type of the channel region 1630, and the peak dopant concentration of the hinder region 1640 is higher than the peak dopant concentration of the channel region 1630. In some embodiments, the peak dopant concentration of the hinder region 1640 is between $1 \times 10^{18}$ cm$^{-3}$ and $5 \times 10^{20}$ cm$^{-3}$. For example, if the photo-detecting apparatus 1600e is configured to process the collected electrons for further application. the first doped regions 1601b, 1601a are of n-type, the channel region 1630 is of n-type, the hinder region 1640 is of p-type, and the peak dopant concentration of the hinder region 1640 is higher than the peak dopant concentration of the channel region 1630.

The hinder region 1640 can block the carriers to be collected from reaching the first surface 1602s of the absorption layer 1602. As a result, a collection efficiency of the photo-detecting apparatus 1600e can be improved.

Figure 16F:
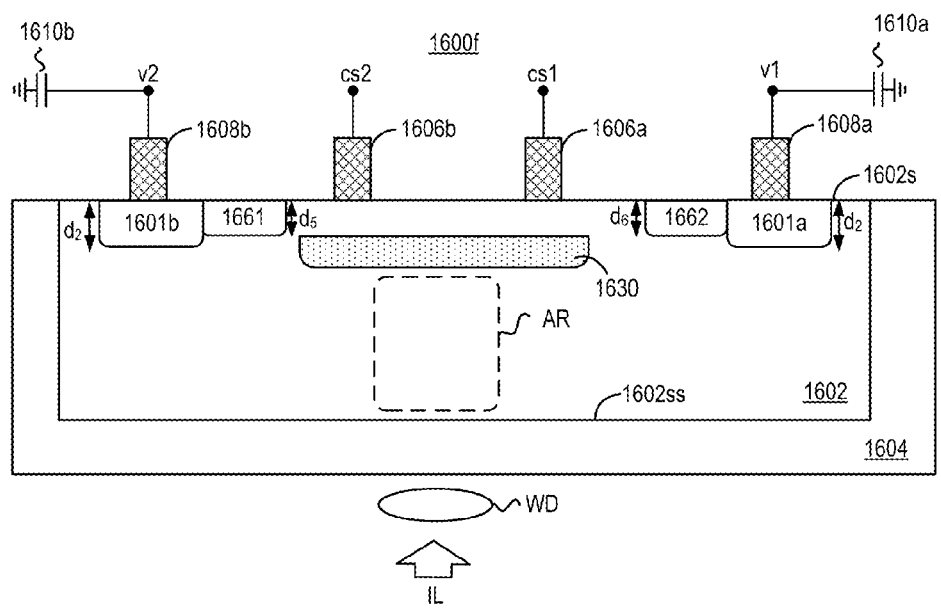

FIG. 16F illustrates a cross-sectional view of a photo-detecting apparatus, according to some embodiments. The photo-detecting apparatus 1600f in FIG. 16F is similar to the photo-detecting apparatus 1600e in FIG. 16E, where the difference is described below. The photo-detecting apparatus 1600f further includes a first buffer region 1661 and a second buffer region 1662. The first buffer region 1661 and the second buffer region 1662 are in the absorption layer 1602. The first buffer region 1661 is between the first doped regions 1601a, 1601b and is adjacent to or overlapped with the first doped region 1601b. In some embodiments, the first buffer region 1661 is separated from the channel region 1630 for lowering the dark current of the photo-detecting apparatus 1600f. The second buffer region 1662 is between the first doped regions 1601a, 1601b and is adjacent to or overlapped with the first doped region 1601a. In some embodiments, the second buffer region 1662 is separated from the channel region 1630 for lowering the dark current of the photo-detecting apparatus 1600f. The first buffer region 1661 and the second buffer region 1662 can further modify the depletion regions in the absorption layer 1602, such as the depletion regions around the first doped regions 1601a, 1601b and the depletion regions near the first surface 1602s of the absorption layer 1602.

In some embodiments, each of the first buffer region 1661 and the second buffer region 1662 has a conductivity type. In some embodiments, each of the first buffer region 1661 and the second buffer region 1662 includes a fifth dopant and has a dopant profile with a peak dopant concentration. The peak dopant concentration is not less than $1 \times 10^{16}$ cm$^{-3}$. In some embodiments, the peak dopant concentrations of the first buffer region 1661 and the second buffer region 1662 are lower than the peak dopant concentrations of the first doped regions 1601b, 1601a. In some embodiments, the peak dopant concentration of the first buffer region 1661 and the second buffer region 1662 is, for example, between $1 \times 10^{16}$ cm$^{-3}$ and $1 \times 10^{18}$ cm$^{-3}$.

Since each of the first buffer region 1661 and the second buffer region 1662 has a peak dopant concentration lower than the peak dopant concentrations of the first doped regions 1601b, 1601a, the reliability of the photo-detecting apparatus 1600f can be improved.

In some embodiments, the conductivity types of the first buffer region 1661 and the second buffer region 1662 are the same as the first conductivity type of the first doped regions 1601a, 1601b. For example, if the photo-detecting apparatus 1600f is configured to process the collected electrons for further application, the first doped regions 1601a, 1601b are of n-type, the channel region 1630 is of n-type, and the first buffer region 1661 and the second buffer region 1662 are of n-type.

The first buffer region 1661 and the second buffer region 1662 with the same conductivity type as the first conductivity type of the first doped regions 1601a, 1601b can improve carrier collection efficiency since the carrier collection can be confined near the first surface 1602s of the absorption layer 1602 by the first buffer region 1661 and the second buffer region 1662.

In some embodiments, the conductivity types of the first buffer region 1661 and the second buffer region 1662 are different from the first conductivity type of the first doped regions 1601a, 1601b. For example, if the photo-detecting apparatus 1600f is configured to process the collected electrons for further application, the first doped regions 1601a, 1601b are of n-type, the channel region 1630 is of n-type, and the first buffer region 1661 and the second buffer region 1662 are of p-type. The first buffer region 1661 blocks the carriers from flowing near the first surface 1602s into the first doped region 1601b, and lowers the local dark current at the same time. The second buffer region 1662 blocks the carriers from flowing near the first surface 1602s into the first doped region 1601a and lowers the local dark current at the same time.

The first buffer region 1661 and the second buffer region 1662 with conductivity type different from the first conductivity type of the first doped regions 1601a, 1601b can improve carrier collection efficiency, since the carrier collection can be confined within a region away from the first surface 1602s of the absorption layer 1602, for example, confined at the part of the first doped region 1601a, 1601b farther from the first surface 1602s of the absorption layer 1602.

In some embodiments, the first buffer region 1661 includes a depth $d_5$ less than a depth $d_2$ of the first doped region 1601b. In some embodiments, the second buffer region 1662 includes a depth $d_6$ less than a depth $d_2$ of the first doped region 1601a. The depth is measured from the first surface 1602s of the absorption layer 1602 to a position where the dopant profile reaches a background concentration, such as $1 \times 10^{15}$ cm$^{-3}$.

Figure 16G:
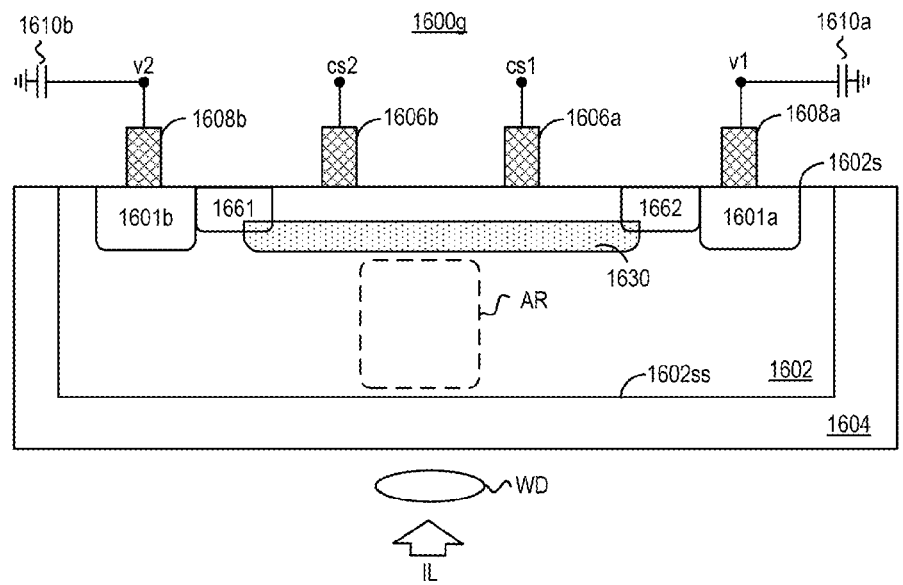

FIG. 16G illustrates a cross-sectional view of a photo-detecting apparatus, according to some embodiments. The photo-detecting apparatus 1600g in FIG. 16G is similar to the photo-detecting apparatus 1600f in FIG. 16F, where the difference is described below. In some embodiments, the channel region 1630 may be overlapped with the first buffer region 1661 and the second buffer region 1662. That is, the channel region 1630 may be connected to the first buffer region 1661 and the second buffer region 1662. Since the channel region 1630 is connected to the first buffer region 1661 and the second buffer region 1662, the demodulation contrast of the photo-detecting apparatus 1600g is improved.

Figure 16H:
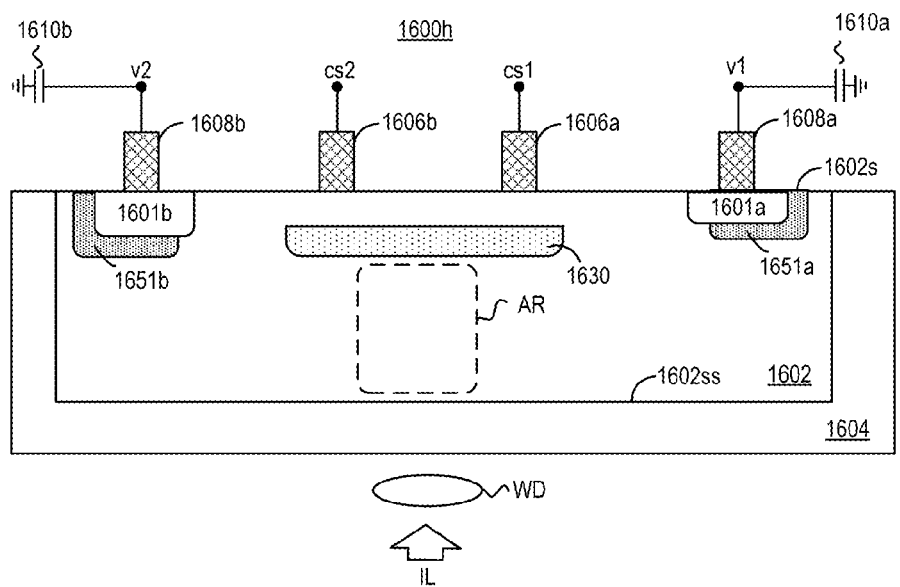

FIG. 16H illustrates a cross-sectional view of a photo-detecting apparatus, according to some embodiments. The photo-detecting apparatus 1600h in FIG. 16H is similar to the photo-detecting apparatus 1600a in FIG. 16A, where the difference is described below. In some embodiments, the pixel of the photo-detecting apparatus 1600h further includes two counter-doped regions 1651a, 1651b in the absorption layer 1602. The counter-doped regions 1651a, 1651b are similar to the counter-doped regions as mentioned before, such as the counter-doped regions 1551a, 1551b as described in FIG. 15D.

Figure 16I:
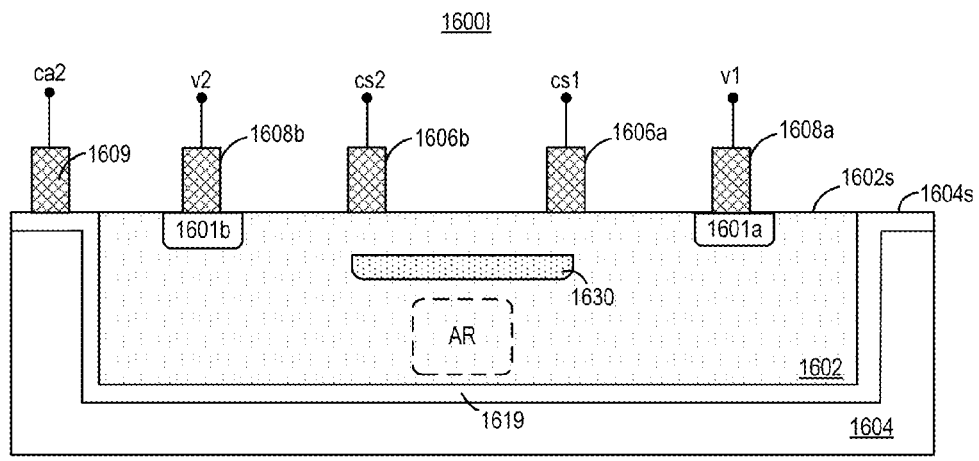

FIG. 16I illustrates a cross-sectional view of a photo-detecting apparatus, according to some embodiments. The photo-detecting apparatus 1600i in FIG. 16I is similar to the photo-detecting apparatus 1600a in FIG. 16A, where the difference is described below. In some embodiments, the photo-detecting apparatus 1600i further includes a blocking layer 1619 surrounding the absorption layer 1602. The blocking layer 1619 is similar to the blocking layer as described before, such as the blocking layer 1519 in FIG. 15A and FIG. 15C. The photo-detecting apparatus 1600i further includes a conductive layer 1609 electrically coupled to the blocking layer 1619. In some embodiments, the blocking layer 1619 may be biased by a bias voltage ca2 through the conductive layer 1609 to discharge the carriers not collected by the first doped regions 1601a, 1601b.

In some embodiments, since the channel region 1630 and blocking layer 1619 are collectively formed as a vertical photodiode, there is a built-in vertical electrical field established between channel region 1630 and the blocking layer 1619, which may assist in separating the electron-hole pairs generated by the absorbed photons in the absorption layer 1602, for example, when the channel region 1630 is of n-type and the blocking layer 1619 is of p-type, the electrons tend to move toward the channel region 1630 and the holes tends to move toward the blocking layer 1619. The channel region 1630 is operated to collect the electrons and serves as a preliminary collector. The blocking layer 1619 is operated to collect the holes. The electrons stored in the channel region 1630 may further move to first doped region 1601b or the first doped region 1601a based on the control signals cs1, cs2. Accordingly, the demodulation contrast of the photo-detecting apparatus 1600i is improved.

Figure 16J:
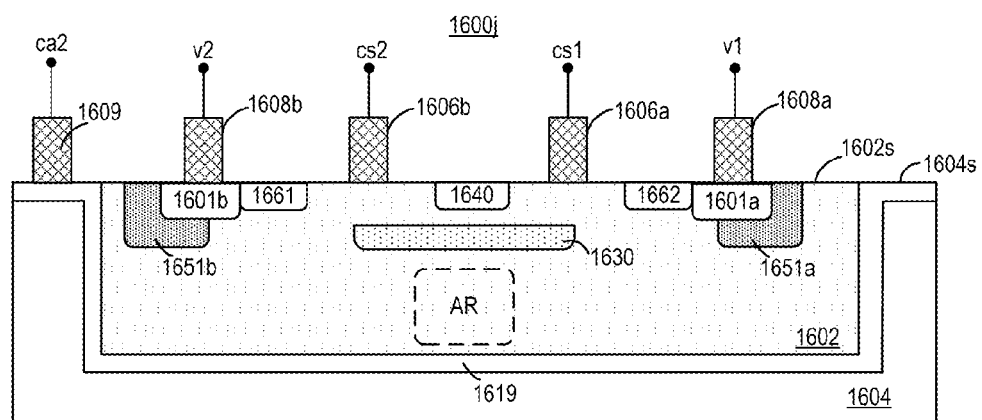

FIG. 16J illustrates a cross-sectional view of a photo-detecting apparatus, according to some embodiments. The photo-detecting apparatus 1600j in FIG. 16J is similar to the photo-detecting apparatus 1600i in FIG. 16I, where the difference is described below. In some embodiments, the pixel of the photo-detecting apparatus 1600j further includes counter-doped regions 1651a, 1651b. The counter-doped regions 1651a, 1651b are similar to the counter-doped regions as mentioned before, such as the counter-doped regions 1651a, 1651b as described in FIG. 16H. In some embodiments, the absorption layer 1602 of the pixel includes a hinder region 1640. The hinder region 1640 is similar to the hinder region as described before, such as the hinder region 1640 as described in FIG. 16E. In some embodiments, the pixel of the photo-detecting apparatus 1600j further includes a first buffer region 1661 and a second buffer region 1662. The first buffer region 1661 and the second buffer region 1662 are similar to the first buffer region 1661 and the second buffer region 1662 as described in FIG. 16F.

In some embodiments, if the conductivity types of the first buffer region 1661 and the second buffer region 1662 are the same as the first conductivity type of the first doped regions 1601a, 1601b, each of the first doped regions 1601b, 1601a is entirely overlapped with respective counter-doped region 1651b, 1651a. In some embodiments, the first buffer region 1661 is adjacent to the first doped region 1601b or overlapped with a part of the counter-doped regions 1651b, and the second buffer region 1662 is adjacent to the first doped region 1601a or overlapped with a part of the counter-doped regions 1651a. That is, a part of the first buffer region 1661 overlapped with the counter-doped regions 1651b includes both of the fifth dopant and the dopant of the counter-doped region 1651a, wherein the fifth dopant is different from the dopant of the counter-doped region 1651b. The peak dopant concentration of the counter-doped regions 1651b is lower than the peak dopant concentration of the first buffer region 1661. Similarly, a part of the second buffer region 1662 overlapped with the counter-doped regions 1651a includes both of the dopant of the counter-doped regions 1651a and the fifth dopant. The peak dopant concentration of the counter-doped region 1651a is lower than the peak dopant concentration of the second buffer region 1662.

In some embodiments, the conductivity types of the first buffer region 1661 and the second buffer region 1662 are different from the first conductivity type of the first doped regions 1601a, 1601b, the counter-doped regions 1651b overlaps with a portion of the first doped region 1601b, and the counter-doped regions 1651a overlaps with a portion of the first doped region 1601a. That is, the part of the first doped region 1601b farther from the first surface 1602s of the absorption layer 1602 is neither overlapped with the counter-doped regions 1651b nor with the first buffer region 1661, and the portion of the first doped region 1601a farther from the first surface 1602s of the absorption layer 1602 is neither overlapped with the counter-doped regions 1651a nor with the second buffer region 1662.

The first buffer region 1661 and the second buffer region 1662 with conductivity type different from the first conductivity type of the first doped regions 1601a, 1601b can improve carrier collection efficiency, since the carrier collection can be confined within a region away from the first surface 1602s of the absorption layer 1602, for example, confined at the part of the first doped region 1601a farther from the first surface 1602s of the absorption layer 1602 and neither overlapped with the counter-doped regions 1651a nor with the second buffer region 1662; and confined at the part of the first doped region 1601b farther from the first surface 1602s of the absorption layer 1602 and neither overlapped with the counter-doped regions 1651b nor with the first buffer region 1661.

Figure 16K:
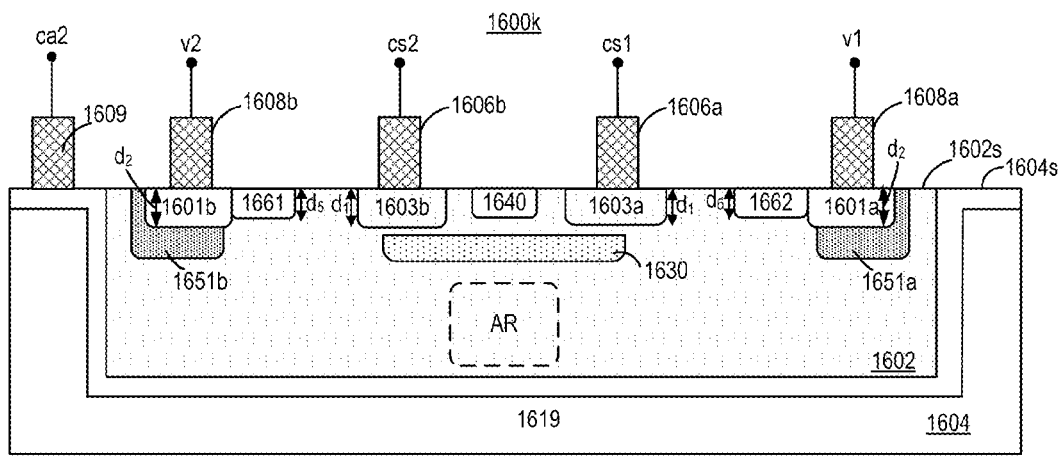

FIG. 16K illustrates a cross-sectional view of a photo-detecting apparatus, according to some embodiments. The photo-detecting apparatus 1600k in FIG. 16K is similar to the photo-detecting apparatus 1600j in FIG. 16J, where the difference is described below. In some embodiments, the photo-detecting apparatus 1600k further includes second doped regions 1603a, 1603b. The second doped regions 1603a, 1603b are similar to the second doped regions as described before, such as the second doped regions 1603a, 1603b as described in FIG. 16B. In some embodiments, the first buffer region 1661 is separated from the second doped region 1603b. In some embodiments, the second buffer region 1662 is separated from the second doped region 1603a. In some embodiments, the first buffer region 1661, the first doped region 1601b and the counter-doped regions 1651b can be formed in different steps such as by different masks. The second buffer region 1662, the first doped region 1601a and the counter-doped regions 1651a can be formed in different steps such as by different masks.

In some embodiments, if the hinder region 1640 is of a conductivity type different from the conductivity type of the channel region 1630, the hinder region 1640 is separated from the second doped regions 1603a, 1603b. That is, the hinder region 1640 is not overlapped with the second doped regions 1603a, 1603b. In some embodiments, the width of the hinder region 1640 is less than the width of the channel region 1630.

In some embodiments, if the hinder region 1640 is of a conductivity type the same as the conductivity type of the channel region 1630, the hinder region 1640 may be connected to the second doped regions 1603a, 1603b. That is, the hinder region 1640 is overlapped with the second doped regions 1603a, 1603b.

The first buffer region 1661 and the second buffer region 1662 with the same conductivity type as the first conductivity type of the first doped regions 1601a, 1601b can improve carrier collection efficiency since the carrier collection can be confined near the first surface 1602s of the absorption layer 1602 by the first buffer region 1661 and the second buffer region 1662 and since a distance between two regions with opposite conductivity types is shortened, that is, the distance between the first buffer region 1661 and the second doped region 1603b is shorter than the distance between the first doped region 1601b and the second doped region 1603b; and the distance between the second buffer region 1662 and the second doped region 1603a is shorter than the distance between the first doped region 1601a and the second doped region 1603a.

In some embodiments, the depth $d_5$ of the first buffer region 1661 is less than a depth $d_1$ of the second doped region 1603b. In some embodiments, the depth $d_6$ of the second buffer region 1662 is less than a depth $d_1$ of the second doped region 1603a.

Figure 16L:
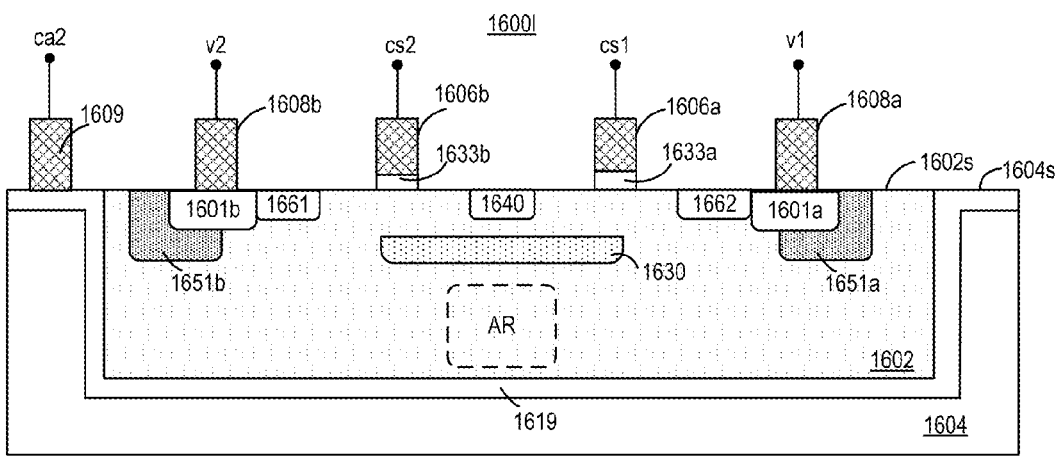

FIG. 16L illustrates a cross-sectional view of a photo-detecting apparatus, according to some embodiments. The photo-detecting apparatus 1600l in FIG. 16L is similar to the photo-detecting apparatus 1600j in FIG. 16J, where the difference is described below. In some embodiments, the first switch further includes a first dielectric layer 1633a between the absorption layer 1602 and the control contact layer 1606a. The second switch may further include a second dielectric layer 1633b between the absorption layer 1602 and the control contact layer 1606b. The first dielectric layer 1633a and the second dielectric layer 1633b are similar to the first dielectric layer and the second dielectric layer as described before, such as the first dielectric layer 1633a and the second dielectric layer 1633b as described in FIG. 16C.

Figure 16M:
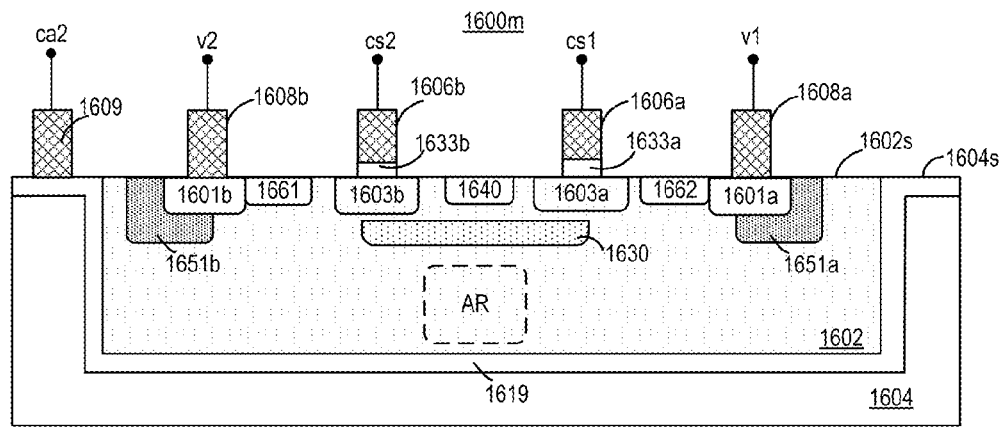

FIG. 16M illustrates a cross-sectional view of a photo-detecting apparatus, according to some embodiments. The photo-detecting apparatus 1600m in FIG. 16M is similar to the photo-detecting apparatus 1600l in FIG. 16L, where the difference is described below. In some embodiments, the photo-detecting apparatus 1600m further includes second doped regions 1603a, 1603b under the first dielectric layer 1633a and the second dielectric layer 1633b respectively. The second doped regions 1603a, 1603b are similar to the second doped regions as described before, such as the second doped regions 1603a, 1603b as described in FIG. 16B.

Figure 17A:
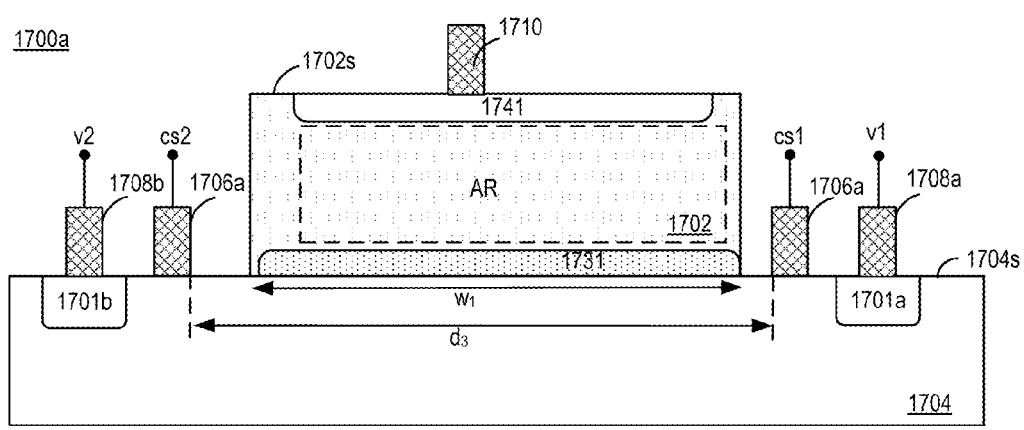
FIGS. 17A-17I illustrate cross-sectional views of a photo-detecting apparatus, according to some embodiments.

FIG. 17A illustrates a cross-sectional view of a photo-detecting apparatus, according to some embodiments. The photo-detecting apparatus 1700a includes a substrate 1704. The photo-detecting apparatus further includes a pixel including an absorption layer 1702 supported by the substrate 1704. The absorption layer 1702 is entirely over a first surface 1704s of the substrate 1704. The pixel includes an absorbed region AR in the absorption layer 1702. The absorbed region AR is similar to the absorbed region as mentioned before, such as the absorbed region AR as described in FIG. 15A. The pixel includes a first switch (not labeled) and a second switch (not labeled) electrically coupled to the absorption layer 1702. The first switch includes a control contact layer 1706a and a readout contact layer 1708a. The second switch includes a control contact layer 1706b and a readout contact layer 1708b. In some embodiments, the readout contact layers 1708a, 1708b are formed over a first surface 1704s of the substrate 1704. In some embodiments, the absorption layer 1702 is between the control contact layer 1706b, 1706b. In some embodiments, the control contact layer 1706b, 1706b are disposed at two opposite sides of the absorption layer 1702. In some embodiments, a width $w_1$ of the absorption layer 1702 is less than a distance $d_3$ between the control contact layers 1706b, 1706b. In some embodiments, an incoming optical signal enters into the absorbed region AR from the first surface 1702s of the absorption layer 1702. In some embodiments, the absorption layer 1702 may be intrinsic.

In some embodiments, the photo-detecting apparatus 1700a includes multiple repeating pixels. The photo-detecting apparatus 1700a includes a pixel-array including multiple repeating pixels. In some embodiments, the pixel-array may be a one-dimensional or a two-dimensional array of pixels.

In some embodiments, the pixel further includes a first readout circuit (not shown) and a second readout circuit (not shown) electrically coupled to the first switch and the second switch respectively for processing the collected charges. The first readout circuit is electrically coupled to the readout contact layer 1708a. The second readout circuit is electrically coupled to the readout contact layer 1708b.

In some embodiments, the first switch includes a first doped region 1701a in the substrate 1704 under the readout contact layers 1708a. The second switch includes a first doped region 1701b in the substrate 1704 and under the readout contact layers 1708b. The first doped regions 1701a, 1701b are similar to the first doped regions as described before, such as the first doped regions 1601a, 1601b as described in FIG. 16A. In some embodiments, the pixel of the photo-detecting apparatus 1700a further includes a buried region 1731 in the absorption layer 1702.

The buried region 1731 is nearer to the first surface 1704s of the substrate 1704 than to the first surface 1702s of the absorption layer 1702. The buried region 1731 includes a dopant and is of a conductivity type the same as the first conductivity type of the first doped regions 1701a,1701b. In some embodiments, the buried region 1731 includes a dopant and has a dopant profile with a peak dopant concentration not less than $1\times10^{15}$ cm$^{-3}$. In some embodiments, the peak dopant concentration of the buried region 1731 is between $1\times10^{15}$ cm$^{-3}$ and $5\times10^{17}$ cm$^{-3}$. In some embodiments, the peak dopant concentration of the buried region 1731 lies in the absorption layer 1702. In some embodiments, a distance between the first surface 1704s of the substrate 1704 and a location of the buried region 1731 having the peak dopant concentration is not more than 50 nm. The dopant profile of the buried region 1731 can be controlled by any suitable method, such as by implantation including providing multiple implant doses and energies.

In some embodiments, the dopant of the buried region 1731 may diffuse through the interface between the substrate 1704 and the absorption layer 1702 to the substrate 1704. In some embodiments, a dopant concentration at the interface between the substrate 1704 and the absorption layer 1702 is not less than $1\times10^{15}$ cm$^{-3}$. Accordingly, the defects at the interface can be passivated.

In some embodiments, the pixel of the photo-detecting apparatus 1700a further include a repel region 1741 in the absorption layer 1702. The repel region 1741 is opposite to the buried region 1731. In some embodiments, the repel region 1741 is nearer the first surface 1702s of the absorption layer 1702 than to the first surface 1704s of the substrate 1740. In some embodiments, the repel region 1741 is of a conductivity type different from the first conductivity type of the first doped regions 1701a, 1701b. In some embodiments, the repel region 1741 includes a dopant and a dopant profile with a peak dopant concentration not less than $5\times10^{15}$ cm$^{-3}$. In some embodiments, the peak dopant concentration of the buried region 1731 is between $1\times10^{18}$ cm$^{-3}$ and $5\times10^{20}$ cm$^{-3}$.

The repel region 1741 may repel the carriers to be collected in the absorption layer 1702, and thus the carriers are driven to move toward the substrate 1704. Accordingly, the operation speed of the photo-detecting apparatus 1700a is improved. For example, if the photo-detecting apparatus 1700a is configured to collects electrons, the repel region 1741 may repel the electrons and push the electrons to move toward the substrate 1704.

In some embodiments, the carriers are generated in the absorption layer 1702 and the demodulation and the collection of the carriers are in the substrate 1704.

In some embodiments, the repel region 1741 may be floated. In some embodiments, the photo-detecting apparatus 1700a further includes a conductive layer 1710 electrically coupled to the repel region 1741. For example, the repel region 1741 may be coupled to ground through the conductive layer 1710.

In some embodiments, since the buried region 1731 and repel region 1741 in the absorption layer 1702 are collectively formed as a vertical photodiode, there is a built-in vertical electrical field established between the buried region 1731 and the repel region 1741, which may assist in separating the electron-hole pairs generated by the absorbed photons in the absorption layer 1702, for example, when the buried region 1731 is of n-type and the repel region 1741 is of p-type, the electrons tend to move toward the buried region 1731 and the holes tends to move toward the repel region 1741. The buried region 1731 is operated to collect the electrons and serves as a preliminary collector. The repel region 1741 is operated to collect the holes. The electrons stored in the buried region 1731 may further move to the first doped region 1701b or the first doped region 1701a across the interface between the substrate 1704 and the absorption layer 1702 based on the control signals cs1, cs2. Accordingly, the demodulation contrast of the photo-detecting apparatus 1700a is improved.

Figure 17B:
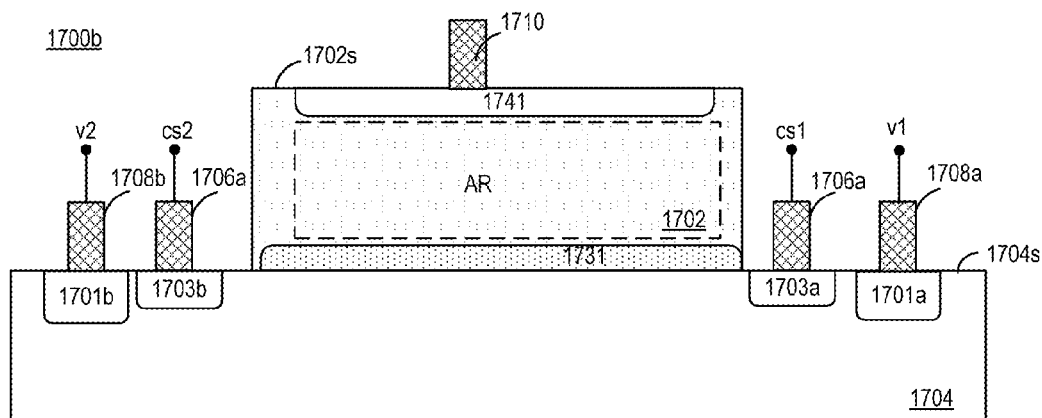

FIG. 17B illustrates a cross-sectional view of a photo-detecting apparatus, according to some embodiments. The photo-detecting apparatus 1700b in FIG. 17B is similar to the photo-detecting apparatus 1700a in FIG. 17A, where the difference is described below. In some embodiments, the first switch further includes a second doped region 1703a in the substrate 1704 and under the control contact layer 1706a. The second switch further includes a second doped region 1703b in the substrate 1704 and under the control contact layer 1706b. The second doped regions 1703a, 1703b are similar to the second doped regions as described before, such as the second doped regions 1603a, 1603b as described in FIG. 16B.

Figure 17C:
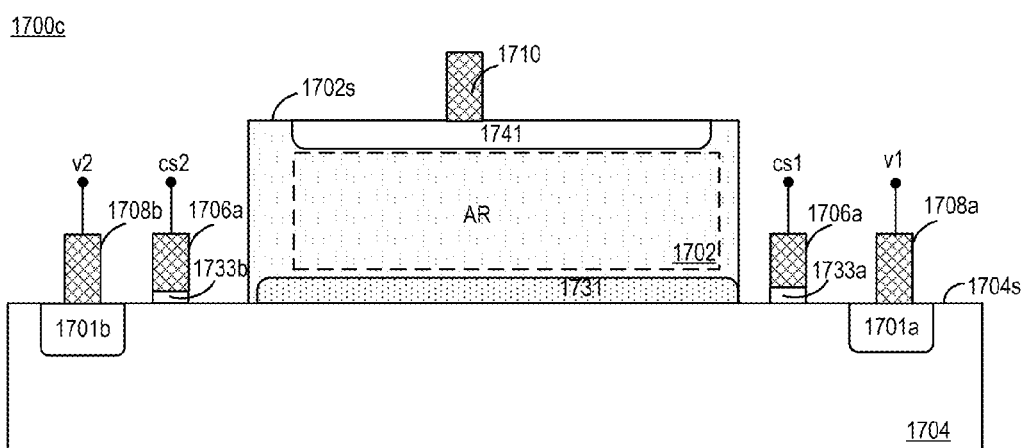

FIG. 17C illustrates a cross-sectional view of a photo-detecting apparatus, according to some embodiments. The photo-detecting apparatus 1700c in FIG. 17C is similar to the photo-detecting apparatus 1700a in FIG. 17A, where the difference is described below. In some embodiments, the first switch further includes a first dielectric layer 1733a between the substrate 1704 and the control contact layer 1706a. The second switch may further include a second dielectric layer 1733b between the substrate 1704 and the control contact layer 1706b. The first dielectric layer 1733a prevents direct current conduction from the control contact layer 1706a to the substrate 1704, but allows an electric field to be established within the substrate 1704 in response to an application of a voltage to the control contact layer 1706a. The second dielectric layer 1733b prevents direct current conduction from the control contact layer 1706b to the substrate 1704 but allows an electric field to be established within the substrate 1704 in response to an application of a voltage to the control contact layer 1706b. The established electric field may attract or repel charge carriers within the substrate 1704.

Figure 17D:
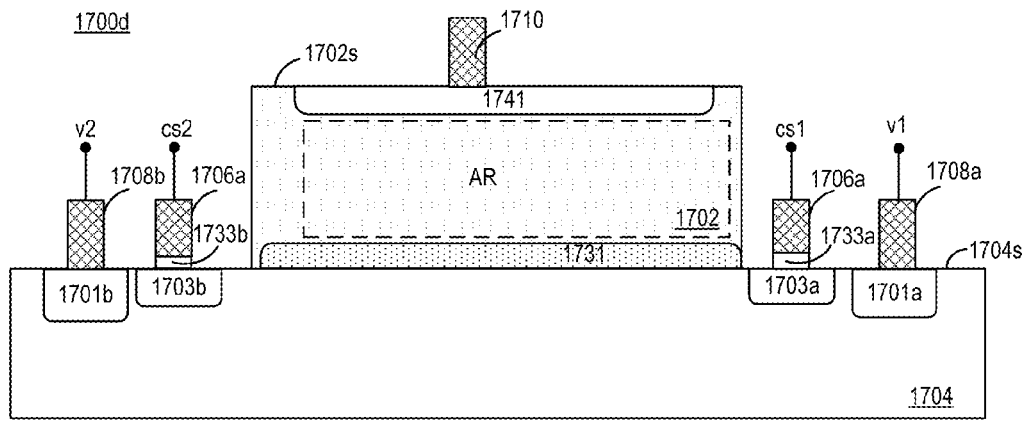

FIG. 17D illustrates a cross-sectional view of a photo-detecting apparatus, according to some embodiments. The photo-detecting apparatus 1700d in FIG. 17D is similar to the photo-detecting apparatus 1700c in FIG. 17C, where the difference is described below. In some embodiments, the first switch further includes a second doped region 1703a in the substrate 1704 and under the first dielectric layer 1733a. The second switch further includes a second doped region 1703b in the substrate 1704 and under the first dielectric layer 1733b. The second doped regions 1703a, 1703b are similar to the second doped regions as mentioned before, such as the second doped regions 1603a, 1603b as described in FIG. 16B.

Figure 17E:
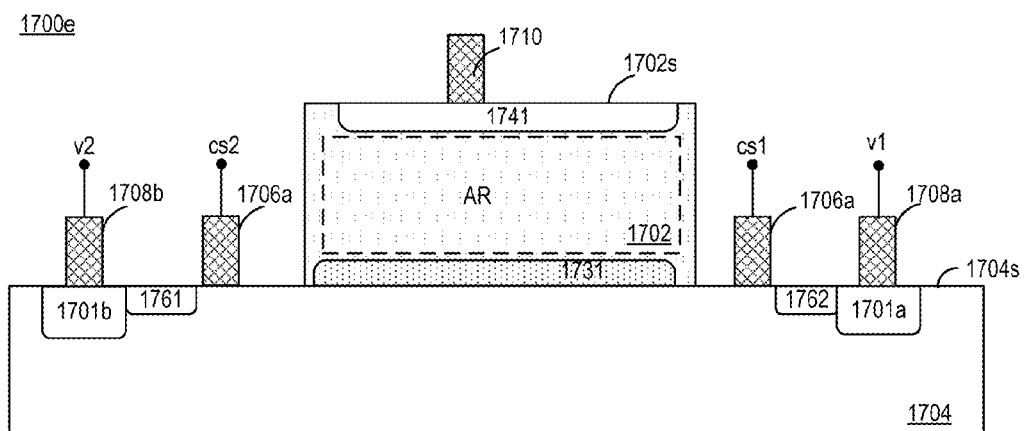

FIG. 17E illustrates a cross-sectional view of a photo-detecting apparatus, according to some embodiments. The photo-detecting apparatus 1700e in FIG. 17E is similar to the photo-detecting apparatus 1700a in FIG. 17A, where the difference is described below. In some embodiments, the photo-detecting apparatus 1700e further includes a first buffer region 1761 and a second buffer region 1762 in the substrate 1704. The first buffer region 1761 and the second buffer region 1762 are similar to the first buffer region 1661 and the second buffer region 1662 as described in FIG. 16F.

The first buffer region 1761 and the second buffer region 1762 can further modify the depletion regions in the substrate 1704, such as the depletion regions around the first doped regions 1701a, 1701b and the depletion regions near the first surface 1704s of the substrate 1704.

The first buffer region 1761 and the second buffer region 1762 with conductivity type different from the first conductivity type of the first doped regions 1701a, 1701b can improve carrier collection efficiency, since the carrier collection can be confined within a region away from the first surface 1704s of the substrate 1704, for example, confined at the part of the first doped region 1701a, 1701b farther from the first surface 1704s of the substrate 1704.

The first buffer region 1761 and the second buffer region 1762 with the same conductivity type as the first conductivity type of the first doped regions 1701a, 1701b can improve carrier collection efficiency since the carrier collection can be confined near the first surface 1704s of the substrate 1704 by the first buffer region 1761 and the second buffer region 1762.

In some embodiments, the photo-detecting apparatus 1700e may further include second doped regions (not shown) under the control contact layers 1706a, 1706b. The second doped regions are similar to the second doped regions described before, such as the second doped regions 1703a, 1703b as described in FIG. 17B. In such an embodiments, The first buffer region 1761 and the second buffer region 1762 with the same conductivity type as the first conductivity type of the first doped regions 1701a, 1701b can improve carrier collection efficiency since the carrier collection can be confined near the first surface 1704s of the substrate 1704 by the first buffer region 1761 and the second buffer region 1762 and since a distance between two regions with opposite conductivity types is shortened, that is, the distance between the first buffer region 1761 and the second doped region (not shown) is shorter than the distance between the first doped region 1701b and the second doped region (not shown); and the distance between the second buffer region 1762 and the second doped region (not shown) is shorter than the distance between the first doped region 1701a and the second doped region (not shown).

In some embodiments, the photo-detecting apparatus 1700e may further include a first dielectric layer and a second dielectric layer 1733a, 1733b as described in FIG. 17C.

Figure 17F:
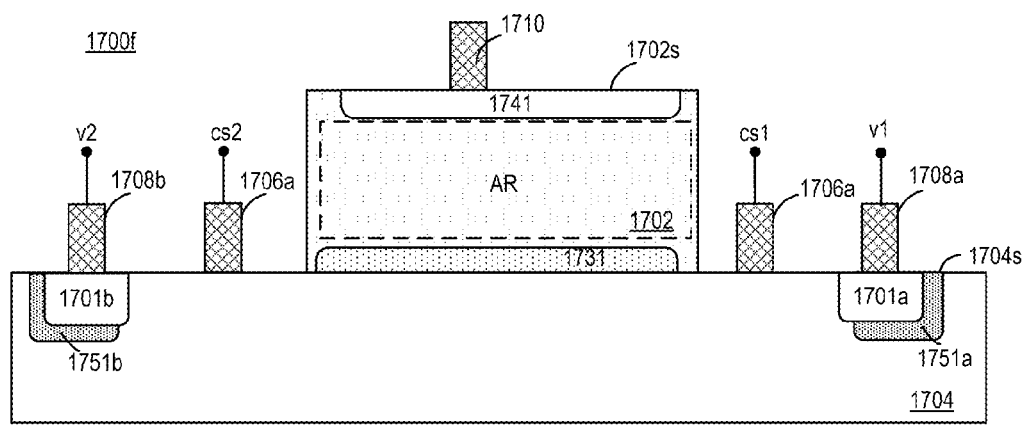

FIG. 17F illustrates a cross-sectional view of a photo-detecting apparatus, according to some embodiments. The photo-detecting apparatus 1700f in FIG. 17F is similar to the photo-detecting apparatus 1700a in FIG. 17A, where the difference is described below. In some embodiments, the pixel of the photo-detecting apparatus 1700f further includes counter-doped regions 1751a, 1751b in the substrate 1704. The counter-doped regions 1751a, 1751b are similar to the counter-doped regions as mentioned before, such as 1651a, 1651b as described in FIG. 16H. Since the counter-doped region 1751a, 1751b overlaps with at least a portion of the first doped region 1701a, 1701b, the photo-detecting apparatus 1700f has thinner depletion regions in the substrate 1704, and thus the photo-detecting apparatus 1700f is with lower dark current.

In some embodiments, the photo-detecting apparatus 1700f may further include a first dielectric layer and a second dielectric layer as mentioned before, such as the first dielectric layer 1733a, and the second dielectric layer 1733b as described in FIG. 17C.

Figure 17G:
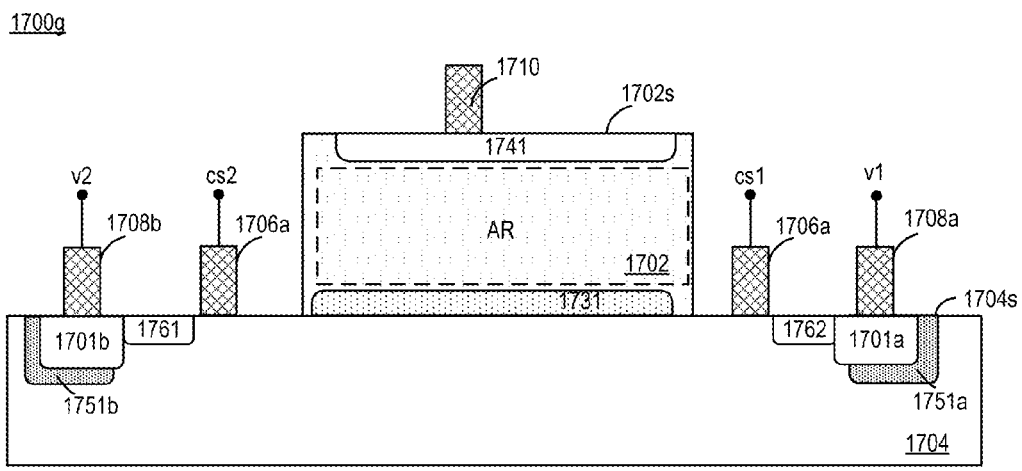

FIG. 17G illustrates a cross-sectional view of a photo-detecting apparatus, according to some embodiments. The photo-detecting apparatus 1700g in FIG. 17G is similar to the photo-detecting apparatus 1700f in FIG. 17F, where the difference is described below. In some embodiments, the pixel of the photo-detecting apparatus 1700g further includes a first buffer region 1761 and a second buffer region 1762 in the substrate 1704. The first buffer region 1761 and the second buffer region 1762 are similar to the first buffer region and the second buffer region as mentioned before, such as the first buffer region 1761 and the second buffer region 1762 as described in FIG. 17E. In some embodiments, the photo-detecting apparatus 1700g may further includes a first dielectric layer and a second dielectric layer as mentioned before, such as the first dielectric layer 1733a, and the second dielectric layer 1733b as described in FIG. 17C.

Figure 17H:
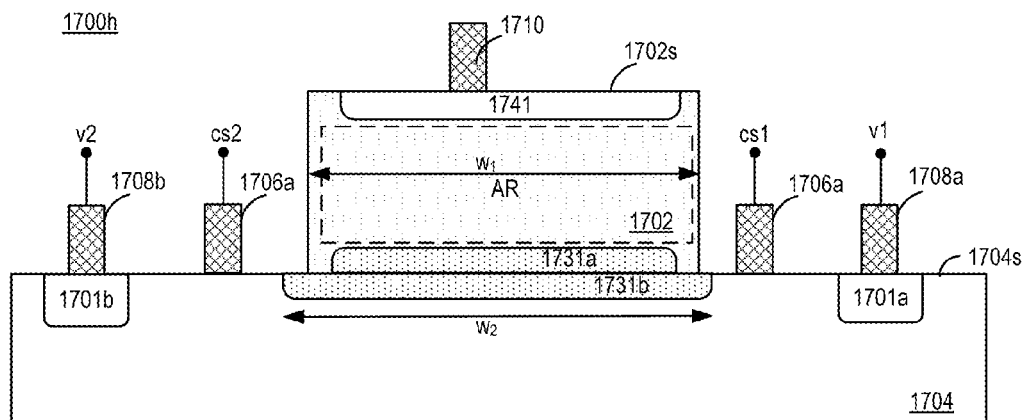

FIG. 17H illustrates a cross-sectional view of a photo-detecting apparatus, according to some embodiments. The photo-detecting apparatus 1700h in FIG. 17H is similar to the photo-detecting apparatus 1700a in FIG. 17A, where the difference is described below. In some embodiments, the photo-detecting apparatus 1700h includes multiple buried regions. For example, the photo-detecting apparatus 1700h includes a first buried region 1731a, which is similar to the buried region 1731 as described in FIG. 17A. The pixel of the photo-detecting apparatus 1700h further includes a second buried region 1731b. The second buried region 1731b is in the substrate 1704. The second buried region 1731b is formed at the first surface 1704s of the substrate layer 1704. The second buried region 1731b also includes a dopant and is of a conductivity type the same as the first conductivity type of the first doped regions 1701a, 1701b. In some embodiments, the peak dopant concentration of the second buried region 1731b lies in the substrate 1704. In some embodiments, a distance between the first surface 1704s of the substrate 1704 and a location of the second buried region 1731b having the peak dopant concentration is not more than 50 nm. In some embodiments, the dopant of the second buried region 1731b may diffuse through the interface between the substrate 1704 and the absorption layer 1702 to the absorption layer 1702. Accordingly, the defects at the interface can be passivated. In some embodiments, a width $w_2$ of the second buried region 1731b is greater than the width $w_1$ of the absorption layer 1702.

In some embodiments, the dopant of the first buried region 1731a and the dopant of the second buried region 1731a may be the same. In some embodiments, the peak dopant concentration of the first buried region 1731a and the peak dopant concentration of the second buried region 1731a are on the two opposite sides of the interface between the substrate 1704 and the absorption layer 1702. In some embodiments, the absorption layer 1702 may be intrinsic.

Figure 17I:
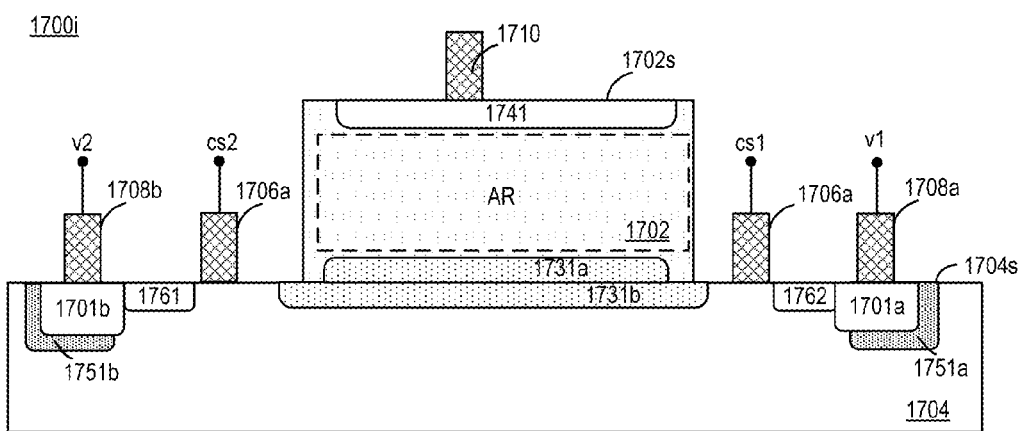

FIG. 17I illustrates a cross-sectional view of a photo-detecting apparatus, according to some embodiments. The photo-detecting apparatus 1700i in FIG. 17I is similar to the photo-detecting apparatus 1700h in FIG. 17H, where the difference is described below. In some embodiments, the pixel of the photo-detecting apparatus 1700i further includes a first buffer region 1761 and a second buffer region 1762 in the substrate 1704. The first buffer region 1761 and the second buffer region 1762 are similar to the first buffer region and the second buffer region as mentioned before, such as the first buffer region 1761 and the second buffer region 1762 as described in FIG. 17E. In some embodiments, the pixel of the photo-detecting apparatus 1700i further includes counter-doped regions 1751a, 1751b in the substrate 1704. The counter-doped regions 1751a, 1751b are similar to the counter-doped regions as mentioned before, such as the counter-doped regions 1751a, 1751b as described in FIG. 17F.

In some embodiments, the first switch of the photo-detecting apparatus 1700i further includes a second doped region (not shown) in the substrate and under the control contact layer 1706a. The second switch of the photo-detecting apparatus 1700i further includes a second doped region (not shown) in the substrate 1704 and under the control contact layer 1706b. The second doped regions 1703a, 1703b are similar to the second doped regions as mentioned before, such as the second doped regions 1703a, 1703b as described in FIG. 17B.

Figure 18A:
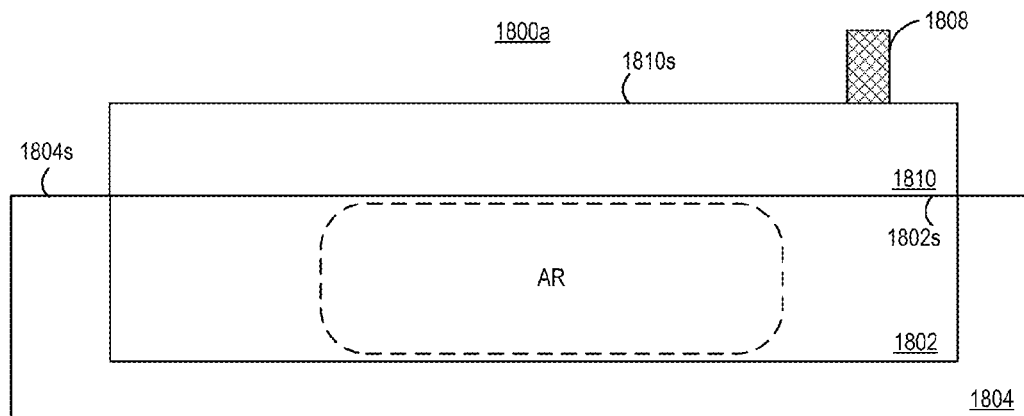
FIGS. 18A-18U illustrate cross-sectional views of a photo-detecting apparatus, according to some embodiments.

FIG. 18A illustrates a cross-sectional view of a photo-detecting apparatus, according to some embodiments. The photo-detecting apparatus 1800a includes a substrate 1804. The photo-detecting apparatus 1800a further includes a pixel including an absorption layer 1802 supported by the substrate 1804. The pixel includes an absorbed region AR in the absorption layer 1802. The absorbed region AR is similar to the absorbed region AR mentioned before, such as the absorbed region AR as described in FIG. 15A. The pixel further includes a carrier control layer 1810 over the absorption layer 1802. In some embodiments, the carrier control layer 1810 is over a first surface 1802s of the absorption layer 1802. In some embodiments, the carrier control layer 1810 is epitaxially formed on the first surface 1802s of the absorption layer 1802.

In some embodiments, the absorption layer 1802 receives an optical signal and converts the optical signal into electrical signals. In some embodiments, a material of the carrier control layer 1810 is different from a material of the absorption layer 1802.

In some embodiments, the material of the carrier control layer 1810 includes a semiconductor material. In some embodiments, the material of the absorption layer 1802 includes a semiconductor material. In some embodiments, the material of the absorption layer 1802 has a first band gap, and the material of the carrier control layer 1810 has a second band gap greater than the first band gap. In some embodiments, the carrier control layer 1810 is of a conductivity type different from a conductivity type of the absorption layer 1802. In some embodiments, the carrier control layer 1810 is of a conductivity type the same as a conductivity type of the absorption layer 1802. In some embodiments, the semiconductor material includes a group III-V semiconductor material or a group IV semiconductor material. In some embodiments, the carrier control layer 1810 includes Si, and the absorption layer 1802 includes Ge. In some embodiments, the carrier control layer 1810 includes amorphous Si, polycrystalline Si, crystalline Si, or a combination thereof.

In some embodiments, the carrier control layer 1810 and the absorption layer 1802 is a heterojunction diode. In some embodiments, the carrier control layer 1810 has a thickness less than a thickness of the absorption layer 1802. In some embodiments, the carrier control layer 1810 has a thickness not less than 100 nm, and not more than 500 nm. In some embodiments, the thickness of the carrier control layer 1810 is between 200 nm and 500 nm. In some embodiments, the photo-detecting apparatus 1800a further includes a readout contact layer 1808 electrically coupled to the carrier control layer 1810. The readout contact layer 1808 is over a first surface 1810s of the carrier control layer 1810. The carrier control layer 1810 may be biased through the readout contact layer 1808 by a bias voltage to control and collect carriers.

In some embodiments, the photo-detecting apparatus 1800a includes a first doped region (not shown) under the readout contact layer 1808. The first doped region includes a first dopant and has a dopant profile with a peak dopant concentration in a range from $1\times10^{17}$ cm$^{-3}$ to $5\times10^{20}$ cm$^{-3}$. The first doped region is to facilitate controlling the movement and the collection of the carriers.

In some embodiments, the first doped regions under the readout contact layer 1808 are of n-type if the photo-detecting apparatus 1800a is configured to collect electrons.

The photo-detecting apparatus 1800a includes multiple repeating pixels. The photo-detecting apparatus 1800a includes a pixel-array including multiple repeating pixels. In some embodiments, the pixel-array may be a one-dimensional or a two-dimensional array of pixels.

In some embodiments, the carriers generated in the absorption layer 1802 flow across the interface between the absorption layer 1802 and the carrier control layer 1810 and then flow into the carrier control layer 1810 to be controlled, such as demodulated and collected by the readout contact layer 1808 formed over the carrier control layer 1810. In this way, the scaling capability and process integration may be improved since the process afterwards can be finished on the carrier control layer 1810 rather than on the absorption layer 1802. Furthermore, since the absorption function and the carrier control function such as demodulation of the carriers and collection of the carriers operate in the absorption layer 1802 and the carrier control layer 1810 respectively, and wherein the carrier control layer 1810 has a band gap greater than the bandgap of the absorption layer 1802, the dark current of the photo-detecting apparatus 1800a is lower.

In some embodiments, the photo-detecting apparatus 1800a may be applied to a CMOS image sensor.

Figure 18B:
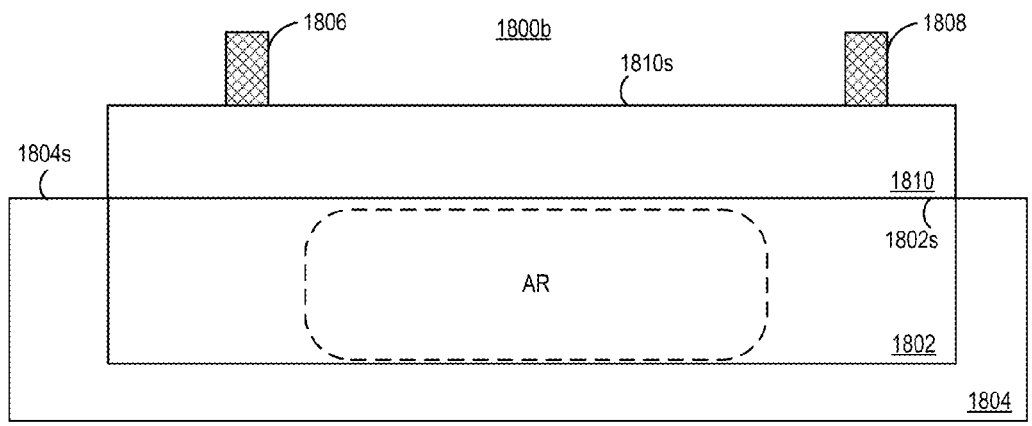

FIG. 18B illustrates a cross-sectional view of a photo-detecting apparatus, according to some embodiments. The photo-detecting apparatus 1800b in FIG. 18B is similar to the photo-detecting apparatus 1800a in FIG. 18A, where the difference is described below.

In some embodiments, the pixel of the photo-detecting apparatus 1800b further includes a control contact layer 1806 electrically coupled to the carrier control layer 1810. The control contact layer 1806 is formed over the first surface 1810s of the carrier control layer 1810.

In some embodiments, the photo-detecting apparatus 1800b further includes a second doped region (not shown) right under the control contact layer 1806. The second doped region is of a conductivity type different from the conductivity type of the first doped region. In some embodiments, the second doped region includes a second dopant and has a dopant profile with dopant concentration in a range from $1\times10^{17}$ cm$^{-3}$ to $5\times10^{20}$ cm$^{-3}$. The second doped region is to facilitate collecting carriers different from the carriers collected by the readout contact layer 1808. The second doped region may be biased through the control contact layer 1806 by a bias voltage to discharge collected carriers.

Figure 18C:
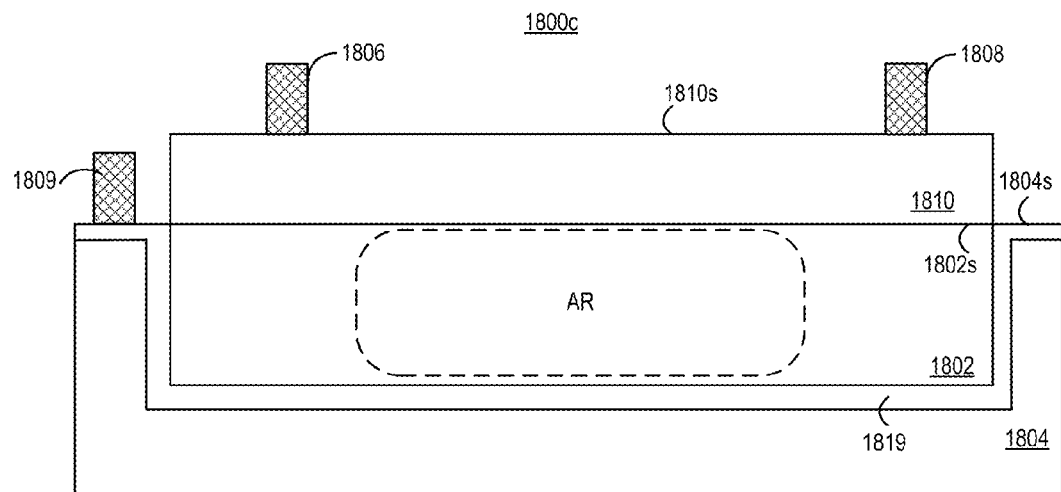

FIG. 18C illustrates a cross-sectional view of a photo-detecting apparatus, according to some embodiments. The photo-detecting apparatus 1800c in FIG. 18C is similar to the photo-detecting apparatus 1800b in FIG. 18B, where the difference is described below.

In some embodiments, the photo-detecting apparatus 1800c further includes a blocking layer 1819 surrounding at least a portion of the absorption layer 1802. The blocking layer 1819 may be similar to the blocking layer as mentioned before, such as the blocking layer 1519 as described in FIG. 15 A.

In some embodiments, the photo-detecting apparatus 1800c further includes a conductive layer 1809 electrically connected to the blocking layer 1819 and over the first surface 1804s of the substrate 1804. The blocking layer 1819 may be biased through the conductive layer 1809 by a bias voltage to discharge carriers.

Figure 18D:
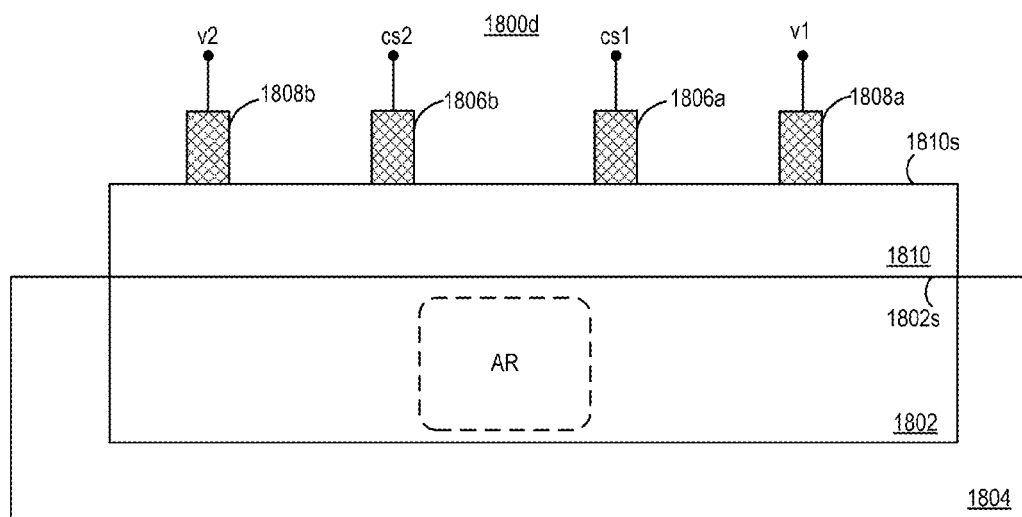

FIG. 18D illustrates a cross-sectional view of a photo-detecting apparatus, according to some embodiments.

The photo-detecting apparatus 1800d includes a substrate 1804. The photo-detecting apparatus 1800d further includes a pixel including an absorption layer 1802 supported by the substrate 1804. The pixel includes an absorbed region AR in the absorption layer 1802. The absorbed region AR is similar to the absorbed region AR mentioned before, such as the absorbed region AR as described in FIG. 15A. The pixel further includes a carrier control layer 1810 over the absorption layer 1802. In some embodiments, the carrier control layer 1810 is over a first surface 1802s of the absorption layer 1802. In some embodiments, the carrier control layer 1810 is epitaxially formed on the first surface 1802s of the absorption layer 1802. The carrier control layer 1810 may be similar to the carrier control layer 1810 as described in FIG. 18A. The pixel further includes a first switch (not labeled) and a second switch (not labeled) electrically coupled to the absorption layer 1802. The first switch includes a control contact layer 1806a and a readout contact layer 1808a. The second switch includes a control contact layer 1806b and a readout contact layer 1808b. In some embodiments, the readout contact layers 1808a, 1808b and the control contact layers 1806a, 1806b are formed over the first surface 1810s of the carrier control layer 1810. In some embodiments, a width of the absorbed region AR is less than a distance between the readout contact layers 1808a, 1808b. In some embodiments, the readout contact layers 1808a, 1808b are disposed at two opposite sides of the absorbed region AR.

In some embodiments, an un-doped region (not labeled) is right under the control contact layer 1806a. Another un-doped region (not labeled) is right under the control contact layer 1806b. That is, the portions of the carrier control layer 1810 right under the control contact layers 1806a, 1806b may be intrinsic or include a dopant having a peak dopant concentration below approximately $1\times10^{15}$ cm$^{-3}$. The term "intrinsic" means that the portions of the carrier control layer 1810 right under the control contact layers 1806a, 1806b are without intentionally adding dopants. In some embodiments, the control contact layers 1806a, 1806b on the carrier control layer 1810 may lead to formation of a Schottky contact, an Ohmic contact, or a combination thereof having an intermediate characteristic between the two, depending on various factors including the material of the carrier control layer 1810, the material of the control contact layers 1806a, 1806b, and the impurity or defect level of the carrier control layer 1810.

The pixel further includes two control signals cs1, cs2 controlling the control contact layers 1806a, 1806b for controlling the moving direction of the carriers in the carrier control layer 1810, wherein the carriers are generated by the absorbed photons in the absorption layer 1802. For example, when voltages are used, if the control signal cs1 is biased against the control signal cs2, an electric field is created between the two portions of the carrier control layer 1810 right under the control contact layers 1806a, 1806b, and free charges drift towards one of the two undoped portions of the carrier control layer 1810 right under the readout contact layers 1808b, 1808a depending on the direction of the electric field.

In some embodiments, the photo-detecting apparatus 1800d includes two capacitors as mentioned before, such as the capacitors 1610a, 1610b as described in FIG. 16A. The capacitors are for storing the carriers generated in the absorption layer 1802 and flow into the carrier control layer 1810 based on the control of the two control signals cs1, cs2.

In some embodiments, the photo-detecting apparatus 1800d further includes a first readout circuit and a second readout circuit electrically coupled to the first switch and the second switch respectively for processing the collected charges. The first readout circuit may include one of the capacitors. The second readout circuit may include the other capacitor. The first readout circuit is electrically coupled to the readout contact layer 1808a. The second readout circuit is electrically coupled to the readout contact layer 1808b.

The photo-detecting apparatus 1800d includes multiple repeating pixels. The photo-detecting apparatus 1800d includes a pixel-array including multiple repeating pixels. In some embodiments, the pixel-array may be a one-dimensional or a two-dimensional array of pixels.

In some embodiments, the carriers generated in the absorption layer 1802 flow across the interface between the absorption layer 1802 and the carrier control layer 1810 and then flow into the carrier control layer 1810 to be controlled, such as demodulated and collected by the control contact layers 1806a, 1806b and the readout contact layers 1808b, 1808a. In this way, the scaling capability and process integration may be improved since the process afterwards can be finished on the carrier control layer 1810 rather than on the absorption layer 1802. Furthermore, since the absorption function and the carrier control function such as demodulation of the carriers and collection of the carriers operate separately in the absorption layer 1802 and the carrier control layer 1810 respectively, and wherein the carrier control layer 1810 has a band gap greater than the bandgap of the absorption layer 1802, the dark current of the photo-detecting apparatus 1800d is lower.

Figure 18E:
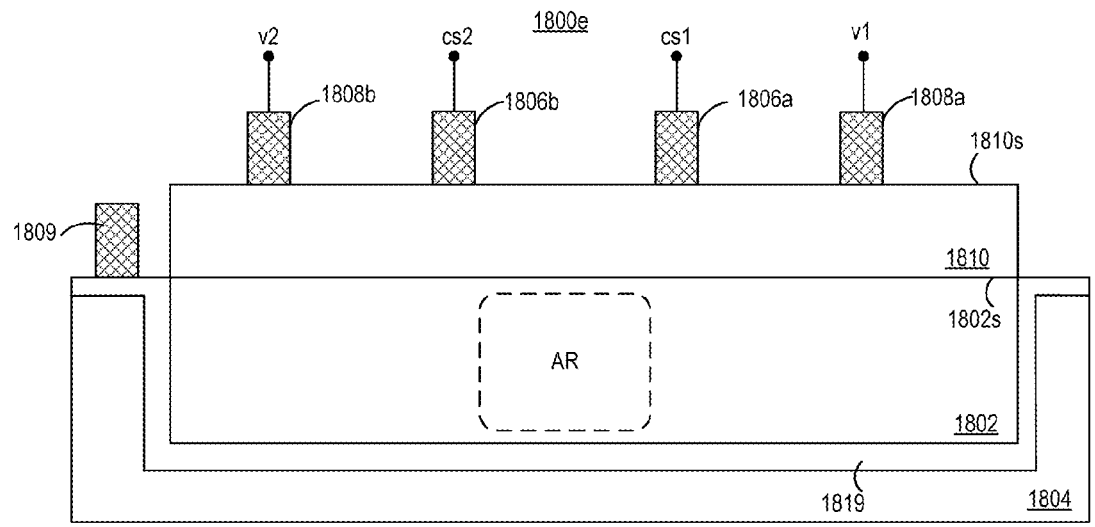

FIG. 18E illustrates a cross-sectional view of a photo-detecting apparatus, according to some embodiments. The photo-detecting apparatus 1800e in FIG. 18E is similar to the photo-detecting apparatus in FIG. 18D, where the difference is described below. In some embodiments, the photo-detecting apparatus 1800e further includes a blocking layer 1819. The blocking layer 1819 may be similar to the blocking layer as mentioned before, such as the blocking layer 1519 as described in FIG. 15A. In some embodiments, the photo-detecting apparatus 1800e further includes a conductive layer 1809 electrically connected to the blocking layer 1819. The blocking layer 1819 may be biased through the conductive layer 1809 by a bias voltage to discharge carriers.

Figure 18F:
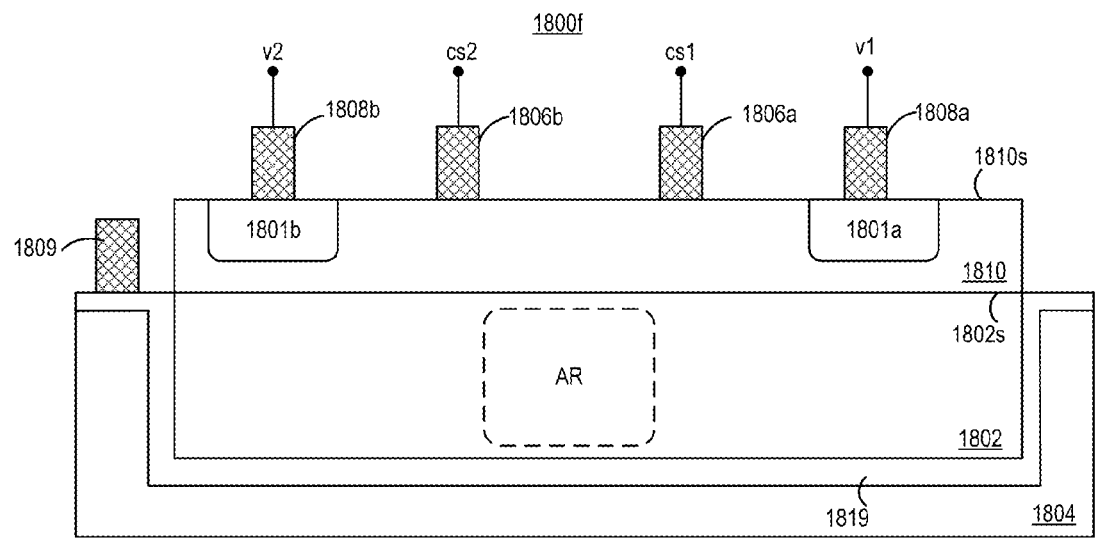

FIG. 18F illustrates a cross-sectional view of a photo-detecting apparatus, according to some embodiments. The photo-detecting apparatus 1800f in FIG. 18F is similar to the photo-detecting apparatus 1800e in FIG. 18E, where the difference is described below. In some embodiments, the first switch includes a first doped region 1801a under the readout contact layer 1808a and in the carrier control layer 1810. The second switch includes a first doped region 1801b under the readout contact layers 1808b and in the carrier control layer 1810. In some embodiments, the first doped regions 1801a, 1801b are each of a first conductivity type. In some embodiments, the first doped regions 1801a, 1801b include a first dopant. The peak dopant concentrations of the first doped regions 1801a, 1801b depend on the material of the readout contact layers 1808a, 1808b and the material of the carrier control layer 1810, for example, between $5 \times 10^{18}$ cm$^{-3}$ to $5 \times 10^{20}$ cm$^{-3}$. In some embodiments, the peak dopant concentrations of the first doped regions 1801a, 1801b lie in the carrier control layer 1810. The first doped regions 1801a, 1801b are for collecting the carriers generated and flow from the absorption layer 1802, which are further processed by the first readout circuit (not shown) and the second readout circuit (not shown) respectively based on the control of the two control signals cs1, cs2.

Figure 18G:
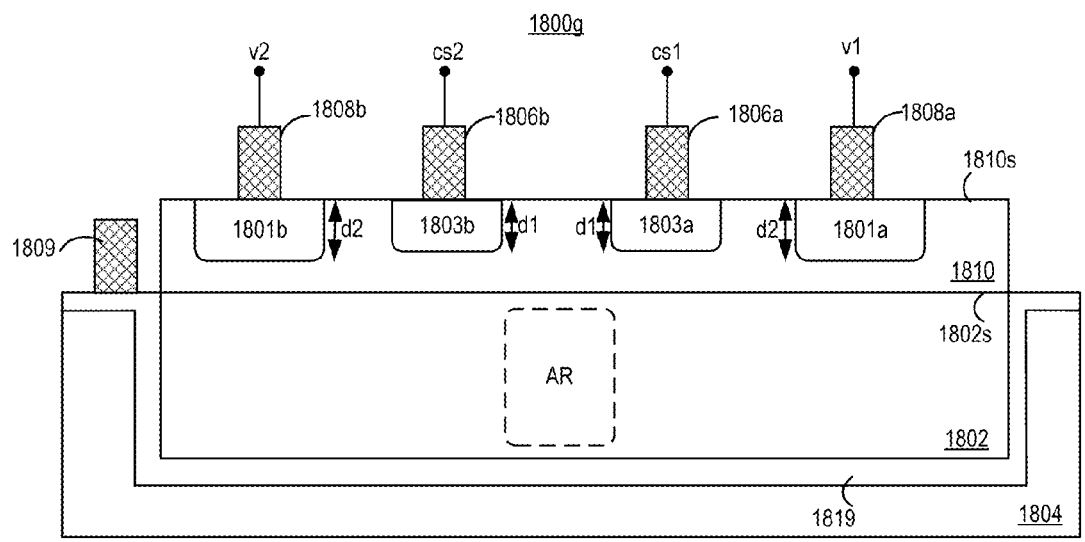

FIG. 18G illustrates a cross-sectional view of a photo-detecting apparatus, according to some embodiments. The photo-detecting apparatus 1800g in FIG. 18G is similar to the photo-detecting apparatus 1800f in FIG. 18F, where the difference is described below. In some embodiments, the first switch further includes a second doped region 1803a under the control contact layers 1806a. The second switch further includes a second doped region 1803b under the control contact layers 1806b. The second doped regions 1803a, 1803b are in the carrier control layer 1810. In some embodiments, the second doped regions 1803a, 1803b are each of a second conductivity type different from the conductivity type of the first doped regions 1801b, 1801a. In some embodiments, each of the second doped regions 1803a, 1803b includes a second dopant. The peak dopant concentrations of the second doped regions 1803a, 1803b depend on the material of the control contact layers 1806b, 1806a and the material of the carrier control layer 1810, for example, between $1 \times 10^{17}$ cm$^{-3}$ to $5 \times 10^{20}$ cm$^{-3}$. In some embodiments, the peak dopant concentrations of the second doped regions 1801a, 1801b lie in the carrier control layer 1810. The second doped regions 1803a, 1803b forms a Schottky or an Ohmic contact or a combination thereof with the control contact layers 1806b, 1806a. The second doped regions 1803a, 1803b are for demodulating the carriers generated and flow from the absorption layer 1802 based on the control of the control signals cs1, cs2. In some embodiments, the depth d2 of each of the first doped regions 1801a, 1801b and the depth d1 of each of the second doped regions 1803a, 1803b is less than a thickness of the carrier control layer 1810. The depth is measured from the first surface 1810s of the carrier control layer 1810 to a position where the dopant profile reaches a background concentration, such as $1 \times 10^{15}$ cm$^{-3}$. In some embodiments, the parts of the interface between the carrier control layer 1810 and the absorption layer 1802 and under second doped regions 1803a,1803b are of or lower than a background concentration, such as $1 \times 10^{15}$ cm$^{-3}$. In some embodiments, the parts of the interface between the carrier control layer 1810 and the absorption layer 1802 and under the first doped regions 1801a, 1801b are of or lower than a background concentration, such as $1 \times 10^{15}$ cm$^{-3}$.

In some embodiment, since the absorption function and the carrier control function such as demodulation of the carriers and collection of the carriers operate separately in the absorption layer 1802 and the carrier control layer 1810 respectively, and wherein the carrier control layer 1810 has a band gap greater than the bandgap of the absorption layer 1802, the leakage current between the two control contact layers 1806a, 1806b of the photo-detecting apparatus 1800g is lower.

Figure 18H:
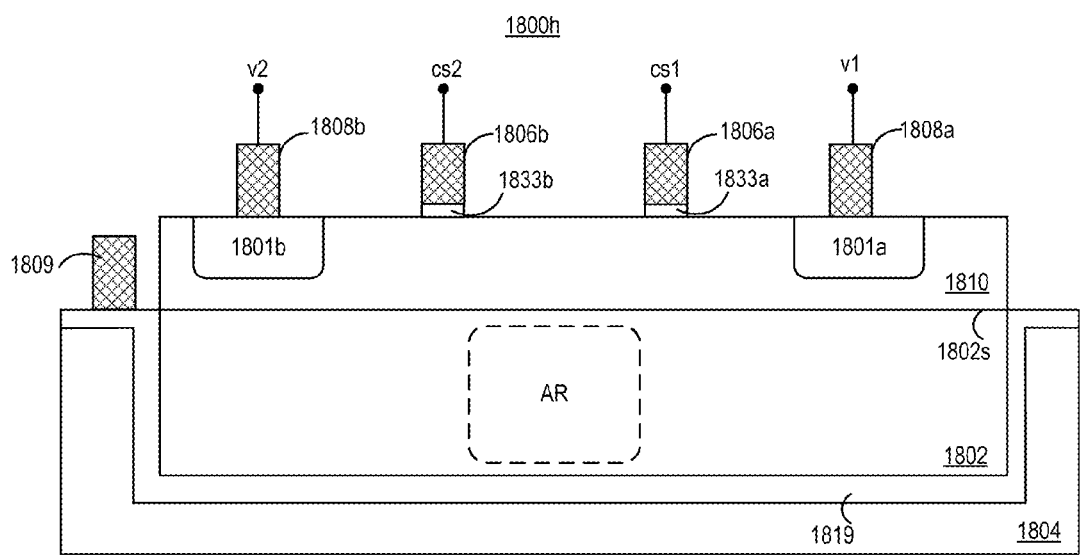

FIG. 18H illustrates a cross-sectional view of a photo-detecting apparatus, according to some embodiments. The photo-detecting apparatus 1800h in FIG. 18H is similar to the photo-detecting apparatus 1800f in FIG. 18F, where the difference is described below. In some embodiments, the first switch further includes a first dielectric layer 1833a between the carrier control layer 1810 and the control contact layer 1806a. The second switch may further include a second dielectric layer 1833b between the carrier control layer 1810 and the control contact layer 1806b. The first dielectric layer 1833a prevents direct current conduction from the control contact layer 1806a to the carrier control layer 1810, but allows an electric field to be established within the carrier control layer 1810 in response to an application of a voltage to the control contact layer 1806a. The second dielectric layer 1833b prevents direct current conduction from the control contact layer 1806b to the carrier control layer 1810 but allows an electric field to be established within the carrier control layer 1810 in response to an application of a voltage to the control contact layer 1806b. The established electric field may attract or repel charge carriers within the carrier control layer 1810, wherein the charge carriers are generated and flow from the absorption layer 1802.

Figure 18I:
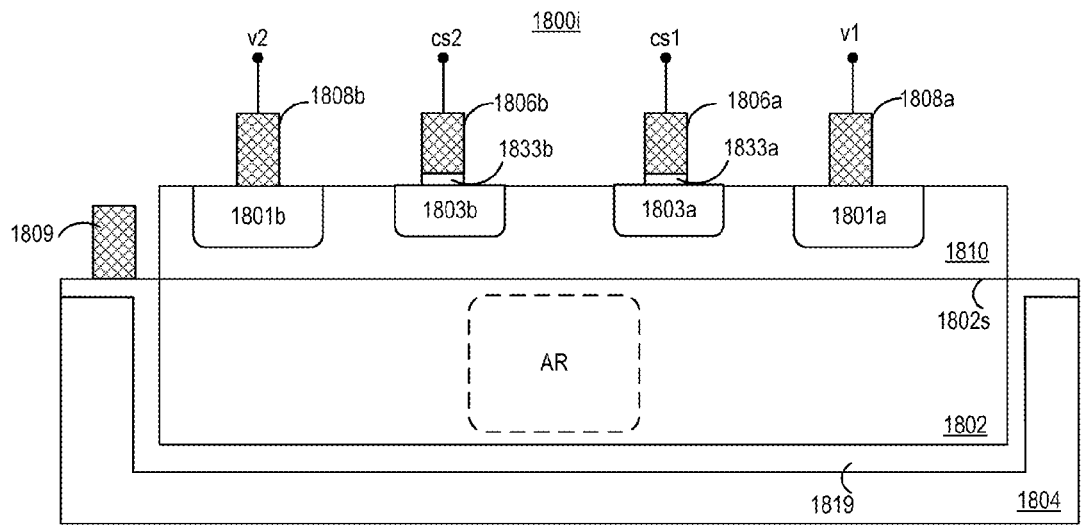

FIG. 18I illustrates a cross-sectional view of a photo-detecting apparatus, according to some embodiments. The photo-detecting apparatus 1800i in FIG. 18I is similar to the photo-detecting apparatus 1800h in FIG. 18H, where the difference is described below. In some embodiments, the first switch further includes a second doped region 1803a under the first dielectric layer 1833a. The second switch further includes a second doped region 1803b under the second dielectric layer 1833b. The second doped regions 1803a, 1803b are similar to the second doped regions 1803a, 1803b as described in FIG. 18G.

Figure 18J:
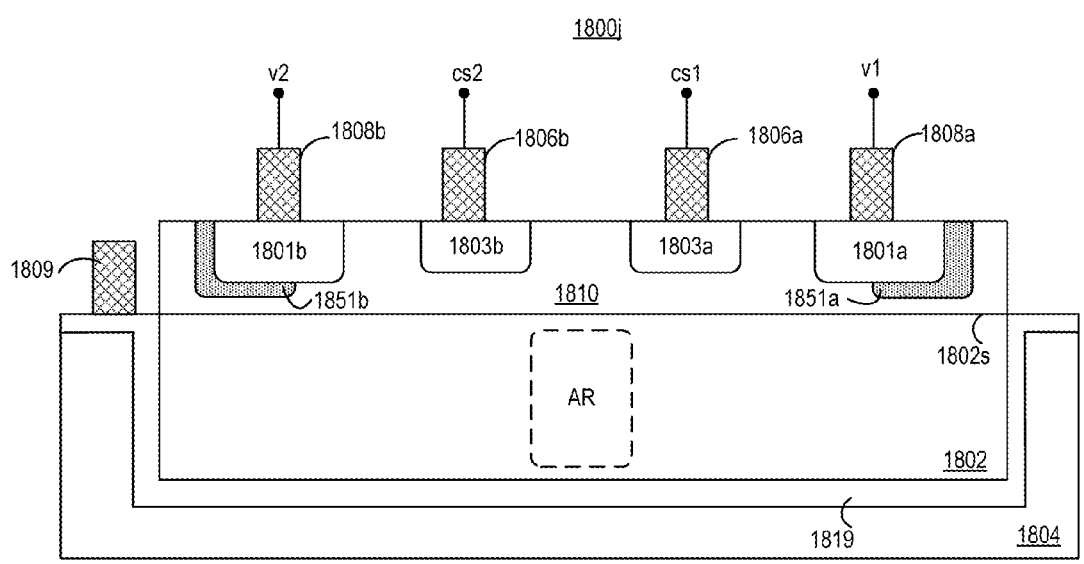

FIG. 18J illustrates a cross-sectional view of a photo-detecting apparatus, according to some embodiments. The photo-detecting apparatus 1800j in FIG. 18J is similar to the photo-detecting apparatus 1800g in FIG. 18G, where the difference is described below. In some embodiments, the pixel of the photo-detecting apparatus 1800j further includes two counter-doped regions 1851a, 1851b in the carrier control layer 1810. The counter-doped regions 1851a, 1851b are similar to the counter-doped regions as mentioned before, such as the counter-doped region 1551a, 1551b as described in FIG. 15D. In some embodiments, the peak dopant concentrations of the counter-doped region 1851a, 1851b lie in the carrier control layer 1810. In some embodiments, the dopants of the counter-doped region 1851a, 1851b may diffuse into the absorption layer 1802. The counter-doped regions 1851a, 1851b serve as dark-current reduction regions for reducing the dark current of the photo-detecting apparatus 1800j. Compared to a photo-detecting apparatus devoid of counter-doped region 1851a, 1851b, the photo-detecting apparatus 1800j including counter-doped region 1851a, 1851b overlapped with at least a portion of the first doped region 1801a,1801b has thinner depletion regions in the carrier control layer 1810, and thus the photo-detecting apparatus 1800j is with lower dark current.

Figure 18K:
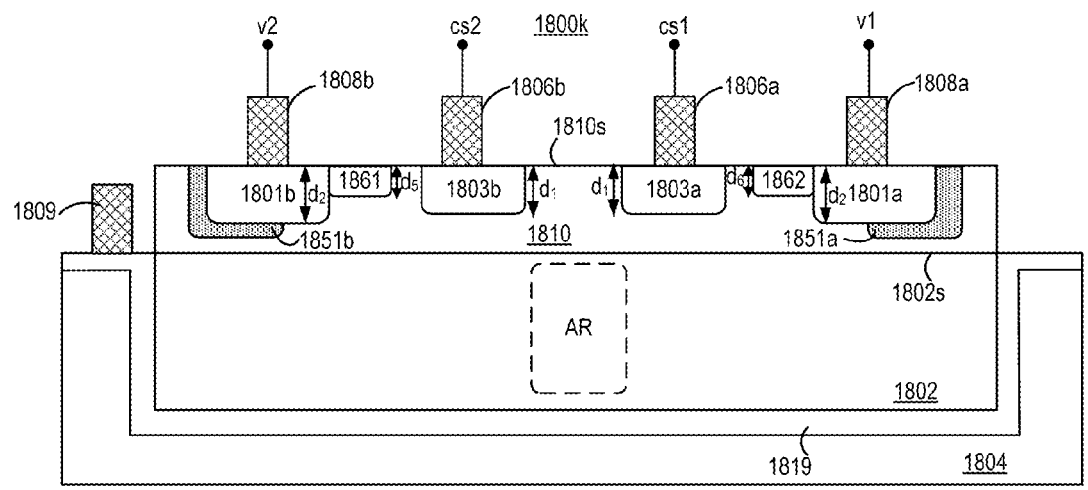

FIG. 18K illustrates a cross-sectional view of a photo-detecting apparatus, according to some embodiments. The photo-detecting apparatus 1800k in FIG. 18K is similar to the photo-detecting apparatus 1800j in FIG. 18J, where the difference is described below. The pixel of the photo-detecting apparatus 1800k further includes a first buffer region 1861 and a second buffer region 1862. The first buffer region 1861 and the second buffer region 1862 are in the carrier control layer 1810. The first buffer region 1861 and the second buffer region 1862 are similar to the first buffer region and the second buffer region mentioned before, such as the first buffer region 1661 and the second buffer region 1662 as described in FIG. 16J. In some embodiments, the peak dopant concentrations of the first buffer region 1861 and the second buffer region 1862 lie in the carrier control layer 1810.

The first buffer region 1861 and the second buffer region 1862 can further modify the depletion regions near the first surface 1810s of the carrier control layer 1810.

In some embodiments, as similarly described in FIG. 16J, the conductivity types of the first buffer region 1861 and the second buffer region 1862 are the same as the first conductivity type of the first doped regions 1801a, 1801b. The first buffer region 1861 and the second buffer region 1862 with the same conductivity type as the first conductivity type of the first doped regions 1801a, 1801b can improve carrier collection efficiency since the carrier collection can be confined near the first surface 1810s of the carrier control layer 1810 by the first buffer region 1861 and the second buffer region 1862 and since a distance between two regions with opposite conductivity types is shortened, that is, the distance between the first buffer region 1861 and the second doped region 1803b is shorter than the distance between the first doped region 1801b and the second doped region 1803b; and the distance between the second buffer region 1862 and the second doped region 1803a is shorter than the distance between the first doped region 1801a and the second doped region 1803a.

In some embodiments, as similarly described in FIG. 16J, the conductivity types of the first buffer region 1861 and the second buffer region 1862 are different from the first conductivity type of the first doped regions 1801a, 1801b. For example, if the photo-detecting apparatus 1800k is configured to process the collected electrons for further application, the first doped regions 1801a, 1801b are of n-type, the second doped regions 1803a, 1803b are of p-type, the counter-doped regions 1851a, 1851b are of p-type, and the first buffer region 1861 and the second buffer region 1862 are of p-type. The first buffer region 1861 blocks the carriers from flowing near the first surface 1810s of the carrier control layer 1810 into the first doped region 1801b, and lowers the local dark current at the same time. The second buffer region 1862 blocks the carriers from flowing near the first surface 1810s of the carrier control layer 1810 into the first doped region 1801a, and lowers the local dark current at the same time.

In some embodiments, the counter-doped regions 1851b overlaps with only a portion of the first doped region 1801b, that is, a portion of the first doped region 1801b farther from the first surface 1810s of the carrier control layer 1810 is neither overlapped with the counter-doped regions 1851b nor with the first buffer region 1861. In some embodiments, the counter-doped regions 1851a overlaps with only a portion of the first doped region 1801a, that is, a portion of the first doped region 1801a farther from the first surface 1810s of the carrier control layer 1810 is neither overlapped with the counter-doped regions 1851a nor with the second buffer region 1862.

The first buffer region 1861 and the second buffer region 1862 with conductivity type different from the first conductivity type of the first doped regions 1801a, 1801b can improve carrier collection efficiency, since the carrier collection can be confined within a region away from the first surface 1810s of the carrier control layer 1810, for example, confined at the portion of the first doped region 1801a farther from the first surface 1810s of the carrier control layer 1810 and neither overlapped with the counter-doped regions 1851a nor with the second buffer region 1862; and confined at the portion of the first doped region 1801b farther from the first surface 1810s of the carrier control layer 1810 and neither overlapped with the counter-doped regions 1851*b* nor with the first buffer region 1861.

In some embodiments, as similarly described in FIG. 16*k*, the first buffer region 1861 includes a depth $d_5$ less than a depth $d_2$ of the first doped region 1801*b*. In some embodiments, the depth $d_5$ of the first buffer region 1861 is less than a depth $d_1$ of the second doped region 1803*b*. In some embodiments, the second buffer region 1862 includes a depth $d_6$ less than a depth $d_2$ of the first doped region 1801*a* In some embodiments, the depth $d_6$ of the second buffer region 1862 is less than a depth $d_1$ of the second doped region 1803*a*.

Figure 18L:
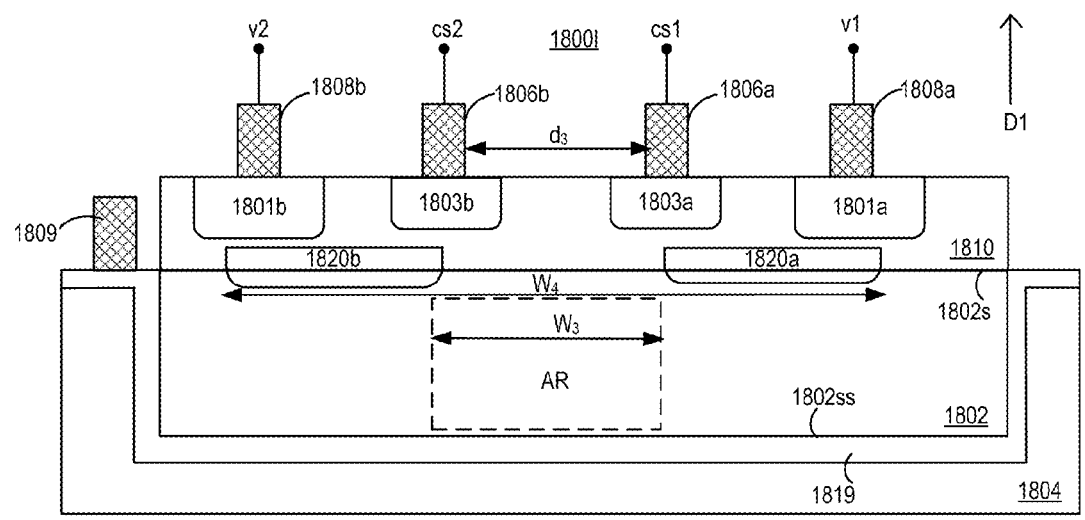

FIG. 18L illustrates a cross-sectional view of a photo-detecting apparatus, according to some embodiments. The photo-detecting apparatus 18001 in FIG. 18L is similar to the photo-detecting apparatus 1800*g* in FIG. 18G, where the difference is described below. The pixel of the photo-detecting apparatus 18001 further includes barrier regions 1820*a*, 1820*b*. In some embodiments, a part of the barrier region 1820*a* is in the absorption layer 1802. A part of the barrier region 1820*b* is in the absorption layer 1802. In some embodiments, the barrier region 1820*a* is formed in both of the absorption layer 1802 and the carrier control layer 1810. The barrier region 1820*b* is formed in both of the absorption layer 1802 and the carrier control layer as 1810. The barrier regions 1820*a*, 1820*b* cover a part of the interface between the carrier control layer 1810 and the absorption layer 2002.

In some embodiments, the barrier region 1820*a* is between the first switch and the second surface 1802*ss'*. In some embodiments, the barrier region 1820*a* is partially under the first doped region 1801*a* along a vertical direction D1. The barrier region 1820*b* is between the second switch and the second surface 1802*ss'*. In some embodiments, the barrier region 1820*b* is partially under the first doped region 1801*b* along a vertical direction D1. In some embodiments, the barrier region 1820*a* is partially under the second doped region 1803*a* along a vertical direction D1. The barrier region 1820*b* is partially under the second doped region 1803*b* along a vertical direction D1. In some embodiments, a width w3 of the absorbed region AR is greater than a distance d3 between the control contact layers 1806*a*, 1806*b*. In some embodiments, the width w3 of the absorbed region AR is shorter than a distance w4 between the outer sides of the barrier regions 1820*a* and 1820*b*.

In some embodiments, each of the barrier regions 1820*a*, 1820*b* is of a conductivity type different from the first conductivity type of the first doped regions 1801*a*, 1801*b*. In some embodiments, each of the barrier regions 1820*a*, 1820*b* includes a dopant and has a dopant profile with a peak dopant concentration. The peak dopant concentration is lower than the peak dopant concentrations of the first doped regions 1801*b*, 1801*a*. In some embodiments, the peak dopant concentration of the barrier regions 1820*a*, 1820*b* is, for example, not more than $1 \times 10^{18}$ cm$^{-3}$. In some embodiments, a concentration at the interface between the absorption layer 1802 and the carrier control layer 1810 and covered by the barrier regions 1820*a*, 1820*b* is not less than $1 \times 10^{15}$ cm$^{-3}$.

In some embodiments, the barrier regions 1820*a*, 1820*b* include a material different from the material of the absorption layer 1802 and different from the material of the carrier control layer 1810. In some embodiments, the barrier regions 1820*a*, 1820*b* include an insulating material to serve as a region of high electrical resistance between absorbed region AR and the first doped regions 1801*a*, 1801*b*.

In some embodiments, the barrier regions 1820*a*, 1802*b* are capable of confining a path for the carriers, which are generated in the absorption layer 1802, and then flowing to the carrier control layer 1810. As a result, the absorbed region AR can be enlarged compared to a photo-detecting apparatus devoid of the barrier regions, and thus more carriers can be generated in the absorbed region AR and then flow into the carrier control layer 1810 through the path confined between the barrier regions 1820*a*, 1802*b*. Furthermore, the barrier regions 1820*a*, 1802*b* can also block the dark current generated in the absorption layer 1802. Accordingly, the demodulation contrast of the photo-detecting apparatus 18001 is improved and the dark current of the photo-detecting apparatus 18001 can be reduced at the same time.

In some embodiments, the photo-detecting apparatus 18001 also includes a first buffer region 1861 and a second buffer region 1862 as described in FIG. 18K.

In some embodiments, the photo-detecting apparatus 18001 also includes counter-doped regions 1851*a*, 1851*b* as described in FIG. 18J.

Figure 18M:
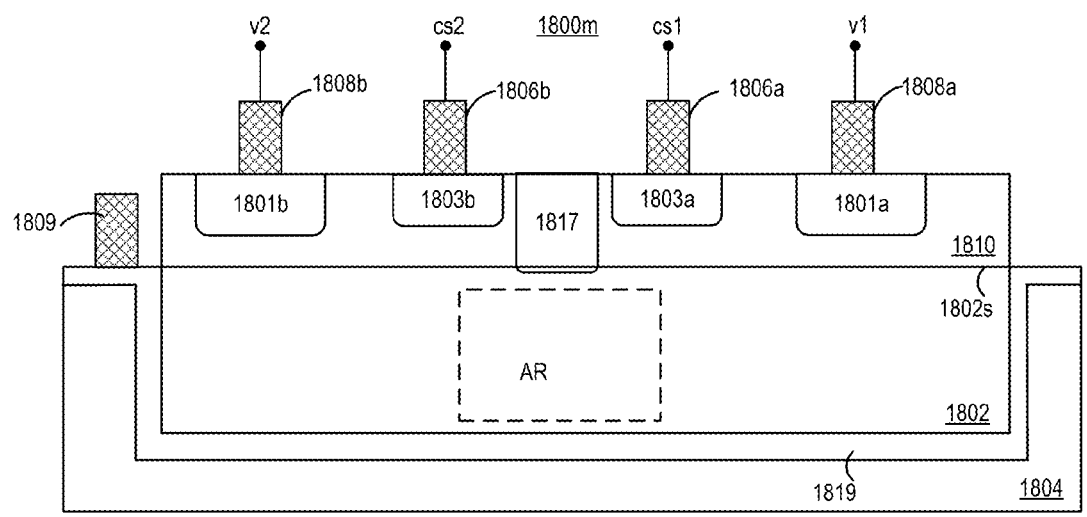

FIG. 18M illustrates a cross-sectional view of a photo-detecting apparatus, according to some embodiments. The photo-detecting apparatus 1800*m* in FIG. 18M is similar to the photo-detecting apparatus 1800*g* in FIG. 18G, where the difference is described below.

The pixel of the photo-detecting apparatus 1800*m* further includes a third doped region 1817 in the carrier control layer 1810 and between the first switch and the second switch. In some embodiments, the third doped region 1817 is between the second doped regions 1803*a*,1803*b*. The third doped region 1817 is of a third conductivity type the same as the first conductivity type of the first doped regions 1801*b*, 1801*a*. In some embodiments, the third doped region 1817 includes a dopant and a dopant profile with a peak dopant concentration lower than the peak dopant concentration of the first doped regions 1801*b*, 1801*a* In some embodiments, the peak dopant concentration of the third doped region 1817 is not more than $1 \times 10^{18}$ cm$^{-3}$. In some embodiments, the peak dopant concentration of the third doped region 1817 lies in the carrier control layer 1810. In some embodiments, the dopant of the third doped region 1817 may diffuse into the absorption layer 1802.

Since the third doped region 1817 and blocking layer 1819 are collectively formed as a vertical photodiode, there is a built-in vertical electrical field established between third doped region 1817 and the blocking layer 1819, which may assist in separating the electron-hole pairs generated by the absorbed photons in the absorption layer 1802, for example, when the third doped region 1817 is of n-type and the blocking layer 1819 is of p-type, the electrons tend to move toward the third doped region 1817 and the holes tends to move toward the blocking layer 1819. The third doped region 1817 is operated to collect the electrons and the blocking layer 1819 is operated to collect the holes. The third doped region 1817 serves as a preliminary collector. The electrons stored in the third doped region 1817 may then move to the first doped region 1801*b* or the first doped region 1801*a* based on the control signals cs1, cs2.

In some embodiments, the carriers generated in the absorption layer 1802 may have difficulty flowing from the absorption layer 1802 to the carrier control layer 1810 through the interface there between due to the band gap difference between the absorption layer 1802 and the carrier control layer 1810. The third doped region 1817 serves as a channel to attract the carriers. As a result, the absorbed region AR may also be enlarged since the carriers generated in the absorption layer 1802 will flow concentratedly toward the third doped region 1817 and then into the carrier control layer 1810. Therefore, the quantum efficiency of the photo-detecting apparatus 1800m is higher and the amount of the carriers moving toward the first doped region 1801b or the first doped region 1801a is also higher.

In some embodiments, the photo-detecting apparatus 1800m may also include the barrier regions 1820a, 1802b as described in FIG. 18L to further confine the flow of the carriers in a certain path.

In some embodiments, the photo-detecting apparatus 1800m also includes a first buffer region 1861 and a second buffer region 1862 as described in FIG. 18K to further modify the depletion regions near the first surface 1810s of the carrier control layer 1810.

In some embodiments, the photo-detecting apparatus 1800M also includes counter-doped regions 1851a, 1851b as described in FIG. 18J to further lower the dark current of the photo-detecting apparatus 1800M.

Figure 18N:
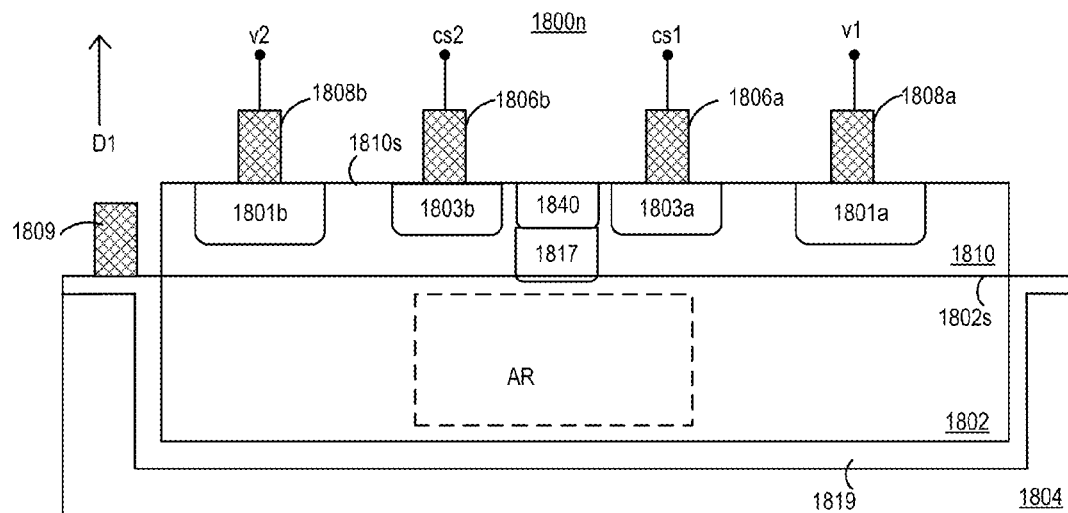

FIG. 18N illustrates a cross-sectional view of a photo-detecting apparatus, according to some embodiments. The photo-detecting apparatus 1800n in FIG. 18N is similar to the photo-detecting apparatus 1800m in FIG. 18M, where the difference is described below. The carrier control layer 1810 of the pixel further includes a hinder region 1840. The hinder region 1840 is between the first switch and the second switch. In some embodiments, the hinder region 1840 is between the second doped regions 1803a, 1803b and is closer to the first surface 1810s of the carrier control layer 1810 than the third doped region 1817. The hinder region 1840 is separated from the second doped regions 1803a, 1803b.

In some embodiments, the hinder region 1840 is overlapped with the third doped region 1817 along a vertical direction D1. In some embodiments, the hinder region 1840 includes a dopant and is of a conductivity type different from the third conductivity type of the third doped region 1817. In some embodiments, the hinder region 1840 includes a dopant and has a dopant profile with a peak dopant concentration higher than the peak dopant concentration of the third doped region 1817. In some embodiments, the peak dopant concentration of the hinder region 1840 is between $1\times10^{20}$ $cm^{-3}$ and $5\times10^{20}$ $cm^{-3}$.

The hinder region 1840 can block the carriers to be collected from reaching the first surface 1810s of the carrier control layer 1810. As a result, a surface leakage current between the two second doped regions 1803a, 1803b of the photo-detecting apparatus 1800n is reduced.

In some embodiments, the photo-detecting apparatus 1800n may also include the barrier regions 1820a, 1802b as described in FIG. 18L to further confine the flow of the carriers in a certain path.

In some embodiments, the photo-detecting apparatus 1800n also includes a first buffer region 1861 and a second buffer region 1862 as described in FIG. 18K to further modify the depletion regions near the first surface 1810s of the carrier control layer 1810.

In some embodiments, the photo-detecting apparatus 1800n also includes counter-doped regions 1851a, 1851b as described in FIG. 18J to further lower the dark current of the photo-detecting apparatus 1800n.

Figure 18O:
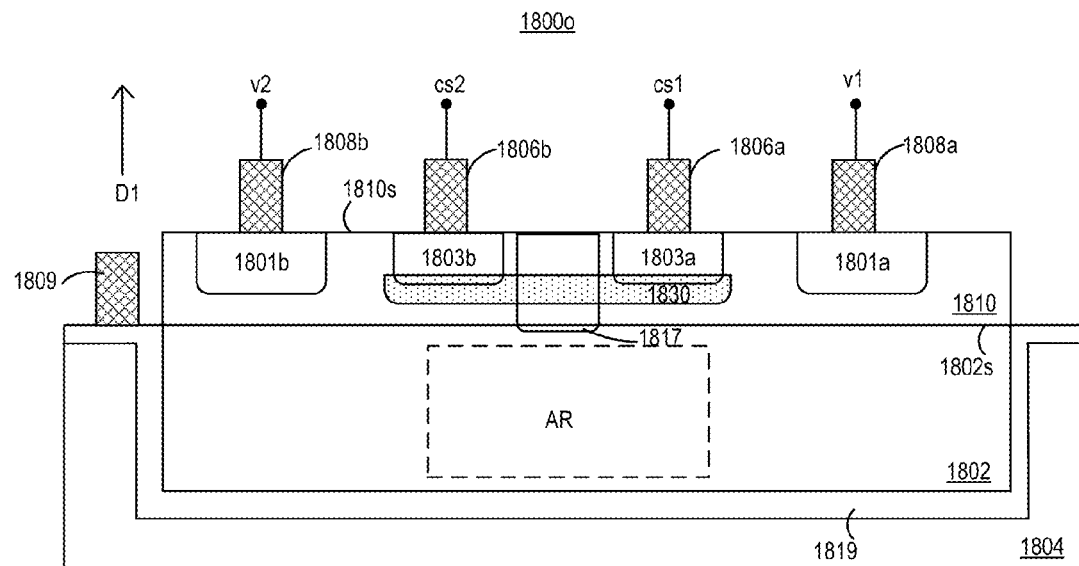

FIG. 18O illustrates a cross-sectional view of a photo-detecting apparatus, according to some embodiments. The photo-detecting apparatus 1800o in FIG. 18O is similar to the photo-detecting apparatus 1800m in FIG. 18M, where the difference is described below. The pixel of the photo-detecting apparatus 1800o further includes a channel region 1830 in the carrier control layer 1810. The channel region 1830 is under the control contact layers 1806a, 1806b along a vertical direction D1. In some embodiments, the carrier control layer 1810 is under the second doped regions 1803a, 1803b along a vertical direction D1. The channel region 1830 includes a dopant and is of a conductivity type the same as the first conductivity type of the first doped regions 1801a, 1801b. In some embodiments, the channel region 1830 includes dopant and has a dopant profile with a peak dopant concentration not less than $1\times10^{15}$ $cm^{-3}$. In some embodiments, the peak dopant concentration of the channel region 1830 is between $1\times10^{15}$ $cm^{-3}$ and $5\times10^{17}$ $cm^{-3}$. In some embodiments, the peak dopant concentration of the channel region 1830 lies in the carrier control layer 1810. In some embodiments, a distance between the first surface 1810s of the carrier control layer 1810 and the location of the channel region 1830 having the peak dopant concentration is not less than 30 nm. The channel region 1830 facilitates the carriers generated from the absorption layer 1802 flowing toward the first doped regions 1801a, 1801b without reaching the first surface 1810s of the carrier control layer 1810. Accordingly, the demodulation contrast is improved and the leakage current between the two control contact layers 1806a, 1806b of the photo-detecting apparatus 1800o is lower.

In some embodiments, the channel region 1830 is overlapped with the second doped regions 1803a, 1803b.

In some embodiments, the channel region 1830 may be overlapped with the first doped regions 1801a, 1801b. That is, the channel region 1830 can be connected to the first doped regions 1801a, 1801b. If the first switch is switched on and the second switch is switched off, the carriers can be pushed to flow toward the first doped region 1801a by biasing the first doped region 1801b of the second switch. That is, through the voltage control, there is a disconnection between the channel region 1830 and the first doped region 1801a of the switch that is turned off for the carriers, and thus the carriers will not flow into the first doped region of the switch that is turned off.

In a combination of the third doped region 1817 and the channel region 1830, the carriers generated in the absorption layer 1802 concentratedly flow toward the third doped region 1817 and move toward one of the first doped regions 1801a,1801b through the channel region 1830 based on the control of the two control signals cs1, cs2.

In some embodiments, the photo-detecting apparatus 1800o may also include the barrier regions 1820a, 1802b as described in FIG. 18L to further confine the flow of the carriers in a certain path.

In some embodiments, the photo-detecting apparatus 1800o also includes a first buffer region 1861 and a second buffer region 1862 as described in FIG. 18K to further modify the depletion regions near the first surface 1810s of the carrier control layer 1810.

In some embodiments, the photo-detecting apparatus 1800o also includes counter-doped regions 1851a, 1851b as described in FIG. 18J to further lower the dark current of the photo-detecting apparatus 1800o.

In some embodiments, the carrier control layer 1810 of the pixel further includes a hinder region 1840 as described in FIG. 18N to block the carriers from reaching the first surface 1810s.

Figure 18P:
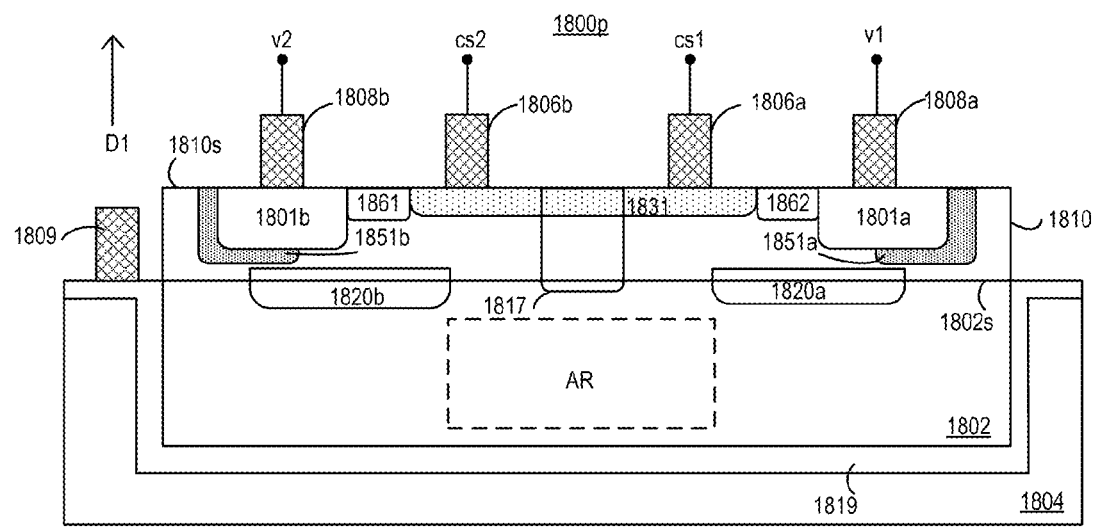

FIG. 18P illustrates a cross-sectional view of a photo-detecting apparatus, according to some embodiments. The photo-detecting apparatus 1800p in FIG. 18P is similar to the photo-detecting apparatus 1800f in FIG. 18F, where the difference is described below. The pixel of the photo-detecting apparatus 1800p further includes a shallow channel region 1831 in the carrier control layer 1810. The shallow channel region 1831 is under the control contact layers 1806a, 1806b along a vertical direction D1. The shallow channel region 1831 includes a dopant and is of a conductivity type the same as the first conductivity type of the first doped regions 1801a, 1801b. In some embodiments, the shallow channel region 1831 includes a dopant profile with a peak dopant concentration not less than $1\times10^{15}$ cm$^{-3}$. In some embodiments, the peak dopant concentration of the shallow channel region 1831 is between $1\times10^{15}$ cm$^{-3}$ and $5\times10^{17}$ cm$^{-3}$. In some embodiments, the peak dopant concentration of the shallow channel region 1831 lies in the carrier control layer 1810. In some embodiments, a distance between the first surface 1810s and the location of the shallow channel region 1831 having the peak dopant concentration is less than 30 nm. The shallow channel region 1831 can attract the carriers generated in the absorption layer 1802 and also further confine the carriers flowing toward one of the first doped regions 1801a, 1801b based on the control of the two control signals cs1, cs2.

Accordingly, the demodulation contrast of the photo-detecting apparatus 1800p is improved and the leakage current between the two control contact layers 1806a, 1806b of the photo-detecting apparatus 1800p is lower.

In some embodiments, the pixel of the photo-detecting apparatus 1800p further includes a third doped region 1817 in the carrier control layer 1810 and between the first switch and the second switch. The third doped region 1817 is similar to the third doped region 1817 as described in FIG. 18M. The third doped region 1817 serves as a vertical channel to further attract the carriers generated from the absorption layer 1802.

In some embodiments, the pixel of the photo-detecting apparatus 1800p further includes barrier regions 1820a, 1820b as described FIG. 18L to further confine the flow of the carriers in a certain path. In some embodiments, since the barrier regions 1820a, 1820b block the flow of the carriers and since the third doped region 1817 attracts the carriers, the carriers generated in the absorption layer 1802 concentratedly flow toward the third doped region 1817 and move toward one of the first doped regions 1801a, 1801b through the shallow channel region 1831 based on the control of the two control signals cs1, cs2. The absorbed region AR can be enlarged since photo-detecting apparatus 1800p includes the barrier regions 1820a, 1820b and the third doped region 1817.

In some embodiments, the pixel of the photo-detecting apparatus 1800p further includes counter-doped regions 1851a, 1851b as described FIG. 18J to further lower the dark current of the photo-detecting apparatus 1800p.

In some embodiments, the pixel of the photo-detecting apparatus 1800p further includes a first buffer region 1861 and a second buffer region 1862 as described in FIG. 18K to further modify the depletion regions near the first surface 1810s of the carrier control layer 1810.

Figure 18Q:
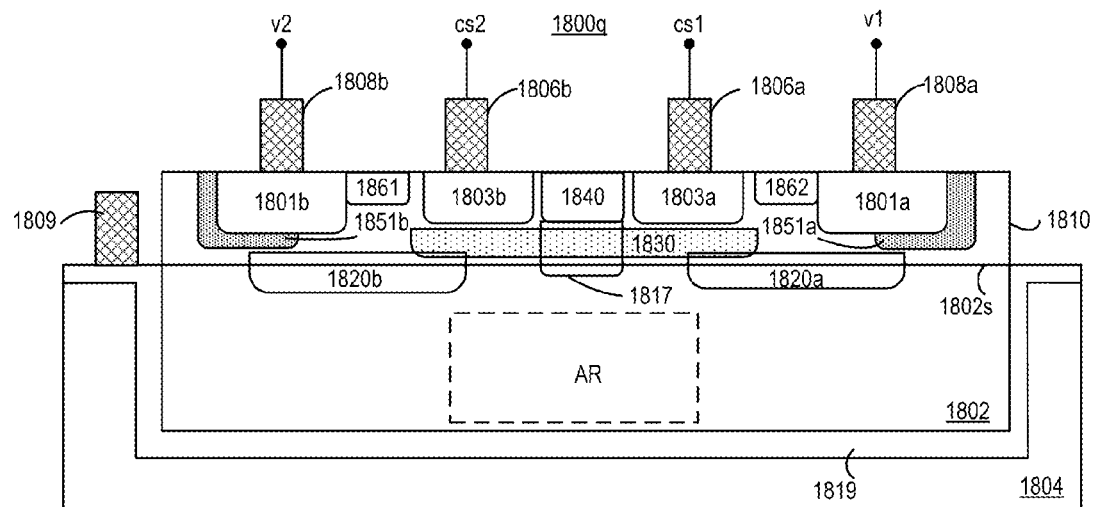

FIG. 18Q illustrates a cross-sectional view of a photo-detecting apparatus, according to some embodiments. The photo-detecting apparatus 1800q in FIG. 18Q is similar to the photo-detecting apparatus 1800o in FIG. 18O, where the difference is described below.

In some embodiments, the carrier control layer 1810 of the pixel further includes a hinder region 1840 as described in FIG. 18N to block the carriers to be collected from reaching the first surface 1810s.

In some embodiments, the pixel of the photo-detecting apparatus 1800q further includes barrier regions 1820a, 1820b as described FIG. 18L to further confine the flow of the carriers in a certain path.

In some embodiments, the pixel of the photo-detecting apparatus 1800q further includes a first buffer region 1861 and a second buffer region 1862 as described in FIG. 18K to further modify the depletion regions near the first surface 1810s of the carrier control layer 1810.

In some embodiments, the pixel of the photo-detecting apparatus 1800q further includes counter-doped regions 1851a, 1851b as described FIG. 18J to further lower the dark current of the photo-detecting apparatus 1800q.

Figure 18R:
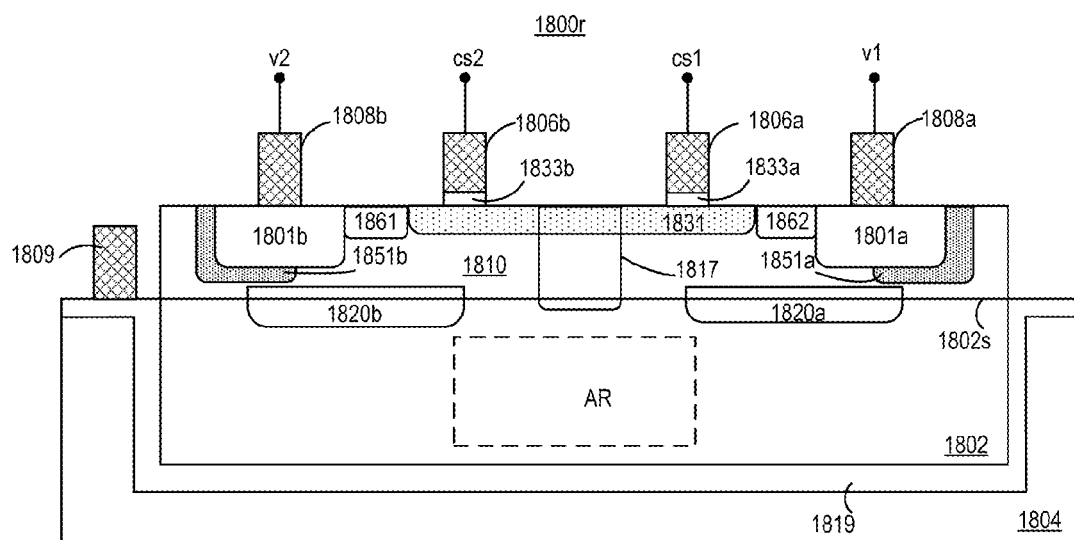

FIG. 18R illustrates a cross-sectional view of a photo-detecting apparatus, according to some embodiments. The photo-detecting apparatus 1800r in FIG. 18R is similar to the photo-detecting apparatus 1800p in FIG. 18P, where the difference is described below. The first switch further includes a first dielectric layer 1833a between the shallow channel region 1831 and the control contact layer 1806a. The second switch may further include a second dielectric layer 1833b between the shallow channel region 1831 and the control contact layer 1806b. The first dielectric layer 1833a and the second dielectric layer 1833b are similar to the first dielectric layer 1833a and the second dielectric layer 1833b respectively as described in FIG. 18H.

Figure 18S:
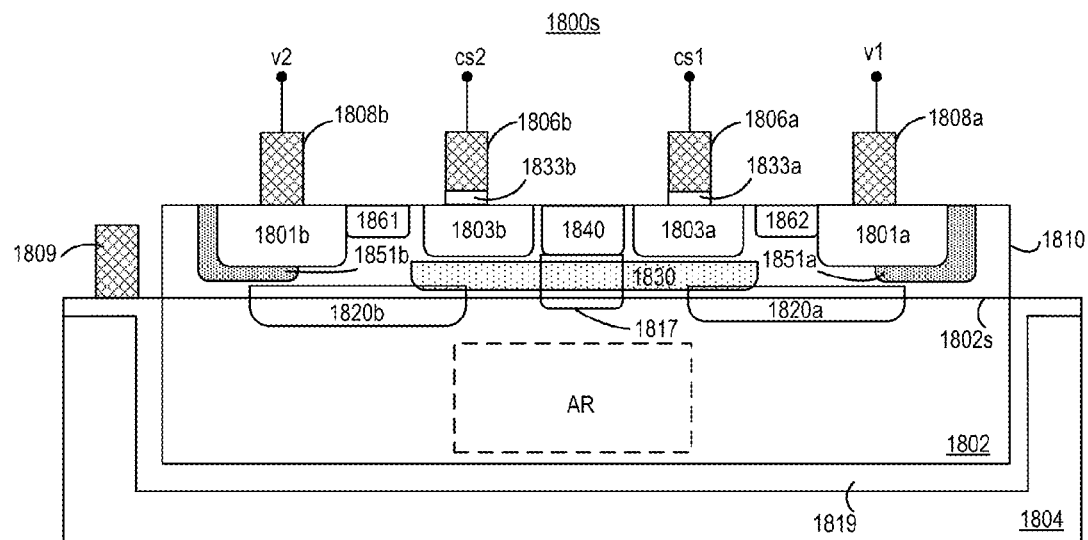

FIG. 18S illustrates a cross-sectional view of a photo-detecting apparatus, according to some embodiments. The photo-detecting apparatus 1800s in FIG. 18S is similar to the photo-detecting apparatus 1800q in FIG. 18Q, where the difference is described below. The first switch further includes a first dielectric layer 1833a between the second doped region 1803a and the control contact layer 1806a. The second switch may further include a second dielectric layer 1833b between the second doped region 1803b and the control contact layer 1806b. The first dielectric layer 1833a and the second dielectric layer 1833b are similar to the first dielectric layer 1833a and the second dielectric layer 1833b respectively as described in FIG. 18H.

Figure 18T:
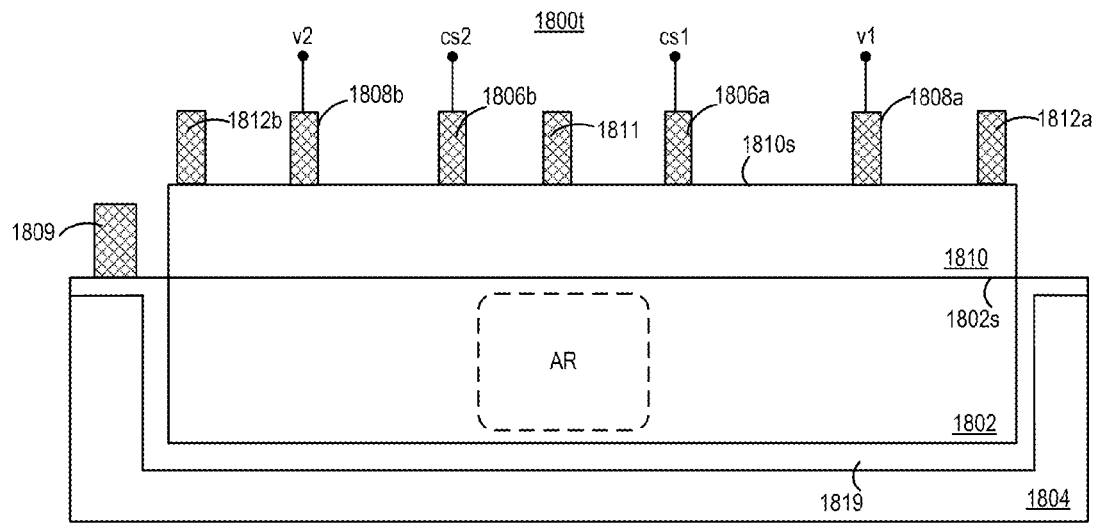

FIG. 18T illustrates a cross-sectional view of a photo-detecting apparatus, according to some embodiments. The photo-detecting apparatus 1800t in FIG. 18T is similar to the photo-detecting apparatus 1800e in FIG. 18E, where the difference is described below.

The photo-detecting apparatus 1800t further includes a first conductive layer 1811 over the first surface 1810s of the carrier control layer 1810. In some embodiments, the first conductive layer 1811 is between the control contact layers 1806a, 1806b. The first conductive layer 1811 can be biased by a bias voltage to reduce the leakage current of the photo-detecting apparatus 1800t.

In some embodiments, the photo-detecting apparatus 1800t further includes a modification contact layer 1812a over the first surface 1810s of the carrier control layer 1810. In some embodiments, the readout contact layer 1808a is between the control contact layers 1806a and the modification contact layer 1812a from a cross-sectional view. The photo-detecting apparatus 1800t further includes a modification contact layer 1812b over the first surface 1810s of the carrier control layer 1810. In some embodiments, the readout contact layer 1808b is between the control contact layers 1806b and the modification contact layer 1812b from a cross-sectional view.

In some embodiments, the modification contact layers 1812a, 1812b can be each biased by a bias voltage to shape the electric field in the carrier control layer 1810. Accordingly, the dark current of the photo-detecting apparatus 1800t is lower. The modification contact layer 1812a is for shaping the electric field near the first switch. The modification contact layer 1812b is for shaping the electric field near the second switch.

Figure 18U:
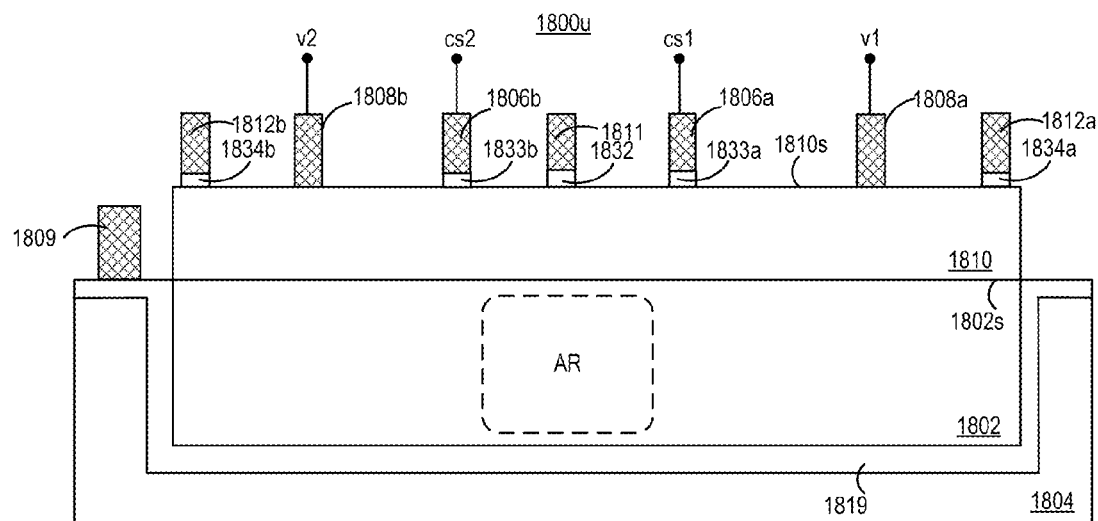

FIG. 18U illustrates a cross-sectional view of a photo-detecting apparatus, according to some embodiments. The photo-detecting apparatus 1800u in FIG. 18U is similar to the photo-detecting apparatus 1800t in FIG. 18T, where the difference is described below.

The first switch further includes a first dielectric layer 1833a between the carrier control layer 1810 and the control contact layer 1806a. The second switch may further include a second dielectric layer 1833b between the carrier control layer 1810 and the control contact layer 1806b. The first dielectric layer 1833a and the second dielectric layer 1833b are similar to the first dielectric layer 1833a and the second dielectric layer 1833b respectively as described in FIG. 18H.

The photo-detecting apparatus 1800u further includes a third dielectric layer 1834a between the carrier control layer 1810 and the modification contact layers 1812a. The photo-detecting apparatus 1800u further includes a fourth dielectric layer 1834b between the carrier control layer 1810 and the modification contact layers 1812b.

In some embodiments, the photo-detecting apparatus 1800u further includes a fifth dielectric layer 1832 between the carrier control layer 1810 the first conductive layer 1811.

In some embodiments, the photo-detecting apparatus 1800u further includes the first doped regions 1801a, 1801b as described FIG. 18L. In some embodiments, the photo-detecting apparatus 1800u further includes the second doped regions 1803a, 1803b as described FIG. 18L.

In some embodiments, the pixel of photo-detecting apparatus 1800u further includes the barrier regions 1820a, 1820b as described FIG. 18L.

In some embodiments, the pixel of the photo-detecting apparatus 1800u further includes the counter-doped regions 1851a, 1851b as described FIG. 18K.

In some embodiments, the pixel of the photo-detecting apparatus 1800u further includes the first buffer region 1861 and the second buffer region 1862 as described FIG. 18K.

In some embodiments, the pixel of the photo-detecting apparatus 1800u further includes the third doped region 1817 as described in FIG. 18M, In some embodiments, the pixel of the photo-detecting apparatus 1800u further includes the hinder region 1840 as described in FIG. 18N, In some embodiments, the pixel of the photo-detecting apparatus 1800u further includes the channel region 1830 as described in FIG. 18O or a shallow channel region 1831 as described in FIG. 18P.

In some embodiment, the photo-detecting apparatus in FIG. 18D-18U may further include two first silicide regions, and each of the first silicide regions is under the respective readout contact layer 1808a, 1808b. The first silicide regions are in the carrier control layer 1810 and may be similar to the first silicide regions 513a', 513b' as described in FIG. 5B. In some embodiment, the photo-detecting apparatus in FIG. 18D-18G, 18J-18Q, 18T may further include two second silicide regions under the respective control contact layer 1806a, 1806b. The second silicide regions are in the carrier control layer 1810 and may be similar to the second silicide regions 515a', 515b' as described in FIG. 5B.

The combination of the elements is within the scope of the present disclosure as long as the person having ordinary skill in the technical field can produce.

Figure 19A:
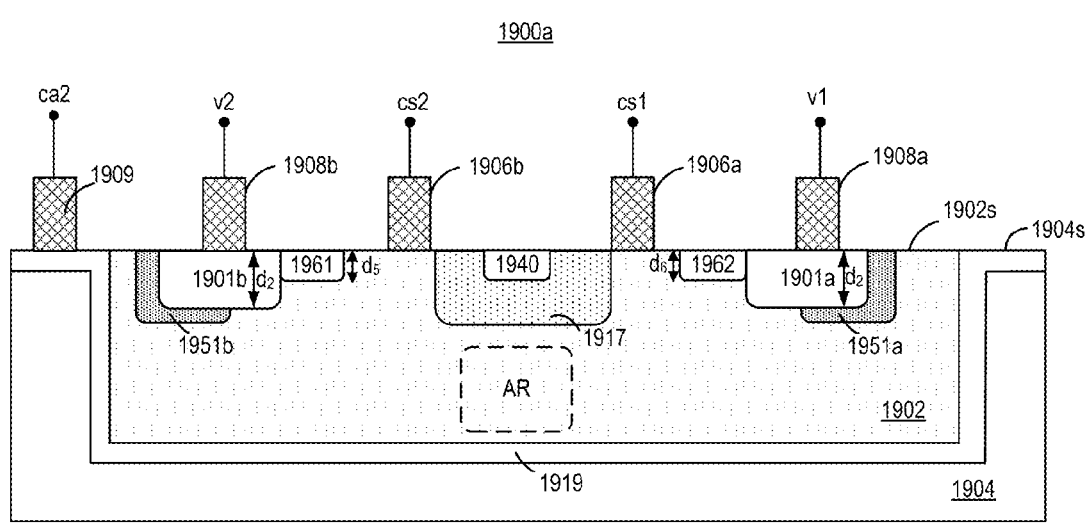
FIGS. 19A-19D illustrate cross-sectional views of a photo-detecting apparatus, according to some embodiments.

FIG. 19A illustrates a cross-sectional view of a photo-detecting apparatus, according to some embodiments. The photo-detecting apparatus 1900a includes a substrate 1904. The photo-detecting apparatus 1900a further includes a pixel including an absorption layer 1902 supported by the substrate 1904. The pixel includes an absorbed region AR in the absorption layer 1902. The absorbed region AR is similar to the absorbed region as mentioned before, such as the absorbed region AR as described in FIG. 15A. The pixel includes a first switch (not labeled) and a second switch (not labeled) electrically coupled to the absorption layer 1902. The first switch includes a control contact layer 1906a and a readout contact layer 1908a. The second switch includes a control contact layer 1906b and a readout contact layer 1908b. The first switch further includes a first doped region 1901a under the readout contact layer 1908a. The second switch further includes a first doped region 1901b under the readout contact layer 1908b. In some embodiments, the pixel further includes a first readout circuit (not shown) and a second readout circuit (not shown) electrically coupled to the first switch and the second switch respectively for processing the collected charges. The first readout circuit is electrically coupled to the readout contact layer 1908a. The second readout circuit is electrically coupled to the readout contact layer 1908b.

The control contact layers 1906a, 1906b are similar to the control contact layers as mentioned before, such as the control contact layers 1606a, 1606b as described in FIG. 16A. The readout contact layer 1908b, 1908a are similar to the readout contact layer as described before, such as the readout contact layer 1608a, 1608b as described in FIG. 16A. The first doped regions 1901b, 1901a are similar to the first doped regions as mentioned before, such as the first doped regions 1601a, 1601b as described in FIG. 16A.

In some embodiments, the photo-detecting apparatus 1900a further includes a blocking layer 1919 similar to the blocking layer as mentioned before, such as the blocking layer 1519 as described in FIG. 15A and FIG. 15C.

In some embodiments, the pixel of the photo-detecting apparatus 1900a further includes a third doped region 1917 similar to the third doped region 617' described in FIG. 6G.

In some embodiments, the pixel of the photo-detecting apparatus 1900a further includes a hinder region 1940 similar to the hinder region 640 described in FIG. 6L.

In some embodiments, the photo-detecting apparatus 1900a further includes a conductive layer 1909 electrically coupled to the blocking layer 1919 to bias the blocking layer 1919.

The photo-detecting apparatus 1900a further includes a conductive layer 1909 electrically coupled to the blocking layer 1919.

In some embodiments, the pixel of the photo-detecting apparatus 1900a further includes two counter-doped regions 1951a, 1951b in the absorption layer 1902. The counter-doped regions 1951a, 1951b are similar to the counter-doped regions as mentioned before, such as the counter-doped regions 1551a, 1551b as described in FIG. 15D.

In some embodiments, the pixel of the photo-detecting apparatus 1900a further includes a first buffer region 1961 and a second buffer region 1962. The first buffer region 1961 and the second buffer region 1962 are in the absorption layer 1902. The first buffer region 1961 and the second buffer region 1962 are similar to the first buffer region 1661 and the second buffer region 1662 respectively as described in FIG. 16F. The first buffer region 1961 and the second buffer region 1962 can further modify the depletion regions near the first surface 1902s of the absorption layer 1902.

In some embodiments, the photo-detecting apparatus 1900a further includes a conductive layer (not shown) on the first surface 1902s of the absorption layer 1902 and electrically coupled to the hinder region 1940.

In some embodiments, as mentioned before, the first buffer region 1961 includes a depth $d_5$ less than a depth $d_2$ of the first doped region 1901b, the second buffer region 1962 includes a depth $d_6$ less than a depth $d_2$ of the first doped region 1901a.

Figure 19B:
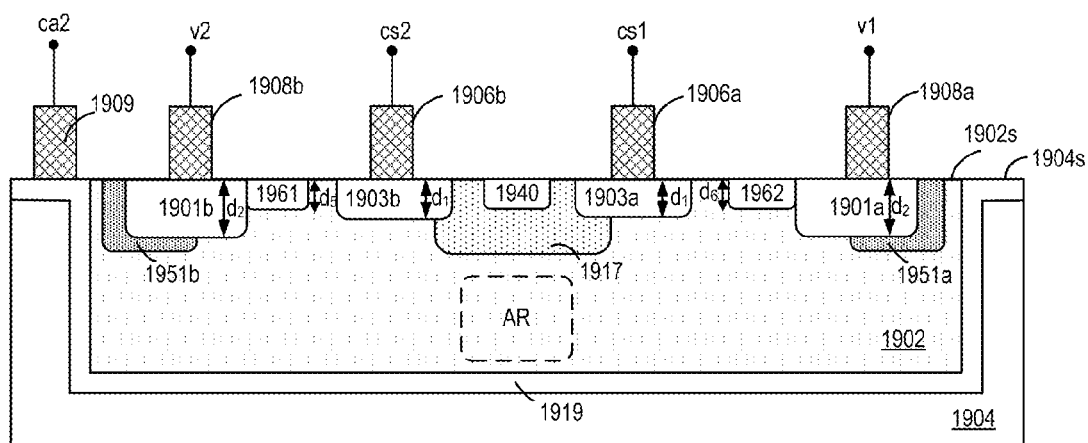

FIG. 19B illustrates a cross-sectional view of a photo-detecting apparatus, according to some embodiments. The photo-detecting apparatus 1900b in FIG. 19B is similar to the photo-detecting apparatus 1900a in FIG. 19A, where the difference is described below. In some embodiments, the first switch further includes a second doped region 1903a under the control contact layers 1906a. The second switch further includes a second doped region 1903b under the control contact layers 1906b. The second doped regions 1903a, 1903b are similar to the second doped regions as mentioned before, such as the second doped regions 1603a, 1603b as described in FIG. 16B.

In some embodiments, the third doped region 1917 overlaps with a portion of the second doped region 1903a farther from the first doped region 1901a of the first switch. The third doped region 1917 also overlaps with a portion of the second doped region 1903b farther from the first doped region 1901b of the second switch. In some embodiments, the entire second doped regions 1903a, 1903b are overlapped with the third doped region 1917 and are separated from the first buffer region 1961 and the second buffer region 1962.

In some embodiments, as mentioned before, the depth $d_5$ of the first buffer region 1961 is less than a depth $d_1$ of the second doped region 1903b. In some embodiments, the depth $d_6$ of the second buffer region 1962 is less than a depth $d_1$ of the second doped region 1903a.

Figure 19C:
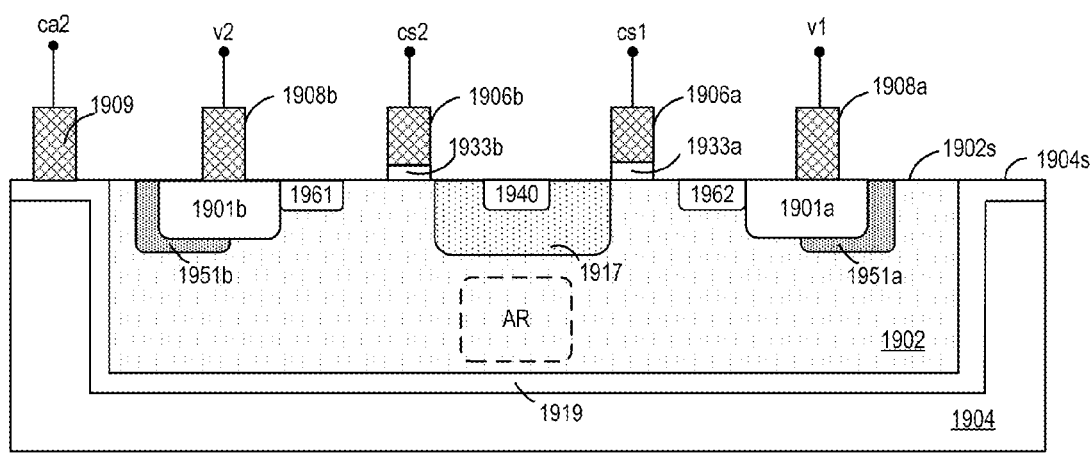

FIG. 19C illustrates a cross-sectional view of a photo-detecting apparatus, according to some embodiments. The photo-detecting apparatus 1900c in FIG. 19C is similar to the photo-detecting apparatus 1900a in FIG. 19A, where the difference is described below.

In some embodiments, the first switch further includes a first dielectric layer 1933a between the absorption layer 1902 and the control contact layer 1906a. The second switch may further include a second dielectric layer 1933b between the absorption layer 1902 and the control contact layer 1906b. The first dielectric layer 1933a and the second dielectric layer 1933a are similar to the first dielectric layer and the second dielectric layer as mentioned before, such as such as the first dielectric layer 1633a and the second dielectric layer 1633b as described in FIG. 16C.

Figure 19D:
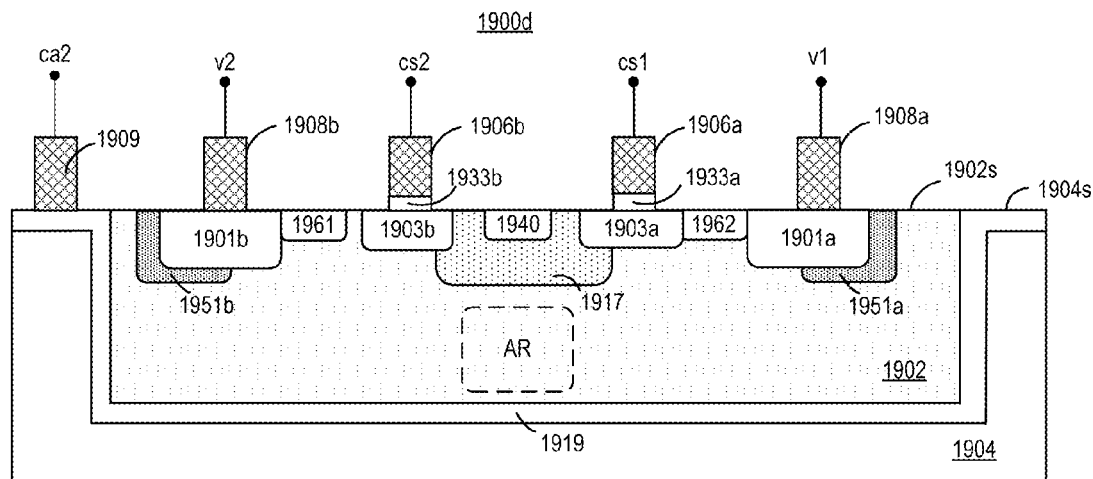

FIG. 19D illustrates a cross-sectional view of a photo-detecting apparatus, according to some embodiments. The photo-detecting apparatus 1900d in FIG. 19D is similar to the photo-detecting apparatus 1900c in FIG. 19C, where the difference is described below. In some embodiments, the first switch further includes a second doped region 1903a under the control contact layers 1906a. The second switch further includes a second doped region 1903b under the control contact layers 1906b. The second doped regions 1903b, 1903a are similar to the second doped regions as mentioned before, such as the second doped regions 1603a, 1603b as described in FIG. 16B.

Figure 20A:
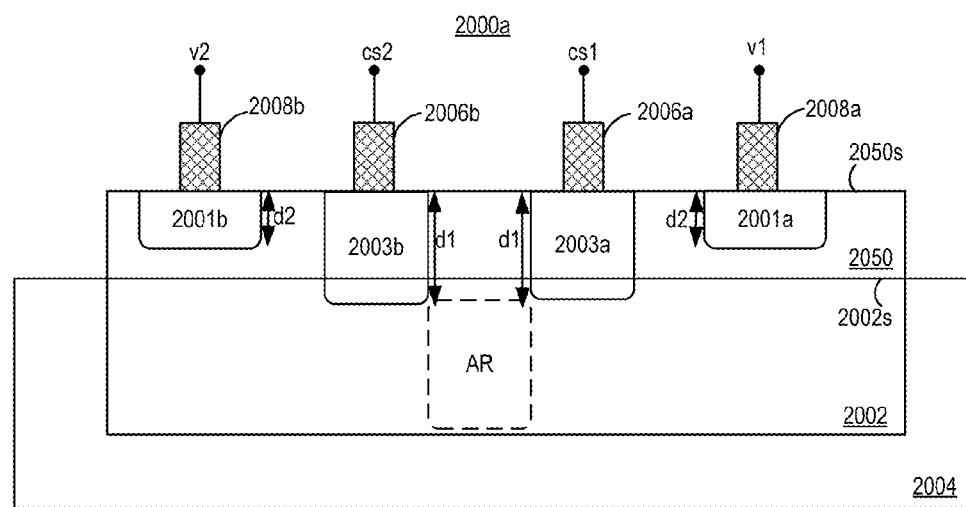
FIGS. 20A-20M illustrate cross-sectional views of a photo-detecting apparatus, according to some embodiments.

FIG. 20A illustrates a cross-sectional view of a photo-detecting apparatus, according to some embodiments. The photo-detecting apparatus 2000a includes a substrate 2004. The photo-detecting apparatus 2000a further includes a pixel including an absorption layer 2002 supported by the substrate 2004. The pixel includes an absorbed region AR in the absorption layer 2002. The absorbed region AR is similar to the absorbed region AR mentioned before, such as the absorbed region AR as described in FIG. 15A. The pixel further includes a carrier collection layer 2050 over the absorption layer 2002. In some embodiments, the carrier collection layer 2050 is over a first surface 2002s of the absorption layer 2002. In some embodiments, the carrier collection layer 2050 is epitaxially formed on the first surface 2002s of the absorption layer 2002.

The pixel further includes a first switch (not labeled) and a second switch (not labeled) electrically coupled to the absorption layer 2002. The first switch includes a control contact layer 2006a and a readout contact layer 2008a. The second switch includes a control contact layer 2006b and a readout contact layer 2008b. In some embodiments, the readout contact layers 2008a, 2008b and the control contact layers 2006a, 2006b are formed over the first surface 2050s of the carrier collection layer 2050. In some embodiments, a width of the absorbed region AR is less than a distance between the readout contact layers 2008a, 2008b. In some embodiments, the readout contact layers 2008a, 2008b are disposed at two opposite sides of the absorbed region AR. In some embodiments, the pixel further includes a first readout circuit (not shown) and a second readout circuit (not shown) electrically coupled to the first switch and the second switch respectively for processing the collected charges. The first readout circuit is electrically coupled to the readout contact layer 2008a. The second readout circuit is electrically coupled to the readout contact layer 2008b. The photo-detecting apparatus 2000a includes multiple repeating pixels. The photo-detecting apparatus 2000a includes a pixel-array including multiple repeating pixels. In some embodiments, the pixel-array may be a one-dimensional or a two-dimensional array of pixels.

In some embodiments, a material of the carrier collection layer 2050 is different from a material of the absorption layer 2002. In some embodiments, the material of the carrier collection layer 2050 includes a semiconductor material. In some embodiments, the material of the absorption layer 2002 includes a semiconductor material. In some embodiments, the material of the absorption layer 2002 has a first band gap, and the material of the carrier collection layer 2050 has a second band gap greater than the first band gap. In some embodiments, the semiconductor material includes a group III-V semiconductor material or a group IV semiconductor material. In some embodiments, the carrier collection layer 2050 includes Si, and the absorption layer 2002 includes Ge. In some embodiments, the carrier collection layer 2050 includes amorphous Si, polycrystalline Si, crystalline Si, or a combination thereof.

In some embodiments, the carrier collection layer 2050 has a thickness less than a thickness of the absorption layer 2002. In some embodiments, the carrier collection layer 2050 has a thickness not less than 100 nm, and not more than 500 nm. In some embodiments, the thickness of the carrier collection layer 2050 is between 200 nm and 500 nm.

In some embodiments, the first switch includes a first doped region 2001a under the readout contact layer 2008a and in the carrier collection layer 2050. The second switch includes a first doped region 2001b under the readout contact layers 2008b and in the carrier collection layer 2050. In some embodiments, the first doped regions 2001a, 2001b are each of a first conductivity type. In some embodiments, the first doped regions 2001a, 2001b include a first dopant. The peak dopant concentrations of the first doped regions 2001a, 2001b depend on the material of the readout contact layers 2008a, 2008b and the material of the carrier collection layer 2050, for example, between $5 \times 10^{18}$ cm$^{-3}$ to $5 \times 10^{20}$ cm$^{-3}$. In some embodiments, the peak dopant concentrations of the first doped regions 2001a, 2001b lie in the carrier collection layer 2050. The first doped regions 2001a, 2001b are for collecting the carriers in the carrier collection layer 2050, wherein the carriers are generated and flow from the absorption layer 2002, which are further processed by the first readout circuit (not shown) and the second readout circuit (not shown) respectively based on the control of the two control signals cs1, cs2. In some embodiments, each of the first doped regions 2001*a*, 2001*b* has a depth d2. The depth d2 of each of the first doped regions 2001*a*, 2001*b* is less than a thickness of the carrier collection layer 2050. The depth d2 is measured from the first surface 2050*s* of the carrier collection layer 2050 to the position where the dopant profile reaches a background concentration, such as $1\times10^{15}$ cm$^{-3}$. In some embodiments, the parts of the interface between the carrier collection layer 2050 and the absorption layer 2002 and under first doped regions 2001*a*, 2001*b* are of or lower than a background concentration, such as $1\times10^{15}$ cm$^{-3}$.

In some embodiments, the first switch further includes a second doped region 2003*a* under the control contact layers 2006*a*. The second switch further includes a second doped region 2003*b* under the control contact layers 2006*b*. The second doped regions 2003*a*, 2003*b* are in the carrier collection layer 2050 and in the absorption layer 2002. In some embodiments, the second doped regions 2003*a*, 2003*b* cover a part of the interface between the carrier collection layer 2050 and the absorption layer 2002. In some embodiments, the second doped regions 2003*a*, 2003*b* are each of a second conductivity type different from the conductivity type of the first doped regions 2001*b*, 2001*a*. In some embodiments, each of the second doped regions 2003*a*, 2003*b* includes a second dopant. The peak dopant concentrations of the second doped regions 2003*a*, 2003*b* depend on the material of the control contact layers 2006*b*, 2006*a* and the material of the carrier collection layer 2050, for example, between $1\times10^{17}$ cm$^{-3}$ to $5\times10^{20}$ cm$^{-3}$. In some embodiments, the peak dopant concentrations of the second doped regions 2001*a*, 2001*b* lie in the carrier collection layer 2050. The second doped regions 2003*a*, 2003*b* forms a Schottky or an Ohmic contact or a combination thereof with the control contact layers 2006*b*, 2006*a*. In some embodiments, each of the second doped regions 2003*a*, 2003*b* has a depth d1. The depth d1 of each of the second doped regions 2003*a*, 2003*b* is greater than the thickness of the carrier collection layer 2050. The depth d1 is measured from the first surface 2050*s* of the carrier collection layer 2050 to the position where the dopant profile of each of the second doped regions 2003*a*, 2003*b* reaches a background concentration, such as $1\times10^{15}$ cm$^{-3}$. In some embodiments, a dopant concentration of the second doped regions 2003*a*, 2003*b* at the interface between the carrier collection layer 2050 and the absorption layer 102 and covered by the second doped regions 2003*a*,2003*b* is not less than $1\times10^{15}$ cm$^{-3}$, in some embodiments, is not less than $1\times10^{17}$ cm$^{-3}$. The second doped regions 2003*a*, 2003*b* are for demodulating the carriers generated in the absorption layer 2002 based on the control of the control signals cs1, cs2.

In some embodiments, the absorption function and the carrier demodulation function operate in absorption layer 202 whereas the collection of the carriers operate in the carrier collection layer 2050, In some embodiments, since the dopant concentration of the second dopant at the interface between the carrier collection layer 2050 and the absorption layer 2002 and covered by the second doped regions 2003*a*,2003*b* is not less than $1\times10^{11}$ cm$^{-3}$, the dark current resulted from interface can be suppressed. Besides, a transverse field between the second doped regions 2003*a*, 2003*b* can be stronger at the same time. As a result, the demodulation contrast of the photo-detecting apparatus 2000*a* can be improved and the dark current of the photo-detecting apparatus 2000*a* can be reduced at the same time.

Figure 20B:
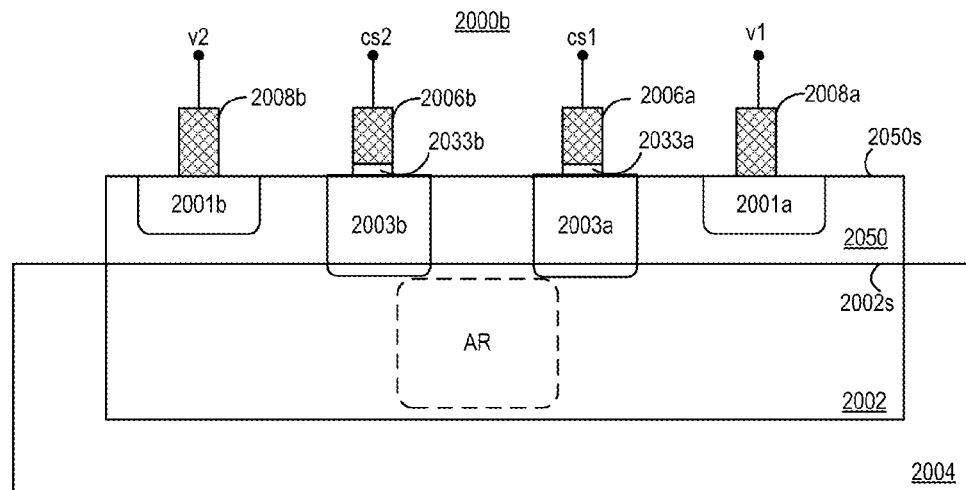

FIG. 20B illustrates a cross-sectional view of a photo-detecting apparatus, according to some embodiments. The photo-detecting apparatus 2000*b* in FIG. 20B is similar to the photo-detecting apparatus 2000*a* in FIG. 20A, the difference is described below. In some embodiments, the first switch further includes a first dielectric layer 2033*a* between the second doped region 2003*a* and the control contact layer 2006*a*. The second switch may further include a second dielectric layer 2033*b* between the second doped region 2003*b* and the control contact layer 2006*b*.

The first dielectric layer 2033*a* prevents direct current conduction from the control contact layer 2006*a* to the carrier collection layer 2050, but allows an electric field to be established within the carrier collection layer 2050 and the absorption layer 2002 in response to an application of a voltage to the control contact layer 2006*a*. The second dielectric layer 2033*b* prevents direct current conduction from the control contact layer 2006*b* to the absorption layer 2002 but allows an electric field to be established within the carrier collection layer 2050 and the absorption layer 2002 in response to an application of a voltage to the control contact layer 2006*b*. The established electric field may attract or repel charge carriers within the absorption layer 2002.

Figure 20C:
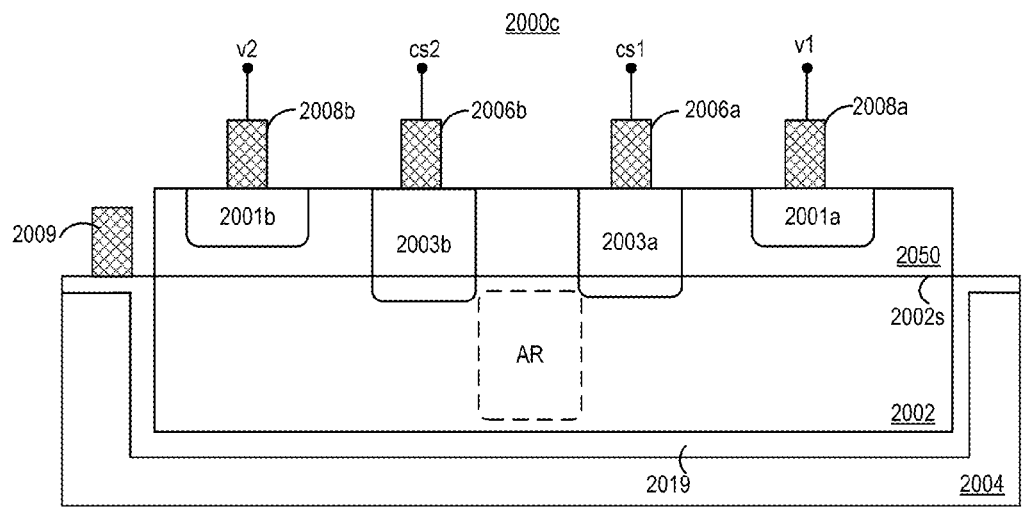

FIG. 20C illustrates a cross-sectional view of a photo-detecting apparatus, according to some embodiments. The photo-detecting apparatus 2000*c* in FIG. 20C is similar to the photo-detecting apparatus 2000*a* in FIG. 20A, where the difference is described below. In some embodiments, the photo-detecting apparatus 2000*c* further includes a blocking layer 2019 surrounding the absorption layer 2002. The blocking layer 2019 is similar to the blocking layer as described before, such as the blocking layer 1519 in FIG. 15A and FIG. 15C. The photo-detecting apparatus 2000*c* further includes a conductive layer 2009 electrically coupled to the blocking layer 2019. In some embodiments, the blocking layer 2019 may be biased by a bias voltage through the conductive layer 1609 to discharge the carriers not collected by the first doped regions 2001*a*, 2001*b*.

Figure 20D:
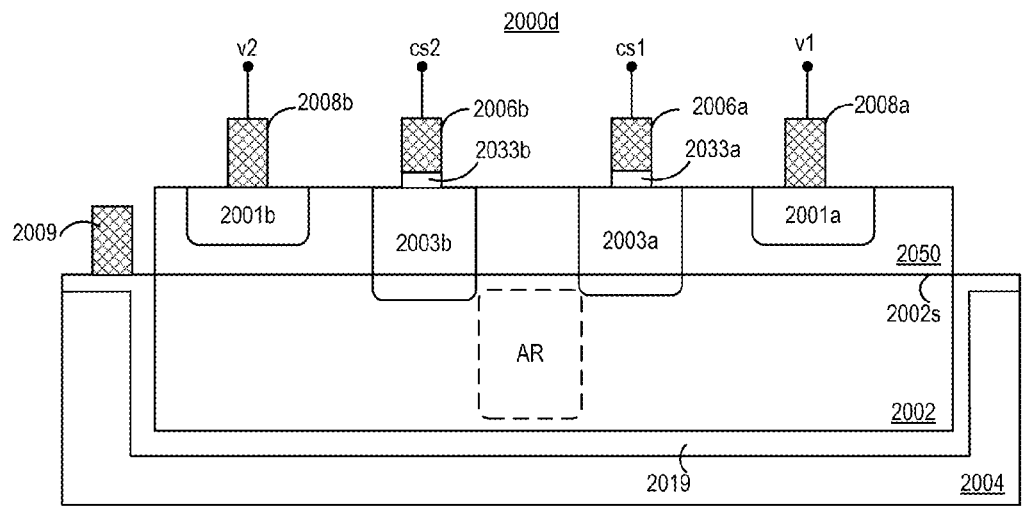

FIG. 20D illustrates a cross-sectional view of a photo-detecting apparatus, according to some embodiments. The photo-detecting apparatus 2000*d* in FIG. 20D is similar to the photo-detecting apparatus 2000*c* in FIG. 20C, where the difference is described below. In some embodiments, the first switch further includes a first dielectric layer 2033*a* between the second doped region 2003*a* and the control contact layer 2006*a*. The second switch may further include a second dielectric layer 2033*b* between the second doped region 2003*b* and the control contact layer 2006*b*. The first dielectric layer 2033*a* and the second dielectric layer 2033*b* are similar to the first dielectric layer and the second dielectric layer as described before, such as the first dielectric layer 2033*a* and the second dielectric layer 2033*b* in FIG. 20B.

Figure 20E:
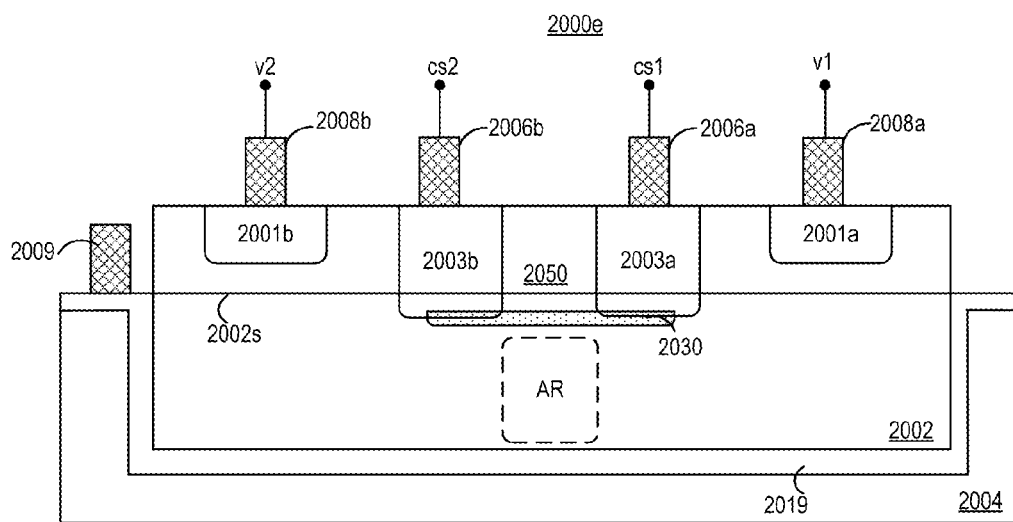

FIG. 20E illustrates a cross-sectional view of a photo-detecting apparatus, according to some embodiments. The photo-detecting apparatus 2000*e* in FIG. 20E is similar to the photo-detecting apparatus 2000*c* in FIG. 20C, where the difference is described below. In some embodiments, the pixel of the photo-detecting apparatus 2000*e* further includes a channel region 2030 in the absorption layer 2002. The channel region 2030 is similar to the channel region as mentioned before, such as the channel region 1630 as described in FIG. 16A. Since the channel region 2030 and the blocking layer 2019 are collectively formed as a vertical photodiode, there is a built-in vertical electrical field established between channel region 2030 and the blocking layer 2019, which may assist in separating the electron-hole pairs generated by the absorbed photons in the absorption layer 2002, for example, when the channel region 2030 is of n-type and the blocking layer 2019 is of p-type, the electrons tend to move toward the channel region 2030 and the holes tends to move toward the blocking layer 1819. The channel region 2030 is operated to collect the electrons and the blocking layer 2019 is operated to collect the holes. The channel region 2030 serves as a preliminary collector. The electrons stored in the channel region 2030 may then move to the first doped region 2001b or the first doped region 2001a based on the control signals cs1, cs2.

Figure 20F:
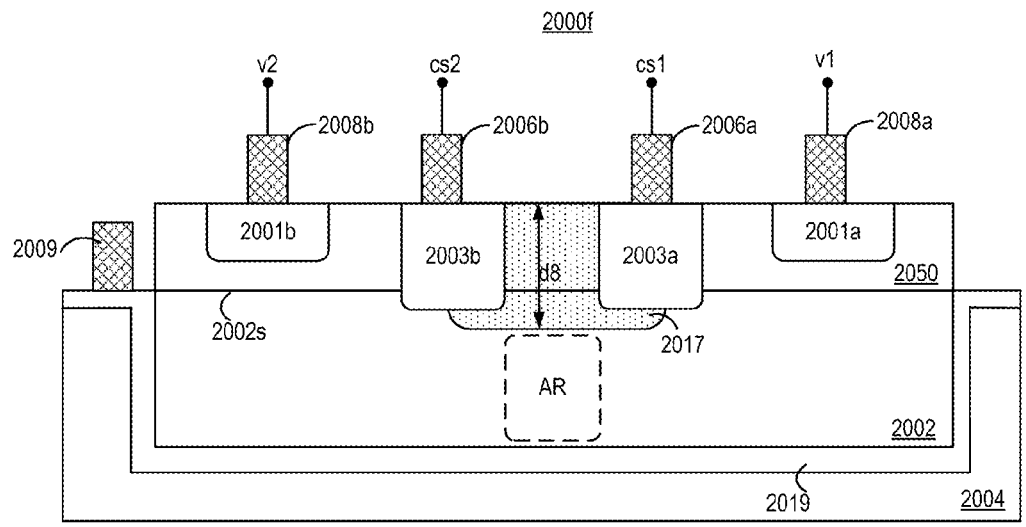

FIG. 20F illustrates a cross-sectional view of a photo-detecting apparatus, according to some embodiments. The photo-detecting apparatus 2000f in FIG. 20F is similar to the photo-detecting apparatus 2000c in FIG. 20C, where the difference is described below. In some embodiments, the pixel of the photo-detecting apparatus 2000f further includes a third doped region 2017. The third doped region 2017 is similar to the third doped region as mentioned before, such as the third doped region 1917 in FIG. 19B. In some embodiments, the third doped region 1917 has a depth d8 greater than the thickness of the carrier collection layer 2050. The depth d8 is measured from the first surface 2050s of the carrier collection layer 2050 to the position where the dopant profile of the third doped region 1917 reaches a background concentration, such as $1 \times 10^{15}$ cm$^{-3}$.

Since the third doped region 2017 and the blocking layer 2019 are collectively formed as a vertical photodiode, there is a built-in vertical electrical field established between third doped region 2017 and the blocking layer 2019, which may assist in separating the electron-hole pairs generated by the absorbed photons, for example, when the third doped region 2017 is of n-type and the blocking layer 2019 is of p-type, the electrons tends to move toward the third doped region 2017 and the holes tends to move toward the blocking layer 2019. The third doped region 2017 is operated to collect the electrons and the blocking layer 2019 is operated to collect the holes. The third doped region 2017 serves as a preliminary collector. The electrons stored in the blocking layer 2019 may be moved to first doped region 2001a or the first doped region 2001b based on the control signals cs1, cs2. Therefore, the quantum efficiency of the photo-detecting apparatus 2000f is higher and the amount of the carriers moving toward the first doped region 2001a or the first doped region 2001b is also higher.

Figure 20G:
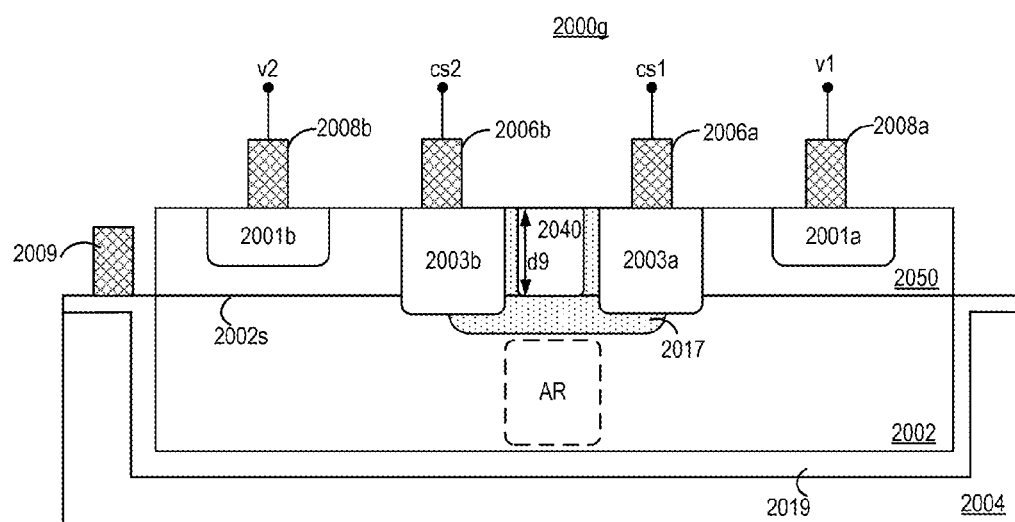

FIG. 20G illustrates a cross-sectional view of a photo-detecting apparatus, according to some embodiments. The photo-detecting apparatus 2000g in FIG. 20G is similar to the photo-detecting apparatus 2000f in FIG. 20F, where the difference is described below. In some embodiments, the carrier collection layer 2050 of the pixel of the photo-detecting apparatus 2000g further includes a hinder region 2040. The hinder region 2040 is similar to the hinder region as described before, such as the hinder region 640 as described in FIG. 6L. In some embodiments, the hinder region 2040 has a depth d9 not more than the thickness of the carrier collection layer 2050. The depth d9 is measured from the first surface 2050s of the carrier collection layer 2050 to the position where the dopant profile of the hinder region 2040 reaches a background concentration, such as $1 \times 10^{15}$ cm$^{-3}$.

The hinder region 2040 can block the carriers to be collected from reaching the first surface 2050s of the carrier collection layer 2050, and also confine the carriers in a restricted flow path. As a result, a surface leakage current between the two second doped regions 2003a, 2003b of the photo-detecting apparatus 2000g is reduced.

Figure 20H:
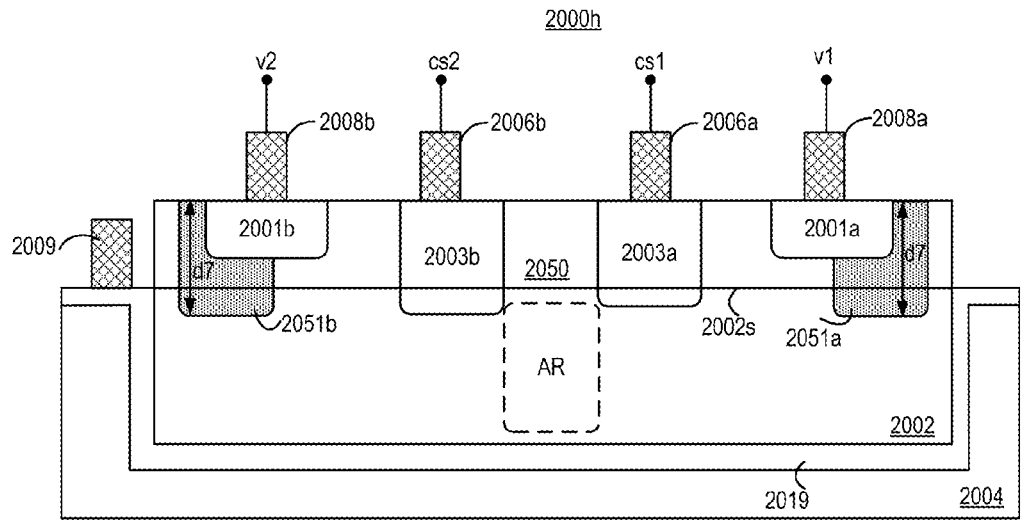

FIG. 20H illustrates a cross-sectional view of a photo-detecting apparatus, according to some embodiments. The photo-detecting apparatus 2000h in FIG. 20H is similar to the photo-detecting apparatus 2000c in FIG. 20C, where the difference is described below. In some embodiments, the pixel of the photo-detecting apparatus 2000h further includes counter-doped regions 2051a, 2051b in the carrier collection layer 2050 and the absorption layer 2002. The counter-doped regions 2051a, 2051b are similar to the counter-doped regions as mentioned before, such as the counter-doped region 1551a, 1551b as described in FIG. 15D. In some embodiments, the peak dopant concentrations of the counter-doped region 2051a, 2051b lie in the carrier collection layer 2050. The counter-doped regions 2051a, 2051b cover a part of the interface between the carrier collection layer 2050 and the absorption layer 2002. In some embodiments, each of the counter-doped regions 2051a, 2051b has a depth d7. The depth d7 of each of the counter-doped region 2051a, 2051b is greater than the thickness of the carrier collection layer 2050. The depth d7 is measured from the first surface 2050s of the carrier collection layer 2050 to the position where the dopant profile of the counter-doped region 2051a, 2051b reaches a background concentration, such as $1 \times 10^{15}$ cm$^{-3}$. As mentioned before, in some embodiments, the counter-doped region 2051a, 2051b overlaps with at least a portion of the first doped regions 2001a, 2001b to further reduce the dark current of the photo-detecting apparatus 2000h.

Figure 20I:
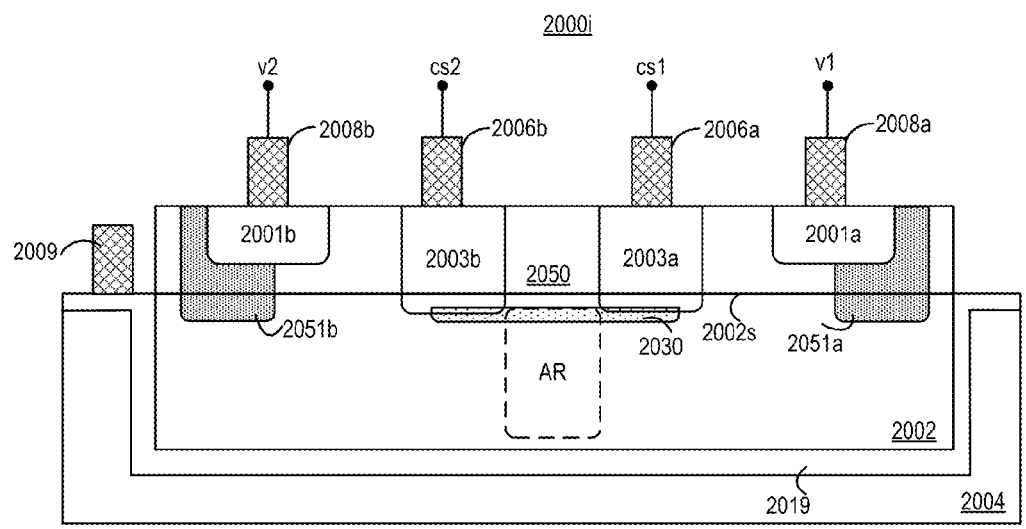

FIG. 20I illustrates a cross-sectional view of a photo-detecting apparatus, according to some embodiments. The photo-detecting apparatus 2000i in FIG. 20I is similar to the photo-detecting apparatus 2000e in FIG. 20E, where the difference is described below. In some embodiments, the pixel of the photo-detecting apparatus 2000I further includes counter-doped regions 2051a, 2051b in the carrier collection layer 2050 and the absorption layer 2002. The counter-doped regions 2051a, 2051b are similar to the counter-doped regions as mentioned before, such as the counter-doped region 2051a, 2051b as described in FIG. 20H. The photo-detecting apparatus 2000i is with a lower dark current.

Figure 20J:
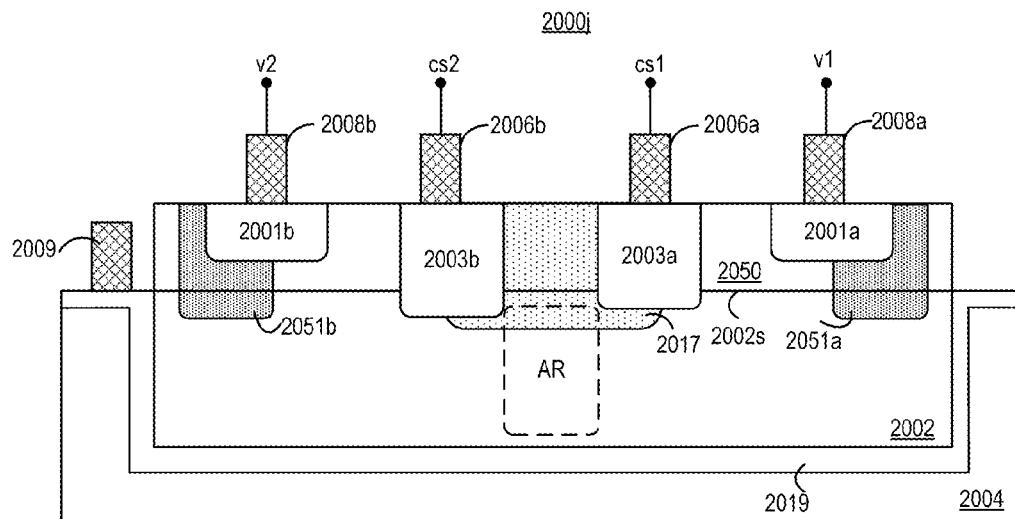

FIG. 20J illustrates a cross-sectional view of a photo-detecting apparatus, according to some embodiments. The photo-detecting apparatus 2000j in FIG. 20J is similar to the photo-detecting apparatus 2000g in FIG. 20G, where the difference is described below. In some embodiments, the pixel of the photo-detecting apparatus 2000j further includes counter-doped regions 2051a, 2051b in the carrier collection layer 2050 and the absorption layer 2002. The counter-doped regions 2051a, 2051b are similar to the counter-doped regions as mentioned before, such as the counter-doped region 2051a, 2051b as described in FIG. 20H. The photo-detecting apparatus 2000j is with a lower dark current.

In some embodiments, the carrier collection layer 2050 of the pixel further includes a hinder region (now shown) in the carrier collection layer 2050. The hinder region is similar to the hinder region as described before, such as the hinder region 2040 as described in FIG. 20G to confine the carriers in a restricted flow path.

Figure 20K:
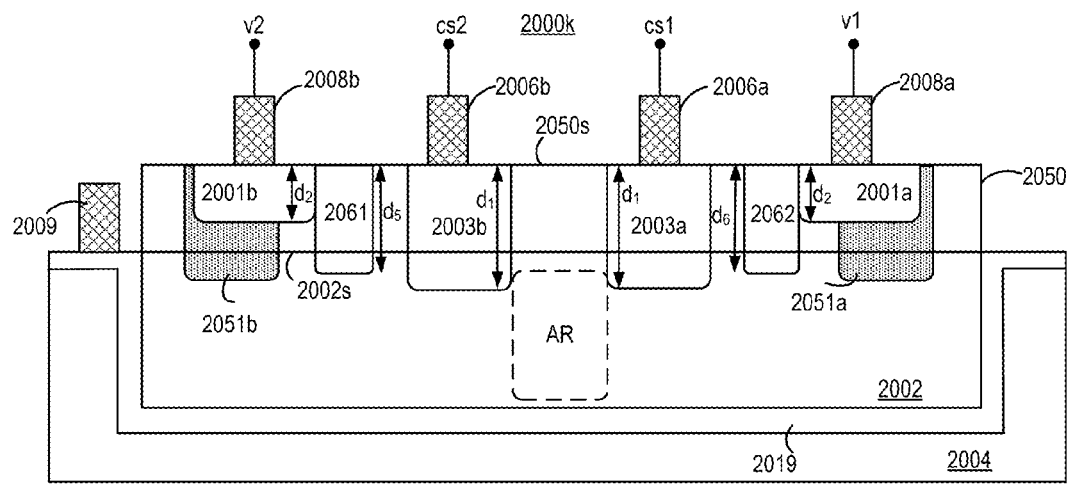

FIG. 20k illustrates a cross-sectional view of a photo-detecting apparatus, according to some embodiments. The photo-detecting apparatus 2000k in FIG. 20K is similar to the photo-detecting apparatus 2000c in FIG. 20C, where the difference is described below. In some embodiments, the pixel of the photo-detecting apparatus 2000k further includes a first buffer region 2061 and a second buffer region 2062. The first buffer region 2061 and the second buffer region 2062 are similar to the first buffer region 1661 and the second buffer region 1662 as described in FIG. 16F, where the difference is described below. In some embodiments, the first buffer region 2061 covers a part of the interface between the carrier collection layer 2050 and the absorption layer 2002. In some embodiments, the second buffer region 2062 covers a part of the interface between the carrier collection layer 2050 and the absorption layer 2002. In some embodiments, the dopant concentration of the fifth dopant at the interface between the carrier collection layer 2050 and the absorption layer 2002 and covered by the first buffer region 2061 and the second buffer region 2062 is not less than $1\times10^{16}$ cm$^{-3}$.

In some embodiments, the depth d5 of the first buffer region 2061 is greater than the thickness of the carrier collection layer 2050. The depth d6 of the second buffer region 2062 is greater than the thickness of the carrier collection layer 2050. The depth d5 is measured from the first surface 2050s of the carrier collection layer 2050 to the position where the dopant profile of the first buffer region 2061 reaches a background concentration, such as $1\times10^{15}$ cm$^{-3}$ The depth d6 is measured from the first surface 2050s of the carrier collection layer 2050 to the position where the dopant profile of the second buffer region 2062 reaches a background concentration, such as $1\times10^{15}$ cm$^{-3}$. The first buffer region 2061 and the second buffer region 2062 can further modify the depletion regions in the carrier collection layer 2050, such as the depletion regions around the first doped regions 1601a, 1601b and the depletion regions near the first surface 2050s of the carrier collection layer 2050. As mentioned before, the conductivity types of the first buffer region 2061 and the second buffer region 2062 can be the same or different from the first conductivity type of the first doped regions 2001a, 2001b. If the conductivity types of the first buffer region 2061 and the second buffer region 2062 are the same as the first conductivity type of the first doped regions 2001a, 2001b, since the dopant concentration of the fifth dopant at the interface between the carrier collection layer 2050 and the absorption layer 2002 and covered by the first buffer region 2061 and the second buffer region 2062 is not less than $1\times10^{15}$ cm$^{-3}$, which can lower the barrier at the interface for the carriers. As a result, the first buffer region 2061 and the second buffer region 2062 can facilitate the carriers flowing from the absorption layer 2002 toward the first doped regions 2001a, 2001b.

If the conductivity types of the first buffer region 2061 and the second buffer region 2062 are different from the first conductivity type of the first doped regions 2001a, 2001b, the flow of the carries can be confined at a path away from the first buffer region 2061 and the second buffer region 2062, and thus. As a result, the demodulation contrast of the photo-detecting apparatus 2000k can be improved.

In some embodiments, the pixel of the photo-detecting apparatus 2000k may further includes counter-doped regions 2051a, 2051b in the carrier collection layer 2050 and the absorption layer 2002. The counter-doped regions 2051a, 2051b are similar to the counter-doped regions as mentioned before, such as the counter-doped region 2051a, 2051b as described in FIG. 20H to further lower the dark of the photo-detecting apparatus 2000k.

Figure 20L:
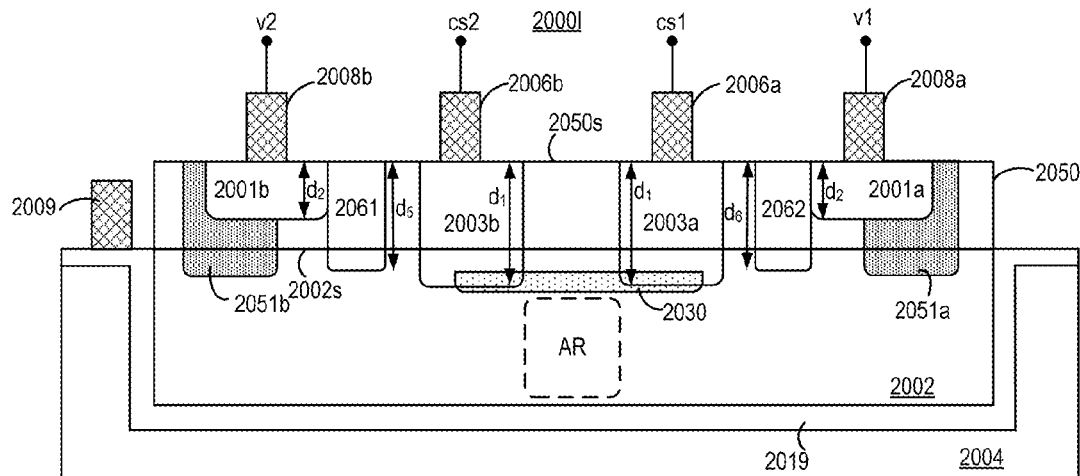

FIG. 20L illustrates a cross-sectional view of a photo-detecting apparatus, according to some embodiments. The photo-detecting apparatus 20001 in FIG. 20L is similar to the photo-detecting apparatus 2000k in FIG. 20K, where the difference is described below. In some embodiments, the pixel of the photo-detecting apparatus 20001 further includes a channel region 2030 in the absorption layer 2002. The channel region 2030 is similar to the channel region as mentioned before, such as the channel region 2030 as described in FIG. 20E to further improve the demodulation contrast of the photo-detecting apparatus 2000L.

Figure 20M:
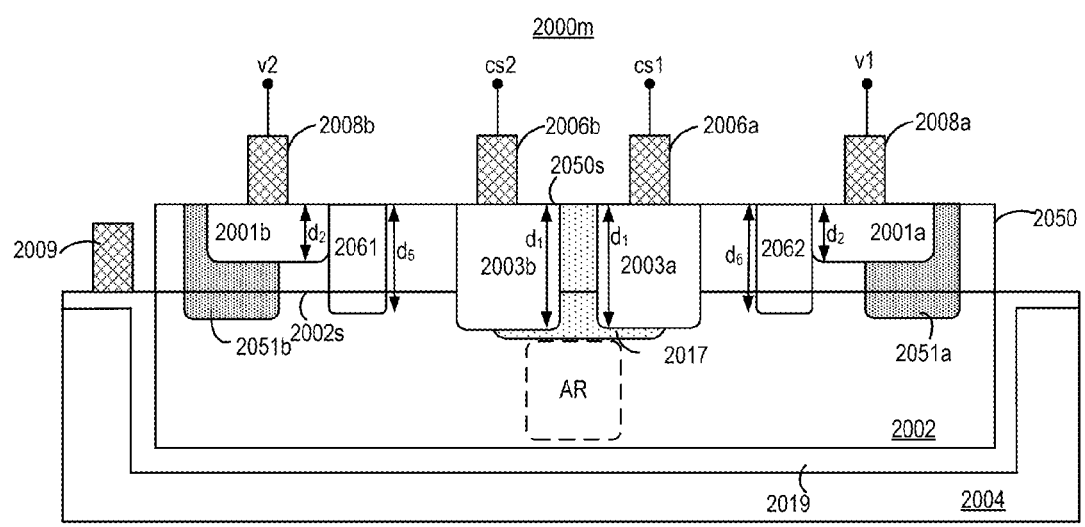

FIG. 20M illustrates a cross-sectional view of a photo-detecting apparatus, according to some embodiments. The photo-detecting apparatus 2000m in FIG. 20M is similar to the photo-detecting apparatus 2000k in FIG. 20K, where the difference is described below. In some embodiments, the pixel of the photo-detecting apparatus 20001 further includes a third doped region 2017. The third doped region 2017 is similar to the third doped region as mentioned before, such as the third doped region 2017 as described in FIG. 20G to further improve the demodulation contrast of the photo-detecting apparatus 2000m.

In some embodiments, the carrier collection layer 2050 of the pixel of the photo-detecting apparatus 2000m further includes a hinder region (now shown). The hinder region is similar to the hinder region as described before, such as the hinder region 2040 as described in FIG. 20G to confine the carriers in a restricted flow path.

In some embodiment, the photo-detecting apparatus in FIG. 20A-20M may further include two first silicide regions under the readout contact layers 2008a, 2008b. The first silicide regions are in the carrier collection layer 2050 and may be similar to the first silicide regions 513a', 513b' as described in FIG. 5B. In some embodiment, the photo-detecting apparatus in FIGS. 20A, 20C, and 20E-20M may further include two second silicide regions under the control contact layer 2006a, 2006b. The second silicide regions are in the carrier collection layer 2050 and may be similar to the second silicide regions 515a', 515b' as described in FIG. 5B.

In some embodiments, the first switch of the photo-detecting apparatus 2000e to 2000m may further include a first dielectric layer between the second doped region 2003a and the control contact layer 2006a. The second switch of the photo-detecting apparatus 2000e to 2000m may further include a second dielectric layer between the second doped region 2003b and the control contact layer 2006b. The first dielectric layer and the second dielectric layer are similar to the first dielectric layer and the second dielectric layer as described before, such as the first dielectric layer 2033a and the second dielectric layer 2033b in FIG. 20B.

In some embodiments, the photo-detecting apparatus in FIG. 1A-1J, in FIGS. 2A-2H, in FIGS. 3A-3B, in FIG. 4A-4H, in FIG. 5A-5H, in FIG. 6A-6C, in FIG. 6H-6V, FIG. 7A-7D, in FIG. 8A-8B, in FIG. 15A-15D, in FIG. 16A-16M, in FIG. 17A-17I, in FIG. 18A-18U, in FIG. 19A-19D and in FIG. 20A-20M further include an isolation region as described before, such as the isolation region 624 in FIG. 6D or the isolation region 1524 in FIG. 15E.

In some embodiments, the photo-detecting apparatus in FIG. 1A-1H, in FIGS. 2A-2H, in FIGS. 3A-3B, in FIG. 4A-4H, in FIG. 6A-6H, in FIG. 6K-6M, FIG. 6O, FIG. 6Q-FIG. 6V, FIG. 9A-9E, FIG. 15A-15L, FIG. 16A-16B, FIG. 16E-16K, FIG. 19A-19B further include a passivation layer 514 as described in one of the FIGS. 5A-5H as long as the person having ordinary skill in the technical field can produce.

In some embodiments, the photo-detecting apparatus in the present disclosure further includes an optical element (not shown) over the pixel. In some embodiments, the photo-detecting apparatus in the present disclosure further includes multiple optical elements (not shown) over the multiple pixels. The optical element converges an incoming optical signal to enter the absorbed region. In some embodiments, the optical elements include lenses.

In some embodiments, p-type dopant includes a group-III element. In some embodiments, p-type dopant is boron. In some embodiments, n-type dopant includes a group-V element. In some embodiments, n-type dopant is phosphorous In the present disclosure, if not specifically mention, the absorption layer is entirely embedded in the substrate, partially embedded in the substrate or entirely on the first surface of the substrate. Similarly, if not specifically mention, the germanium-based light absorption material is entirely embedded in the semiconductor substrate, partially embedded in the semiconductor substrate or entirely over the first surface of the semiconductor substrate.

In the present disclosure, if not specifically mention, the absorption layer is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, the absorption layer receives an optical signal and converts the optical signal into electrical signals.

In the present disclosure, if not specifically mention, the substrate is made by a first material or a first material-composite. The absorption layer is made by a second material or a second material-composite. The second material or a second material-composite is different from the first material or a first material-composite. In some embodiments, the absorption layer includes a semiconductor material. In some embodiments, the absorption layer includes polycrystalline material. In some embodiments, the substrate includes a semiconductor material. In some embodiments, the absorption layer includes a Group III-V semiconductor material. In some embodiments, the substrate includes a Group III-V semiconductor material. The Group III-V semiconductor material may include, but is not limited to, GaAs/AlAs, InP/InGaAs, GaSb/InAs, or InSb. In some embodiments, the absorption layer includes a semiconductor material including a Group IV element. For example, Ge, Si or Sn. In some embodiments, the absorption layer includes $Ge_xSi_{1-x}$, wherein $0<x<1$. In some embodiments, the absorption layer includes the $Si_xGe_ySn_{1-x-y}$, wherein $0 \le x \le 1$, $0 \le y \le 1$. In some embodiments, the absorption layer includes the $Ge_{1-a}Sn_a$, wherein $0 \le a \le 0.1$. In some embodiments, the substrate includes Si. In some embodiments, the substrate is composed of Si. In some embodiments, the absorption layer is composed of Ge, Si or $Ge_xSi_{1-x}$. In some embodiments, the absorption layer composed of intrinsic germanium is of p-type due to material defects formed during formation of the absorption layer, wherein the defect density is from $1 \times 10^{14}$ $cm^{-3}$ to $1 \times 10^{16}$ $cm^{-3}$.

In the present disclosure, if not specifically mention, the absorption layer has a thickness depending on the wavelength of photons to be detected and the material of the absorption layer. In some embodiments, when the absorption layer includes germanium and is designed to absorb photons having a wavelength not less than 800 nm, the absorption layer has a thickness not less than 0.1 um. In some embodiments, the absorption layer includes germanium and is designed to absorb photons having a wavelength between 800 nm and 2000 nm, the absorption layer has a thickness between 0.1 um and 2.5 um. In some embodiments, the absorption layer has a thickness between 1 um and 2.5 um for higher quantum efficiency. In some embodiments, the absorption layer may be grown using a blanket epitaxy, a selective epitaxy, or other applicable techniques.

In the present disclosure, if not specifically mention, the first readout circuits, the second readout circuits, may be in a three-transistor configuration consisting of a reset gate, a source-follower, and a selection gate, a circuit including four or more transistors, or any suitable circuitry for processing charges. In some embodiments, the first readout circuits and the second readout circuits may be fabricated on the substrate. In some other embodiments, the first readout circuits and the second readout circuits may be fabricated on another substrate and integrated/co-packaged with the absorption layer via die/wafer bonding or stacking.

In the present disclosure, if not specifically mention, the first readout circuit includes a first capacitor. The first capacitor is configured to store the photo-carriers collected by one of the first doped regions. In some embodiments, the first capacitor is electrically coupled to the reset gate of the first readout circuit. In some embodiments, the first capacitor is between the source-follower of the first readout circuit and the reset gate of the first readout circuit. In some embodiments, the second readout circuit includes a second capacitor. The second capacitor is configured to store the photo-carriers collected by the other one of the first doped regions. In some embodiments, the second capacitor is electrically coupled to the reset gate of the second readout circuit. In some embodiments, the second capacitor is between the source-follower of the second readout circuit and the reset gate of the second readout circuit. Examples of the first capacitor and the second capacitor include, but not limited to, floating-diffusion capacitors, metal-oxide-metal (MOM) capacitors, metal-insulator-metal (MIM) capacitors, and metal-oxide-semiconductor (MOS) capacitors.

In the present disclosure, if not specifically mention, the light shield has the optical window for defining the position of the absorbed region in the absorption layer. In other words, the optical window is for allowing the incident optical signal enter into the absorption layer and defining the absorbed region. In some embodiments, the light shield is on a second surface of the substrate distant from the absorption layer when an incident light enters the absorption layer from the second surface of the substrate. In some embodiments, a shape of the optical window can be ellipse, circle, rectangular, square, rhombus, octagon or any other suitable shape from a top view of the optical window.

In the present disclosure, if not specifically mention, the collection of the charges by the two switches of a pixel may be altered over time, such that the photo-detecting apparatus applied to an imaging system may determine phase information of the sensed light. The imaging system may use the phase information to analyze characteristics associated with the three-dimensional object including depth information or a material composition. The imaging system may also use the phase information to analyze characteristics associated with facial recognition, eye-tracking, gesture recognition, 3-dimensional model scanning/video recording, motion tracking, and/or augmented/virtual reality applications. In some embodiments, the photo-detecting apparatus is configured for time-of-flight detection. The imaging system may be a mobile device (e.g., a smartphone or a tablet), an ancillary device (e.g., a wearable device) for a mobile device, a computing system on a vehicle or in a fixed facility (e.g., a factory), a robotics system, or any other suitable device and/or system. In some embodiments, an imaging system may include one or more optical modules. For example, an optical module may include one or more cameras that are integrated with the photo-detecting apparatus. As another example, one optical module of an imaging system may include one or more cameras, and another optical module of the imaging system may include a photo-detecting apparatus having a one-dimensional or a two-dimensional array of pixels implemented for time-of-flight detection for obtaining time-of-flight information.

In the present disclosure, in some embodiments, one of the control signals may be fixed at a voltage value Vi, and the other control signal may alternate between voltage values Vi±ΔV. In some embodiments, the two control signals may be voltages that are differential to each other. In some embodiments, one of the control signals is a constant voltage signal (e.g., 0.5 v) and the other control signal is a time-varying voltage signal (e.g., sinusoid signal, clock signal or pulse signal operated between 0V and 1V). The direction of the bias value determines the drift direction of the charges generated from the absorption layer.

In the present disclosure, if not specifically mention, in a same pixel, the type of the carriers collected by the first doped region of one of the switches and the type of the carriers collected by the first doped region of the other switch are the same. For example, when the photo-detecting apparatus is configured to collects electrons, when the first switch is switched on and the second switch is switched off, the first doped region in the first switch collects electrons of the photo-carriers generated from the absorption layer, and when the second switch is switched on and the first switch is switched off, the first doped region in the second switch also collects electrons of the photo-carriers generated from the absorption layer.

In some embodiments, each of the switches further includes a portion of the absorption layer and/or a portion of the substrate or a portion of the carrier control layer or a portion of the carrier collection layer. In some embodiments, the readout contact layer of each of the switches is electrically coupled to and arranged over the respective portion of absorption layer and/or the substrate or the carrier control layer or the carrier collection layer. In some embodiments, each portion of the absorption layer and/or the substrate or the carrier control layer or the carrier collection layer of the two switches further includes a first doped region arranged under the respective readout contact layer.

In some embodiments, each of the switches includes another portion of the absorption layer and/or another portion of the substrate or another portion of the carrier control layer or another portion of the carrier collection layer. In some embodiments, the control contact layer of each of the switches is electrically coupled to and arranged over the respective portion of absorption layer and/or the substrate or the carrier control layer or the carrier collection layer. In some embodiments, each portion of the absorption layer and/or the substrate or carrier control layer or the carrier collection layer of the two switches further includes a second doped region arranged under the respective control contact layer.

In some embodiments, the first dielectric layer, the second dielectric layer, the third dielectric layer, the fourth dielectric layer and the fifth dielectric layer in the present disclosure include, but is not limited to $SiO_2$. In some embodiments, the first dielectric layer, the second dielectric layer the third dielectric layer, the fourth dielectric layer and the fifth dielectric layer include a high-k material including, but is not limited to, $Si_3N_4$, SiON, $SiN_x$, $SiO_x$, $GeO_x$, $Al_2O_3$, $Y_2O_3$, $TiO_2$, $HfM_2$ or $ZrO_2$. In some embodiments, the first dielectric layer, the second dielectric layer, the third dielectric layer, the fourth dielectric layer and the fifth dielectric layer in the present disclosure include semiconductor material but, but is not limited to amorphous Si, polycrystalline Si, crystalline Si, or a combination thereof.

In the present disclosure, if not specifically mention, the readout metal line, control metal line, readout contact layer, the control contact layer and the conductive layer include metals or alloys. For example, the readout metal line, control metal line, readout contact layer, the control contact layer and the conductive layer include Al, Cu, W, Ti, Ta—TaN—Cu stack or Ti—TiN—W stack.

In the present disclosure, if not specifically mention, the third doped region and the blocking layer in the photo-detecting apparatus according to the present disclosure can be floating, open, short or biased by a voltage source or a current source such as bias voltage ca1 or ca2.

In some embodiments, if not specifically mention, the pixel-array can be arranged in a way similar, but not limited to the pixel array in FIG. 12A and FIG. 12B.

In some embodiments, if not specifically mention, the cross-sectional views shown in the present disclosure may be a cross-sectional view along any possible cross-sectional line of a photo-detecting apparatus.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A photo-detecting apparatus, comprising:
a semiconductor substrate;
one or more pixels supported by the semiconductor substrate, wherein each of the one or more pixels comprises:
a germanium-based light absorption material configured to absorb an optical signal having a wavelength greater than 800 nm;
a first metal line electrically coupled to the germanium-based light absorption material;
a second metal line electrically coupled to the germanium-based light absorption material;

a third metal line electrically coupled to the germanium-based light absorption material;
a fourth metal line electrically coupled to the germanium-based light absorption material;
a first region doped with a first type of dopant and electrically coupled to the first metal line;
a second region doped with a second type of dopant, wherein the first metal line is configured to control an amount of a first type of photo-generated carriers generated inside the germanium-based light absorption material to be collected by the second region, and wherein the second type of dopant is different from the first type of dopant;
a third region doped with the first type of dopant and electrically coupled to the third metal line; and
a fourth region doped with the second type of dopant, wherein the third metal line is configured to control an amount of the first type of photo-generated carriers generated inside the germanium-based light absorption material to be collected by the fourth region,
wherein a depth of the first region extending from a first surface of the germanium-based light absorption material is deeper than a depth of the second region extending from the first surface of the germanium-based light absorption material.

2. The photo-detecting apparatus of claim 1, wherein the first metal line and the second metal line are positioned diagonally with respect to an axis passing through an optical window along a direction substantially parallel to the first surface of the germanium-based light absorption material.

3. The photo-detecting apparatus of claim 1, wherein the first region, the second region, the third region and the fourth region are formed within the germanium-based light absorption material.

4. The photo-detecting apparatus of claim 1, further comprising two counter-doped regions overlapping with at least a portion of the first region and the third region respectively, wherein each of the counter-doped regions is of a conductivity type different from a conductivity type of the first region and the third region.

5. The photo-detecting apparatus of claim 1, further comprising two counter-doped regions overlapping with at least a portion of the second region and the fourth region respectively, wherein each of the counter-doped regions is of a conductivity type different from a conductivity type of the second region and the fourth region.

6. The photo-detecting apparatus of claim 1, further comprising a blocking layer surrounding at least a portion of the germanium-based light absorption material, wherein the blocking layer is of a conductivity type different from a conductivity type of the second region, and the blocking layer is configured to block the first type of photo-generated carriers from reaching the semiconductor substrate.

7. The photo-detecting apparatus of claim 6, further comprising a conductive layer electrically coupled to the blocking layer and configured to bias the blocking layer.

8. The photo-detecting apparatus of claim 1, wherein the one or more pixels comprise multiple pixels, and the photo-detecting apparatus further comprises an isolation region between two adjacent pixels of the multiple pixels, wherein the isolation region is configured to impede a flow of the first type of photo-generated carriers between the two adjacent pixels.

9. The photo-detecting apparatus of claim 1, further comprising a guiding region between the first region and the third region, wherein the guiding region is of a conductivity type different from a conductivity type of the first region and configure to collect the first type of photo-generated carriers between the first region or the third region.

10. The photo-detecting apparatus of claim 1, further comprising a passivation layer over the first surface of the germanium-based light absorption material, wherein the passivation layer is composed of a material different from the germanium-based light absorption material.

11. The photo-detecting apparatus of claim 1, wherein the germanium-based light absorption material comprises an absorbed region configured to receive the optical signal, wherein the first region, the second region, the third region and the fourth region are formed at a same side of the absorbed region.

12. The photo-detecting apparatus of claim 11, further comprising a guiding region at least partially formed in the germanium-based light absorption material and between the first region and the third region, wherein the guiding region is of a conductivity type that is the same as a conductivity type of the second region and configured to guide the first type of photo-generated carriers from the germanium-based light absorption material to the first region or the third region.

13. A photo-detecting apparatus, comprising:
a semiconductor substrate;
one or more pixels supported by the semiconductor substrate, wherein each of the one or more pixels comprises:
an absorption layer configured to absorb an optical signal having a wavelength greater than 800 nm and to generate photo-carriers;
one or more switches electrically coupled to the absorption layer, wherein each of the one or more switches comprises a respective first doped region of a first conductivity type and configured to collect a first portion of the photo-carriers; and
one or more buffer regions adjacent to or overlapped with a corresponding first doped region of the one or more switches, wherein the one or more buffer regions are of a second conductivity type different from the first conductivity type, wherein the one or more buffer regions and the respective first doped region are formed along a surface of the semiconductor substrate or the absorption layer, wherein the one or more buffer regions are configured to block the first portion of the photo-carriers from reaching the surface of the semiconductor substrate or the absorption layer, and wherein a depth of a respective buffer region of the one or more buffer regions is less than a depth of the corresponding first doped region.

14. The photo-detecting apparatus of claim 13, wherein each of the one or more switches comprises a respective second doped region of the second conductivity type, wherein the respective first doped region, the one or more buffer regions and the respective second doped region are formed along the surface of the semiconductor substrate or the absorption layer, and the respective buffer region is between the corresponding first doped region and a corresponding second doped region.

15. The photo-detecting apparatus of claim 14, wherein the depth of the respective buffer region of the one or more buffer regions is less than a depth of the corresponding second doped region.

16. The photo-detecting apparatus of claim 13, wherein the one or more switches comprises multiple switches, and the photo-detecting apparatus further comprises a guiding region between two adjacent switches, wherein the guiding region is of the first conductivity type and configured to gather the first portion of the photo-carriers between the two adjacent switches.

17. The photo-detecting apparatus of claim 13, wherein the one or more pixels comprises multiple pixels, and the photo-detecting apparatus further comprises an isolation region between two adjacent pixels of the multiple pixels, wherein the isolation region is configured to impede a flow of the photo-carriers between the two adjacent pixels.

18. The photo-detecting apparatus of claim 13, further comprising a blocking layer surrounding at least a portion of the absorption layer, wherein the blocking layer is of the second conductivity type and is configured to block the first portion of the photo-carriers from reaching the semiconductor substrate.

19. The photo-detecting apparatus of claim 18, further comprising a conductive layer electrically coupled to the blocking layer and configured to bias the blocking layer.

20. The photo-detecting apparatus of claim 13, further comprising a passivation layer over the surface of the absorption layer, wherein the passivation layer is composed of a material different from the absorption layer.

\* \* \* \* \*